(12) United States Patent
Tanaka et al.

(10) Patent No.: US 9,269,905 B2
(45) Date of Patent: Feb. 23, 2016

(54) POLYMER COMPOUND HAVING CARBON CLUSTER STRUCTURE AND ORGANIC DEVICE USING SAME

(75) Inventors: Shin-Ya Tanaka, Tsukuba (JP); Motoaki Usui, Tsukuba (JP); Haruki Otsuka, Osaka (JP); Ken Yoshimura, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 53 days.

(21) Appl. No.: 13/995,823

(22) PCT Filed: Dec. 21, 2011

(86) PCT No.: PCT/JP2011/079599
§ 371 (c)(1),
(2), (4) Date: Jun. 19, 2013

(87) PCT Pub. No.: WO2012/086672
PCT Pub. Date: Jun. 28, 2012

(65) Prior Publication Data
US 2013/0270545 A1 Oct. 17, 2013

(30) Foreign Application Priority Data

Dec. 21, 2010 (JP) ................................. 2010-285025
Jul. 22, 2011 (JP) ................................. 2011-161285

(51) Int. Cl.
*C08G 75/00* (2006.01)
*H01L 51/00* (2006.01)
(Continued)

(52) U.S. Cl.
CPC ............. *H01L 51/0039* (2013.01); *B82Y 10/00* (2013.01); *C08G 61/02* (2013.01); *C08G 61/12* (2013.01); *C08G 61/122* (2013.01); *C08G 61/123* (2013.01); *C08G 61/126* (2013.01);
(Continued)

(58) Field of Classification Search
CPC ................... C08G 2261/3162; C08G 2261/76; C08G 2261/95; C08L 79/02; H01L 51/0039
USPC ........... 528/380, 377, 373; 368/205; 505/460; 423/445 B
See application file for complete search history.

(56) References Cited

U.S. PATENT DOCUMENTS

2004/0150328 A1  8/2004 Czerw et al.
2004/0238799 A1* 12/2004 Hwang et al. ................. 252/511
(Continued)

FOREIGN PATENT DOCUMENTS

CN       101511904 A    8/2009
EP         2308910 A1    4/2011
(Continued)

OTHER PUBLICATIONS

Liu (Journal of Applied Polymer Science, vol. 86, 2737-2741 (2002).*
(Continued)

*Primary Examiner* — Shane Fang
(74) *Attorney, Agent, or Firm* — Panitch Schwarze Belisario & Nadel LLP

(57) ABSTRACT

A polymer compound, is provided in which at least a part of repeating units has a group containing a carbon cluster structure. The polymer compound preferably one or more, more preferably two or more, units selected from an arylene unit, a heteroarylene unit and an aromatic amine unit, as repeating units.

15 Claims, 5 Drawing Sheets

(51) Int. Cl.
*B82Y 10/00* (2011.01)
*C09K 11/06* (2006.01)
*C08K 3/04* (2006.01)
*C08G 61/12* (2006.01)
*C08L 65/00* (2006.01)
*C08G 61/02* (2006.01)
*H01L 51/42* (2006.01)
*H01L 51/52* (2006.01)

(52) U.S. Cl.
CPC . *C08K 3/04* (2013.01); *C08L 65/00* (2013.01); *C09K 11/06* (2013.01); *H01L 51/0047* (2013.01); *C08G 2261/124* (2013.01); *C08G 2261/135* (2013.01); *C08G 2261/148* (2013.01); *C08G 2261/1414* (2013.01); *C08G 2261/3142* (2013.01); *C08G 2261/3162* (2013.01); *C08G 2261/3245* (2013.01); *C08G 2261/3246* (2013.01); *C08G 2261/344* (2013.01); *C08G 2261/411* (2013.01); *C08G 2261/512* (2013.01); *C08G 2261/76* (2013.01); *C08G 2261/91* (2013.01); *C08G 2261/92* (2013.01); *C08G 2261/95* (2013.01); *C09K 2211/1416* (2013.01); *C09K 2211/1425* (2013.01); *C09K 2211/1433* (2013.01); *C09K 2211/1458* (2013.01); *C09K 2211/1483* (2013.01); *C09K 2211/1491* (2013.01); *H01L 51/4253* (2013.01); *H01L 51/5256* (2013.01); *Y02E 10/549* (2013.01)

(56) References Cited

U.S. PATENT DOCUMENTS

| | | |
|---|---|---|
| 2006/0226770 A1 | 10/2006 | Lee et al. |
| 2009/0256475 A1 | 10/2009 | Nakatani et al. |
| 2010/0137518 A1* | 6/2010 | Yang et al. .............. 525/186 |
| 2010/0187500 A1 | 7/2010 | Prakash |
| 2011/0036406 A1 | 2/2011 | Okubo et al. |
| 2011/0127517 A1 | 6/2011 | Nakatani |

FOREIGN PATENT DOCUMENTS

| | | | |
|---|---|---|---|
| EP | 2311893 | A1 | 4/2011 |
| JP | 08-505859 | A | 6/1996 |
| JP | 09-188726 | A | 7/1997 |
| JP | 3227784 | B2 | 11/2001 |
| JP | 2004-231958 | A | 8/2004 |
| JP | 2004-277736 | A | 10/2004 |
| JP | 2005-179480 | A | 7/2005 |
| JP | 2006-295163 | A | 10/2006 |
| JP | 2007-191645 | A | 8/2007 |
| JP | 3985277 | B2 | 10/2007 |
| JP | 2008-095080 | A | 4/2008 |
| JP | 2009-506519 | A | 2/2009 |
| JP | 4270381 | B2 | 5/2009 |
| JP | 2010-053349 | A | 3/2010 |
| JP | 2010-195918 | A | 9/2010 |
| WO | 9417018 | A1 | 8/1994 |
| WO | 2006045199 | A1 | 5/2006 |
| WO | 2006108272 | A2 | 10/2006 |
| WO | 2007011739 | A2 | 1/2007 |
| WO | 2010013723 | A1 | 2/2010 |
| WO | 2010013724 | A1 | 2/2010 |
| WO | 2010021374 | A1 | 2/2010 |

OTHER PUBLICATIONS

Int'l Preliminary Report on Patentability issued Jul. 11, 2013 in Int'l Application No. PCT/JP2011/079599.
Office Action issued Feb. 25, 2015 in CN Application No. 201180061963.7.
Int'l Search Report issued Mar. 27, 2012 in Int'l Application No. PCT/JP2011/079599.
Bernius et al, "Progress with Light-Emitting Polymers," Advanced Materials, vol. 12, pp. 1737-1750 (2000).
Park et al, "Properties of a C60-fluorene polymer," Synthetic Metals, vol. 135-136, pp. 767-768 (2003).
Office Action issued May 7, 2015 in TW Application No. 100147657.
Office Action issued Oct. 6, 2015 in JP Application No. P2011-280111.

* cited by examiner

POLYMER COMPOUND HAVING CARBON CLUSTER STRUCTURE AND ORGANIC DEVICE USING SAME

CROSS-REFERENCE TO RELATED APPLICATION

This application is a Section 371 of International Application No. PCT/JP2011/079599, filed Dec. 21, 2011, which was published in the Japanese language on Jun. 28, 2012, under International Publication No. WO 2012/086672 A1, and the disclosure of which is incorporated herein by reference.

TECHNICAL FIELD

The present invention relates to a polymer compound having a carbon cluster structure and an organic device using the same. More specifically the present invention relates to a polymer compound having a carbon cluster structure, and an electroluminescence device (hereinafter, referred to simply as an "organic EL device") such as an organic electroluminescence device, a photoelectric conversion device such as solar cells, and an organic film transistor using the same.

BACKGROUND ART

An organic EL device is an self-luminescence device using a material emitting light by itself, and thus has e.g., an excellent contrast ratio, view angle and response rate compared to a liquid crystal display device. In addition, the organic EL device is easily reduced in film thickness, and thus, has recently drawn attention as a display device of a second-generation to be used in place of a liquid crystal display device.

The materials to be used in organic EL devices are roughly divided into two types, i.e., a low-molecular material and a high-molecular material. In the case of using a high-molecular material, an organic EL device can be formed by a coating method. Thus, the high-molecular material has an advantage over a low-molecular material in that an organic EL device is relatively easily formed. Accordingly, in recent years, various types of polymer compounds, for example, polymer compounds having a phenylene group and a fluorenediyl group as a constitutional unit have been proposed as the polymer material (for example, Non Patent Literature 1).

Furthermore, it has been recently demanded that the amount of carbon dioxide being emitted to the atmosphere is reduced to prevent global warming. For example, providing a solar system using e.g., pn-junction silicon solar cells on the house roofs has been proposed; however, a single crystal silicon, polycrystal silicon and amorphous silicon used in the silicone solar cells, require high-temperature and high-vacuum conditions in a manufacturing process. In contrast, in an embodiment of a photoelectric conversion device, i.e., an organic film solar cell, a high-temperature and high-vacuum process used in manufacturing silicon solar cells can be omitted. There is a possibility of manufacturing solar cells by a coating process alone at low cost. For the reason, an organic film solar cell has been drawn attention in recent years.

As an organic film solar cell, an organic film solar cell containing a polymer material, which contains a polymer compound composed of a repeating unit (A) and a repeating unit (B) and a fullerene derivative serving as an electron transport material, in an organic layer, is known (Patent Literature 1).

[Chemical Formula 1]

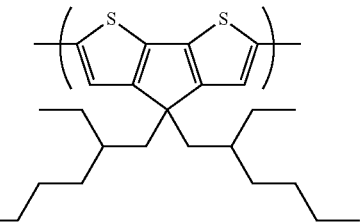

Repeating unit (A)

[Chemical Formula 2]

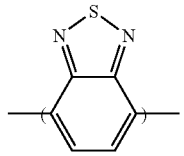

Repeating unit (B)

CITATION LIST

Patent Literature

Patent Literature 1: Japanese Unexamined Patent Application Publication No. 2009-506519

Non Patent Literature

Non Patent Literature 1: Advanced Materials, 2000, vol. 12, pp. 1737-1750

SUMMARY OF INVENTION

Technical Problem

However, the aforementioned polymer materials, the brightness life of the resultant organic EL device is not sufficient or the short-circuit current density and photoelectric conversion efficiency of the resultant photoelectric conversion device are not sufficient. Likewise, it was difficult to say that the properties of the resultant organic devices using the materials are sufficient.

As mentioned above, it has been desired to develop a polymer compound that can be preferably used in organic devices such as an organic EL device and a photoelectric conversion device.

Then, an object of the present invention is to provide a polymer compound that can be preferably applied to organic devices. More specifically, the object is to provide a polymer compound, when it is used as a polymer material in manufacturing an organic EL device, providing an excellent brightness life of the resultant organic EL device. Furthermore, the object is to provide a polymer compound, when it is used as a polymer material for manufacturing a photoelectric conversion device, providing excellent short-circuit current density and photoelectric conversion efficiency of the resultant photoelectric conversion device.

Solution to Problem

A polymer compound of the present invention is a polymer compound, in which at least a part of repeating units has a group containing a carbon cluster structure, can be preferably applied to uses of e.g., an organic EL device and a photoelectric conversion device. Hereinafter, an embodiment where the polymer compound is preferably applied to use of an organic EL device and an embodiment where the polymer compound is preferably applied to use of a photoelectric conversion device will be separately described in order.

First, the embodiment where the polymer compound is preferably applied to use of an organic EL device will be described below.

The present invention provides a polymer compound having two or more units selected from the group consisting of an arylene unit, a heteroarylene unit, a heterocyclic unit and an aromatic amine unit as repeating units, at least a part of the repeating units has a group containing a carbon cluster structure.

Since the polymer compound of the present invention has the above structure, when it is used as a polymer material in manufacturing an organic EL device, the resultant organic EL device has an excellent brightness life.

It is preferable that the polymer compound has one or more units selected from the group consisting of an arylene unit, a heteroarylene unit and a heterocyclic unit, and an aromatic amine unit as repeating units. Owing to this, the brightness life of the organic EL device becomes more excellent.

In the polymer compound, it is preferable that the aromatic amine unit is one or more units selected from the group consisting of a unit represented by the following formula (2) and a unit represented by formula (3):

[Chemical Formula 3]

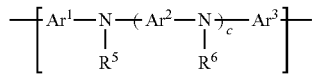
(2)

wherein $Ar^1$, $Ar^2$ and $Ar^3$ each independently represent an unsubstituted or substituted arylene group, an unsubstituted or substituted heteroarylene group, or an unsubstituted or substituted divalent heterocyclic group; $R^5$ and $R^6$ each independently represent a hydrogen atom, an unsubstituted or substituted alkyl group, an unsubstituted or substituted aryl group, or an unsubstituted or substituted monovalent heterocyclic group; and c represents 0 or 1,

[Chemical Formula 4]

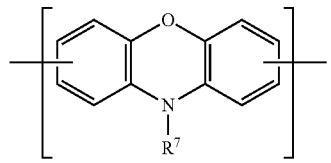
(3)

wherein $R^7$ represents a hydrogen atom, an unsubstituted or substituted alkyl group, an unsubstituted or substituted aryl group, or an unsubstituted or substituted monovalent heterocyclic group.

In the polymer compound, the arylene unit is preferably a unit having a phenylene structure or a fluorene structure and more preferably a unit having a fluorene structure. Furthermore, it is preferable that the polymer compound is a conjugated polymer.

In the polymer compound, it is preferable that the repeating unit having a group containing a carbon cluster structure is a repeating unit represented by the following formula (5A):

[Chemical Formula 5]

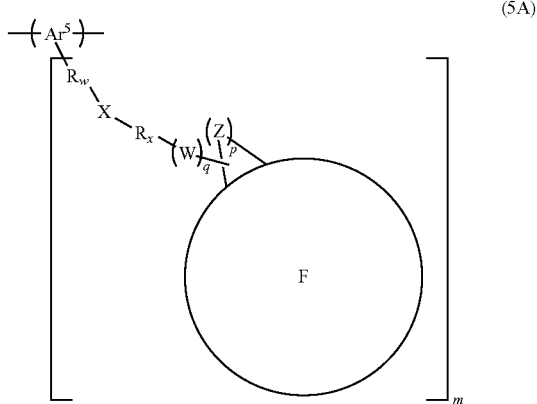
(5A)

wherein $Ar^5$ represents an unsubstituted or substituted arylene group, an unsubstituted or substituted heteroarylene group, an unsubstituted or substituted divalent heterocyclic group, or an unsubstituted or substituted divalent aromatic amine residue; X represents a single bond, an oxygen atom, a sulfur atom, an unsubstituted or substituted alkylene group, or an unsubstituted or substituted phenylene group; $R_w$ and $R_x$ each independently represent a single bond, an unsubstituted or substituted $C_1$ to $C_{20}$ alkylene group, an unsubstituted or substituted $C_6$ to $C_{20}$ arylene group, or a divalent group of a combination thereof; ring F represents a carbon cluster structure; m represents an integer of 1 to 4; W represents a divalent group containing a carbon atom or a silicon atom; Z represents a hetero atom selected from a nitrogen atom, an oxygen atom and a sulfur atom, or a carbon atom; p represents an integer of 0 to 12; q represents 0 or 1; when p is 0, q is 1 and W is a silicon atom, when p is 1, z is a carbon atom, when p is 2 or more, at least one of a plurality of Z may be a hetero atom, the bond between adjacent carbon atoms is a single bond or an unsaturated bond, and the divalent group containing a carbon atom and represented by W may form a ring together with a ring containing Z; and note that when there are a plurality of $R_w$, $R_x$, X, W, Z, p, q and ring F, they may be independently the same or different.

It is preferable that the carbon cluster structure is a structure containing a fullerene. Furthermore, examples of the fullerene include fullerene C60, fullerene C70 and fullerene 84. Fullerene C60 and fullerene C70 are preferable and fullerene 60 is more preferable.

It is preferable that the repeating unit having a group containing a carbon cluster structure is a repeating unit represented by the following formula (6):

[Chemical Formula 6]

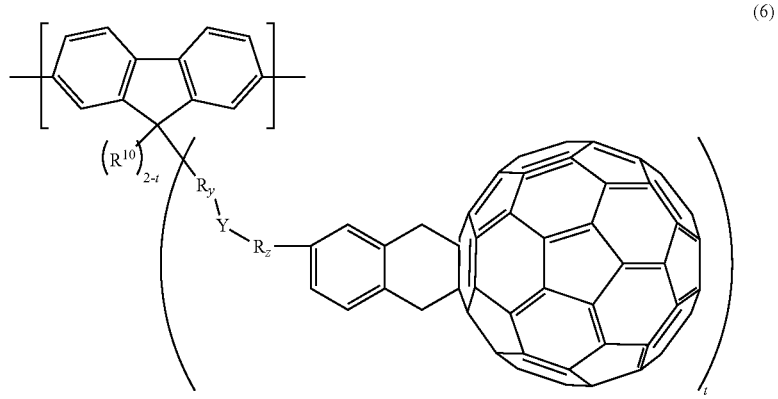

(6)

wherein Y represents a single bond, an oxygen atom, a sulfur atom, an unsubstituted or substituted alkylene group, or an unsubstituted or substituted phenylene group; $R_y$ and $R_z$ each independently represent a single bond, an unsubstituted or substituted $C_1$ to $C_{20}$ alkylene group, an unsubstituted or substituted $C_6$ to $C_{20}$ arylene group, or a divalent group of a combination thereof; $R^{10}$ represents a hydrogen atom, an unsubstituted or substituted alkyl group, an unsubstituted or substituted alkoxy group, an unsubstituted or substituted aryl group, an unsubstituted or substituted monovalent heterocyclic group, or a crosslinkable group; t represents 1 or 2; and when there are a plurality of $R_y$, $R_z$ and Y, they may be independently the same or different.

The present invention further provides a polymer compound, which can be obtainable by reacting a precursor polymer compound having two or more units selected from the group consisting of an arylene unit, a heteroarylene unit, a heterocyclic unit and an aromatic amine unit as repeating units, at least a part of the repeating units contains a crosslinkable group, and a carbon cluster. The polymer compound thus obtained, when it is used as a polymer material in manufacturing of an organic EL device, provides excellent brightness life of the resultant organic EL device.

It is preferable that the repeating unit containing a crosslinkable group is a unit represented by the following formula (7):

[Chemical Formula 7]

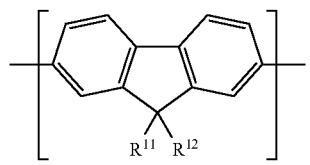

(7)

wherein $R^{11}$ represents a crosslinkable group; and $R^{12}$ represents a hydrogen atom, a crosslinkable group, an unsubstituted or substituted alkyl group, or an unsubstituted or substituted aryl group.

The present invention further provides a composition (usually, solid) containing one or more materials (usually, solid components) selected from the group consisting of a hole transport material, an electron transport material and a light-emitting material, and a polymer compound as mentioned above. The composition, since it contains a polymer compound as mentioned above suitable as a polymer material for an organic EL device, can be used for manufacturing, for example, a light-emitting layer, a charge transport layer or a charge injection layer of an organic EL device and can improve a manufacturing efficiency.

The present invention further provides a solution containing a polymer compound as mentioned above and a solvent. The solution can provide a film (a laminated film) containing the polymer compound suitable as a polymer material for an organic EL device by coating. Due to this, the solution is extremely favorable in manufacturing. Accordingly, the present invention further provides a film obtainable by using the above polymer compound or composition suitable as a polymer material for an organic EL device.

The present invention also provides an organic EL device including a film as mentioned above. The organic EL device of the present invention, since it employs the polymer compound or composition suitable as a polymer material for an organic EL device, is excellent in brightness life. In the organic EL device, it is preferable that the film is used as a hole transport layer. Owing to this, the organic EL device is more excellent in brightness life.

The present invention further provides a surface light source and a display apparatus having an organic EL device as mentioned above.

Next, an embodiment preferably applied to use of a photoelectric conversion device will be described below.

The present invention provides a polymer compound having at least one type selected from the group consisting of an arylene unit and a heteroarylene unit as a repeating unit, at least a part of the repeating units has a group containing a carbon cluster structure.

Due to the structure of the polymer compound of the present invention, when the polymer compound is used for manufacturing a photoelectric conversion device as a polymer material, the short-circuit current density and photoelectric conversion efficiency of the resultant photoelectric conversion device become excellent.

It is preferable that the group containing a carbon cluster structure is a group remaining after removing one hydrogen atom from fullerene C60 derivative, a group remaining after removing one hydrogen atom from fullerene C70 derivative, or a group remaining after removing one hydrogen atom from fullerene C84 derivative. Owing to this, the short-circuit current density and photoelectric conversion efficiency of the photoelectric conversion device becomes further excellent.

It is preferable that the repeating unit having a group containing a carbon cluster structure as mentioned above is 5 mole % or more and 100 mole % or less relative to the sum of all repeating units contained in the polymer compound.

The present invention further provides a photoelectric conversion composition (usually, solid) containing a first compound and a second compound, which is different from the first compound, in which the first compound is a polymer compound as mentioned above; the second compound is a fullerene or a fullerene derivative, or a polymer compound with a light absorption terminal wavelength of 500 nm or more and 1500 nm or less; and a content of the second compound is 0.1 mass % to 99 mass % based on the total amount. The photoelectric conversion composition, since it contains the aforementioned polymer compound suitable as a polymer material for a photoelectric conversion device, can be preferably used in manufacturing a photoelectric conversion device.

The present invention further provides a photoelectric conversion device containing a pair of electrodes and at least one active layer between the electrodes, in which the active layer contains a polymer compound as mentioned above or a photoelectric conversion composition as mentioned above. The photoelectric conversion device, since it contains a polymer compound as mentioned above suitable as a polymer material for a photoelectric conversion device, is excellent in short-circuit current density and photoelectric conversion efficiency.

The present invention further provides a solar cell including a photoelectric conversion device as mentioned above and a solar cell module containing the same as well as an image sensor containing a photoelectric conversion device as mentioned above.

The present invention also provides an organic film transistor including a gate electrode, a source electrode, a drain electrode and an active layer in which a polymer compound as mentioned above is contained.

Advantageous Effects of Invention

The polymer compound of the present invention is a polymer compound, when it is used for manufacturing an organic EL device, providing excellent brightness life of the resultant organic EL device. The polymer compound is useful as a material for organic EL devices such as a light-emitting material and a charge transport material. Accordingly, the polymer compound and organic EL device of the present invention are useful as backlights of liquid crystal displays, curved light sources or flat-surface light sources (surface light source) for illumination, and display apparatuses such as a segment type display apparatus and a dot matrix display apparatus.

The polymer compound of the present invention is also a polymer compound, when it is used for manufacturing a photoelectric conversion device, providing excellent short-circuit current density and photoelectric conversion efficiency of the resultant photoelectric conversion device. Accordingly, the polymer compound of the present invention is useful as a material for e.g., solar cells (particularly, organic film solar cell), solar cell modules, organic image sensors and organic transistors (particularly, organic film transistor).

DESCRIPTION OF EMBODIMENTS

Figure 1:
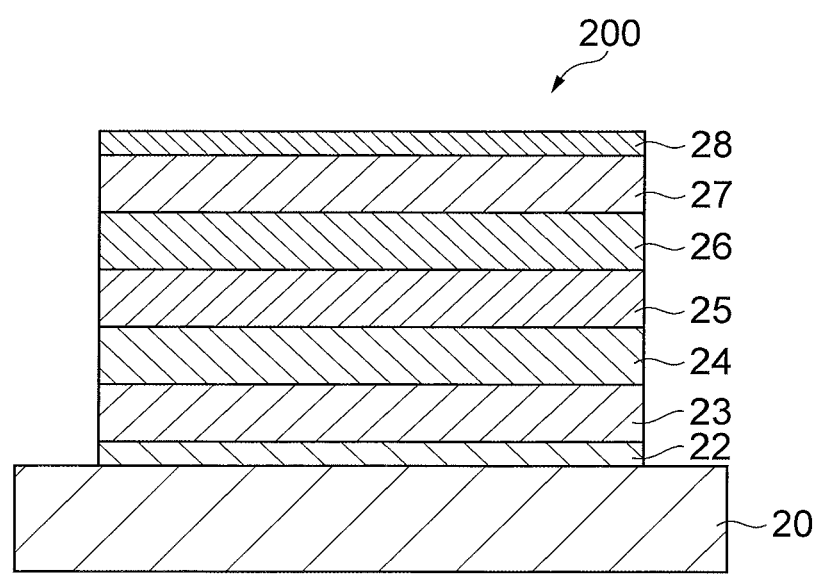
FIG. 1 is a schematic sectional view of an organic EL device (constitution p).

Embodiments of the present invention will be more specifically described below; however, the present invention is not limited to the following embodiments. First, an embodiment of an organic EL device (hereinafter, also referred to as a "the electroluminescence device embodiment") using the polymer compound of the present invention will be described in more detail.

[Definition of Term]

Common terms used in the electroluminescence device embodiments of the invention will be explained, if necessary, by way of specific examples, below.

The term "unit" refers to a group derived from a compound, which is subjected to condensation polymerization when a polymer compound is synthesized by condensation polymerization.

The term "arylene unit" means that the group derived from a compound subjected to condensation polymerization is a unit being an unsubstituted or substituted arylene group. The "arylene unit" may have a group containing a carbon cluster structure or a crosslinkable group.

The term "heterocyclic unit" means that the group derived from a compound subjected to condensation polymerization is a unit being an unsubstituted or substituted divalent heterocyclic group. The "heterocyclic unit" may have a group containing a carbon cluster structure or a crosslinkable group.

The term "heteroarylene unit" means that the group derived from a compound subjected to condensation polymerization is a unit being an unsubstituted or substituted heteroarylene group. The "heteroarylene unit" may have a group containing a carbon cluster structure or a crosslinkable group.

The term "aromatic amine unit" means that the group derived from a compound subjected to condensation polymerization is a unit being an unsubstituted or substituted divalent aromatic amine residue. The "aromatic amine unit" may have a group containing a carbon cluster structure or a crosslinkable group.

The term "constitutional unit" refers to a unit which appears at a frequency of one or more in a polymer compound.

The term "repeating unit" refers to a unit which appears at a frequency of two or more in a polymer compound.

The "divalent heterocyclic group" refers to an atomic group remaining after removing two hydrogen atoms from a heterocyclic compound having no aromaticity (more specifically, heterocyclic compounds except the heterocyclic compounds with aromaticity described later). Herein, the divalent heterocyclic group may have a substituent. The "heterocyclic compound" described in the "divalent heterocyclic group" above, refers to an organic compound having a ring structure and having a hetero atom such as an oxygen atom, a nitrogen atom, a phosphorus atom and a boron atom in addition to the carbon atoms as the elements constituting the ring.

The "heteroarylene group" refers to an atomic group remaining after removing two hydrogen atoms from an aromatic heterocyclic compound. Herein, the heteroarylene group may have a substituent. The "heterocyclic compound" described in the "heteroarylene group" above refers to an organic compound having a ring structure and having a hetero atom such as an oxygen atom, a nitrogen atom, a phosphorus atom and a boron atom in addition to the carbon atoms, as the elements constituting the ring.

The term "arylene group" refers to an atomic group remaining after removing two hydrogen atoms bound to carbon atoms constituting an aromatic ring, from an aromatic hydrocarbon. Herein, the arylene group may have a substituent.

The term "divalent aromatic amine residue" refers to an atomic group remaining after removing two hydrogen atoms from an aromatic amine compound. Herein, the divalent aromatic amine residue may have a substituent.

The term "heteroarylidine group" refers to an atomic group remaining after removing three hydrogen atoms from a heterocyclic compound with aromaticity.

The "arylidine group" refers to an atomic group remaining after removing three hydrogen atoms bound to carbon atoms constituting an aromatic ring, from an aromatic hydrocarbon.

The term "carbon cluster" refers to a molecule in which a minimum structure is constituted of from several to several thousands of carbon atoms. For example, a fullerene molecule having a spherical shell structure, a cylindrical carbon nanotube and carbon nano-horn are mentioned.

The term "carbon cluster structure" refers to a structure derived from a carbon cluster.

The "crosslinkable group" refers to a group containing a functional group capable of binding to a carbon cluster e.g., the Diels-Alder reaction and the Bingel-Hirsh reaction.

The term "$C_x$ to $C_y$" (x, y are positive integers satisfying x<y) means that the number of carbon atoms of the partial structure represented by the name of a functional group described immediately after the term is x to y. To describe more specifically, when the name of the organic group described immediately after "$C_x$ to $C_y$" is a combination of a plurality of the names of functional groups (for example, $C_x$ to $C_y$ alkoxyphenyl group), the number of carbon atoms of the partial structure represented by the name of a functional group described immediately after the term (for example, alkoxy group) of the plurality of the names of the functional groups, is meant to be x to y. For example, a "$C_1$ to $C_{12}$ alkyl group" refers to an alkyl group having 1 to 12 carbon atoms; a "$C_1$ to $C_{12}$ alkoxyphenyl group" refers to a phenyl group having "an alkoxy group of 1 to 12 carbon atoms".

The term "unsubstituted or substituted" means that the group described immediately after the term may have a substituent. For example, "an unsubstituted or substituted arylene group" refers to "an arylene group having no substituent or an arylene group having a substituent".

Examples of the substituent include an alkyl group, an alkoxy group, an alkylthio group, an aryl group, an aryloxy group, an arylthio group, an alkenyl group, an alkynyl group, an amino group, a silyl group, a halogen atom, an acyl group, an acyloxy group, a monovalent heterocyclic group, a monovalent heterocyclic thio group, an imine residue, an amide compound residue, an acid imide residue, an alkoxycarbonyl group, a carboxyl group, a nitro group and a cyano group. Hereinafter, as examples of a "substituent", the same ones can be mentioned, if otherwise specified. Furthermore, in some cases, these substituents may further have a "substituent".

The alkyl group may be any one of a linear alkyl group, a branched alkyl group and a cyclic alkyl group (cycloalkyl group). A hydrogen atom of an alkyl group may be substituted with a fluorine atom. Examples of the alkyl group include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, a dodecyl group, a trifluoromethyl group, a pentafluoroethyl group, a perfluorobutyl group, a perfluorohexyl group and a perfluorooctyl group. Examples of the $C_1$ to $C_{12}$ alkyl group include a methyl group, an ethyl group, a propyl group, an isopropyl group, a butyl group, an isoamyl group, a hexyl group, a cyclohexyl group, a heptyl group, an octyl group, a nonyl group, a decyl group and a dodecyl group.

The alkoxy group may be any one of a linear alkoxy group, a branched alkoxy group and a cyclic alkoxy group (cycloalkoxy group). A hydrogen atom of the alkoxy group may be substituted with a fluorine atom. Examples of the alkoxy group include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a dodecyloxy group, a trifluoromethoxy group, a pentafluoroethoxy group, a perfluorobutoxy group, a perfluorohexyloxy group, a perfluorooctyloxy group, a methoxymethyloxy group and a 2-methoxyethyloxy group. Examples of $C_1$ to $C_{12}$ alkoxy group include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group and a dodecyloxy group.

The alkylthio group may be any one of a linear alkylthio group, a molecule chain-form alkylthio group and a cyclic alkylthio group (cycloalkylthio group). A hydrogen atom of the alkylthio group may be substituted with a fluorine atom. Examples of the alkylthio group include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a dodecylthio group and a trifluoromethylthio group. Examples of a $C_1$ to $C_{12}$ alkylthio group include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group and a dodecylthio group.

The aryl group refers to an atomic group remaining after removing a single hydrogen atom bound to one of carbon atoms constituting an aromatic ring, from an aromatic hydrocarbon. The aryl group includes a group having a condensed ring and a group in which two or more independent benzene rings or condensed rings are bound via a single bond. The hydrogen atoms of the aryl group may be further substituted with e.g., an alkyl group and an aryl group as mentioned above. Examples of the aryl group include a phenyl group, a $C_1$ to $C_{12}$ alkoxyphenyl group, a $C_1$ to $C_{12}$ alkylphenyl group, a 1-naphthyl group, a 2-naphthyl group, a 1-anthracenyl group, a 2-anthracenyl group, a 9-anthracenyl group, a 2-fluorenyl group, a pentafluorophenyl group, a biphenylyl group, a $C_1$ to $C_{12}$ alkoxybiphenylyl group and a $C_1$ to $C_{12}$ alkylbiphenylyl group.

As the aryl moiety of an aryloxy group, the same examples as mentioned above as the aryl group are mentioned. Examples of the aryloxy group include a phenoxy group, a $C_1$ to $C_{12}$ alkoxyphenoxy group, a $C_1$ to $C_{12}$ alkylphenoxy group, a 1-naphthyloxy group, a 2-naphthyloxy group and a pentafluorophenyloxy group.

As the aryl moiety of an arylthio group, the same examples above as mentioned as the aryl group are mentioned. Examples of the arylthio group include a phenylthio group, a $C_1$ to $C_{12}$ alkoxyphenylthio group, a $C_1$ to $C_{12}$ alkylphenylthio group, a 1-naphthylthio group, a 2-naphthylthio group and a pentafluorophenylthio group.

The alkenyl group may be any one of a linear alkenyl group, a branched alkenyl group and a cyclic alkenyl group. Examples of the alkenyl group include a vinyl group, 1-propenyl group, a 2-propenyl group, a 1-butenyl group, a 2-butenyl group, a 1-pentenyl group, a 2-pentenyl group, a 1-hexenyl group, a 2-hexenyl group and a 1-octenyl group.

The alkynyl group may be any one of a linear alkynyl group, branched alkynyl group and a cyclic alkynyl group. Examples of the alkynyl group include an ethynyl group, 1-propynyl group, a 2-propynyl group, a 1-butynyl group, a 2-butynyl group, a 1-pentynyl group, a 2-pentynyl group, a 1-hexynyl group, a 2-hexynyl group and a 1-octynyl group.

The amino group includes not only a group represented by —$NH_2$ but also an amino group in which one or two hydrogen atoms are substituted with substituents (hereinafter, also referred to as a "substituted amino group"). Examples of the substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a heptylamino group, an octylamino group, a 2-ethylhexylamino group, a nonylamino group, a decylamino group, a 3,7-dimethyloctylamino group, a dodecylamino group, a cyclopentylamino group, a dicyclopentylamino group, a cyclohexylamino group, a dicyclohexylamino group, a ditrifluoromethylamino group, a phenylamino group, a diphenylamino group, a $C_1$ to $C_{12}$ alkoxyphenylamino group, a bis($C_1$ to $C_{12}$ alkoxyphenyl)amino group, a $C_1$ to $C_{12}$ alkylphenylamino group, a bis($C_1$ to $C_{12}$ alkylphenyl)amino group, a 1-naphthylamino group, a 2-naphthylamino group, a pentafluorophenylamino group, a pyridylamino group, a pyridazinylamino group, a pyrimidinyl amino group, a pyrazinylamino group, a triazinylamino group, a phenyl-$C_1$ to $C_{12}$ alkylamino group, a $C_1$ to $C_{12}$ alkoxyphenyl-$C_1$ to $C_{12}$ alkylamino group, a di($C_1$ to $C_{12}$ alkoxyphenyl-$C_1$ to $C_{12}$ alkyl)amino group, a $C_1$ to $C_{12}$ alkylphenyl-$C_1$ to $C_{12}$ alkylamino group, a di($C_1$ to $C_{12}$ alkylphenyl-$C_1$ to $C_{12}$ alkyl) amino group, a 1-naphthyl-$C_1$ to $C_{12}$ alkylamino group and a 2-naphthyl-$C_1$ to $C_{12}$ alkylamino group.

Examples of the silyl group include not only a group represented by —$SiH_3$ but also a silyl group in which one to three hydrogen atoms are substituted with substituents (hereinafter, also referred to as a "substituted silyl group"). Examples of the substituted silyl group include a trimethylsilyl group, a triethylsilyl group, a tripropylsilyl group, a tri-isopropylsilyl group, a dimethyl-isopropylsilyl group, a diethyl-isopropylsilyl group, a tert-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyl-dimethylsilyl group, a dodecyldimethylsilyl group, a phenyl-$C_1$ to $C_{12}$ alkylsilyl group, a $C_1$ to $C_{12}$ alkoxyphenyl-$C_1$ to $C_{12}$ alkylsilyl group, a $C_1$ to $C_{12}$ alkylphenyl-$C_1$ to $C_{12}$ alkylsilyl group, a 1-naphthyl-$C_1$ to $C_{12}$ alkylsilyl group, a 2-naphthyl-$C_1$ to $C_{12}$ alkylsilyl group, a phenyl-$C_1$ to $C_{12}$ alkyldimethylsilyl group, a triphenylsilyl group, a tri-p-xylylsilyl group, a tribenzylsilyl group, a diphenylmethylsilyl group, a tert-butyldiphenylsilyl group and a dimethylphenylsilyl group.

Examples of the halogen atom include a fluorine atom, a chlorine atom, a bromine atom and an iodine atom.

Examples of the acyl group include an acetyl group, a propionyl group, a butyryl group, an isobutyryl group, a pivaloyl group, a benzoyl group, a trifluoroacetyl group and a pentafluorobenzoyl group.

Examples of the acyloxy group include an acetoxy group, a propionyloxy group, a butyryloxy group, an isobutyryloxy group, a pivaloyloxy group, a benzoyloxy group, a trifluoroacetyloxy group and a pentafluorobenzoyloxy group.

The monovalent heterocyclic group refers to an atomic group remaining after removing a single hydrogen atom from a heterocyclic compound (particularly, a heterocyclic compound with aromaticity).

The "heterocyclic compound" described in the "monovalent heterocyclic group" above, refers to an organic compound having a ring structure and having a hetero atom such as an oxygen atom, a sulfur atom, a nitrogen atom, a phosphorus atom and a boron atom in addition to the carbon atoms serving as elements constituting a ring. Examples of the monovalent heterocyclic group include a thienyl group, a $C_1$ to $C_{12}$ alkylthienyl group, a pyrrolyl group, a furyl group, a pyridyl group, a $C_1$ to $C_{12}$ alkylpyridyl group, a pyridazinyl group, a pyrimidinyl group, a pyrazinyl group, a triazinyl group, a pyrrolidyl group, a piperidyl group, a quinolyl group and an isoquinolyl group. The hydrogen atoms in these monovalent heterocyclic groups, may be further substituted with e.g., an alkyl group and an alkoxy group as mentioned above.

The monovalent heterocyclic thio group refers to a group in which the hydrogen atom of a mercapto group is substituted with a monovalent heterocyclic group. Examples of the monovalent heterocyclic thio group include heteroarylthio groups such as a pyridylthio group, a pyridazinylthio group, a pyrimidinylthio group, a pyrazinylthio group and a triazinylthio group.

The imine residue refers to a residue remaining after removing a hydrogen atom from an imine compound having a structure represented by at least one of formula: H—N=C($R^{Y1}$)$_2$ and formula: H—CR$^{X1}$=N—R$^{Y1}$. In the formula, R$^{X1}$ represents a hydrogen atom, an alkyl group, an aryl group, an arylalkyl group, an arylalkenyl group or an arylalkynyl group; and R$^{Y1}$ represents a hydrogen atom, an alkyl group, an aryl group, an arylalkyl group, an arylalkenyl group or an arylalkynyl group. Note that, when there are two R$^{Y1}$, they may be the same or different, and may be mutually joined into one to form a ring as a divalent group, for example, an alkylene group having 2 to 18 carbon atoms such as an ethylene group, a trimethylene group, a tetramethylene group, a pentamethylene group and a hexamethylene group. As such an imine compound, aldimine, ketimine or a compound remaining after substituting the hydrogen atom bound to the nitrogen atom in aldimine with a substituent such as an alkyl group, an aryl group, an arylalkyl group, an arylalkenyl group and an arylalkynyl group, may be mentioned. Specific examples of the imine residue include the groups represented by the following structural formulas.

[Chemical Formula 8]

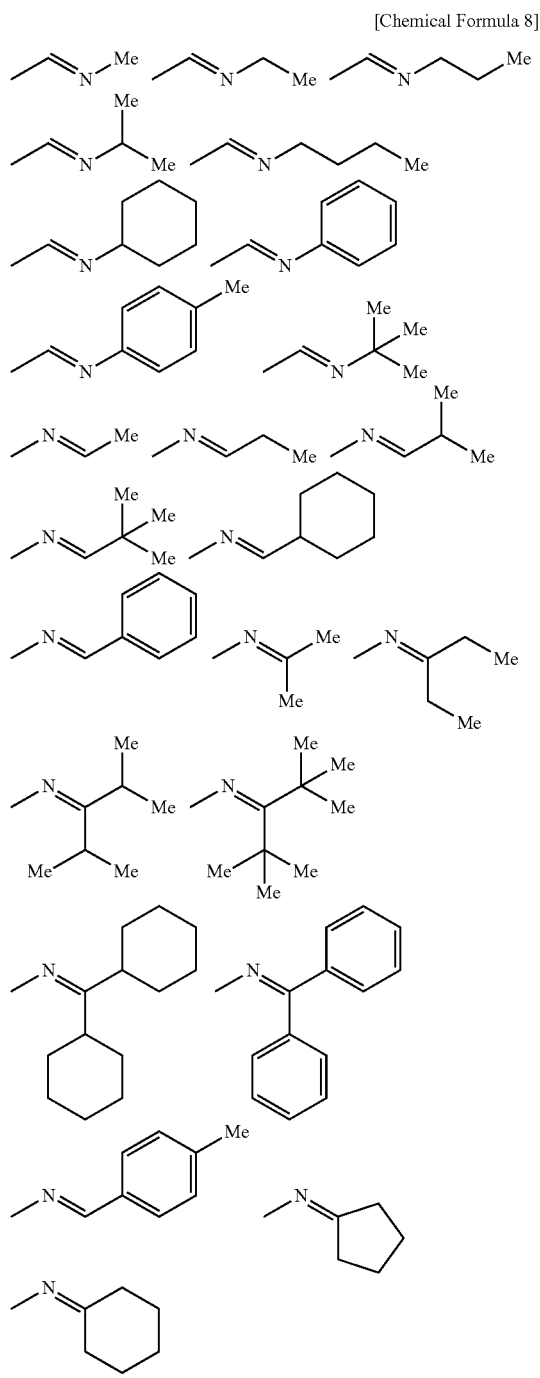

The amide compound residue refers to a residue remaining after removing a hydrogen atom from an amide compound having a structure represented by at least one of formula: H—NR$^{X2}$—COR$^{Y2}$ and formula: H—CO—N(R$^{Y2}$)$_2$. In the formula, R$^{X2}$ represents a hydrogen atom, an alkyl group, an aryl group, an arylalkyl group, an arylalkenyl group or an arylalkynyl group; and R$^{Y2}$ represents a hydrogen atom, an alkyl group, an aryl group, an arylalkyl group, an arylalkenyl group or an arylalkynyl group. Examples of the amide compound residue include a formamide residue, an acetamide residue, a propioamide residue, a butyroamide residue, a benzamide residue, a trifluoroacetamide residue, a pentafluorobenzamide residue, a diformamide residue, a diacetamide residue, a dipropioamide residue, a dibutyroamide residue, a dibenzamide residue, a ditrifluoroacetamide residue and a dipentafluorobenzamide residue.

The acid imide residue refers to a residue remaining after removing a single hydrogen atom bound to a nitrogen atom from an acid imide. Examples of the acid imide residue include the following groups.

[Chemical Formula 9]

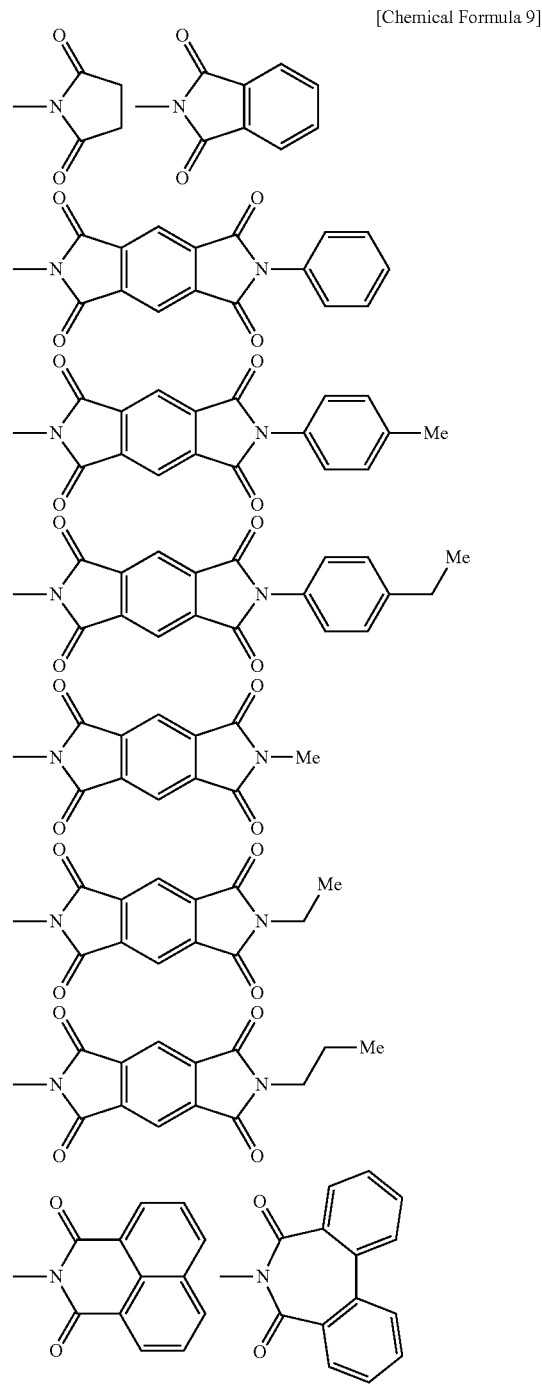

The alkoxycarbonyl group refers to a group represented by formula: R$^{X3}$OCO—. In the formula, R$^{X3}$ represents a hydrogen atom, an alkyl group, an aryl group, an arylalkyl group, an arylalkenyl group or an arylalkynyl group. Examples of the alkoxycarbonyl group include a methoxycarbonyl group, an ethoxycarbonyl group and a n-propoxycarbonyl group.

[Polymer Compound According to the Electroluminescence Device Embodiment]

The polymer compound according to the electroluminescence device embodiment of the invention contains two or more units selected from the group consisting of an arylene unit, a heteroarylene unit, a heterocyclic unit and an aromatic amine unit as repeating units, and at least a part of the repeating units has a group containing a carbon cluster structure.

Furthermore, it is preferable that a polymer compound according to the electroluminescence device embodiment of the invention has one or more units selected from the group consisting of an arylene unit, a heteroarylene unit and a heterocyclic unit, and an aromatic amine unit as repeating units since the brightness life of the organic EL device to be obtained becomes more excellent.

<Heteroarylene Unit>

The heteroarylene group of a heteroarylene unit is the same as defined above.

Examples of the heteroarylene group of a heteroarylene unit include a pyridylene group, a thiazolene group, an oxazolene group, a pyrimidylene group, a pyrolene group, a pyrazolene group, an imidazolene group, a furylene group, a thienylene group and a thiophene group. Furthermore, a pyridylene group, a thiazolene group, an oxazolene group, a pyrimidylene group, a pyrolene group, a pyrazolene group, an imidazolene group and a furylene group are preferable.

<Heterocyclic Unit>

The divalent heterocyclic group in a heterocyclic unit is the same defined above.

<Aromatic Amine Unit>

The divalent aromatic amine residue in an aromatic amine unit is the same as defined above.

It is preferable that the aromatic amine unit is one or more units selected from the group consisting of units represented by the following formula (2) and units represented by formula (3). It is preferable that the divalent aromatic amine residue in an aromatic amine unit is a group represented by the following formula (2) or formula (3).

[Chemical Formula 10]

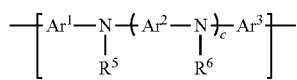

(2)

In formula (2), $Ar^1$, $Ar^2$ and $Ar^3$ each independently represent an unsubstituted or substituted arylene group, an unsubstituted or substituted heteroarylene group, or an unsubstituted or substituted divalent heterocyclic group; $R^5$ and $R^6$ each independently represent a hydrogen atom, an unsubstituted or substituted alkyl group, an unsubstituted or substituted aryl group, or an unsubstituted or substituted monovalent heterocyclic group; an unsubstituted or substituted aryl group is preferable and c represents 0 or 1.

[Chemical Formula 11]

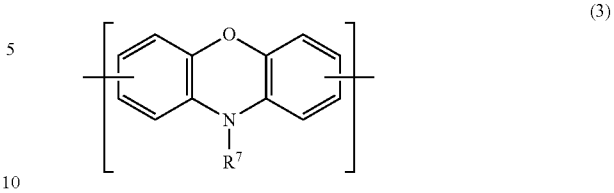

(3)

In formula (3), $R^7$ represents a hydrogen atom, an unsubstituted or substituted alkyl group, an unsubstituted or substituted aryl group, or an unsubstituted or substituted monovalent heterocyclic group. An unsubstituted or substituted aryl group is preferable.

The number of carbon atoms of an unsubstituted or substituted arylene group represented by $Ar^1$, $Ar^2$ or $Ar^3$ with the exclusion of the number of carbon atoms of a substituent is usually 6 to 60, preferably 6 to 30, more preferably 6 to 18, further preferably 6 to 10 and particularly preferably 6.

Examples of the unsubstituted arylene group represented by $Ar^1$, $Ar^2$ or $Ar^3$ include phenylene groups such as a 1,3-phenylene group and a 1,4-phenylene group; naphthalenediyl groups such as a 1,4-naphthalenediyl group and a 2,6-naphthalenediyl group; anthracenediyl groups such as 9,10-anthracenediyl group; phenanthrenediyl groups such as a 2,7-phenanthrenediyl group; naphthacenediyl groups such as 5,12-naphthacenediyl group; fluorenediyl groups such as a 2,7-fluorenediyl group; perylenediyl groups such as a 3,8-perylenediyl group; and chrysenediyl groups such as a 2,8-chrysenediyl group and a 6,12-chrysenediyl group. Examples of the substituted arylene groups represented by $Ar^1$, $Ar^2$ and $Ar^3$ include the aforementioned individual groups having a substituent.

The number of carbon atoms of the unsubstituted or substituted heteroarylene group represented by $Ar^1$, $Ar^2$ or $Ar^3$ with the exclusion of the number of carbon atoms of a substituent is usually 4 to 60, preferably 4 to 20, more preferably 4 to 9 and further preferably 4 or 5.

Examples of the unsubstituted heteroarylene group represented by $Ar^1$, $Ar^2$ or $Ar^3$ include pyrrolediyl groups such as a N-methyl-2,5-pyrrolediyl group; furandiyl groups such as a 2,5-furandiyl group; pyridinediyl groups such as a 2,5-pyridinediyl group and a 2,6-pyridinediyl group; quinolinediyl groups such as a 2,4-quinolinediyl group and a 2,6-quinolinediyl group; isoquinolinediyl groups such as a 1,4-isoquinolinediyl group and a 1,5-isoquinolinediyl group; and carbazolediyl groups such as 3,6-carbazolediyl group. Examples of the substituted heteroarylene groups represented by $Ar^1$, $Ar^2$ and $Ar^3$ include the aforementioned individual groups having a substituent.

The number of carbon atoms of the unsubstituted or substituted divalent heterocyclic group represented by $Ar^1$, $Ar^2$ or $Ar^3$ with the exclusion of the number of carbon atoms of a substituent is usually 4 to 60, preferably 4 to 20, more preferably 4 to 9 and further preferably 4 or 5.

Examples of the unsubstituted divalent heterocyclic group represented by $Ar^1$, $Ar^2$ or $Ar^3$ include phenoxazinediyl groups such as a 3,7-phenoxazinediyl group. Examples of the substituted divalent heterocyclic groups represented by $Ar^1$, $Ar^2$ and $Ar^3$ include the aforementioned individual groups having a substituent.

$Ar^1$ and $Ar^3$ each independently represent an unsubstituted or substituted arylene group, an unsubstituted or substituted heteroarylene group, or an unsubstituted or substituted divalent heterocyclic group, preferably an unsubstituted or substituted arylene group, more preferably an unsubstituted or substituted 1,3-phenylene group, an unsubstituted or substituted 1,4-phenylene group, an unsubstituted or substituted 1,4-naphthalenediyl group, or an unsubstituted or substituted 2,6-naphthalenediyl group, further preferably an unsubstituted or substituted 1,4-phenylene group, or an unsubstituted or substituted 1,4-naphthalenediyl group, and particularly preferably an unsubstituted or substituted 1,4-phenylene group.

$Ar^2$ represents an unsubstituted or substituted arylene group, an unsubstituted or substituted heteroarylene group, or an unsubstituted or substituted divalent heterocyclic group, preferably an unsubstituted or substituted arylene group, or an unsubstituted or substituted divalent heterocyclic group, more preferably an unsubstituted or substituted 1,3-phenylene group, an unsubstituted or substituted 1,4-phenylene group, an unsubstituted or substituted 1,4-naphthalenediyl group, an unsubstituted or substituted 2,7-fluorenediyl group, or a 9,10-anthracenediyl group, further preferably an unsubstituted or substituted 1,4-phenylene group, an unsubstituted or substituted 1,4-naphthalenediyl group, an unsubstituted or substituted 2,7-fluorenediyl group, or a 9,10-anthracenediyl group, and particularly preferably an unsubstituted 1,4-phenylene group or substituted 2,7-fluorenediyl group.

Examples of the substituent that a group represented by $Ar^1$, $Ar^2$ or $Ar^3$ may have, preferably include an unsubstituted or substituted alkyl group, an unsubstituted or substituted alkoxy group, an unsubstituted or substituted aryl group, an unsubstituted or substituted aryloxy group, an unsubstituted or substituted monovalent heterocyclic group, an unsubstituted or substituted silyl group, a halogen atom, an alkoxycarbonyl group, a carboxyl group and a cyano group, more preferably an unsubstituted alkyl group, an unsubstituted alkoxy group and an unsubstituted or substituted aryl group, and further preferably an unsubstituted alkyl group.

In the above formula (2), the unsubstituted alkyl groups represented by $R^5$ and $R^6$ may be linear, branched or cyclic and have carbon atoms of usually 1 to 20, preferably 1 to 15, more preferably 1 to 10, further preferably 1 to 8, and particularly preferably 1 to 6.

Examples of the unsubstituted alkyl groups represented by $R^5$ and $R^6$ include a methyl group, an ethyl group, a n-propyl group, an isopropyl group, a n-butyl group, an isobutyl group, a tert-butyl group, a n-pentyl group, an isoamyl group, a n-hexyl group, a cyclohexyl group, a n-heptyl group, a n-octyl group, a 2-ethylhexyl group, a n-nonyl group, a n-decyl group, a 3,7-dimethyloctyl group and a lauryl group. For the reason that the balance between the solubility of a polymer compound to an organic solvent and the resultant brightness life of an organic EL device is excellent, a methyl group, an ethyl group, a n-propyl group, an isopropyl group, a n-butyl group, an isobutyl group, a tert-butyl group, a n-pentyl group, an isoamyl group, a n-hexyl group, a n-octyl group, a 2-ethylhexyl group and a 3,7-dimethyloctyl group are preferable; a methyl group, n-butyl group, a tert-butyl group, a n-hexyl group and a n-octyl group are more preferable; and a methyl group, a n-butyl group and a n-hexyl group are further preferable.

The substituted alkyl groups represented by $R^5$ and $R^6$ may be linear, branched or cyclic and the number of carbon atoms thereof with the exclusion of the number of carbon atoms of a substituent are usually 1 to 20, preferably 1 to 15, and more preferably 1 to 10.

Examples of the substituted alkyl groups represented by $R^5$ and $R^6$ include alkyl groups substituted with a halogen atom such as a trifluoromethyl group, a pentafluoroethyl group, a perfluorobutyl group, a perfluorohexyl group and a perfluorooctyl group, alkyl groups substituted with an aryl group such as a phenylmethyl group and a 4-(4-hexylphenyl)butyl group and alkyl groups substituted with an alkoxy group such as an ethyloxymethyl group and an ethyloxyethyl group.

The number of carbon atoms of the unsubstituted or substituted aryl groups represented by $R^5$ and $R^6$ with the exclusion of the number of carbon atoms of a substituent is usually 6 to 60, preferably 6 to 48, more preferably 6 to 20, and further preferably 6 to 10.

Examples of the unsubstituted aryl groups represented by $R^5$ and $R^6$ include a phenyl group, 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-perylenyl group, a 3-perylenyl group, a 2-fluorenyl group, 3-fluorenyl group, a 4-fluorenyl group, a 1-biphenylenyl group, a 2-biphenylenyl group, a 2-phenanthrenyl group, a 9-phenanthrenyl group, a 2-phenylphenyl group, a 3-phenylphenyl group and a 4-phenylphenyl group. For the reason that the balance between the solubility of a polymer compound to an organic solvent and heat resistance thereof is satisfactory, a phenyl group is preferable. Examples of the substituted aryl group include groups remaining after substituting a hydrogen atom in the aforementioned groups with an alkyl group, an alkoxy group, an alkyloxycarbonyl group, an acyl group, a N,N-dialkylamino group, a N,N-diarylamino group, a cyano group, a nitro group, a chlorine atom and a fluorine atom. For the reason that the balance between the solubility of a polymer compound to an organic solvent and heat resistance thereof is satisfactory, a phenyl group substituted with an alkyl group is preferable.

Examples of the phenyl group substituted with an alkyl group include a 2-methylphenyl group, a 3-methylphenyl group, a 4-methylphenyl group, a 3-n-butylphenyl group, a 4-n-butylphenyl group, a 4-tert-butylphenyl group, a 3-n-hexylphenyl group, a 4-n-hexylphenyl group, a 4-n-octylphenyl group, a 3,5-dimethylphenyl group, a 3-n-hexyl-5-methylphenyl group and a 3,5-dihexylphenyl group.

The number of carbon atoms of the unsubstituted or substituted monovalent heterocyclic groups represented by $R^5$ and $R^6$ with the exclusion of the number of carbon atoms of a substituent is usually 4 to 60, and preferably 4 to 20.

Examples of the unsubstituted monovalent heterocyclic groups represented by $R^5$ and $R^6$ include a thienyl group, a pyrrolyl group, a furyl group, a pyridyl group, a piperidyl group, a quinolyl group, an isoquinolyl group, a pyrimidyl group and a triazinyl group. A thienyl group, a pyridyl group, a quinolyl group, an isoquinolyl group, a pyrimidyl group, a triazinyl group are preferable; and a pyridyl group, a pyrimidyl group, a triazinyl group are more preferable. Examples of the substituted monovalent heterocyclic group include groups remaining after substituting a hydrogen atom of the aforementioned groups with e.g., an alkyl group and an alkoxy group. Groups remaining after substituting a hydrogen atom of a thienyl group, a pyridyl group, a quinolyl group, an isoquinolyl group, a pyrimidyl group and a triazinyl group with an alkyl group and an alkoxy group are preferable; and groups remaining after substituting a hydrogen atom of a pyridyl group, a pyrimidyl group and a triazinyl group with an alkyl group and an alkoxy group are more preferable.

In the above formula (2), c is 0 or 1, and preferably 1.

The divalent aromatic amine residue represented by the above formula (2), since the brightness life of the organic EL device to be obtained is more excellent, the groups represented by the following formula (2A) are preferable.

[Chemical Formula 12]

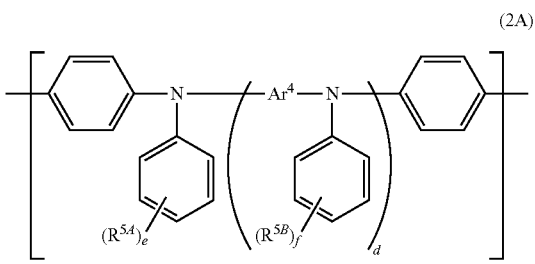

(2A)

In the above formula (2A), $Ar^4$ represents an unsubstituted or substituted arylene group, an unsubstituted or substituted heteroarylene group, or an unsubstituted or substituted divalent heterocyclic group. These groups include an unsubstituted or substituted divalent group in which two aromatic rings are joined with a single bond, preferably an unsubstituted or substituted arylene group, or an unsubstituted or substituted divalent heterocyclic group; more preferably an unsubstituted or substituted 1,3-phenylene group, an unsubstituted or substituted 1,4-phenylene group, an unsubstituted or substituted 1,4-naphthalenediyl group, an unsubstituted or substituted 2,7-fluorenediyl group, an unsubstituted or substituted 9,10-anthracenediyl group, an unsubstituted or substituted 2,6-anthracenediyl group, an unsubstituted or substituted 2,8-chrysenediyl group, an unsubstituted or substituted 3,6-chrysenediyl group; further preferably an unsubstituted or substituted 1,4-phenylene group, an unsubstituted or substituted 1,4-naphthalenediyl group, an unsubstituted or substituted 2,7-fluorenediyl group, an unsubstituted or substituted 9,10-anthracenediyl group, an unsubstituted or substituted 2,6-anthracenediyl group, an unsubstituted or substituted 2,8-chrysenediyl group, an unsubstituted or substituted 3,6-chrysenediyl group; and particularly preferably unsubstituted 1,4-phenylene group or substituted 2,7-fluorenediyl group.

In the above formula (2A), $R^{5A}$ and $R^{5B}$ each independently represent a hydrogen atom, an unsubstituted or substituted alkyl group, an unsubstituted or substituted alkoxy group, an unsubstituted or substituted aryl group, an unsubstituted or substituted aryloxy group, an unsubstituted or substituted monovalent heterocyclic group, an unsubstituted or substituted silyl group, a halogen atom, an alkoxycarbonyl group, a carboxyl group or a cyano group. When there are a plurality of $R^{5A}$ and $R^{5B}$, they may be the same or different and are preferably an unsubstituted or substituted alkyl group, an unsubstituted or substituted alkoxy group, or an unsubstituted or substituted aryl group, and further preferably an unsubstituted or substituted alkyl group, or an unsubstituted or substituted aryl group.

As the unsubstituted or substituted alkyl group, unsubstituted or substituted aryl group, unsubstituted or substituted aryloxy group, unsubstituted or substituted monovalent heterocyclic group, unsubstituted or substituted silyl group, halogen atom, alkoxycarbonyl groups represented by $R^{5A}$ and $R^{5B}$, examples described as the unsubstituted or substituted alkyl group, unsubstituted or substituted aryl group, unsubstituted or substituted aryloxy group, unsubstituted or substituted monovalent heterocyclic group, unsubstituted or substituted silyl group, halogen atom and alkoxycarbonyl groups represented by $R^5$ and $R^6$ can be respectively used.

Examples of the unsubstituted alkoxy groups represented by $R^{5A}$ and $R^{5B}$ include a methoxy group, an ethoxy group, a n-propyloxy group, a isopropyloxy group, a n-butyloxy group, a isobutyloxy group, a tert-butyloxy group, a n-pentyloxy group, a n-hexyloxy group, a cyclohexyloxy group, a n-heptyloxy group, a n-octyloxy group, a 2-ethylhexyloxy group, a n-nonyloxy group, a n-decyloxy group, a 3,7-dimethyloctyloxy group and a lauryloxy group. For the reason that the balance between the solubility to an organic solvent and the heat resistance thereof is satisfactory, a n-butyloxy group, a n-pentyloxy group, a n-hexyloxy group, a n-octyloxy group, a 2-ethylhexyloxy group, a n-decyloxy group, a 3,7-dimethyloctyloxy group and a 2-ethoxyethyloxy group are preferable. As the substituted alkoxy group, the aforementioned groups having a substituent are mentioned.

In the above formula (2A), d is 0 or 1, and preferably 1.

In the above formula (2A), e and f each independently represent an integer of 0 to 5, preferably an integer of 1 to 3, and more preferably 1 or 3.

Examples of the divalent aromatic amine residue represented by the above formula (2A) include the groups represented by the following formulas (2B-1), (2B-2), (2B-3), (2B-4), (2B-5), (2B-6), (2B-7), (2B-8), (2B-9), (2B-10), (2B-11), (2B-12), (2B-13), (2B-14), (2B-15), (2B-16), (2B-17), (2B-18), (2B-19), (2B-20), (2B-21), (2B-22), (2B-23), (2B-24), (2B-25), (2B-26), (2B-27), (2B-28), (2B-29) and (2B-30).

[Chemical Formula 13]

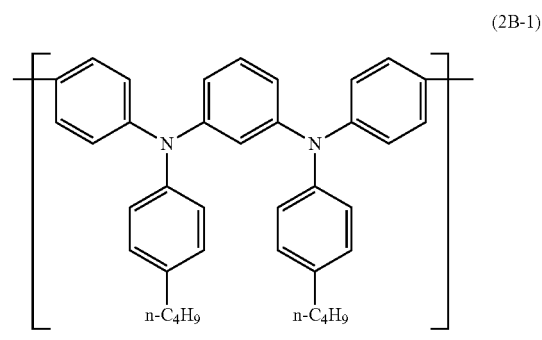

(2B-1)

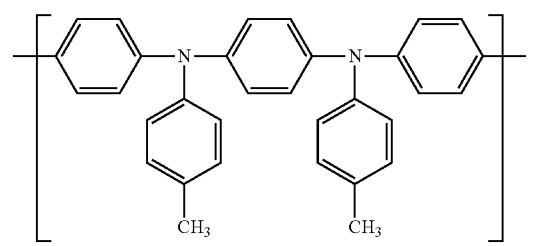

(2B-2)

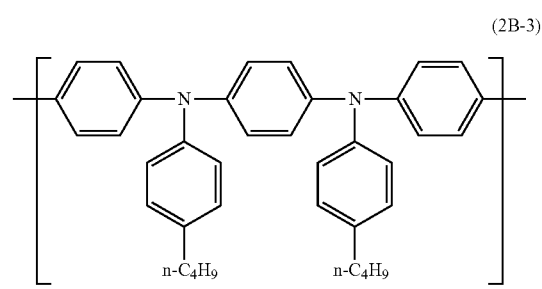

(2B-3)

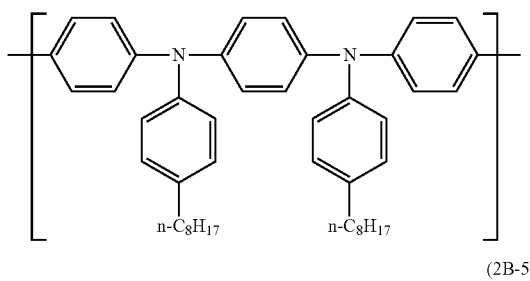
(2B-4)
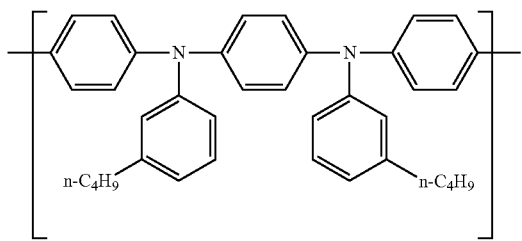
(2B-5)
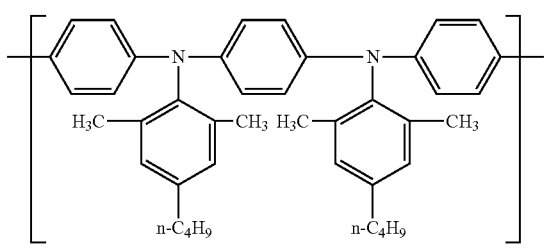
(2B-6)
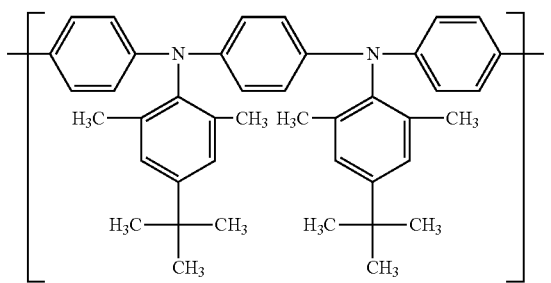
(2B-7)
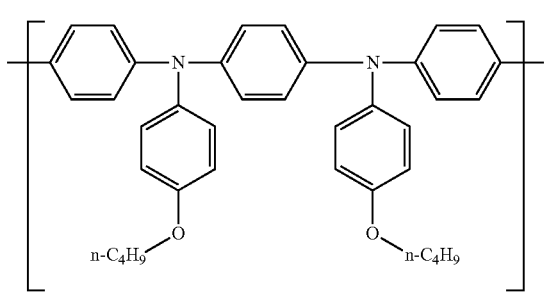
(2B-8)
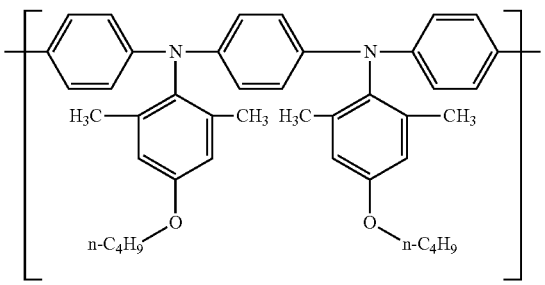
(2B-9)
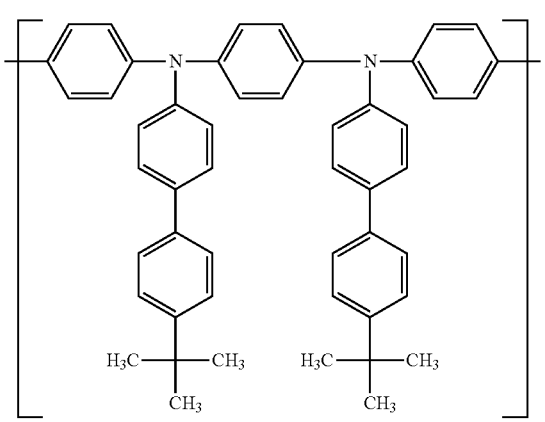
(2B-10)
[Chemical Formula 14]
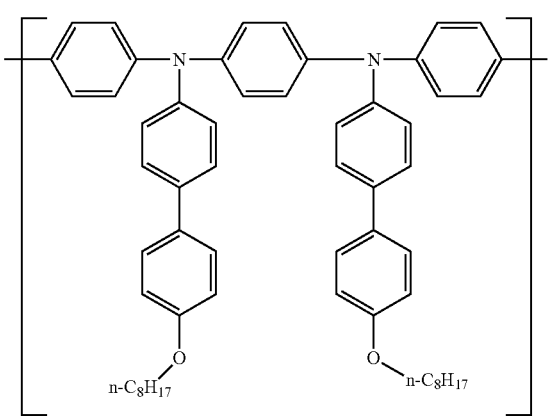
(2B-11)
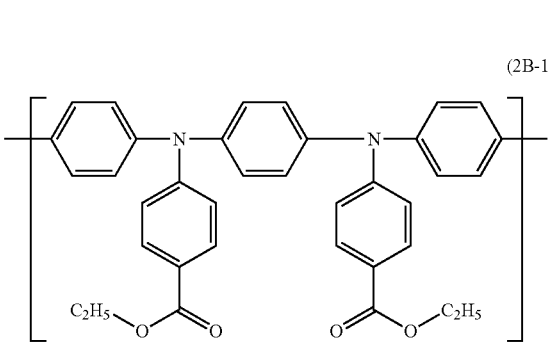
(2B-12)

-continued
(2B-13)
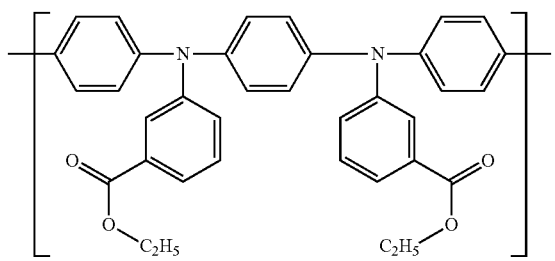
(2B-14)
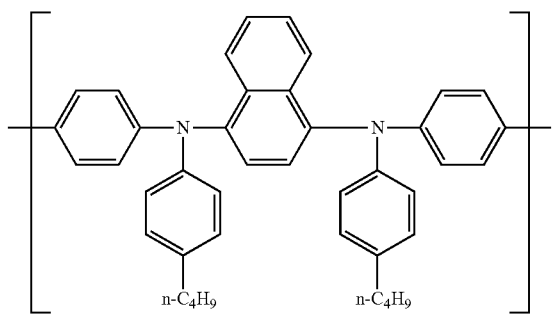
(2B-15)
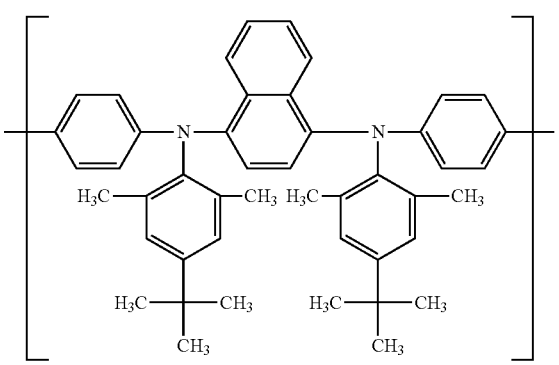
(2B-16)
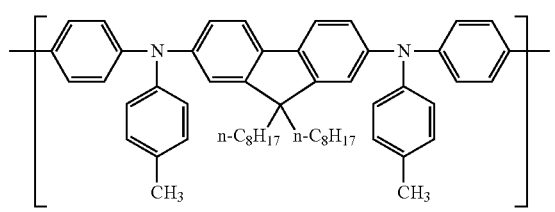
(2B-17)
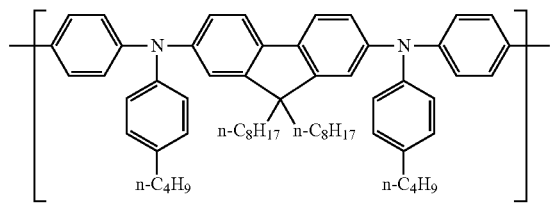
-continued
(2B-18)
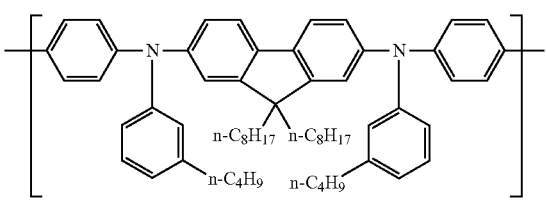
(2B-19)
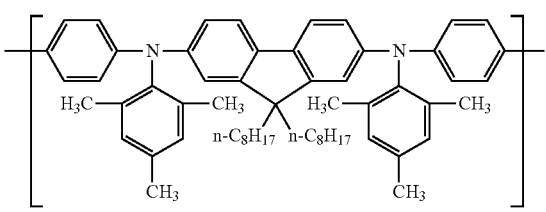
(2B-20)
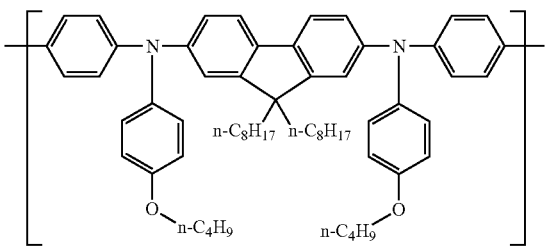
[Chemical Formula 15]
(2B-21)
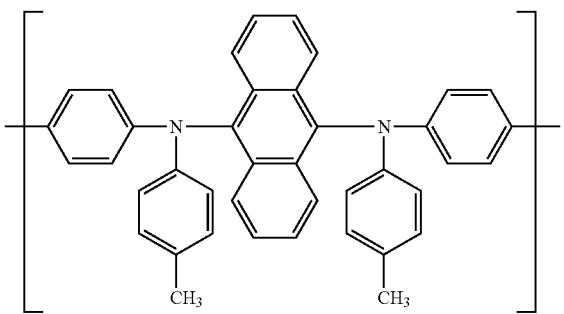
(2B-22)
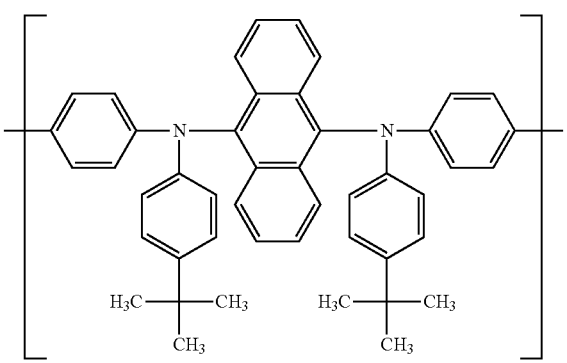

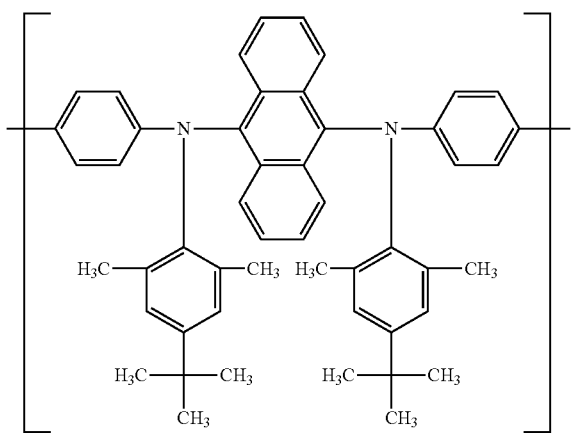

(2B-23)

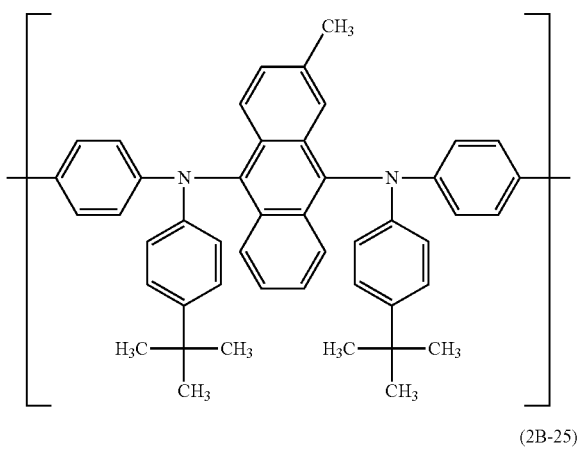

(2B-24)

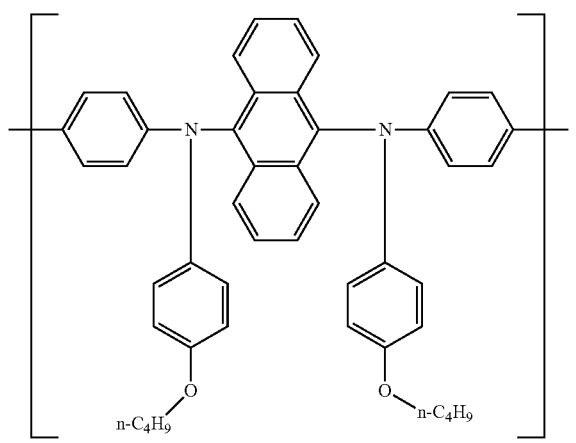

(2B-25)

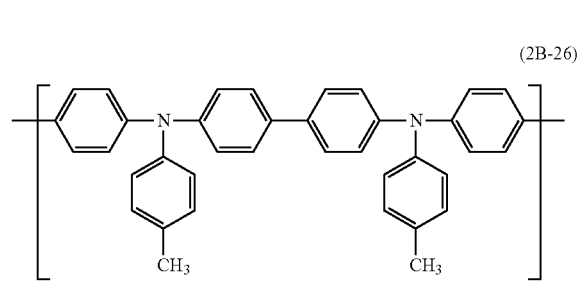

(2B-26)

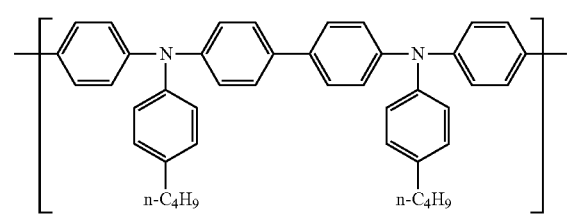

(2B-27)

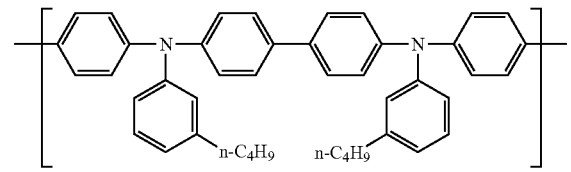

(2B-28)

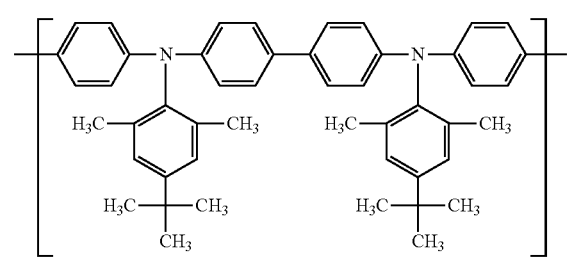

(2B-29)

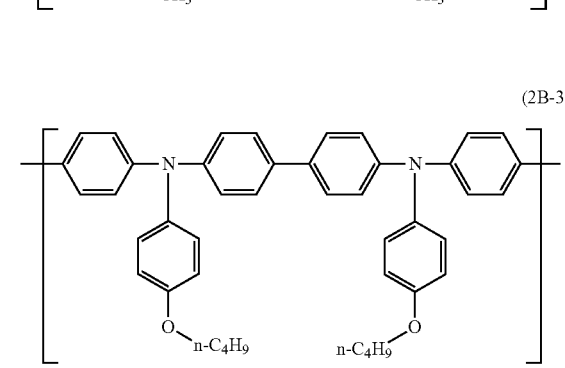

(2B-30)

In the above formula (3), $R^7$ represents a hydrogen atom, an unsubstituted or substituted alkyl group, an unsubstituted or substituted aryl group, or an unsubstituted or substituted monovalent heterocyclic group, and preferably an unsubstituted or substituted aryl group.

Examples of the divalent aromatic amine residue represented by the above formula (3) include groups represented by the following formulas (3A-1), (3A-2), (3A-3), (3A-4), (3A-5), (3A-6), (3A-7), (3A-8) and (3A-9).

[Chemical Formula 16]

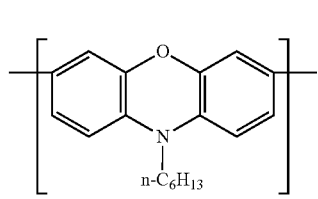

(3A-1)

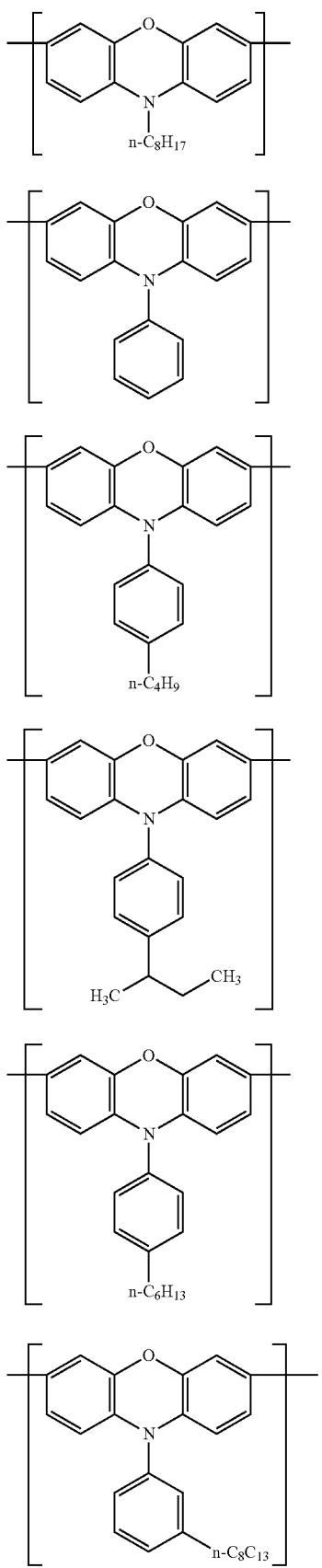
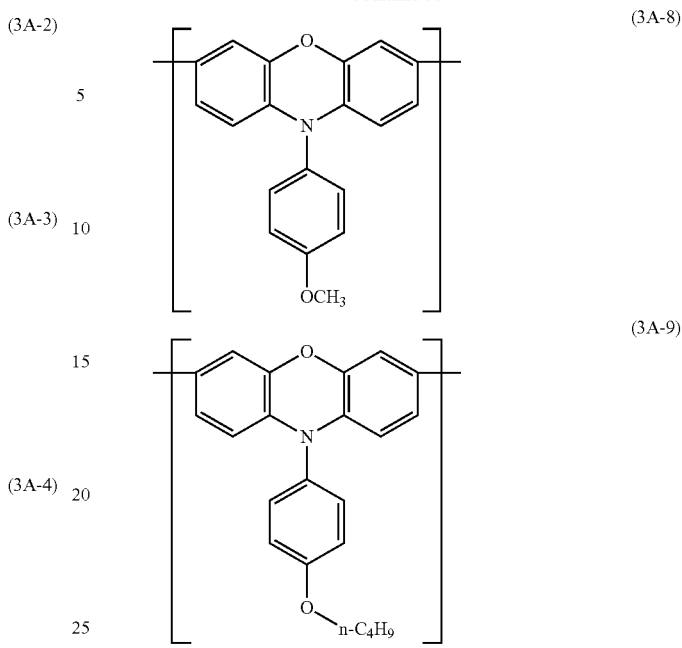

<Arylene Unit>

The arylene group of the arylene unit is the same as defined above.

The number of carbon atoms of the arylene group in an arylene unit with the exclusion of the number of carbon atoms of a substituent is usually 6 to 60, preferably 6 to 30, more preferably 6 to 18 and further preferably 6 to 14.

Examples of the arylene group in the arylene unit include an unsubstituted or substituted phenylene groups such as an unsubstituted or substituted 1,4-phenylene group, an unsubstituted or substituted 1,3-phenylene group and an unsubstituted or substituted 1,2-phenylene group; unsubstituted or substituted naphthalenediyl groups such as an unsubstituted or substituted 1,4-naphthalenediyl group, an unsubstituted or substituted 1,5-naphthalenediyl group and an unsubstituted or substituted 2,6-naphthalenediyl group; unsubstituted or substituted anthracenediyl groups such as an unsubstituted or substituted 1,4-anthracenediyl group, an unsubstituted or substituted 1,5-anthracenediyl group, an unsubstituted or substituted 2,6-anthracenediyl group and an unsubstituted or substituted 9,10-anthracenediyl group; unsubstituted or substituted phenanthrenediyl groups such as an unsubstituted or substituted 2,7-phenanthrenediyl group; unsubstituted or substituted naphthacenediyl groups such as an unsubstituted or substituted 1,7-naphthacenediyl group, an unsubstituted or substituted 2,8-naphthacenediyl group and an unsubstituted or substituted 5,12-naphthacenediyl group; unsubstituted or substituted pyrenediyl groups such as unsubstituted or substituted 1,6-pyrenediyl group, an unsubstituted or substituted 1,8-pyrenediyl group, an unsubstituted or substituted 2,7-pyrenediyl group and an unsubstituted or substituted 4,9-pyrenediyl group; and unsubstituted or substituted perylenediyl groups such as an unsubstituted or substituted 3,9-perylenediyl group and an unsubstituted or substituted 3,10-perylenediyl group, preferably include an unsubstituted or substituted phenylene group, an unsubstituted or substituted naphthalenediyl group, or an unsubstituted or substituted pyrenediyl group, and more preferably include an unsubstituted or substituted phenylene group.

Since a polymer compound according to the electroluminescence device embodiment of the invention has excellent solubility to a solvent, simple film formation and characteristics of the organic EL device to be obtained, it is preferable that the arylene unit is a unit having a fluorene structure, in other words, the arylene group in the arylene unit is a group having a fluorene structure and it is more preferable that the arylene group in the arylene unit is a group having a fluorene structure represented by the following formula (1).

[Chemical Formula 17]

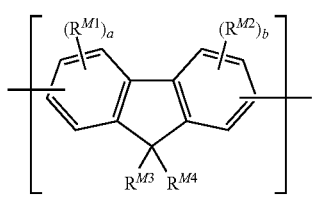

(1)

In formula (1), $R^{M1}$, $R^{M2}$, $R^{M3}$ and $R^{M4}$ each independently represent an unsubstituted or substituted alkyl group, an unsubstituted or substituted alkoxy group, an unsubstituted or substituted aryl group, or an unsubstituted or substituted monovalent heterocyclic group; a and b each independently represent an integer of 0 to 3; and when there are a plurality of $R^{M1}$ and $R^{M2}$, they may be independently the same or different.

In the above formula (1), $R^{M1}$ and $R^{M2}$ each independently represent preferably an unsubstituted or substituted alkyl group, an unsubstituted or substituted alkoxy group, or an unsubstituted or substituted aryl group; more preferably an unsubstituted or substituted alkyl group and an unsubstituted or substituted alkoxy group; further preferably an unsubstituted or substituted alkyl group; and particularly preferably an unsubstituted alkyl group.

As the unsubstituted or substituted alkyl group, unsubstituted or substituted aryl group, unsubstituted or substituted monovalent heterocyclic group or an unsubstituted or substituted alkoxy group represented by each of $R^{M1}$ and $R^{M2}$, examples described as the unsubstituted or substituted alkyl group, unsubstituted or substituted aryl group or unsubstituted or substituted monovalent heterocyclic group represented by each of $R^5$ and $R^6$, or examples described as the unsubstituted or substituted alkoxy groups represented by $R^{5A}$ and $R^{5B}$ can be used.

In the above formula (1), a and b each independently represent an integer of 0 to 3, preferably 0 to 2, more preferably 0 or 1, and particularly preferably 0.

In the above formula (1), $R^{M3}$ and $R^{M4}$ each independently represent preferably an unsubstituted or substituted alkyl group, an unsubstituted or substituted alkoxy group, or an unsubstituted or substituted aryl group; more preferably an unsubstituted or substituted alkyl group, or an unsubstituted or substituted aryl group; further preferably an unsubstituted alkyl group or a substituted aryl group; and particularly preferably a substituted aryl group.

As a combination of $R^{M3}$ and $R^{M4}$, it is preferable that both of $R^{M3}$ and $R^{M4}$ are unsubstituted or substituted alkyl groups, that both of $R^{M3}$ and $R^{M4}$ are unsubstituted or substituted aryl groups, and that $R^{M3}$ is an unsubstituted or substituted alkyl group and $R^{M4}$ is an unsubstituted or substituted aryl group; it is more preferable that both of $R^{M3}$ and $R^{M4}$ are unsubstituted alkyl groups, and that both of $R^{M3}$ and $R^{M4}$ are unsubstituted or substituted aryl groups, and that $R^{M3}$ is an unsubstituted alkyl group and $R^{M4}$ is a substituted aryl group; it is further preferable that both of $R^{M3}$ and $R^{M4}$ are substituted aryl groups and that $R^{M3}$ is an unsubstituted alkyl group and $R^{M4}$ is a substituted aryl group; and it is particularly preferable that both of $R^{M3}$ and $R^{M4}$ are substituted aryl groups.

As the unsubstituted or substituted alkyl group, unsubstituted or substituted alkoxy group, unsubstituted or substituted aryl group or unsubstituted or substituted monovalent heterocyclic group represented by each of $R^{M3}$ and $R^{M4}$, examples described as the unsubstituted or substituted alkyl group, unsubstituted or substituted alkoxy group, unsubstituted or substituted aryl group or unsubstituted or substituted monovalent heterocyclic group represented by each of $R^5$ and $R^6$ can be used.

The groups represented by the above formula (1) are preferably the groups represented by the following formula (1A) and formula (1A'). In formula (1A) and formula (1A'), $R^{1A}$, $R^{1B}$, $R^{2A}$, $R^{2B}$ and $R^C$ each independently represent a hydrogen atom, an unsubstituted or substituted alkyl group, an unsubstituted or substituted alkoxy group, an unsubstituted or substituted aryl group, or an unsubstituted or substituted monovalent heterocyclic group. An unsubstituted or substituted alkyl group, an unsubstituted or substituted alkoxy group and an unsubstituted or substituted aryl group are preferable; an unsubstituted or substituted alkyl group and an unsubstituted or substituted alkoxy group are more preferable; an unsubstituted or substituted alkyl group is further preferable; and an unsubstituted alkyl group is particularly preferable.

[Chemical Formula 18]

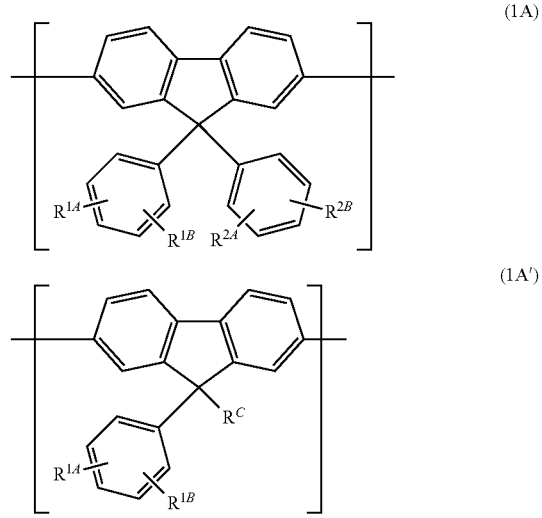

The groups represented by the above formula (1) are more preferably the groups represented by the following formula (1B) and formula (1B'):

[Chemical Formula 19]

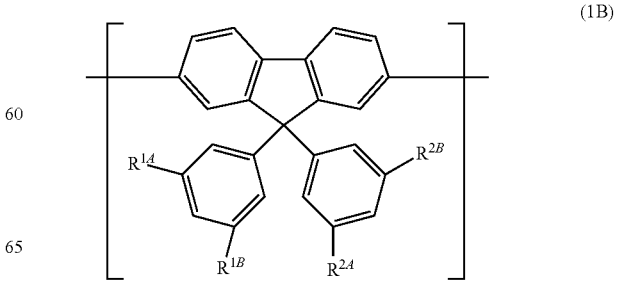

(1B)

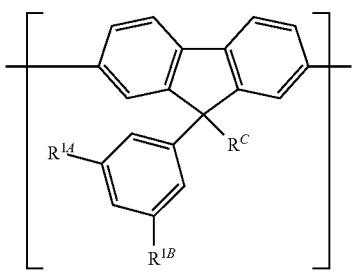
(1B')

[In formula (1B) and formula (1B'), $R^{1A}$, $R^{1B}$, $R^{2A}$, $R^{2B}$ and $R^C$ are the same as defined in formula (1A) and formula (1A').];

the groups represented by the following formula (1C) and formula (1C'):

[Chemical Formula 20]

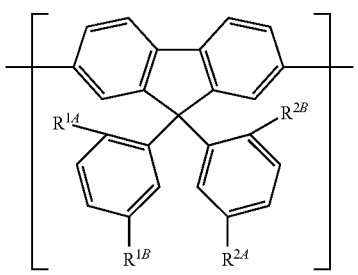
(1C)

(1C')

[In formula (1C) and formula (1C'), $R^{1A}$, $R_{1B}$, $R^{2A}$, $R^{2B}$ and $R^C$ are the same as defined in formula (1A) and formula (1A').]; or the groups represented by the following formula (1D) and formula (1D'):

[Chemical Formula 21]

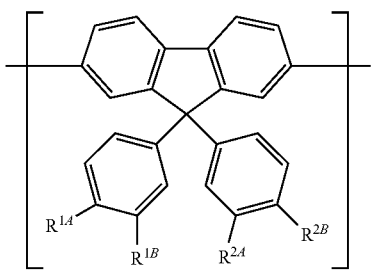
(1D)

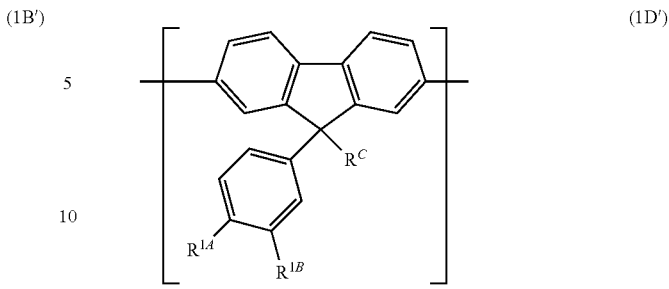
(1D')

[In formula (1D) and formula (1D'), $R^{1A}$, $R^{1B}$, $R^{2A}$, $R^{2B}$ and $R^C$ are the same as defined in formula (1A) and formula (1A').];

further preferably, the groups represented by the above formula (1B) and formula (1B') or the groups represented by the above formula (1D) and formula (1D'); and particularly preferably the groups represented by the above formula (1B) and formula (1B').

As the groups represented by the above formula (1), groups represented by the following formulas (1E-1), (1E-2), (1E-3), (1E-4), (1E-5), (1E-6), (1F-1), (1F-2), (1F-3), (1F-4), (1G-1), (1G-2), (1G-3), (1G-4), (1G-5), (1G-6), (1G-7), (1G-8), (1H-1), (1H-2), (1H-3), (1H-4), (1H-5), (1H-6), (1H-7), (1H-8), (1H-9), (1H-10), (1H-11), (1H-12), (1H-13) and (1H-14) are preferable, and groups represented by the following formulas (1H-1), (1H-2), (1H-3), (1H-4), (1H-5), (1H-6), (1H-7), (1H-8), (1H-9), (1H-10), (1H-11), (1H-12), (1H-13) and (1H-14) are more preferable.

[Chemical Formula 22]

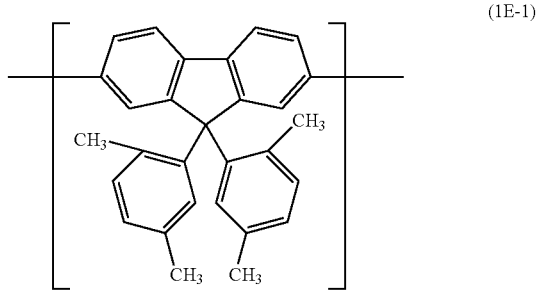
(1E-1)

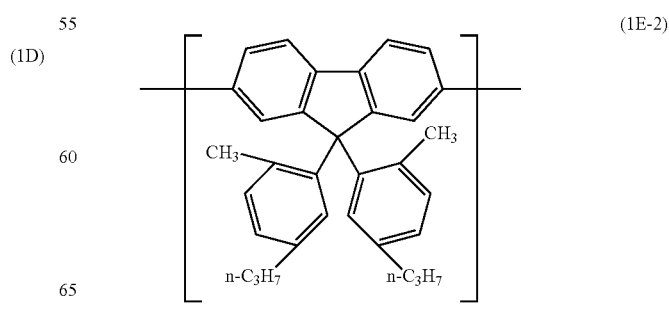
(1E-2)

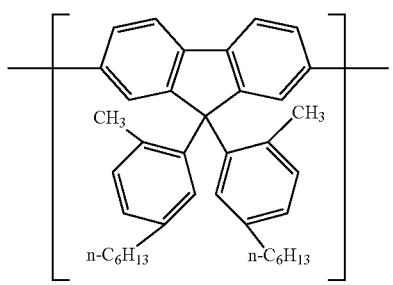 (1E-3)
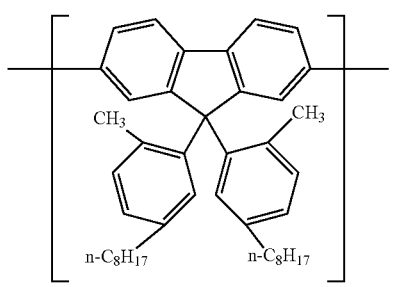 (1E-4)
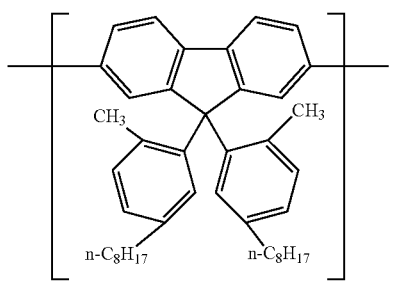 (1E-4)
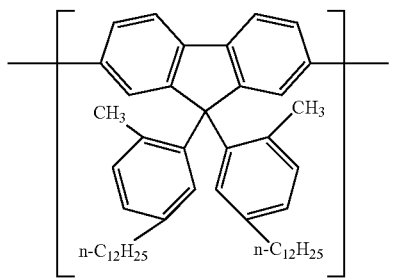 (1E-5)
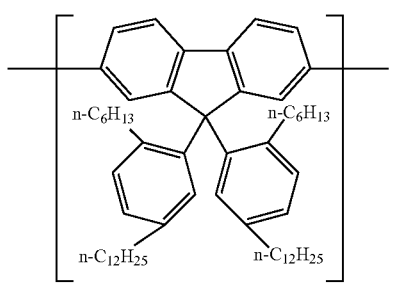 (1E-6)
[Chemical Formula 23]
(1F-1)
(1F-2)
(1F-3)
(1F-4)
[Chemical Formula 24]
(1G-1)

(1G-2)
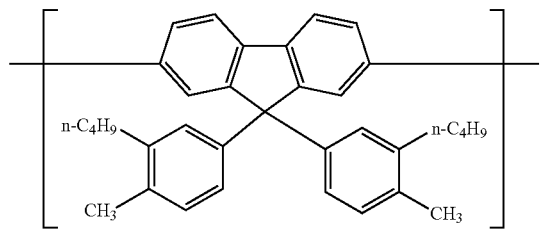
(1G-3)
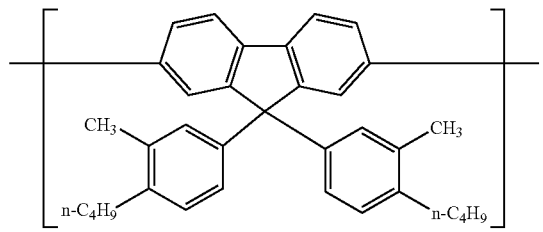
(1G-4)
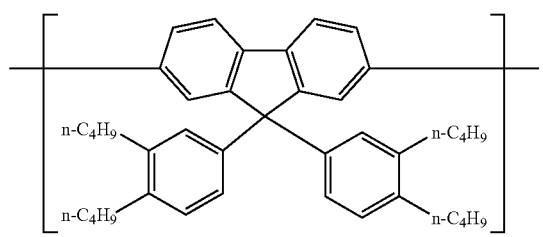
(1G-5)
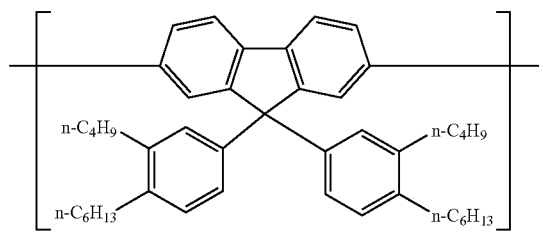
(1G-6)
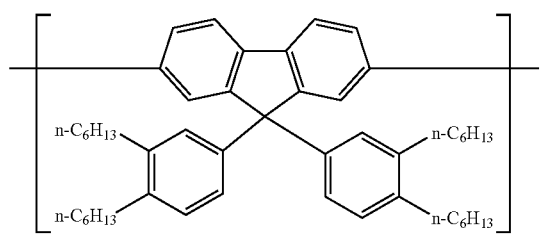
(1G-7)
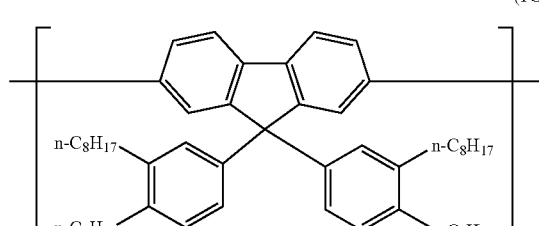
(1G-8)
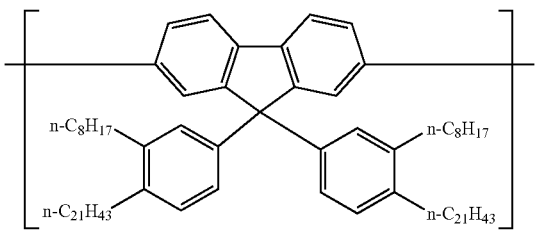
[Chemical Formula 25]
(1H-1)
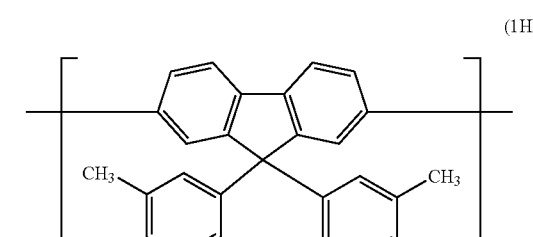
(1H-2)
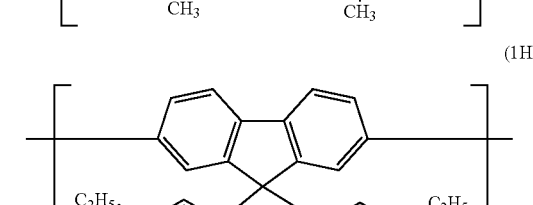
(1H-3)
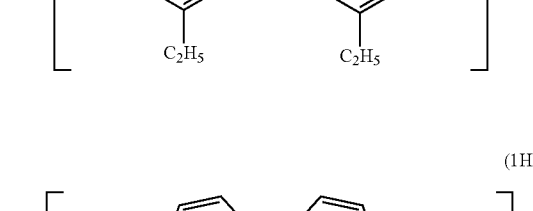
(1H-4)
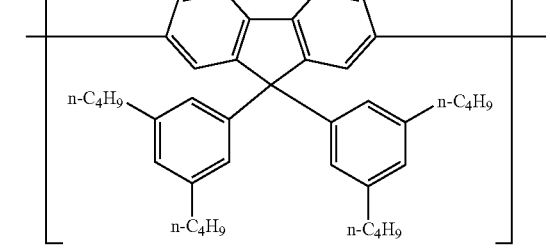

(1H-5)
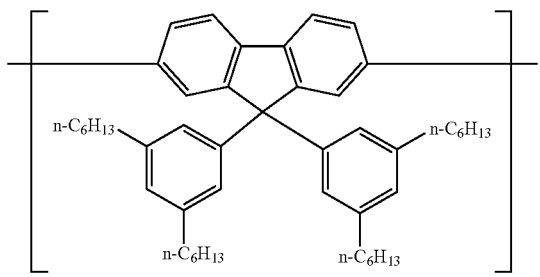
(1H-6)
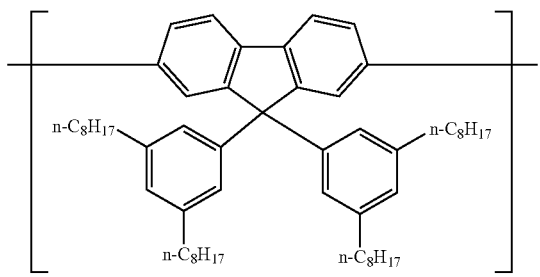
(1H-7)
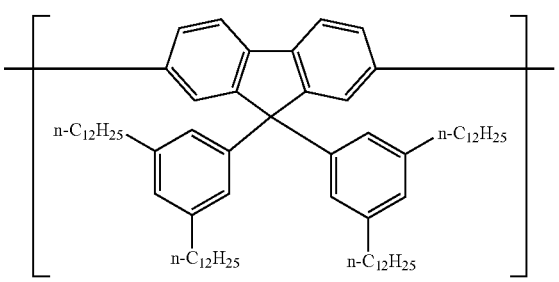
[Chemical Formula 26]
(1H-8)
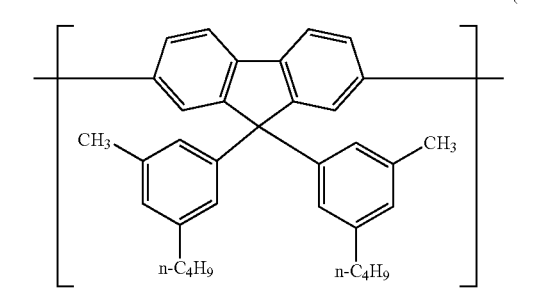
(1H-9)
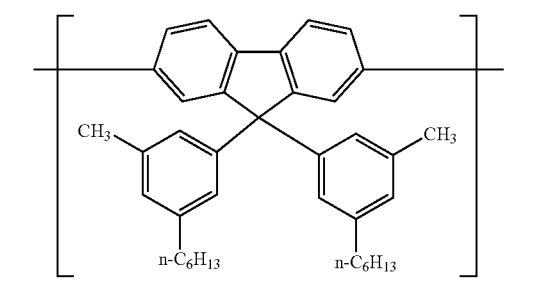
(1H-10)
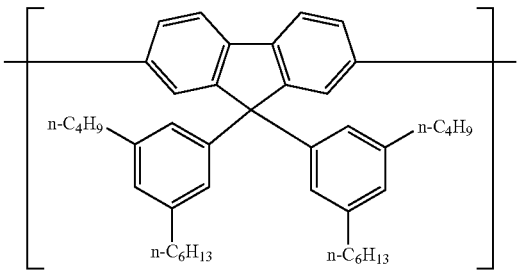
(1H-11)
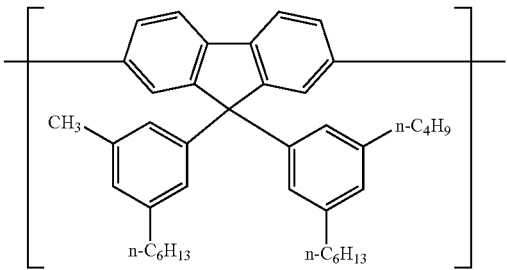
(1H-12)
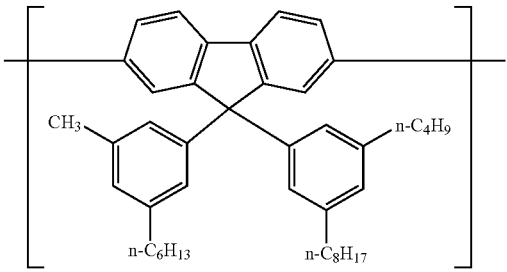
(1H-13)
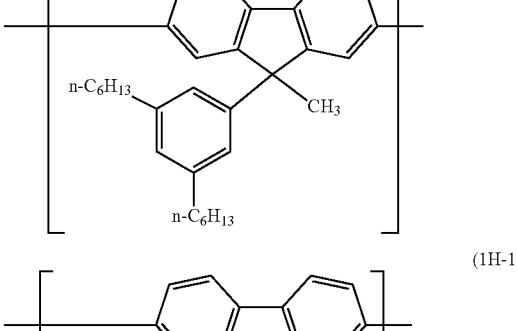
(1H-14)
<Repeating Unit Having a Group Containing a Carbon Cluster Structure>
It is preferable that the repeating unit having a group containing a carbon cluster structure is a repeating unit represented by the following formula (5A).

[Chemical Formula 27]

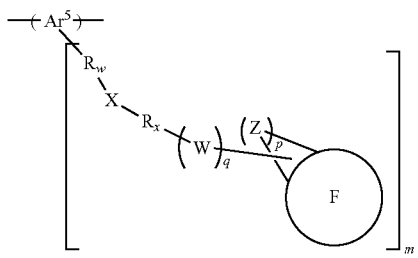

(5A)

In formula (5A), $Ar^5$ represents an unsubstituted or substituted arylene group, an unsubstituted or substituted heteroarylene group, an unsubstituted or substituted divalent heterocyclic group, or an unsubstituted or substituted divalent aromatic amine residue; X represents a single bond, an oxygen atom, a sulfur atom, an unsubstituted or substituted alkylene group, or an unsubstituted or substituted phenylene group; $R_w$ and $R_x$ each independently represent a single bond, an unsubstituted or substituted alkylene group having 1 to 20 carbon atoms, an unsubstituted or substituted arylene group having 6 to 20 carbon atoms, or a divalent group of a combination thereof; ring F represents a carbon cluster structure; m represents an integer of 1 to 4; W represents a divalent group containing a carbon atom or a silicon atom; Z represents a hetero atom selected from a nitrogen atom, an oxygen atom and a sulfur atom, or a carbon atom; p represents an integer of 0 to 12; q represents 0 or 1; when p is 0, q is 1 and W is a silicon atom, when p is 1, Z is a carbon atom, when p is 2 or more, at least one of a plurality of Z may be a hetero atom, the bond between adjacent carbon atoms is a single bond or an unsaturated bond, and the divalent group containing a carbon atom and represented by W may form a ring together with a ring containing Z; and note that when there are a plurality of $R_w$, $R_x$, X, W, Z, p, q and ring F, they may be independently the same or different.

$Ar^5$ is preferably an unsubstituted or substituted arylene group, or an unsubstituted or substituted divalent aromatic amine residue; more preferably an unsubstituted or substituted arylene group; and particularly preferably an unsubstituted or substituted fluorenediyl group. The unsubstituted or substituted arylene group, unsubstituted or substituted heteroarylene group, unsubstituted or substituted heterocyclic group and unsubstituted or substituted divalent aromatic amine residue herein are the same as defined in the explanation of an arylene unit, a heteroarylene unit, a heterocyclic unit and an aromatic amine unit.

The number of carbon atoms of the unsubstituted or substituted fluorenediyl group represented by $Ar^5$ with the exclusion of the number of carbon atoms of a substituent is usually 13 to 60, preferably 13 to 30, more preferably 13 to 18, and particularly preferably 13.

In the above formula (5A), X represents a single bond, an oxygen atom, a sulfur atom or an unsubstituted or substituted phenylene group; and preferably a single bond or an oxygen atom, and more preferably a single bond.

In the above formula (5A), W represents a divalent group containing a carbon atom or a silicon atom. As the divalent group containing a carbon atom, for example, an unsubstituted or substituted alkylene group having 1 to 20 carbon atoms, an arylene group having 6 to 20 carbon atoms, or a divalent group of a combination thereof is mentioned.

In the above formula (5A), $R_w$ and $R_x$ each independently represent a single bond, an unsubstituted or substituted alkylene group having 1 to 20 carbon atoms, an unsubstituted or substituted arylene group having 6 to 20 carbon atoms, or a divalent group of a combination thereof; preferably a single bond or unsubstituted alkylene group; and more preferably a single bond or unsubstituted alkylene group having carbon atoms 1 to 20.

In the above formula (5A), ring F represents a carbon cluster structure such as carbon nanotube, carbon nano-horn and a fullerene; preferably fullerene C60, fullerene C70 or fullerene C84; and more preferably fullerene C60. Herein, a fullerene may have an alkyl group or a cyano group on the surface.

In the above formula (5A), m represents an integer of 1 to 4, preferably an integer of 1 to 3, and more preferably 1 or 2.

In the above formula (5A), p represents an integer of 0 to 12, preferably an integer of 1 to 8, more preferably an integer of 1 to 4, and further preferably 1 or 4. When p is 2 or more, the bond of the adjacent two Z may be a single bond or a double bond.

The repeating unit having a group containing a carbon cluster structure is preferably at least one unit selected from the group consisting of a repeating unit represented by the following formula (5'), a repeating unit represented by the following formula (5B), a repeating unit represented by the following formula (5C) and a repeating unit represented by the following formula (5D).

[Chemical Formula 28]

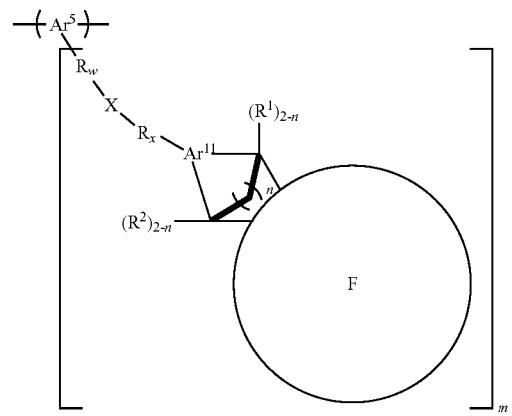

(5')

In formula (5'), $Ar^5$ represents an unsubstituted or substituted arylene group, an unsubstituted or substituted heteroarylene group, an unsubstituted or substituted divalent heterocyclic group, or an unsubstituted or substituted divalent aromatic amine residue; $Ar^{11}$ represents an unsubstituted or substituted arylidine group, or an unsubstituted or substituted heteroarylidine group; X represents a single bond, an oxygen atom, a sulfur atom, an unsubstituted or substituted alkylene group, or an unsubstituted or substituted phenylene group; $R_w$ and $R_x$ each independently represent a single bond, an unsubstituted or substituted alkylene group having 1 to 20 carbon atoms, an unsubstituted or substituted arylene group having 6 to 20 carbon atoms, or a divalent group of a combination thereof; $R^1$ and $R^2$ each independently represent a hydrogen atom, an unsubstituted or substituted alkyl group having 1 to 20 carbon atoms, or an unsubstituted or substituted alkoxy group having 1 to 20 carbon atoms; when there are a plurality of $R^1$ and $R^2$, they may be independently the same or different; Ring F represents a carbon cluster structure; m represents an integer of 1 to 4; n represents 0 or 1; and when there are a plurality of $R_w$, $R_x$, X, $Ar^{11}$, $R^1$, $R^2$, n and ring F, they may be independently the same or different. Note that, when n is 0, the carbon atom to which $R^1$ is bound and the carbon atom to which $R^2$ is bound are not directly bonded.

In the above formula (5'), $Ar^5$, X, $R_w$, $R_x$, ring F and m are the same as defined as those in formula (5A).

The number of carbon atoms of the unsubstituted or substituted arylidine group represented by $Ar^{11}$ with the exclusion of the number of carbon atoms of a substituent is usually 6 to 30 and preferably 6 to 16. The number of carbon atoms of the unsubstituted or substituted heteroarylidine group represented by $Ar^{11}$ with the exclusion of the number of carbon atoms of a substituent is usually 6 to 30 and preferably 6 to 16. The heteroarylidine group may contain a nitrogen atom, an oxygen atom and a sulfur atom in addition to a carbon atom as atoms forming an aromatic ring.

Examples of the unsubstituted arylidine group include a phenylidine group, a naphthalenetriyl group, an anthracenetriyl group, a phenanthrenetriyl group, a naphthacenetriyl group, a fluorenetriyl group, a perylenetriyl group and a chrysenetriyl group. Examples of the substituted arylidine group include the aforementioned groups having a substituent.

Examples of the unsubstituted heteroarylidine group include a pyrroletriyl group, a furantriyl group, a pyridinetriyl group, a quinolinetriyl group, and an isoquinolinetriyl group. Examples of the substituted heteroarylidine group include the aforementioned groups having a substituent.

In the above formula (5'), $R^1$ and $R^2$ each independently represent a hydrogen atom, an unsubstituted or substituted alkyl group having 1 to 20 carbon atoms, or an unsubstituted or substituted alkoxy group having 1 to 20 carbon atoms, and preferably a hydrogen atom.

[Chemical Formula 29]

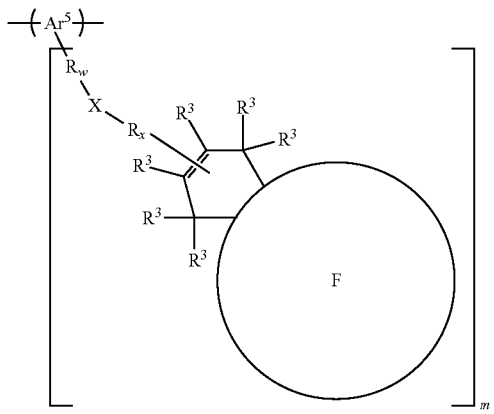

(5B)

In formula (5B), $Ar^5$ represents an unsubstituted or substituted arylene group, an unsubstituted or substituted heteroarylene group, an unsubstituted or substituted divalent heterocyclic group, or an unsubstituted or substituted divalent aromatic amine residue; X represents a single bond, an oxygen atom, a sulfur atom, an unsubstituted or substituted alkylene group, or an unsubstituted or substituted phenylene group; $R_w$ and $R_x$ each independently represent a single bond, an unsubstituted or substituted alkylene group having 1 to 20 carbon atoms, an unsubstituted or substituted arylene group having 6 to 20 carbon atoms, or a divalent group of a combination thereof; $R^3$ represents a hydrogen atom, an unsubstituted or substituted alkyl group having 1 to 20 carbon atoms, an unsubstituted or substituted alkoxy group having 1 to 20 carbon atoms or a direct bond to $R_x$; a plurality of $R^3$ may be mutually the same or different; Ring F represents a carbon cluster structure; m represents an integer of 1 to 4; and when there are a plurality of $R_w$, $R_x$, X and ring F, they may be independently the same or different.

In the above formula (5B), $Ar^5$, X, $R_w$, $R_x$, ring F and m are the same as defined in formula (5A).

In the above formula (5B), $R^3$ represents a hydrogen atom, an unsubstituted or substituted alkyl group having 1 to 20 carbon atoms, an unsubstituted or substituted alkoxy group having 1 to 20 carbon atoms group or a direct bond to $R_x$, and preferably a hydrogen atom. A plurality of $R^3$ are mutually the same or different.

[Chemical Formula 30]

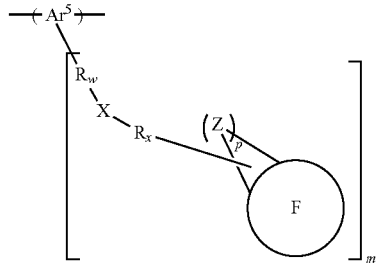

(5C)

In the above formula (5C), $Ar^5$ represents an unsubstituted or substituted arylene group, an unsubstituted or substituted heteroarylene group, an unsubstituted or substituted divalent heterocyclic group, or an unsubstituted or substituted divalent aromatic amine residue; X represents a single bond, an oxygen atom, a sulfur atom, an unsubstituted or substituted alkylene group, or an unsubstituted or substituted phenylene group; $R_w$ and $R_x$ each independently represent a single bond, an unsubstituted or substituted alkylene group having 1 to 20 carbon atoms, an unsubstituted or substituted arylene group having 6 to 20 carbon atoms, or a divalent group of a combination thereof; ring F represents a carbon cluster structure; m represents an integer of 1 to 4; Z represents a hetero atom selected from a nitrogen atom, an oxygen atom, a sulfur atom or a carbon atom; the nitrogen atom and carbon atom represented by Z may have a substituent; p represents an integer of 1 to 12; when p is 1, Z is a carbon atom, when p is 2 or more, at least one of a plurality of Z may be a hetero atom and the bond between adjacent carbon atoms may be a single bond or an unsaturated bond. Note that, when there are a plurality of $R_w$, $R_x$, X, Z, p and ring F, they may be independently the same or different.

In the above formula (5C), $Ar^5$, X, Z, $R_w$, $R_x$, ring F, p and m are the same as defined in formula (5A).

[Chemical Formula 31]

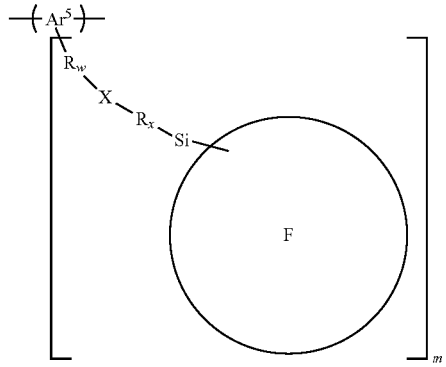

(5D)

In the above formula (5D), $Ar^5$ represents an unsubstituted or substituted arylene group, an unsubstituted or substituted heteroarylene group, an unsubstituted or substituted divalent heterocyclic group, or an unsubstituted or substituted divalent aromatic amine residue; X represents a single bond, an oxygen atom, a sulfur atom, an unsubstituted or substituted alkylene group, or an unsubstituted or substituted phenylene independently the same or different. Note that, when n is 0, the carbon atom to which $R^1$ is bound and the carbon atom to which $R^2$ is bound are not directly bonded.

Furthermore, it is preferable that a repeating unit represented by the above formula (5) is represented by the following formula (6).

[Chemical Formula 33]

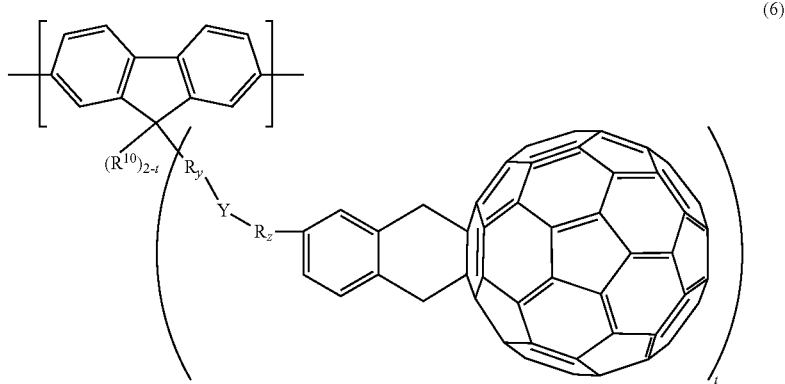

(6)

group; $R_w$ and $R_x$ each independently represent a single bond, an unsubstituted or substituted alkylene group having 1 to 20 carbon atoms, an unsubstituted or substituted arylene group having 6 to 20 carbon atoms, or a divalent group of a combination thereof; ring F represents a carbon cluster structure; and m represents an integer of 1 to 4. Note that, when there are a plurality of $R_w$, $R_x$, X and ring F, they may be independently the same or different.

In the above formula (5D), $Ar^5$, X, $R_w$, $R_x$, ring F and m are the same as defined in formula (5A).

It is more preferable that the repeating unit having a group containing a carbon cluster structure is a repeating unit represented by the following formula (5).

[Chemical Formula 32]

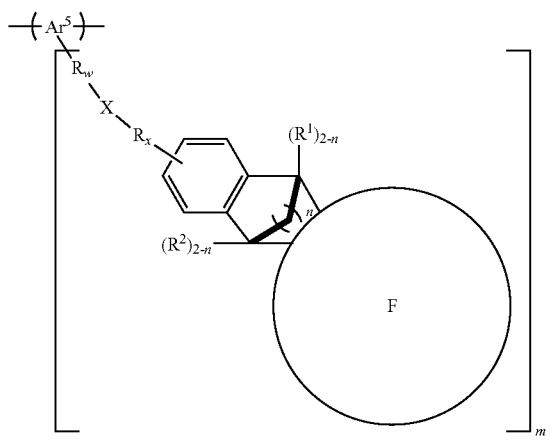

(5)

In the above formula (5), $Ar^5$, X, $R_w$, $R_x$, $R^1$, $R^2$, ring F, m and n are the same as defined in formula (5'); and when there are a plurality of $R_w$, $R_x$, X, $R^1$, $R^2$, n and ring F, they may be independently the same or different.

In formula (6), Y represents a single bond, an oxygen atom, a sulfur atom, an unsubstituted or substituted alkylene group, or an unsubstituted or substituted phenylene group; $R_y$ and $R_z$, each independently represent a single bond, an unsubstituted or substituted alkylene group having 1 to 20 carbon atoms, an unsubstituted or substituted arylene group having 6 to 20 carbon atoms, or a divalent group of a combination thereof; $R^{10}$ represents a hydrogen atom, an unsubstituted or substituted alkyl group, an unsubstituted or substituted alkoxy group, an unsubstituted or substituted aryl group, or an unsubstituted or substituted monovalent heterocyclic group; t is 1 or 2; and when there are a plurality of $R_y$, $R_z$ and Y, they may be independently the same or different.

In formula (6), Y is preferably a single bond, an oxygen atom or a sulfur atom, and more preferably a single bond.

In formula (6), $R_y$ and $R_z$ each independently represent preferably a single bond, or an unsubstituted alkylene group, more preferably a single bond, or an unsubstituted alkylene group having 1 to 6 carbon atoms.

$R^{10}$ is preferably an unsubstituted or substituted alkyl group, or an unsubstituted or substituted aryl group, and more preferably an unsubstituted alkyl group or substituted aryl group.

As the unsubstituted or substituted alkyl group, unsubstituted or substituted aryl group, an unsubstituted or substituted monovalent heterocyclic group or unsubstituted or substituted alkoxy group represented by $R^{10}$, examples described as the unsubstituted or substituted alkyl group, unsubstituted or substituted aryl group, or unsubstituted or substituted monovalent heterocyclic group represented by each of $R^5$ and $R^6$, or the unsubstituted or substituted alkoxy group represented by each of $R^{5A}$ and $R^{5B}$ can be used.

Examples of a repeating unit represented by formula (6) include repeating units represented by the following formulas (6A-1), (6A-2), (6A-3), (6A-4), (6A-5), (6A-6), (6A-7), (6A-8), (6A-9), (6A-10) and (6A-11).

[Chemical Formula 34]
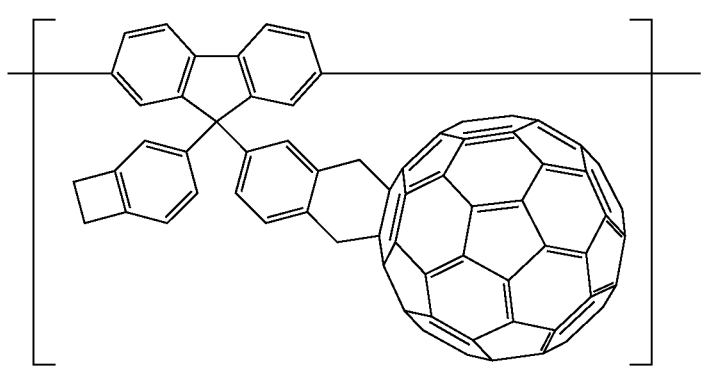
(6A-1)
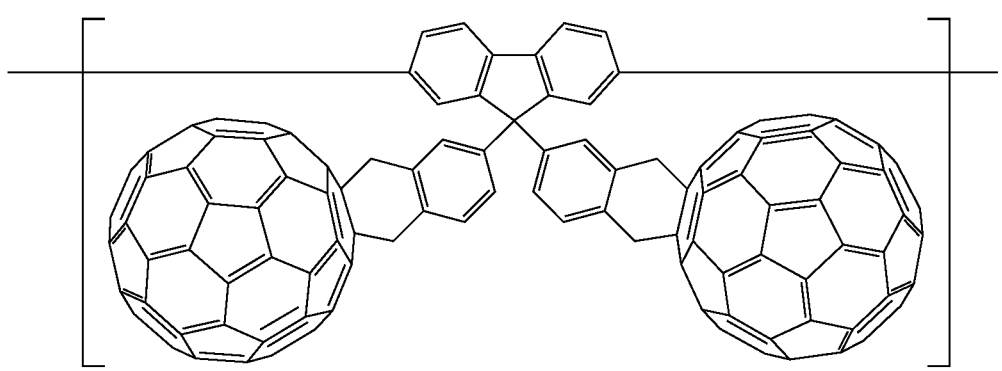
(6A-2)
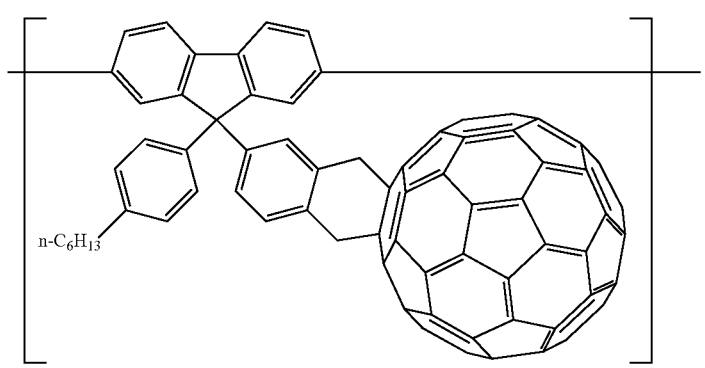
(6A-3)
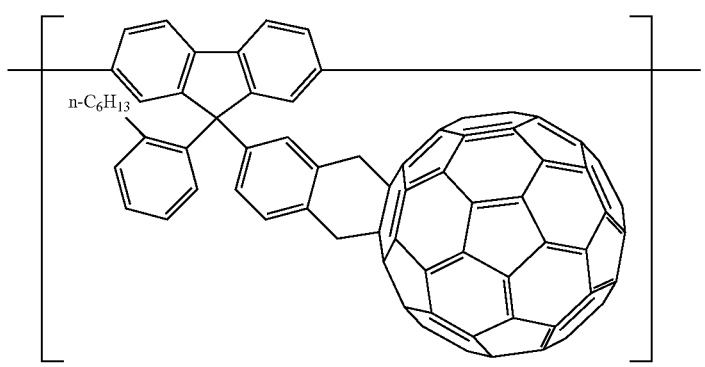
(6A-4)

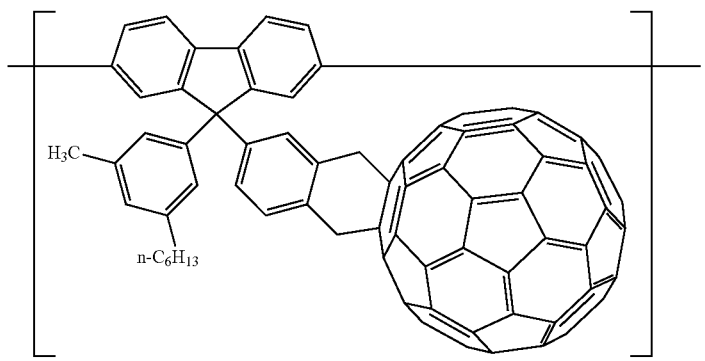
(6A-5)
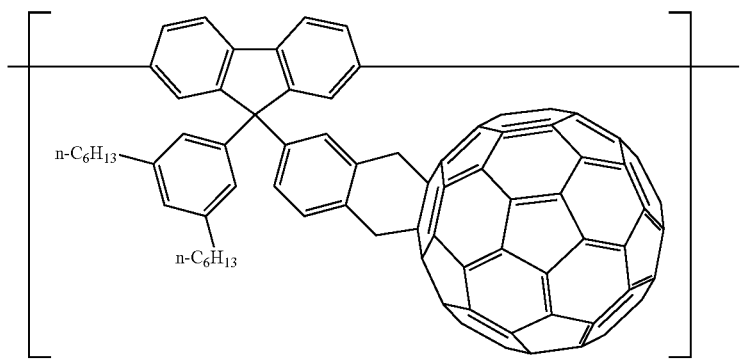
(6A-6)
[Chemical Formula 35]
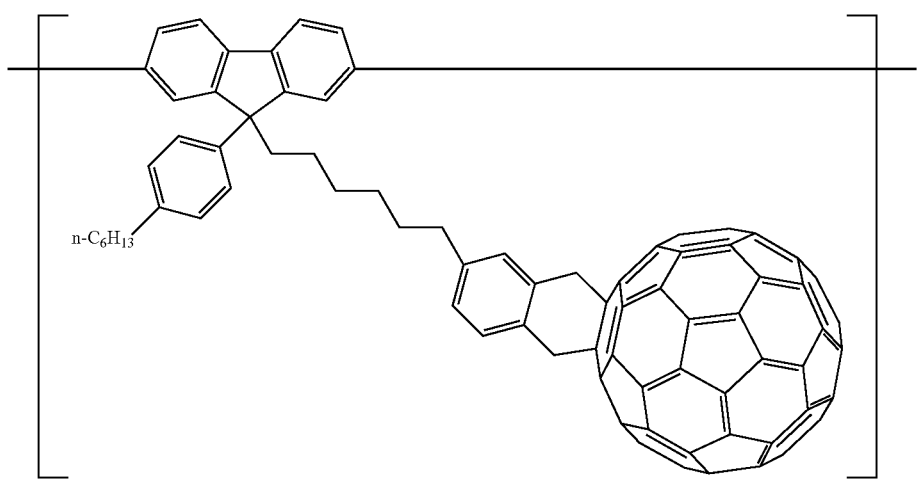
(6A-7)

-continued
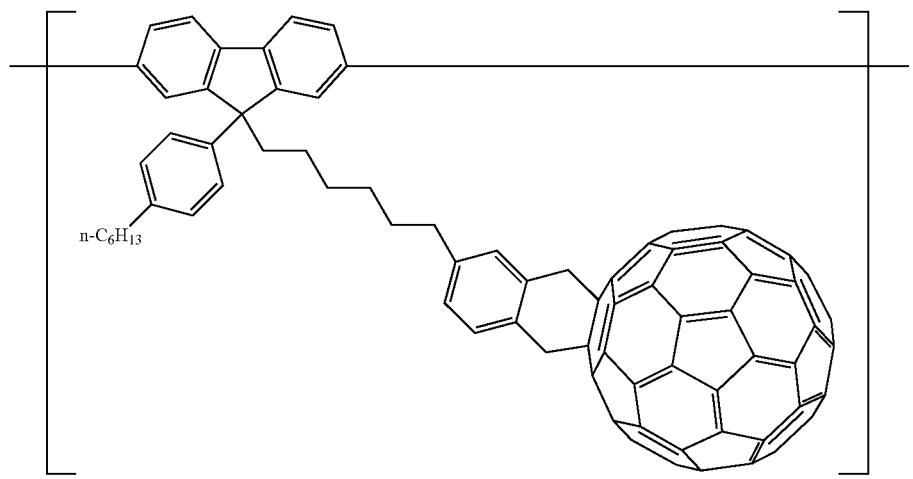
(6A-7)
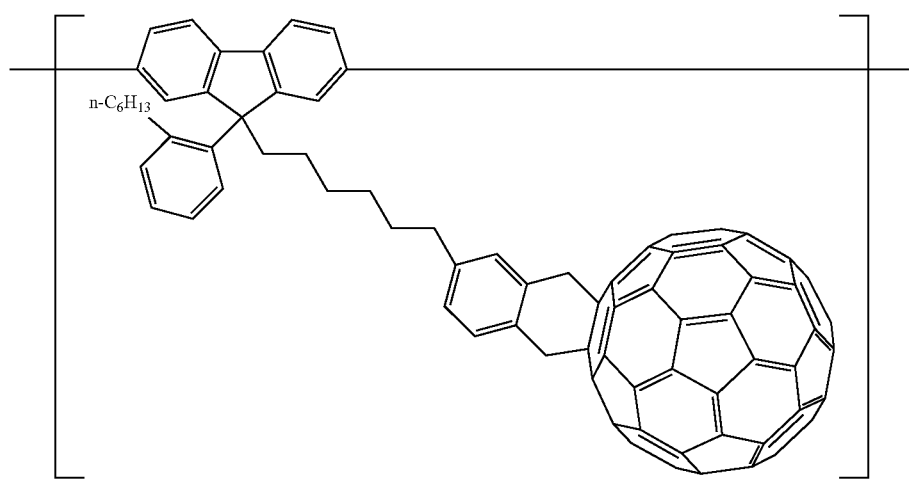
(6A-8)
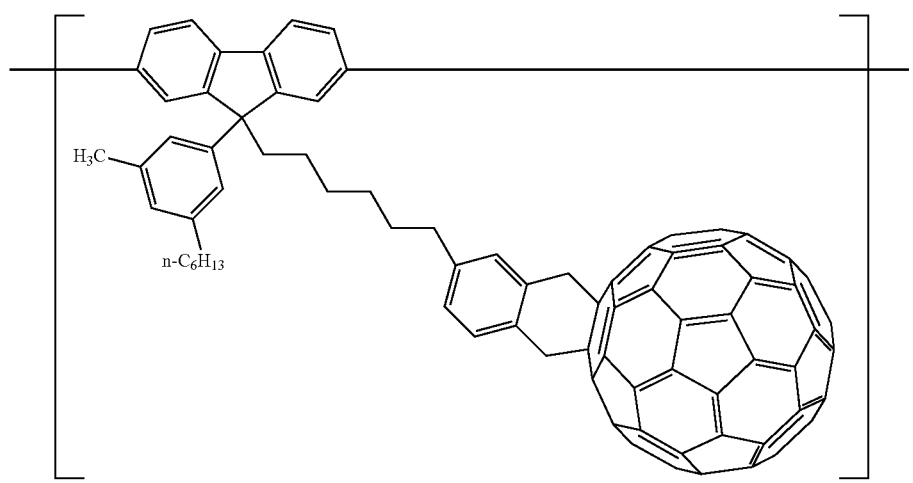
(6A-9)

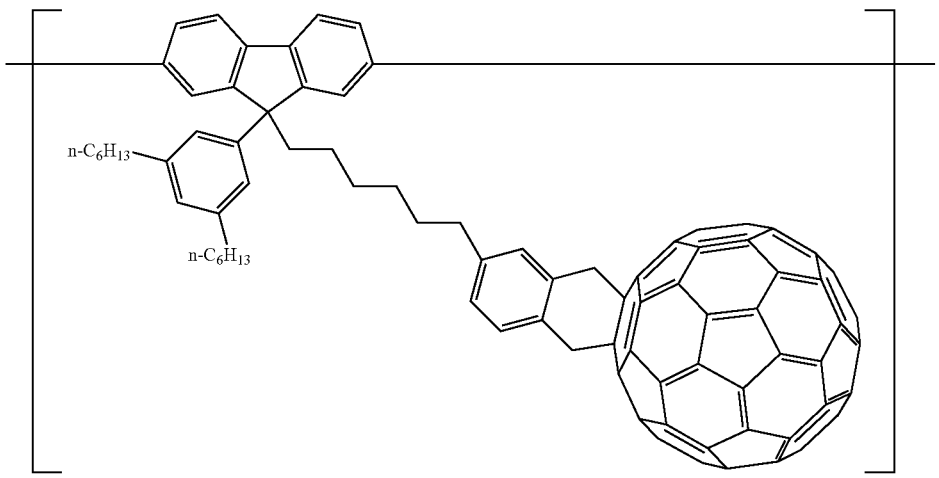
(6A-10)

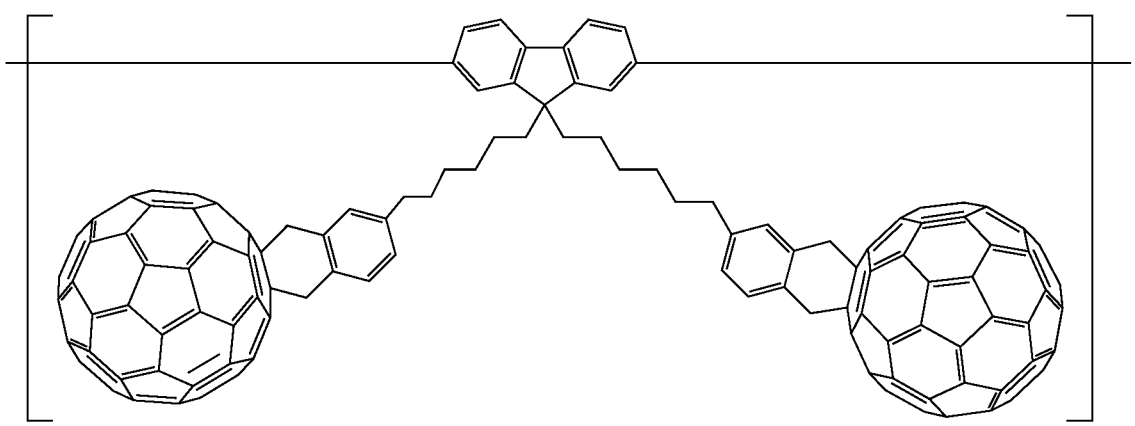
(6A-11)

It is preferable that a polymer compound according to the electroluminescence device embodiment of the invention is a conjugated polymer having a conjugated-system main chain, since the device to be obtained has excellent luminescence property. The main chain refers to a chain along the bond between polymer compound units. Note that, the conjugated system of the main chain may be partially discontinued.

In a polymer compound according to the electroluminescence device embodiment of the invention, provided that, of two or more repeating units selected from the group consisting of an arylene unit, a heteroarylene unit, a heterocyclic unit and an aromatic amine unit, the number of repeating units having a group containing a carbon cluster structure and the number of the other repeating units of the polymer compound are represented by $N_C$ and $N_{NC}$, respectively, it is preferable that $N_C$ and $N_{NC}$ satisfy the following expression (0).

$$5 \leq N_C \times 100/(N_C+N_{NC}) \leq 100 \quad (0)$$

Furthermore, $N_C$ and $N_{NC}$ more preferably satisfy the following expression (I), further preferably satisfy the following expression (II), and particularly preferably the following expression (III).

$$0.001 \leq N_C \times 100/(N_C+N_{NC}) \leq 90 \quad (I)$$

$$0.001 \leq N_C \times 100/(N_C+N_{NC}) \leq 50 \quad (II)$$

$$0.001 \leq N_C \times 100/(N_C+N_{NC}) \leq 10 \quad (III)$$

A polystyrene-equivalent number-average molecular weight (Mn) of a polymer compound according to the electroluminescence device embodiment of the invention by gel permeation chromatography (hereinafter, referred to as "GPC") is usually $5 \times 10^3$ to $1 \times 10^8$, and preferably $1 \times 10^4$ to $1 \times 10^6$. Furthermore, a polystyrene-equivalent weight-average molecular weight (Mw) of a polymer compound according to the electroluminescence device embodiment of the invention is usually $5 \times 10^3$ to $1 \times 10^8$. For the reason that the film formation property is excellent, Mw is preferably $1 \times 10^4$ to $5 \times 10^6$, more preferably $3 \times 10^4$ to $1 \times 10^6$ and further preferably $5 \times 10^4$ to $5 \times 10^5$.

A polymer compound according to the electroluminescence device embodiment of the invention, when it is a copolymer, may be any one of a block copolymer, a random copolymer, an alternate copolymer and a graft copolymer, or another type of copolymer. A polymer compound according to the electroluminescence device embodiment of the invention is preferably a block copolymer, a random copolymer, an alternate copolymer or a graft copolymer, more preferably a block copolymer or a random copolymer, and further preferably a random copolymer.

[Method for Producing a Polymer Compound According to the Electroluminescence Device Embodiment of the Invention]

A polymer compound according to the electroluminescence device embodiment of the invention can be obtained by condensation polymerization of a compound (monomer), which corresponds to a unit contained in the polymer compound. As the monomer, a monomer, which is synthesized and isolated in advance, may be used, or a monomer, which is synthesized in a reaction system, may be directly used. In the case where the resultant polymer compound is used for an organic EL device, the purity of the monomer may influence the performance of the organic EL device. Therefore, it is preferable that these monomers are purified by a method such as distillation, sublimation and recrystallization.

<Production Method 1>

A polymer compound according to the electroluminescence device embodiment of the invention, which is a compound having a group containing a carbon cluster structure, can be produced by condensation polymerization of a compound which is to be synthesized into an arylene unit, a heteroarylene unit, a heterocyclic unit or an aromatic amine unit by condensation polymerization. As the other compounds to be used in condensation polymerization can be selected such that two or more units selected from the group consisting of an arylene unit, a heteroarylene unit, a heterocyclic unit and an aromatic amine unit serve as repeating units.

A polymer compound having a repeating unit represented by the above formula (5A) can be produced by condensation polymerization of, for example, a compound represented by the following formula (5A-a).

[Chemical Formula 36]

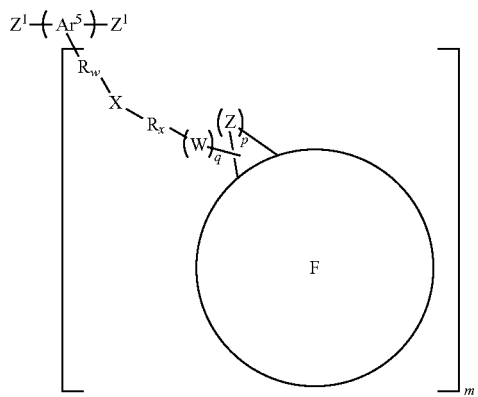

(5A-a)

In formula (5A-a), $Ar^5$, $R_w$, X, W, Z, $R_x$, ring F, p, q and m are the same as defined in formula (5A); $Z^1$ represents a halogen atom, a methoxy group, a boric acid ester residue, a boric acid residue (—B(OH)$_2$), a group represented by the following formula (a-1), a group represented by the following formula (a-2), a group represented by the following formula (a-3) or a group represented by the following formula (a-4); two $Z^1$ may be the same or different; and when there are a plurality of $R_w$, $R_x$, X, W, Z, p, q and ring F, they may be independently the same or different. The boric acid ester residue is the same as defined in $Z^1$ of formula (a-0) later described.

[Chemical Formula 37]

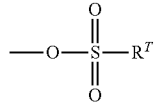

(a-1)

In formula (a-1), $R^T$ represents an unsubstituted or substituted alkyl group, or an unsubstituted or substituted aryl group.

[Chemical Formula 38]

$$—MgX_a \quad \text{(a-2)}$$

In formula (a-2), $X_A$ represents a halogen atom.

[Chemical Formula 39]

$$—ZnX_A \quad \text{(a-3)}$$

In formula (a-3), $X_A$ is the same as defined above.

[Chemical Formula 40]

$$—Sn(R^T)_3 \quad \text{(a-4)}$$

In formula (a-4), $R^T$ is the same as defined above.

It is preferable that a compound represented by the above formula (5A-a) is at least one compound selected from the group consisting of a compound represented by the following formula (5'-a), a compound represented by the following formula (5B-a), a compound represented by the following formula (5C-a) and a compound represented by the following formula (5D-a).

[Chemical Formula 41]

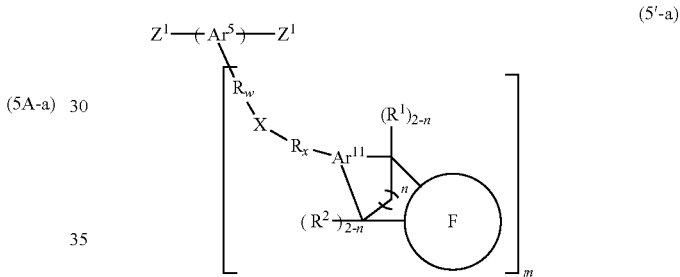

(5'-a)

In formula (5'-a), $Ar^5$, $Ar^{11}$, $R_w$, X, $R_x$, ring F, $R^1$, $R^2$, n and m are the same as defined in formula (5'); $Z^1$ is the same as defined in formula (5A-a); two $Z^1$ may be the same or different; and when there are a plurality of $R_w$, $R_x$, X, $Ar^{11}$, $R^1$, $R^2$, n and ring F, they may be independently the same or different. Note that, when n is 0, the carbon atom to which $R^1$ is bound and the carbon atom to which $R^2$ is bound are not directly bonded.

[Chemical Formula 42]

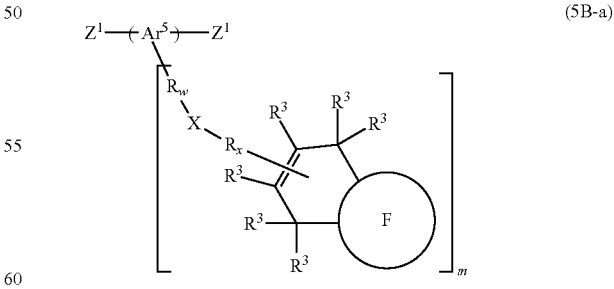

(5B-a)

In formula (5B-a), $Ar^5$, $R_w$, X, $R_x$, ring F, $R^3$ and m are the same as defined in formula (5B); $Z^1$ is the same as defined formula (5A-a); two $Z^1$ may be the same or different; a plurality of $R^3$ may be mutually the same or different; and when there are a plurality of $R_w$, $R_x$, X and ring F, they may be independently the same or different.

[Chemical Formula 43]

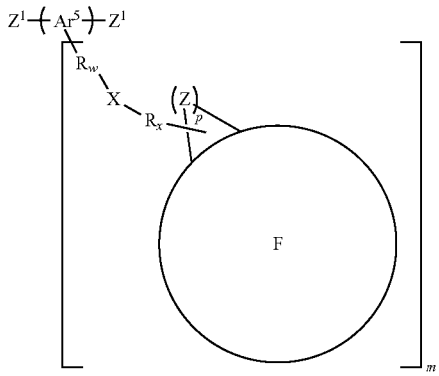

(5C-a)

In formula (5C-a), $Ar^5$, $R_w$, X, Z, $R_x$, ring F, p and m are the same as defined in formula (5C); $Z^1$ is the same as defined in formula (5A-a); two $Z^1$ may be the same or different; and when there are a plurality of $R_w$, $R_x$, X, Z, p and ring F, they may be independently the same or different.

[Chemical Formula 44]

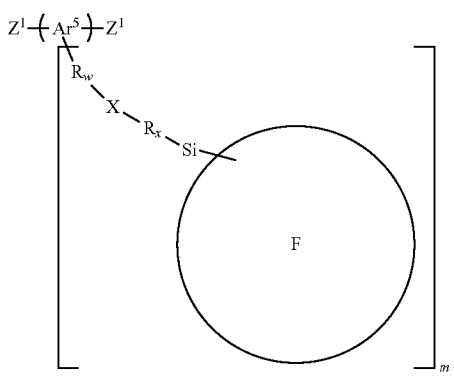

(5D-a)

In formula (5D-a), $Ar^5$, $R_w$, X, $R_x$, ring F and m are the same as defined in formula (5D); $Z^1$ is the same as defined in formula (5A-a); two $Z^1$ may be the same or different; and when there are a plurality of $R_w$, $R_x$, X and ring F, they may be independently the same or different.

A polymer compound having a repeating unit represented by the above formula (5) can be produced by condensation polymerization of, for example, a compound represented by the following formula (a).

[Chemical Formula 45]

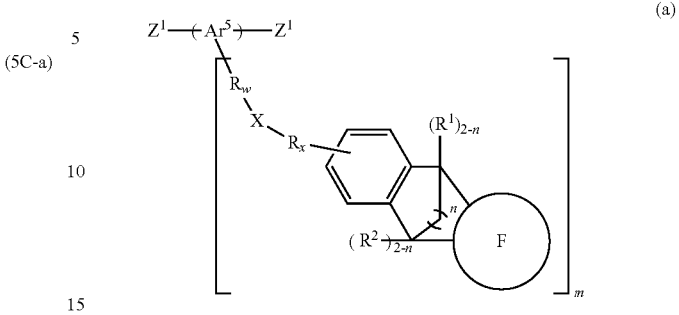

(a)

In formula (a), $Ar^5$, $R_w$, X, $R_x$, ring F, $R^1$, $R^2$, n and m are the same as defined in formula (5'); $Z^1$ is the same as defined in formula (5A-a); two $Z^1$ may be the same or different; and when there are a plurality of $R_w$, $R_x$, X, $R^1$, $R^2$, n and ring F, they may be independently the same or different.

<Production Method 2>

A polymer compound according to the electroluminescence device embodiment of the invention can be produced by reacting a precursor polymer compound, which is synthesized by condensation polymerization in advance, with a carbon cluster. The precursor polymer compound has two or more units selected from the group consisting of an arylene unit, a heteroarylene unit, a heterocyclic unit and an aromatic amine unit as repeating units and at least a part of the repeating units contains a crosslinkable group. It is preferable that the repeating unit containing the crosslinkable group is a unit represented by the following formula (7).

A polymer compound according to the electroluminescence device embodiment of the invention can be produced by reacting, for example, a precursor polymer compound having a repeating unit represented by the following formula (7) and a carbon cluster.

[Chemical Formula 46]

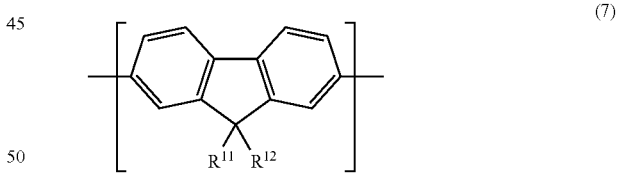

(7)

In formula (7), $R^{11}$ represents a crosslinkable group; and $R^{12}$ represents a hydrogen atom, a crosslinkable group, an unsubstituted or substituted alkyl group, or an unsubstituted or substituted aryl group.

Examples of the crosslinkable group include groups represented by the following formulas (7A-6), (7A-7), (7A-8), (7A-9), (7A-10), (7A-11), (7A-15), (7A-16), (7A-17), (7A-18), (7A-19), (7A-20), (7A-21), (7A-22), (7A-23), (7A-24), (7A-25), (7A-26), (7A-27), (7A-28), (7A-29) and (7A-30). For the reason that the reactivity with a carbon cluster is excellent, examples of the crosslinkable group include preferably groups represented by formulas (7A-6), (7A-7), (7A-8), (7A-9), (7A-10) or (7A-11), and more preferably groups represented by formulas (7A-6), (7A-7), (7A-8) or (7A-9).

[Chemical Formula 47]
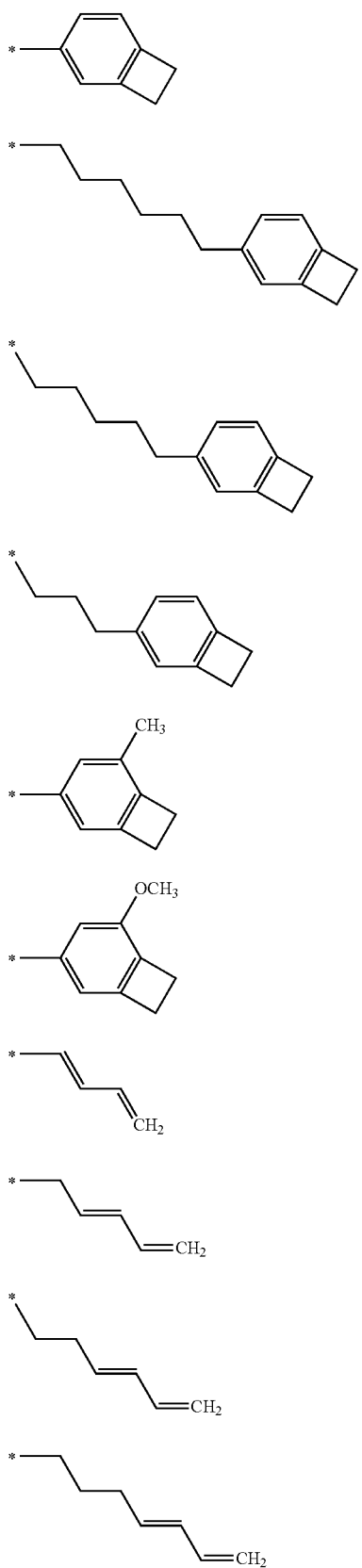
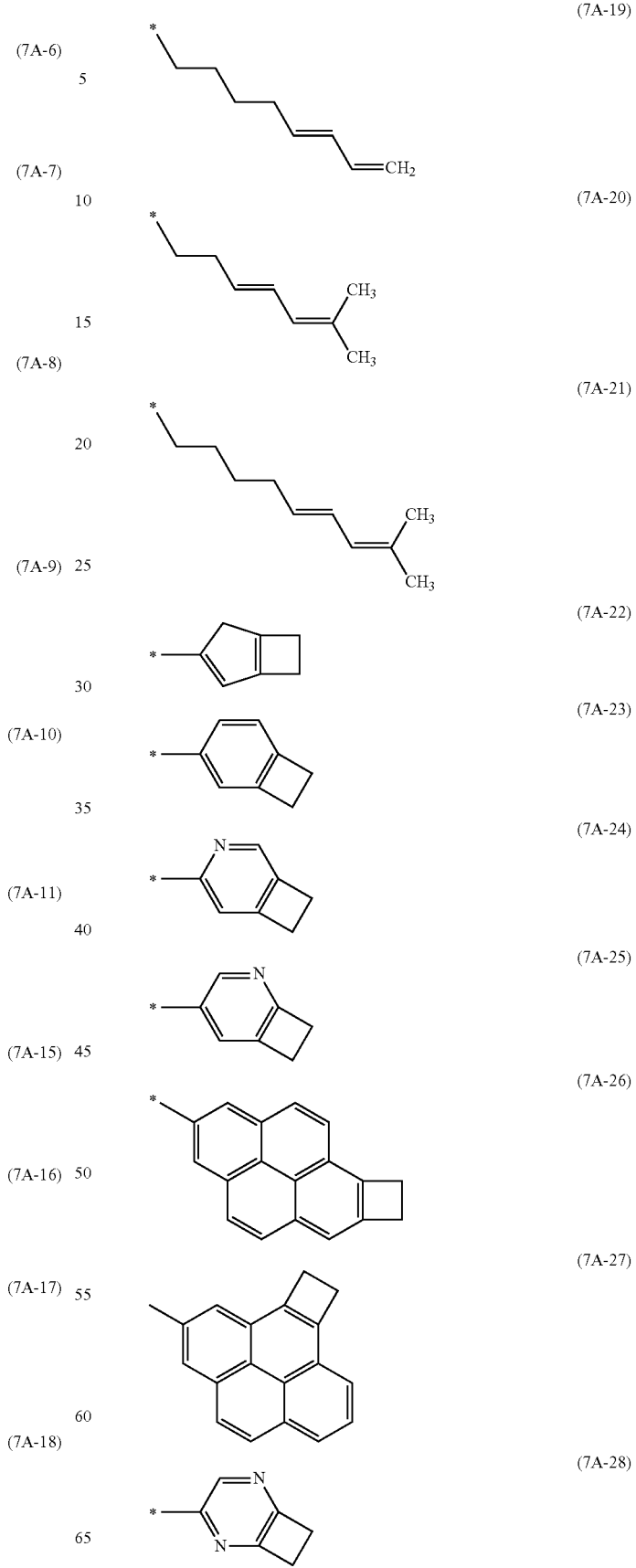

(7A-29)

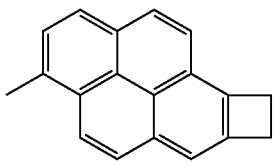

(7A-30)

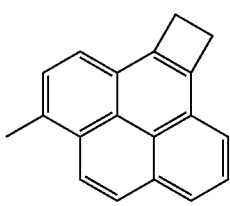

In the formulas above, * represents a bonding site.

In formula (7), $R^{12}$ represents a hydrogen atom, a crosslinkable group, an unsubstituted or substituted alkyl group, or an unsubstituted or substituted aryl group; and $R^{12}$ represents preferably a crosslinkable group, or an unsubstituted or substituted aryl group, and more preferably a crosslinkable group.

As the crosslinkable group represented by $R^{11}$, the same examples as mentioned as the crosslinkable group represented by $R^{12}$ can be used.

As the unsubstituted or substituted alkyl group and unsubstituted or substituted aryl group represented by $R^{12}$, the same examples as mentioned as the unsubstituted or substituted alkyl group and unsubstituted or substituted aryl group represented by each of $R^{M3}$ and $R^{M4}$, can be used respectively.

Examples of the reaction between a crosslinkable group and a fullerene will be shown below.

[Chemical Formula 48]

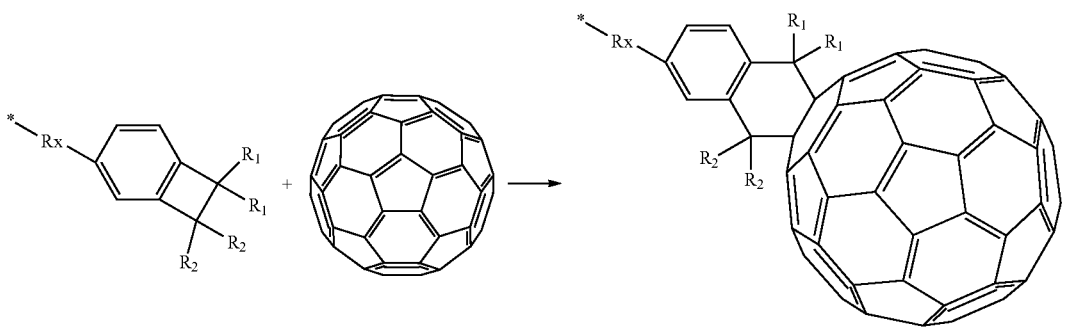

In the reaction formula, $R^1$, $R^2$ and $R_x$ are the same as defined in formula (5').

[Chemical Formula 49]

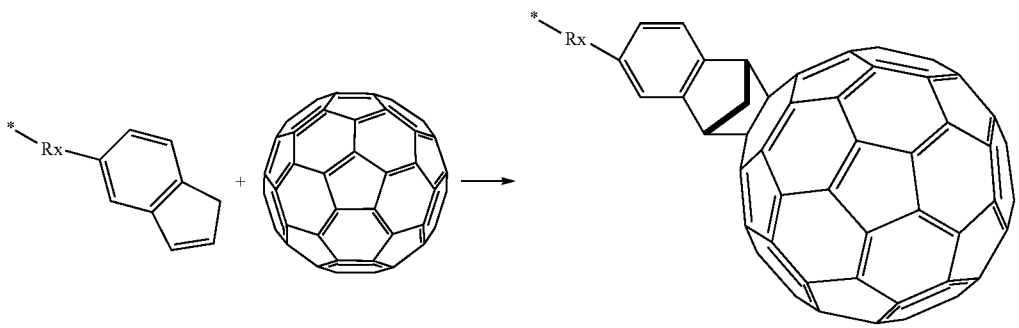

In the reaction formula, $R_x$ is the same as defined in formula (5').

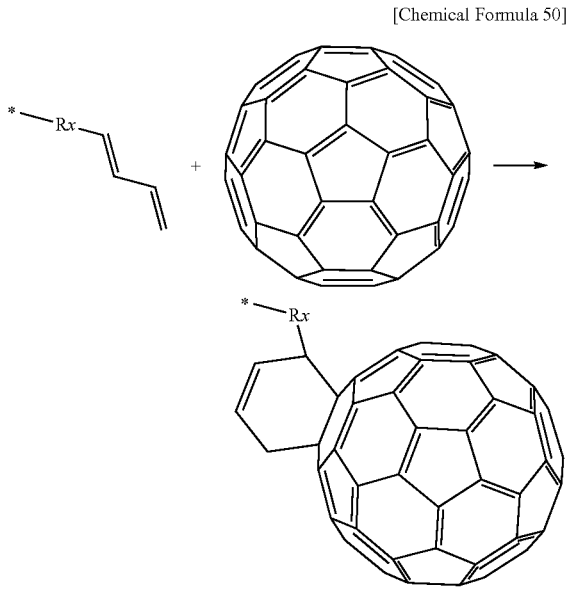

[Chemical Formula 50]

In the reaction formula, $R_x$ is the same as defined in formula (5').

The production method will be more specifically described below by way of the case where a carbon cluster is a fullerene, as an example.

The reaction between a precursor polymer compound and a fullerene is usually performed in the presence of a solvent such as an organic solvent or in absence of a solvent, and preferably performed in the presence of a solvent such as an organic solvent.

Examples of the organic solvent include toluene, xylene, chlorobenzene, dichlorobenzene and trichlorobenzene; preferably chlorobenzene, dichlorobenzene and trichlorobenzene; and particularly preferably, dichlorobenzene and trichlorobenzene.

The use amount of organic solvent is defined such that the total concentration of precursor polymer compounds becomes usually 0.1 mass % to 90 mass %, preferably 0.1 mass % to 10 mass % and more preferably 0.5 mass % to 5 mass %.

The temperature of the reaction between a precursor polymer compound and a fullerene is preferably 60° C. to 250° C., more preferably 100° C. to 220° C., and further preferably 180° C. to 220° C.

The reaction time, which varies depending upon conditions such as reaction temperature, is usually one hour or more, and preferably 10 hours to 500 hours.

The amount of fullerene to be used in the reaction is preferably 0.5 mole equivalents to 5 mole equivalents relative to the mole number of the sum of crosslinkable groups contained in a precursor polymer compound, further preferably 1.0 mole equivalents to 4 mole equivalents, and particularly preferably 1.5 mole equivalents to 3 mole equivalents.

The purity of the fullerene to be used in the reaction is preferably 98% or more for the reason that excellent characteristics of organic EL device are provided, and more preferably 99% or more.

The post treatment of the reaction can be performed by adding the reaction solution obtained in the above reaction to a lower alcohol such as methanol to obtain a precipitate and filtrating and drying the precipitate, in accordance with a conventional method.

The polymer compound obtainable by reacting (condensation polymerization) a precursor polymer compound having a repeating unit represented by formula (7) and a fullerene has a repeating unit represented by formula (7) and an arbitrary additional unit different therefrom, which are introduced by the condensation polymerization. Provided that the molar number of a repeating unit represented by the above formula (7), the molar number of the arbitrary additional unit and the molar number of a fullerene not carried by the polymer compound are represented by $N_7$, $N_M$ and $N_{NS}$, respectively, it is preferable that $N_7$, $N_M$ and $N_{NS}$ satisfy the following expression (IV), for the reason that the characteristics of the organic EL device are further improved and the stability of the characteristics are improved.

$$N_{NS} \times 100/(N_7+N_M) \leq 0.1 \qquad (IV)$$

Furthermore, it is more preferable that $N_7$, $N_M$ and $N_{NS}$ satisfy the following expression (V).

$$N_{NS} \times 100/(N_7+N_M) \leq 0.05 \qquad (V)$$

Herein, the fullerene not carried by the polymer compound refers to an unreacted fullerene, which is not reacted with a (precursor) polymer compound, liberated in a polymer compound.

The fullerene carried by a polymer compound (immobilized fullerene) and the fullerene (free fullerene) not carried by the polymer compound can be quantified by GPC-UV. More specifically, immobilized fullerene and free fullerene are separated by use of different elution time in GPC and UV absorption (335 nm) of both fullerenes are separately measured to quantify them. Specifically, for example, in the case of fullerene C60, the amount of free fullerene can be measured in accordance with the following procedure consisting of steps (1) to (4).

(1) A plurality of toluene solutions of fullerene C60 are prepared in different concentrations and GPC-UV values (detected at 335 nm) of them are separately measured.

(2) Chromatograms obtained in measurement of step (1) are used to form a calibration curve (the value of fullerene elution peak area versus the fullerene concentration)

(3) GPC-UV measurement of a real sample is performed.

(4) The fullerene elution peak area value of a chromatogram obtained in the measurement of step (3) and the calibration curve obtained in step (2) are used to calculate the amount of free fullerene in the real sample.

Furthermore, for example, in the case of fullerene C60, the immobilized fullerene can be quantified in accordance with the following procedure consisting of steps (1) to (5).

(1) To a precursor polymer compound, fullerene C60 is added in different concentrations to prepare standard samples and UV absorption spectrums of the standard samples are separately measured.

(2) From the UV absorption spectrums obtained in step (1), relative absorption intensities at 335 nm are obtained to form a calibration curve (the addition amount of fullerene versus the relative absorption intensity at 335 nm).

(3) A polymer compound elution fraction (containing immobilized fullerene) of a real sample is separated by GPC to obtain the polymer compound elution fraction.

(4) UV absorption spectrum of the polymer compound elution fraction obtained in step (3) is measured.

(5) From the UV absorption spectrum obtained in step (4), the relative absorption intensity at 335 nm is obtained and the amount of immobilized fullerene in the real sample is calculated by using the calibration curve obtained in step (2).

Examples of a purification method for removing free fullerene present in the polymer compound include conventional methods such as recrystallization, continuous extraction by a Soxhlet extractor and column chromatography.

In the case where column chromatography is used as the purification method, it is preferable to use silica gel, alumina or active carbon, further preferable that silica gel and/or active carbon is used and particularly preferable that they are used in combination.

<Condensation Polymerization>

Next, a method for producing a polymer compound according to the electroluminescence device embodiment of the invention or a precursor polymer compound by condensation polymerization will be described by way of the precursor polymer compound as an example.

For producing a precursor polymer compound, for example, a compound represented by the following formula (a-0) can be used as a monomer for use of a condensation polymerization reaction.

[Chemical Formula 51]

(a-0)

In formula (a-0), $Ar^5$ is the same as defined in $Ar^5$ in formula (5'); $Z^1$ represents a halogen atom, a methoxy group, a boric acid ester residue, a boric acid residue (—$B(OH)_2$), a group represented by the above formula (a-1), a group represented by the above formula (a-2), a group represented by the above formula (a-3) or a group represented by the above formula (a-4); and two $Z^1$ may be the same or different.

Examples of halogen atoms represented by $Z^1$ and $X_A$ in the above formulas (a-0), (a-2) and (a-3) include a chlorine atom, a bromine atom and an iodine atom.

In the above formula (a-0), as the boric acid ester residue represented by $Z^1$, groups represented by the following formulas are mentioned.

[Chemical Formula 52]

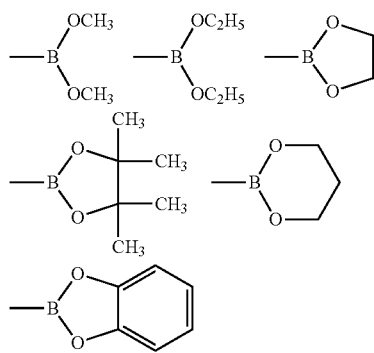

In the above formula (a-1), as an unsubstituted or substituted alkyl group and an unsubstituted or substituted aryl group represented by $R^T$, examples described as the unsubstituted or substituted alkyl group and unsubstituted or substituted aryl group represented by each of $R^5$ and $R^6$ can be used.

Examples of the group represented by the above formula (a-1) include a methanesulfonate group, a trifluoromethanesulfonate group, a phenylsulfonate group and a 4-methylphenylsulfonate group.

In the above formula (a-4), as an unsubstituted or substituted alkyl group and an unsubstituted or substituted aryl group represented by $R^T$, examples described as the unsubstituted or substituted alkyl group and unsubstituted or substituted aryl group represented by each of $R^5$ and $R^6$ can be used.

Examples of the group represented by the above formula (a-4) include a trimethylstannanyl group, a triethylstannanyl group and a tributylstannanyl group.

As the compound represented by the above formula (a-0), a compound synthesized and isolated in advance can be used or a compound prepared in a reaction system can be directly used.

In the above formula (a-0), it is preferable that $Z^1$ is a halogen atom, a boric acid ester residue and a boric acid residue, since a compound represented by the above formula (a-0) can be easily synthesized and handled.

As the condensation polymerization method, a method for reacting a compound represented by the above formula (a-0) by using an appropriate catalyst or a base is mentioned.

Examples of the catalyst include transition metal complexes including palladium complexes such as palladium[tetrakis(triphenylphosphine)], [tris(dibenzylideneacetone)]dipalladium and palladium acetate; and nickel complexes such as nickel[tetrakis(triphenylphosphine)], [1,3-bis(diphenylphosphino)propane]dichloronickel and [bis(1,4-cyclooctadiene)]nickel. Of them, palladium[tetrakis(triphenylphosphine)], palladium acetate, [1,3-bis(diphenylphosphino)propane]dichloronickel and [bis(1,4-cyclooctadiene)]nickel are preferable, and [1,3-bis(diphenylphosphino)propane]dichloronickel and [bis (1,4-cyclooctadiene)]nickel are preferable.

The transition metal complexes may further have a ligand such as triphenylphosphine, tri(tert-butylphosphine), tricyclohexylphosphine, diphenylphosphinopropane and bipyridyl.

As the catalyst, a catalyst synthesized in advance can be used or a catalyst prepared in a reaction system can be directly used. These catalysts may be used alone or in combination of two types or more.

When the catalyst is used, the use amount thereof, i.e., the amount of transition metal relative to the total molar number of all monomers including a compound represented by the above formula (a-0) is usually, 0.00001 mole equivalent to 3 mole equivalents, preferably 0.00005 mole equivalents to 3 mole equivalents, and further preferably 0.0001 mole equivalent to 2.5 mole equivalents.

When a palladium complex is used as the catalyst, examples of the base include inorganic bases such as sodium carbonate, potassium carbonate, cesium carbonate, potassium fluoride, cesium fluoride and tripotassium phosphate; and organic bases such as tetrabutylammonium fluoride, tetrabutylammonium chloride, tetrabutylammonium bromide and tetrabutylammonium hydroxide. These bases may be used alone or in combination of two types or more.

When a base is used, the use amount thereof is usually, 0.5 mole equivalents to 20 mole equivalents relative to the sum of molar numbers of all monomers including a compound represented by the above formula (a-0), and preferably 1 mole equivalent to 10 mole equivalents.

Condensation polymerization is usually performed in the presence of a solvent such as an organic solvent.

Examples of the organic solvent include toluene, xylene, mesitylene, tetrahydrofuran (THF), 1,4-dioxane, dimethoxyethane, N,N-dimethylacetamide, and N,N-dimethyl formamide. To suppress a side reaction, it is desirable to apply a deoxidization treatment to these solvents. These organic solvents may be used alone or in combination of two types or more.

The use amount of organic solvent is defined such that a total concentration of all monomers including a compound represented by the above formula (a-0) becomes usually, 0.1 mass % to 90 mass %, preferably 1 mass % to 50 mass %, and more preferably 2 mass % to 30 mass %.

The reaction temperature of condensation polymerization is usually −100° C. to 200° C., preferably −80° C. to 150° C., and further preferably 0° C. to 120° C.

The reaction time, which varies depending upon conditions such as reaction temperature is usually one hour or more, and preferably 2 hours to 500 hours.

It is desirable that the condensation polymerization, in the case where $Z^1$ in the above formula (a-0) is a group represented by the above formula (a-2), is performed under anhydrous condition.

Examples of the condensation polymerization method include a polymerization method in accordance with the Suzuki reaction (Chemical Review (Chem. Rev.), vol. 95, p.p. 2457 (1995)), a polymerization method in accordance with the Grignard reaction (Kyoritsu Shuppan, polymer functional material series, vol. 2, Synthesis and Reaction of a Polymer (2), p.p. 432 to 433) and a polymerization method in accordance with the Yamamoto polymerization method (Progress in Polymer Science (Prog. Polym. Sci.), vol. 17, p.p. 1153 to 1205, 1992). In view of reactivity, a polymerization method in accordance with the Suzuki reaction is preferable.

The post treatment of the condensation polymerization can be performed by adding the reaction solution obtained in the condensation polymerization to a lower alcohol such as methanol to obtain a precipitate and filtrating and drying the precipitate, in accordance with a conventional method.

Owing to the above post-treatment, a polymer compound according to the electroluminescence device embodiment of the invention can be obtained. When the purity of the polymer compound is low, the polymer compound can be purified by a conventional method such as recrystallization, continuous extraction by a Soxhlet extractor and column chromatography.

[Composition]

A first composition according to the electroluminescence device embodiment of the invention is a composition (usually, solid) containing one or more materials selected from the group consisting of a hole transport material, an electron transport material and a light-emitting material (usually, solid content), and a polymer compound according to the electroluminescence device embodiment of the invention.

Examples of the hole transport material, electron transport material and light-emitting material include hole transport materials, electron transport materials and light-emitting materials that the organic layers of the organic EL devices (described later) may possibly contain.

Furthermore, as the composition according to the electroluminescence device embodiment of the invention, a composition containing a polymer compound obtainable by reacting a precursor polymer compound and a carbon cluster and a precursor polymer compound (a compound before the reaction) is also mentioned.

The content ratio of the one or more materials selected from the group consisting of the hole transport material, electron transport material and light-emitting material, and a polymer compound according to the electroluminescence device embodiment of the invention may be determined depending upon use. For example, in the case of use for a light-emitting material, the content of a polymer compound according to the electroluminescence device embodiment of the invention is usually 1 mass % to 99 mass %, and preferably 1 mass % to 30 mass % relative to the whole composition.

A polystyrene-equivalent number-average molecular weight of the first composition according to the electroluminescence device embodiment of the invention is usually $5 \times 10^3$ to $1 \times 10^8$, and preferably $1 \times 10^4$ to $1 \times 10^6$. Furthermore, a polystyrene-equivalent weight-average molecular weight of the composition according to the electroluminescence device embodiment of the invention is usually $5 \times 10^3$ to $1 \times 10^8$. For the reason that the film formation property and the luminous efficiency of the organic EL device to be obtained becomes excellent, the number-average molecular weight is more preferably $1 \times 10^4$ to $5 \times 10^6$. The average molecular weight of the composition according to the electroluminescence device embodiment of the invention is a value obtained by analyzing the composition by GPC.

A second composition according to the electroluminescence device embodiment of the invention is a composition containing a polymer compound according to the electroluminescence device embodiment of the invention and a solvent. The composition is sometimes called as a solution, ink or an inkjet composition, which will be referred to as "a solution according to the electroluminescence device embodiment of the invention".

A solution according to the electroluminescence device embodiment of the invention is useful for producing a device by coating in accordance with an inkjet printing method or a printing method. Furthermore, a solvent according to the electroluminescence device embodiment of the invention may contain, other than a polymer compound according to the electroluminescence device embodiment of the invention and a solvent, a hole transport material, an electron transport material, a light-emitting material, a stabilizer, a thickener (a high-molecular weight compound to enhance viscosity and a poor solvent), a low-molecular weight compound for reducing viscosity, a surfactant (serving as an agent for reducing surface tension) and an antioxidant.

In a solution according to the electroluminescence device embodiment of the invention, the ratio of a polymer compound according to the electroluminescence device embodiment of the invention relative to the total amount of solution is usually 0.1 mass % to 99.9 mass %, preferably 0.1 mass % to 10 mass %, more preferably 0.2 mass % to 7 mass %, and further preferably 0.5 mass % to 2 mass %.

The viscosity of a solution according to the electroluminescence device embodiment of the invention, which varies depending upon the printing method, is preferably 0.5 mPa·s to 1000 mPa·s at 25° C., and more preferably 0.5 mPa·s to 500 mPa·s. Furthermore, in the case where the solution is sprayed by way of an injection apparatus as in an inkjet printing method, the viscosity at 25° C. is preferably 0.5 mPa·s to 50 mPa·s, and more preferably 0.5 mPa·s to 20 mPa·s in order to prevent clogging during the injection and curved flight.

As the high-molecular weight compound to be used as the thickener, any polymer compound can be used as long as it is soluble in the same solvent in which the compound according to the electroluminescence device embodiment of the invention is dissolved and it does not inhibit light emission and charge transport. For example, high-molecular weight polystyrene and high-molecular weight polymethyl methacrylate can be used. A polystyrene-equivalent weight-average molecular weight of these polymer compounds is preferably $5.0 \times 10^5$ or more, and more preferably $1.0 \times 10^6$ or more.

As the thickener, a poor solvent can be used. Viscosity can be improved by adding a small amount of poor solvent compared to the amount of solid content in the solution. In the case of adding a poor solvent for this purpose, the type and addition amount of solvent may be selected within the range that no solid substance is precipitated in the solvent. In consideration of stability during storage together, the amount of poor solvent is preferably 50 mass % or less, and further preferably 30 mass % or less relative to the whole solution.

The antioxidant is used for improving the storage stability of the solution according to the electroluminescence device embodiment of the invention. As the antioxidant, any antioxidant may be used as long as it is soluble in the same solvent as that in which a polymer compound according to the electroluminescence device embodiment of the invention can be dissolved and as long as it does not inhibit light emission and charge transport. A phenol antioxidant and a phosphorus antioxidant are mentioned as an example.

As a solvent for a solution according to the electroluminescence device embodiment of the invention, any solvent may be used as long as it dissolve or disperse a polymer compound. For example, the following organic solvents are mentioned:

aromatic hydrocarbon solvents: toluene, xylene (isomers or mixture of the isomers), 1,2,3-trimethylbenzene, 1,2,4-trimethylbenzene, mesitylene(1,3,5-trimethylbenzene), ethylbenzene, propylbenzene, isopropylbenzene, butylbenzene, isobutylbenzene, 2-phenylbutane, tert-butylbenzene, pentylbenzene, neopentylbenzene, isoamylbenzene, hexylbenzene, cyclohexylbenzene, heptylbenzene, octylbenzene, 3-propyltoluene, 4-propyltoluene, 1-methyl-4-propylbenzene, 1,4-diethylbenzene, 1,4-dipropylbenzene, 1,4-di-tert-butylbenzene, indane, tetraphosphorus(1,2,3,4-tetrahydronaphthalene) and others;

aliphatic hydrocarbon solvents: n-pentane, n-hexane, cyclohexane, methylcyclohexane, n-heptane, n-octane, n-nonane, n-decane, decalin and others;

aromatic ether solvents: anisole, ethoxybenzene, propoxybenzene, butyloxybenzene, pentyloxybenzene, cyclopentyloxybenzene, hexyloxybenzene, cyclohexyloxybenzene, heptyloxybenzene, octyloxybenzene, 2-methylanisole, 3-methylanisole, 4-methylanisole, 4-ethylanisole, 4-propylanisole, 4-butylanisole, 4-pentylanisole, 4-hexylanisole, diphenylether, 4-methylphenoxybenzene, 4-ethylphenoxybenzene, 4-propylphenoxybenzene, 4-butylphenoxybenzene, 4-pentylphenoxybenzene, 4-hexylphenoxybenzene, 4-phenoxytoluene, 3-phenoxytoluene, 1,3-dimethoxybenzene, 2,6-dimethylanisole, 2,5-dimethylanisole, 2,3-dimethylanisole, 3,5-dimethylanisole and others;

aliphatic ether solvents: tetrahydrofuran, dioxane, dioxolane and others;

ketone solvents: acetone, methylethylketone, methylisobutylketone, cyclohexanone, acetophenone and others;

ester solvents: ethyl acetate, butyl acetate, methyl benzoate, ethyl cellosolve acetate and others;

chlorine solvents: methylene chloride, chloroform, 1,2-dichloroethane, 1,1,2-trichloroethane, chlorobenzene, o-dichlorobenzene and others;

alcohol solvents: methanol, ethanol, propanol, isopropanol, cyclohexanol, phenol and others;

polyvalent alcohols and their derivatives: ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and others; and aprotic polar solvents: dimethylsulfoxide, N-methyl-2-pyrrolidone, N,N-dimethylformamide, N,N-dimethylacetamide and others.

These organic solvents may be used alone or as a mixture of two types or more solvents. When a solvent mixture is used, two or three or more solvents selected from the aforementioned groups of the solvents are preferably used in combination. A plurality of solvents may be selected from the same solvent group or one or more solvents may be selected independently from different solvent groups and used in combination. The composition ratio thereof can be decided in view of physical properties of each solvent and the solubility of e.g., a polymer compound.

In the case where a plurality of solvents are selected from the same solvent group, for example, selecting a plurality of solvents from aromatic hydrocarbon solvents and selecting a plurality of solvents from aromatic ether solvents are preferable.

In the case where one or more solvents are selected independently from different solvent groups and used in combination, for example, the following combinations are preferable.

A combination of an aromatic hydrocarbon solvent(s) and an aliphatic hydrocarbon solvent(s), a combination of an aromatic hydrocarbon solvent(s) and an aromatic ether solvent(s), a combination of an aromatic hydrocarbon solvent(s) and an aliphatic ether solvent(s), a combination of an aromatic hydrocarbon solvent(s) and an aprotic polar solvent(s), and a combination of an aromatic ether solvent(s) and an aprotic polar solvent(s).

Furthermore, water can be added to a single or a mixed organic solvent. Of these organic solvents, organic solvents having a structure containing a benzene ring, and with a melting point of 0° C. or less and a boiling point of 100° C. or more are preferably used alone or as a mixture since viscosity and film formation property become satisfactory. Of them, a case of containing one or more aromatic hydrocarbon solvents and aromatic ether solvents is preferable. These may be used alone or as a mixture of two or more solvents. In view of controlling film formation property, it is preferable to use a solvent mixture.

These solvents may be used after they are purified by a method such as washing, distillation and contact to an absorbent.

For the reason that the solvents are excellent in film formation property and device characteristics, two or more solvents are preferably used in combination, more preferably two to three types in combination, and particularly preferably two types in combination.

In the case where two types of solvents are contained in the solution according to the electroluminescence device embodiment of the invention, one of these solvents may be present in a solid state at 25° C. For the reason that film formation property is excellent, one of the solvents is a solvent with a boiling point of preferably 180° C. or more, and more preferably 200° C. or more. Furthermore, since viscosity is satisfactory, it is preferable that a polymer compound is dissolved in either of the two solvents at 60° C. in a concentration of 1 mass % or more, and it is preferable that a polymer compound is dissolved in one of the two solvents, at 25° C. in a concentration of 1 mass % or more.

In the case where two or more solvents are contained in the solution according to the electroluminescence device embodiment of the invention, since viscosity and film formation property are excellent, the solvent having the highest boiling point of them is contained in a concentration of preferably 40 mass % to 90 mass %, more preferably 50 mass % to 90 mass %, and further preferably 65 mass % to 85 mass % in the total mass of the solvents of the solution.

The number of types of polymer compounds according to the electroluminescence device embodiment of the invention contained in a solution according to the electroluminescence device embodiment of the invention may be one or two or more and a polymer compound other than a polymer compound according to the electroluminescence device embodiment of the invention may be contained as long as it does not negatively affect device characteristics.

A solution according to the electroluminescence device embodiment of the invention may contain water, a metal and a salt thereof within the range of 1 ppm to 1000 ppm on a mass basis. Examples of the metal include lithium, sodium, calcium, potassium, iron, copper, nickel, aluminum, zinc, chromium, manganese, cobalt, platinum and iridium. Furthermore, a solution according to the electroluminescence device embodiment of the invention may contain e.g., silicon, phosphorus, fluorine, chlorine and bromine within the range of 1 ppm to 1000 ppm on a mass basis.

[Film]

A film according to the electroluminescence device embodiment of the invention is obtainable by using a polymer compound according to the electroluminescence device embodiment of the invention. There are an embodiment of the film containing a polymer compound according to the electroluminescence device embodiment of the invention as it is, and an embodiment of the film containing a polymer compound according to the electroluminescence device embodiment of the invention having an intramolecular or intermolecular crosslinkage. Examples of a film according to the electroluminescence device embodiment of the invention include a luminous film and a conductive film.

A film according to the electroluminescence device embodiment of the invention is formed, for example, by a spin coating method, a casting method, a microgravure coating method, a gravure coating method, a bar coating method, a roll coating method, a wire-bar coating method, a dip coating method, a spray coating method, a screen printing method, a flexo printing method, an off-set printing method, an inkjet printing method, a capillary coating method or a nozzle coating method; by a screen printing method, a flexo printing method, an off-set printing method or an inkjet printing method; and more preferably by an inkjet method.

In the case where a film is produced by a solution according to the electroluminescence device embodiment of the invention, heating can be made at 100° C. or more, since a polymer compound according to the electroluminescence device embodiment of the invention contained in the solution has a high glass transition temperature.

A luminous film, since the brightness and light emission initiation voltage of an organic EL device are satisfactory, has a luminescence quantum yield of preferably 30% or more, more preferably, 50% or more, further preferably 60% or more, and particularly preferably, 70% or more.

A conductive film has a surface resistance of preferably 1 KΩ/□ or less, more preferably, 100Ω/□ or less, and further preferably 10Ω/□ or less. The electric conductivity of the conductive film can be enhanced by doping e.g., a Lewis acid and/or an ionic compound.

[Organic EL Device]

Next, an organic EL device according to the electroluminescence device embodiment of the invention will be described.

An organic EL device according to the electroluminescence device embodiment of the invention has an anode, a cathode, an organic layer between the anode and the cathode. The organic layer contains a polymer compound according to the electroluminescence device embodiment of the invention. Furthermore, there is an embodiment where a polymer compound according to the electroluminescence device embodiment of the invention is directly contained without modification and an embodiment where a polymer compound according to the electroluminescence device embodiment of the invention contains a compound having an intramolecular or intermolecular crosslinkage.

Examples of the organic layer include a light-emitting layer, a hole transport layer (generally referred to as "interlayer" in some cases), a hole injection layer, an electron transport layer and an electron injection layer. The light-emitting layer refers to a layer with a function of emitting light. The hole transport layer refers to a layer with a function of transporting holes. The electron transport layer refers to a layer with a function of transporting electrons. Note that, the electron transport layer and the hole transport layer are collectively referred to as a charge transport layer; whereas, the electron injection layer and the hole injection layer are collectively referred to as a charge injection layer. The organic layer, which serves as the light-emitting layer, hole transport layer, hole injection layer, electron transport layer and electron injection layer, may be formed of a single layer alone (more specifically, a single layer contains the functions of these layers) or two or more layers.

It is preferable that the organic layer containing a polymer compound according to the electroluminescence device embodiment of the invention is one or more layers selected from the group consisting of a light-emitting layer, a hole transport layer, a hole injection layer, an electron transport layer and an electron injection layer, and it is more preferable that the organic layer is a light-emitting layer and/or a hole transport layer.

When the organic layer containing a polymer compound according to the electroluminescence device embodiment of the invention is a light-emitting layer, the light-emitting layer may further contain e.g., additives for extending the brightness life of a hole transport material, an electron transport material, a light-emitting material and an organic EL device. Herein, the light-emitting material refers to a material emitting luminescence or phosphorescence (except a polymer compound according to the electroluminescence device embodiment of the invention).

When the organic layer containing a polymer compound according to the electroluminescence device embodiment of the invention contains a polymer compound according to the electroluminescence device embodiment of the invention and a hole transport material, the ratio of the hole transport material relative to the total amount of polymer compound according to the electroluminescence device embodiment of the invention and the hole transport material is usually 1 mass % to 80 mass %, and preferably 5 mass % to 60 mass %.

When the organic layer containing a polymer compound according to the electroluminescence device embodiment of the invention contains a polymer compound according to the electroluminescence device embodiment of the invention and an electron transport material, the ratio of the electron transport material relative to the total amount of polymer compound according to the electroluminescence device embodiment of the invention and the electron transport material is usually 1 mass % to 80 mass %, and preferably 5 mass % to 60 mass %.

When the organic layer containing a polymer compound according to the electroluminescence device embodiment of the invention contains a polymer compound according to the electroluminescence device embodiment of the invention and a light-emitting material, the ratio of the light-emitting material relative to the total amount of polymer compound according to the electroluminescence device embodiment of the invention and the light-emitting material is usually 1 mass % to 80 mass %, and preferably 5 mass % to 60 mass %.

When the organic layer containing a polymer compound according to the electroluminescence device embodiment of the invention contains a polymer compound according to the electroluminescence device embodiment of the invention and two or more materials selected from the group consisting of a hole transport material, an electron transport material and a light-emitting material, the ratio of the light-emitting material relative to the total amount of them is usually 1 mass % to 50 mass %, and more preferably 5 mass % to 40 mass %, and the ratio of the sum of the hole transport material and the electron transport material relative to the total amount of them is usually 1 mass % to 50 mass %, and preferably 5 mass % to 40 mass %.

As the hole transport material, electron transport material and light-emitting material, a known low-molecular weight compound, a triplet emission complex and a polymer compound can be used.

Examples of the polymer compound include polymers and copolymers (hereinafter, referred to as "(co)polymers") containing a fluorenediyl group as a constitutional unit, (co)polymers containing an arylene group as a constitutional unit, (co)polymers containing an arylene vinylene group as a constitutional unit and (co)polymer containing a divalent aromatic amine residue as a constitutional unit described in WO99/13692, WO99/48160, GB2340304A, WO00/53656, WO01/19834, WO00/55927, GB2348316, WO00/46321, WO00/06665, WO99/54943, WO99/54385, US5777070, WO98/06773, WO97/05184, WO00/35987, WO00/53655, WO01/34722, WO99/24526, WO00/22027, WO00/22026, WO98/27136, US573636, WO98/21262, US5741921, WO97/09394, WO96/29356, WO96/10617, EP0707020, WO95/07955, Japanese Unexamined Patent Application Publication No. 2001-181618, Japanese Unexamined Patent Application Publication No. 2001-123156, Japanese Unexamined Patent Application Publication No. 2001-3045, Japanese Unexamined Patent Application Publication No. 2000-351967, Japanese Unexamined Patent Application Publication No. 2000-303066, Japanese Unexamined Patent Application Publication No. 2000-299189, Japanese Unexamined Patent Application Publication No. 2000-252065, Japanese Unexamined Patent Application Publication No. 2000-136379, Japanese Unexamined Patent Application Publication No. 2000-104057, Japanese Unexamined Patent Application Publication No. 2000-80167, Japanese Unexamined Patent Application Publication No. 10-324870, Japanese Unexamined Patent Application Publication No. 10-114891, Japanese Unexamined Patent Application Publication No. 9-111233 and Japanese Unexamined Patent Application Publication No. 9-45478.

Examples of the low-molecular weight compound include, a naphthalene derivative, anthracene and a derivative thereof, perylene and a derivative thereof, pigments such as a polymethine dye, a xanthene dye, a coumarin dye and a cyanine dye, metal complexes such as 8-hydroxy quinoline and a derivative thereof, aromatic amine, tetraphenylcyclopentadiene and a derivative thereof and tetraphenyl butadiene and a derivative thereof. Specifically, compounds described in Japanese Unexamined Patent Application Publication No. 57-51781, Japanese Unexamined Patent Application Publication No. 59-194393 are mentioned.

Examples of the triplet emission complex include Ir(ppy)$_3$, Btp$_2$Ir(acac) using iridium as a core metal, ADS066GE commercially available from American Dye Source, Inc., PtOEP using platinum as a core metal and Eu(TTA)$_3$-phen using europium as a core metal. Specific examples thereof are described in Nature, (1998), 395, 151, Appl. Phys. Lett. (1999), 75 (1), 4, Proc. SPIE-Int. Soc. Opt. Eng. (2001), 4105 (Organic Light-Emitting Materials and DevicesIV), 119, J. Am. Chem. Soc., (2001), 123, 4304, Appl. Phys. Lett., (1997), 71 (18), 2596, Syn. Met., (1998), 94 (1), 103, Syn. Met., (1999), 99 (2), 1361, Adv. Mater., (1999), 11 (10), 852 and Jpn. J. Appl. Phys., 34, 1883 (1995).

[Chemical Formula 53]

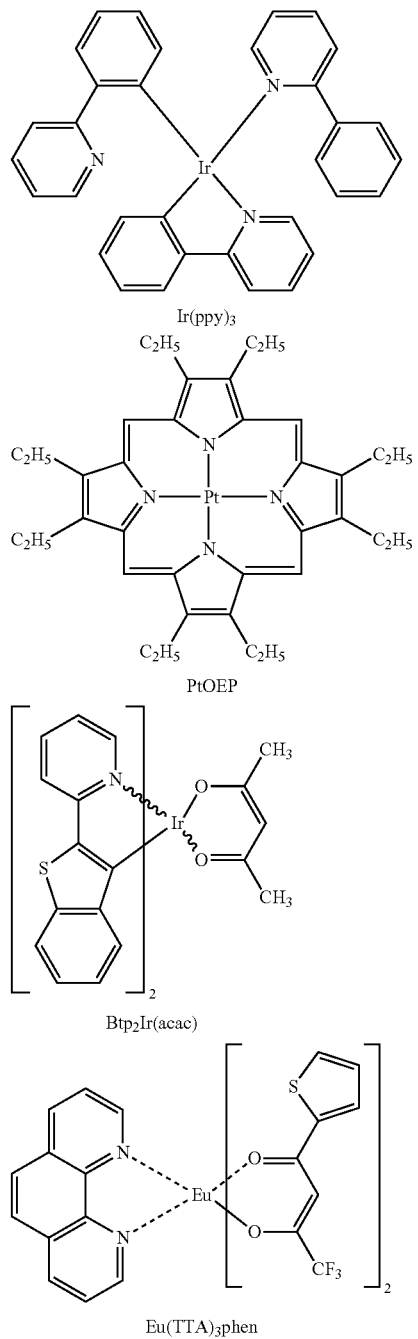

Ir(ppy)$_3$

PtOEP

Btp$_2$Ir(acac)

Eu(TTA)$_3$phen

Examples of the additives include bipyridyls such as 2,2'-bipyridyl, 3,3'-bipyridyl and 4,4'-bipyridyl; and bipyridyl derivatives such as 4-methyl-2,2'-bipyridyl, 5-methyl-2,2'-bipyridyl and 5,5'-dimethyl-2,2'-bipyridyl.

The optimal thickness of a light-emitting layer, which varies depending upon the material to be used and may be selected so as to provide an appropriate driving voltage and luminous efficiency, is usually 1 nm to 1 μm, preferably 2 nm to 500 nm, more preferably 5 nm to 200 nm, and further preferably 50 nm to 150 nm.

As a method for forming a light-emitting layer, a film formation method from a solution is mentioned. Examples of the film formation method from a solution that can be used include coating methods such as a spin coating method, a casting method, a microgravure coating method, a gravure coating method, a bar coating method, a roll coating method, a wire bar coating method, a dip coating method, a spray coating method, a screen printing method, a flexo printing method, an off-set printing method, an inkjet printing method, a capillary coating method and a nozzle coating method. Since pattern formation and multicolor painting are easily made, printing methods such as a screen printing method, a flexo printing method, an off-set printing method and an inkjet printing method are preferable.

As an organic EL device according to the electroluminescence device embodiment of the invention, organic EL device including an electron transport layer provided between a cathode and a light-emitting layer; organic EL device including a hole transport layer provided between an anode and a light-emitting layer; and an organic EL device including an electron transport layer provided between a cathode and a light-emitting layer and a hole transport layer provided between an anode and a light-emitting layer. In the organic EL device according to the electroluminescence device embodiment of the invention, it is preferable that a polymer compound according to the electroluminescence device embodiment of the invention is contained in the hole transport layer.

As the structure of such an organic EL device, the structures a) to d) shown below are mentioned. Note that, "/" indicates that the layers before and after "/" are laminated in contact with each other (for example, "anode/light-emitting layer" indicates that the anode and the light-emitting layer are laminated in contact with each other. The same applies hereinafter).

a) anode/light-emitting layer/cathode
   b) anode/hole transport layer/light-emitting layer/cathode
   c) anode/light-emitting layer/electron transport layer/cathode
   d) anode/hole transport layer/light-emitting layer/electron transport layer/cathode Furthermore, in each of these structures, a hole transport layer may be provided between a light-emitting layer and an anode so as to be in contact with the light-emitting layer. As the structure of such an organic EL device, the structures a') to d') shown below are mentioned.

a') anode/hole transport layer/light-emitting layer/cathode
   b') anode/hole transport layer/hole transport layer/light-emitting layer/cathode
   c') anode/hole transport layer/light-emitting layer/electron transport layer/cathode
   d') anode/hole transport layer/hole transport layer/light-emitting layer/electron transport layer/cathode When an organic EL device according to the electroluminescence device embodiment of the invention has a hole transport layer, the hole transport layer usually contains a polymer compound according to the electroluminescence device embodiment of the invention. Examples of other hole transport materials (high-molecular weight compound, low-molecular weight compound) include polyvinylcarbazole and a derivative thereof, polysilane and a derivative thereof, a polysiloxane derivative having an aromatic amine structure in a side chain or a main chain, a pyrazoline derivative, an arylamine derivative, a stilbene derivative, a triphenyldiamine derivative, polyaniline and a derivative thereof, polythiophene and a derivative thereof, polypyrrole and a derivative thereof, polyp-phenylenevinylene) and a derivative thereof, poly(2,5-thienylenevinylene) and a derivative thereof, and those described in Japanese Unexamined Patent Application Publication No. 63-70257, 63-175860 and Japanese Unexamined Patent Application Publication No. 2-135359, 2-135361, 2-209988, 3-37992 and 3-152184.

Of them, as the high-molecular weight compound, polyvinylcarbazole and derivative thereof, polysilane and a derivative thereof, a polysiloxane derivative having an aromatic amine structure in a side chain or a main chain, polyaniline and a derivative thereof, polythiophene and a derivative thereof, poly(p-phenylenevinylene) and a derivative thereof, and poly(2,5-thienylenevinylene) and a derivative thereof are preferable; and polyvinylcarbazole and a derivative thereof, polysilane and a derivative thereof, and a polysiloxane derivative having an aromatic amine structure in a side chain or a main chain are more preferable.

Of them, as the low-molecular weight compound, a pyrazoline derivative, an arylamine derivative, a stilbene derivative and a triphenyldiamine derivative are preferable. It is preferable that these low-molecular weight compounds are each used by dispersing it in a polymer binder.

As the polymer binder, a compound, which does not deadly inhibit charge transport and does not have intensive absorption to visible light, is preferable. Examples thereof include poly(N-vinylcarbazole), polyaniline and a derivative thereof, polythiophene and a derivative thereof, poly(p-phenylenevinylene) and a derivative thereof, poly(2,5-thienylenevinylene) and a derivative thereof, polycarbonate, polyacrylate, polymethylacrylate, polymethylmethacrylate, polystyrene, poly(vinyl chloride) and polysiloxane.

Polyvinylcarbazole and a derivative thereof are obtained, for example, from a vinyl monomer by cation polymerization or radical polymerization.

As a polysilane and a derivative thereof, compounds described in Chemical Review (Chem. Rev.) vol. 89, page 1359 (1989), British Patent GB2300196 are mentioned as examples. As a synthesis method, methods describes in these can be used, particularly a capping method is preferably used.

As a polysiloxane and a derivative thereof, since a siloxane skeleton structure virtually no hole transportability, a compound having the low-molecular weight hole transportable structure in a side chain or main chain is preferable, and a compound having a hole transportable aromatic amine structure in a side chain or main chain is more preferable.

As a method for forming a hole transport layer, when a low-molecular weight compound is used, a method of forming a film from a solution mixture with a polymer binder is mentioned as an example, and when a high-molecular weight compound (including a polymer compound according to the electroluminescence device embodiment of the invention) is used, a method for forming a film from a solution is mentioned as an example.

As a solvent for use in forming a film from a solution, a solvent capable of dissolving or homogeneously dispersing a hole transport material is preferable. Examples of the solvent include chlorine solvents such as chloroform, methylene chloride, 1,2-dichloroethane, 1,1,2-trichloro ethane, chlorobenzene and o-dichlorobenzene; ether solvents such as tetrahydrofuran and dioxane; aromatic hydrocarbon solvents such as toluene and xylene; aliphatic hydrocarbon solvents such as cyclohexane, methylcyclohexane, n-pentane, n-hexane, n-heptane, n-octane, n-nonane and n-decane; ketone solvents such as acetone, methyl ethyl ketone and cyclohexanone; ester solvents such as ethyl acetate, butyl acetate and ethyl cellosolve acetate; polyvalent alcohols and derivatives thereof such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexanediol; alcohol solvents such as methanol, ethanol, propanol, isopropanol and cyclohexanol; sulfoxide solvents such as dimethyl sulfoxide; and amide solvents such as N-methyl-2-pyrrolidone and N,N-dimethyl formamide. These solvents may be used alone or in combination of two types or more.

For forming a film from a solution, coating methods such as a spin coating method, a casting method, a microgravure coating method, a gravure coating method, a bar coating method, a roll-coating method, a wire bar coating method, a dip coating method, a spray coating method, a screen printing method, a flexo printing method, an off-set printing method, an inkjet printing method, a capillary coating method and a nozzle coating method can be used.

The optimal thickness of the hole transport layer, which varies depending upon the material to be used and may be selected so as to provide an appropriate driving voltage and luminous efficiency, is usually 1 nm to 1 µm, preferably 2 nm to 500 nm, and more preferably 5 nm to 200 nm.

When an organic EL device according to the electroluminescence device embodiment of the invention has an electron transport layer, the electron transport layer usually contains the electron transport material (high-molecular weight compound, low-molecular weight compound). As the electron transport material, a known material can be used. Examples thereof include an oxadiazole derivative, an anthraquinodimethane and a derivative thereof, benzoquinone and a derivative thereof, naphthoquinone and a derivative thereof, anthraquinone and a derivative thereof, tetracyanoanthraquinodimethane and a derivative thereof, a fluorenone derivative, diphenyldicyanoethylene and a derivative thereof, a diphenoquinone derivative, 8-hydroxyquinoline and a metal complex of a derivative thereof, polyquinoline and a derivative thereof, polyquinoxaline and a derivative thereof, polyfluorene and a derivative thereof and compounds described in Japanese Unexamined Patent Application Publication No. 63-70257, Japanese Unexamined Patent Application Publication No. 63-175860, Japanese Unexamined Patent Application Publication No. 2-135359, Japanese Unexamined Patent Application Publication No. 2-135361, Japanese Unexamined Patent Application Publication No. 2-209988, Japanese Unexamined Patent Application Publication No. 3-37992, and Japanese Unexamined Patent Application Publication No. 3-152184. An oxadiazole derivative, benzoquinone and a derivative thereof, anthraquinone and a derivative thereof, 8-hydroxyquinoline and a metal complex of a derivative thereof, polyquinoline and a derivative thereof, polyquinoxaline and a derivative thereof and polyfluorene and a derivative thereof are preferable; and 2-(4-biphenylyl)-5-(4-tert-butylphenyl)-1,3,4-oxadiazole, benzoquinone, anthraquinone, tris(8-quinolinol)aluminum and polyquinoline are further preferable.

As a method for forming the film of an electron transport layer, when a low-molecular weight compound is used, a vacuum vapor deposition method using a power, or a method for forming a film from a solution or a molten-state are mentioned as examples; and when a high-molecular weight compound is used, a method for forming a film from a solution or a molten-state is mentioned as an example. In the method for forming a film from a solution or a molten-state, a polymer binder as mentioned above may be used in combination.

As the solvent to be used in forming a film from a solution, a solvent capable of dissolving or homogenously dispersing an electron transport material and/or a polymer binder is preferable. Examples of the solvent include chlorine solvents such as chloroform, methylene chloride, 1,2-dichloroethane, 1,1,2-trichloro ethane, chlorobenzene and o-dichlorobenzene; ether solvents such as tetrahydrofuran and dioxane; aromatic hydrocarbon solvents such as toluene and xylene; aliphatic hydrocarbon solvents such as cyclohexane, methylcyclohexane, n-pentane, n-hexane, n-heptane, n-octane, n-nonane and n-decane; ketone solvents such as acetone, methyl ethyl ketone and cyclohexanone; ester solvents such as ethyl acetate, butyl acetate, ethyl cellosolve acetate; polyvalent alcohols and derivatives thereof such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, and 1,2-hexanediol; alcohol solvents such as methanol, ethanol, propanol, isopropanol and cyclohexanol; sulfoxide solvents such as dimethyl sulfoxide; and amide solvents such as N-methyl-2-pyrrolidone and N,N-dimethyl formamide. These solvents may be used alone or in combination of two types or more.

For forming a film from a solution or a molten state solution, coating methods such as a spin coating method, a casting method, a microgravure coating method, a gravure coating method, a bar coating method, a roll-coating method, a wire bar coating method, a dip coating method, a spray coating method, a screen printing method, a flexo printing method, an off-set printing method, an inkjet printing method, a capillary coating method and a nozzle coating method can be used.

The optimal thickness of the electron transport layer, which varies depending upon the material to be used and may be selected so as to provide an appropriate driving voltage and luminous efficiency, is usually 1 nm to 1 µm, preferably 2 nm to 500 nm, and more preferably 5 nm to 200 nm.

The hole injection layer and electron injection layer have a function of improving a charge injection efficiency from the electrode of the charge transport layer provided adjacent to an electrode, and has an effect of reducing the driving voltage of an organic EL device.

To improve adhesion to an electrode and improve charge injection from the electrode, a charge injection layer or an insulating layer (usually, having an average thickness of 0.5 nm to 4.0 nm. The same applies hereinafter) may be provided adjacent to the electrode. Furthermore, for example, to improve adhesion of the interface and prevent contamination, the interface of a charge transport layer or a light-emitting layer, a thin buffer layer may be inserted.

The order and number of layers to be laminated and the thickness of each layer may be controlled in consideration of luminous efficiency and device life.

In the electroluminescence device embodiment of the invention, as an organic EL device including a charge injection layer (electron injection layer, hole injection layer) provided therein, an organic EL device including a charge injection layer adjacent to a cathode and an organic EL device including a charge injection layer adjacent to an anode are mentioned. As the structure of such an organic EL device, the structures e) to p) shown below are mentioned.

e) anode/charge injection layer/light-emitting layer/cathode f) anode/light-emitting layer/charge injection layer/cathode g) anode/charge injection layer/light-emitting layer/charge injection layer/cathode h) anode/charge injection layer/hole transport layer/light-emitting layer/cathode i) anode/hole transport layer/light-emitting layer/charge injection layer/cathode j) anode/charge injection layer/hole transport layer/light-emitting layer/charge injection layer/cathode k) anode/charge injection layer/light-emitting layer/electron transport layer/cathode l) anode/light-emitting layer/electron transport layer/charge injection layer/cathode m) anode/charge injection layer/light-emitting layer/electron transport layer/charge injection layer/cathode n) anode/charge injection layer/hole transport layer/light-emitting layer/electron transport layer/cathode o) anode/hole transport layer/light-emitting layer/electron transport layer/charge injection layer/cathode p) anode/charge injection layer/hole transport layer/light-emitting layer/electron transport layer/charge injection layer/cathode In each of these structures, for example, a hole transport layer may be provided between a light-emitting layer and an anode so as to be in contact with the light-emitting layer.

Examples of the charge injection layer include a layer containing a conductive polymer, a layer provided between an anode and a hole transport layer and containing a material having an ionization potential, which is an intermediate value between that of an anode material and that of a hole transport material contained in a hole transport layer, and a layer provided between a cathode and an electron transport layer and containing a material having an electron affinity value, which is an intermediate value between that of a cathode material and an electron transport material contained in the electron transport layer.

When the charge injection layer is a layer containing a conductive polymer, the electric conductivity of the conductive polymer is preferably $1 \times 10^{-5}$ S/cm to $1 \times 10^{3}$ S/cm. In order to reduce current leakage between light emitting pixels, the electric conductivity is more preferably $1 \times 10^{-5}$ S/cm to $1 \times 10^{2}$ S/cm and further preferably $1 \times 10^{-5}$ S/cm to $1 \times 10^{1}$ S/cm. Usually, to control the electric conductivity of a conductive polymer to fall within such a range, an appropriate amount of ion is doped into the conductive polymer.

The type of ion to be doped in a hole injection layer is anion and that to be doped in an electron injection layer is anion. Examples of the anion include a polystyrene sulfonic acid ion, an alkyl benzenesulfonic acid ion and camphorsulfonic acid ion. Examples of the cation include a lithium ion, a sodium ion, a potassium ion and a tetrabutylammonium ion.

A material to be used in a charge injection layer may be selected in consideration of materials of an electrode and the adjacent layer. Examples thereof include conductive polymers such as polyaniline and a derivative thereof, polythiophene and a derivative thereof, polypyrrole and a derivative thereof, polyphenylenevinylene and a derivative thereof, polythienylene vinylene and a derivative thereof, polyquinoline and a derivative thereof, polyquinoxaline and a derivative thereof, and a polymer having an aromatic amine structure in a main chain or side chain; metal phthalocyanine (e.g., copper phthalocyanine); and carbon.

Examples of a material for an insulating layer include metal fluorides, metal oxides and organic insulating materials. Examples of an organic EL device provided with an insulating layer include an organic EL device including an insulating layer adjacent to a cathode and an organic EL device including an insulating layer adjacent to an anode.

As the structure of such an organic EL device, the structures q) to ab) shown below are mentioned.

q) anode/insulating layer/light-emitting layer/cathode r) anode/light-emitting layer/insulating layer/cathode s) anode/insulating layer/light-emitting layer/insulating layer/cathode t) anode/insulating layer/hole transport layer/light-emitting layer/cathode u) anode/hole transport layer/light-emitting layer/insulating layer/cathode v) anode/insulating layer/hole transport layer/light-emitting layer/insulating layer/cathode w) anode/insulating layer/light-emitting layer/electron transport layer/cathode x) anode/light-emitting layer/electron transport layer/insulating layer/cathode y) anode/insulating layer/light-emitting layer/electron transport layer/insulating layer/cathode z) anode/insulating layer/hole transport layer/light-emitting layer/electron transport layer/cathode aa) anode/hole transport layer/light-emitting layer/electron transport layer/insulating layer/cathode ab) anode/insulating layer/hole transport layer/light-emitting layer/electron transport layer/insulating layer/cathode In each of these structures, for example, a hole transport layer may be provided between a light-emitting layer and an anode so as to be in contact with the light-emitting layer.

As a substrate for forming an organic EL device according to the electroluminescence device embodiment of the invention, any substrate may be used as long as it is not chemically changed in forming an electrode and an organic layer. Examples thereof include substrates formed of a material such as glass, plastic, a polymer film and silicon. In the case of an opaque substrate, it is preferable that the opposite electrode is transparent or semitransparent.

At least one of an anode and a cathode contained in an organic EL device according to the electroluminescence device embodiment of the invention is usually transparent or semitransparent; however, it is preferable that the anode is transparent or semitransparent.

Examples of the material for an anode include a conductive metal oxide film and a semitransparent metal film. More specifically, a film formed of a conductive compound such as indium oxide, zinc oxide, tin oxide and a complex thereof such as indium.tin.oxide (ITO) and indium.zinc.oxide; NESA, gold, platinum, silver and copper. Of them, ITO, indium.zinc.oxide and tin oxide are preferable. Examples of a film-formation method include a vacuum vapor deposition method, a sputtering method, an ion plating method and a plating method. As the anode, a transparent conductive layer formed of an organic compound such as polyaniline and a derivative thereof and polythiophene and a derivative thereof may be used. The anode may have a laminate structure formed of two layers or more.

The thickness of an anode, which can be selected in consideration of light transmissivity and electric conductivity, is, for example, 10 nm to 10 μm, preferably 20 nm to 1 μm, and more preferably 40 nm to 500 nm.

To facilitate charge injection, a layer formed of e.g., a phthalocyanine derivative, a conductive polymer or carbon; and/or an insulating layer formed of a metal oxide, a metal fluoride or an organic insulating material, on an anode.

As a material for a cathode, a material with a small work function is preferable. A metal such as lithium, sodium, potassium, rubidium, cesium, beryllium, magnesium, calcium, strontium, barium, aluminium, scandium, vanadium, zinc, yttrium, indium, cerium, samarium, europium, terbium and ytterbium, or an alloy formed of two metals or more selected from these, or an alloy between one or more metals selected from these and at least one of e.g., gold, silver, platinum, copper, manganese, titanium, cobalt, nickel, tungsten and tin, and graphite and graphite interlayer compound are used. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy. A cathode may have a laminate structure of two layers or more.

The thickness of a cathode, which can be controlled in consideration of electric conductivity and durability, is for example, 10 nm to 10 µm, preferably 20 nm to 1 µm, and more preferably 50 nm to 500 nm.

As a method for forming a cathode, e.g., a vacuum vapor deposition method, a sputtering method or a laminate method in which metal films are bonded by thermal compression is used. Furthermore, between a cathode and an organic layer (more specifically, any one of the layers containing a polymer compound according to the electroluminescence device embodiment of the invention), a layer formed of a conductive polymer or a layer formed of e.g., a metal oxide, a metal fluoride or an organic insulating material and having an average thickness of 2 nm or less may be provided. Alternatively, after a cathode is formed, a protection layer for protecting an organic EL device may be provided. To use an organic EL device stably for a long time, it is preferable that a protection layer and/or a protection cover is provided in order to protect a device from the outside.

As the protection layer, e.g., a polymer compound, a metal oxide, a metal fluoride and a metal borate can be used. As the protection cover, e.g., a metal plate, a glass plate and a plastic plate having a surface to which a treatment for reducing water permeability is applied can be used. A method of bonding the protection cover to a device substrate with a thermosetting resin or a light curing resin airtight is preferably used. When the space is maintained by use of a spacer, damage of the device can be easily prevented. When the space is filled with an inert gas such as nitrogen or argon, oxidation of the cathode can be prevented. Furthermore, when a drying agent such as barium oxide is placed in the space, it is easily prevent water adsorbed during a manufacturing step or a small amount of water which penetrates through a cured resin, from damaging a device. Of these counter measures, it is preferable to take at least one of the measures.

FIG. 1 is a schematic sectional view showing a structure of an organic EL device according to the electroluminescence device embodiment of the invention (organic EL device having the above structure (p)). FIG. 1 shows an organic EL device 200, which has a substrate 20, and an anode 22, a charge injection layer 23, a hole transport layer 24, a light-emitting layer 25, an electron transport layer 26, a charge injection layer 27 and a cathode 28, which are formed on the substrate 20. The anode 22 is provided on the substrate 20 so as to be in contact with the substrate 20. On the opposite side of the anode 22 to the side facing the substrate 20, the charge injection layer 23, hole transport layer 24, light-emitting layer 25, electron transport layer 26, charge injection layer 27 and cathode 28 are laminated in this order. The hole transport layer 24 contains a polymer compound according to the electroluminescence device embodiment of the invention.

Figure 2:
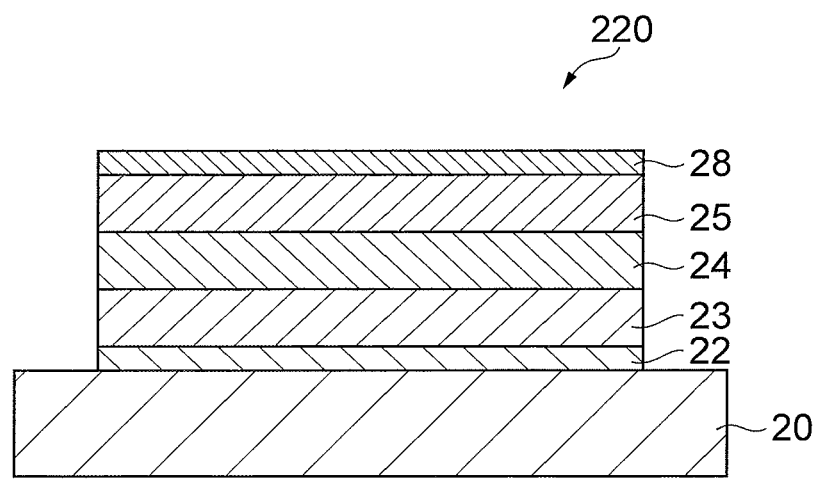
FIG. 2 is a schematic sectional view of an organic EL device (constitution h).

FIG. 2 is a schematic sectional view of an organic EL device according to the electroluminescence device embodiment of the invention (organic EL device having the above structure (h)). FIG. 2 shows an organic electroluminescence device 220, which has a substrate 20, and an anode 22, a charge injection layer 23, a hole transport layer 24, a light-emitting layer 25 and cathode 28, which are formed on the substrate 20. The anode 22 is provided on the substrate 20 so as to be in contact with the substrate 20. On the opposite side of the anode 22 to the side facing the substrate 20, the charge injection layer 23, hole transport layer 24, light-emitting layer 25 and cathode 28 are laminated in this order. The hole transport layer 24 contains a polymer compound according to the electroluminescence device embodiment of the invention.

[Surface Light Source, Display Apparatus]

An organic EL device according to the electroluminescence device embodiment of the invention is useful as a surface light source and a backlight of a segment display apparatus, a dot matrix display apparatus and a liquid crystal display apparatus.

To obtain surface light emission by using an organic EL device according to the electroluminescence device embodiment of the invention, a planar anode and a planar cathode are arranged so as to be overlapped with each other. Furthermore, to obtain a patterned light emission, there are a method of providing a patterned mask having shaped windows on the surface of a surface organic EL device, a method of forming an extremely thick layer on the portion from which no light emission is desired to thereby substantially emit no light, and a method of forming a patterned anode or cathode, or patterned anode and cathode. By forming patterns by any one of these methods and arranging some electrodes such that they can be independently turned ON/OFF, a segment type display apparatus that can display e.g., numbers, letters or simple symbols can be obtained. Furthermore, to form a dot matrix display apparatus, both an anode and a cathode are formed in the shape of a stripe and arranged so as to be crossed in perpendicular to each other. By a method of separately applying a plurality of polymer fluorescent substances emitting different colors or a method of using a color filter or a fluorescence conversion filter, partial color display and multicolor display can be made. A dot matrix device can be operated in accordance with a passive matrix driving system or an active matrix driving system in combination with e.g., TFT. These display apparatuses can be used as display apparatuses of computers, televisions, mobile terminals, mobile phones, car navigations and view finders of video cameras.

Furthermore, a surface organic EL device, which is a self-luminous thin type device, can be preferably used as a surface light source for a backlight of a liquid crystal display apparatus or a surface illumination light source. Furthermore, when a flexible substrate is employed, the surface organic EL device can be used also as a curved light source or display apparatus.

Figure 3:
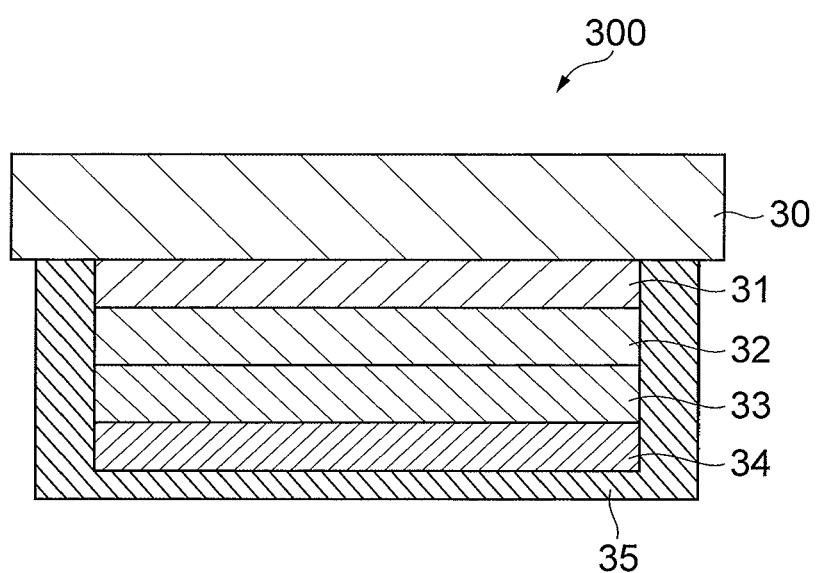
FIG. 3 is a schematic sectional view of a surface light source.

FIG. 3 is a schematic sectional view of a surface light source according to the electroluminescence device embodiment of the invention. FIG. 3 shows a surface light source 300, which is constituted of a substrate 30, an anode 31, a hole transport layer 32, a light-emitting layer 33, a cathode 34 and a protection layer 35. The anode 31 is provided on the substrate 30 so as to be in contact with the substrate 30. On the opposite side of the anode 31 to the side facing the substrate 30, the hole transport layer 32, light-emitting layer 33 and cathode 34 are laminated in this order. Furthermore, the protection layer 35 is formed so as to cover all of the anode 31, hole transport layer 32, light-emitting layer 33 and cathode 34 formed on the substrate 30 and so as to be in contact with the substrate 30 at ends. The hole transport layer 32 contains a polymer compound according to the electroluminescence device embodiment of the invention.

The surface light source 300 shown in FIG. 3 further has a plurality of light-emitting layers other than the light-emitting layer 33. When the light-emitting layers are formed of a red light-emitting material, a blue light-emitting material and a green light-emitting material, and separately controlled, a color display apparatus can be obtained.

Next, embodiments of a photoelectric conversion device using a polymer compound according to the present invention (hereinafter, also referred to as "photoelectric conversion device embodiment") will be more specifically described.

[Definition of Term]

Common terms used in the photoelectric conversion device embodiments of the invention will be specified, if necessary, by way of specific examples, below.

The term "unit" refers to a group derived from a compound, which is subjected to condensation polymerization when a polymer compound is synthesized by condensation polymerization.

The term "constitutional unit" refers to a unit which appears at a frequency of one or more in a polymer compound.

The term "repeating unit" refers to a unit which appears at a frequency of two or more in a polymer compound.

The term "arylene unit" means that the group derived from a compound subjected to condensation polymerization is a unit being an unsubstituted or substituted arylene group. The "arylene unit" may have a group containing a carbon cluster structure or a crosslinkable group.

The term "heteroarylene unit" means that the group derived from a compound subjected to condensation polymerization is a unit being an unsubstituted or substituted heteroarylene group. The "heteroarylene unit" may have a group containing a carbon cluster structure or a crosslinkable group.

The term "arylene group" refers to an atomic group remaining after removing two hydrogen atoms bound to carbon atoms constituting an aromatic ring, from an aromatic hydrocarbon. Herein, the arylene group may have a substituent.

The "heteroarylene group" refers to an atomic group remaining after removing two hydrogen atoms from an aromatic heterocyclic compound. Herein, the heteroarylene group may have a substituent. The "heterocyclic compound" described in the "heteroarylene group" above refers to an organic compound having a ring structure and having a hetero atom such as an oxygen atom, a nitrogen atom, a phosphorus atom, sulfur atom and a boron atom in addition to the carbon atoms, as the elements constituting the ring.

The term "carbon cluster" refers to a molecule in which a minimum structure is constituted of from several to several thousands of carbon atoms. For example, a fullerene molecule having a spherical shell structure, a cylindrical carbon nanotube and carbon nano-horn are mentioned.

The term "carbon cluster structure" refers to a structure derived from a carbon cluster.

The "crosslinkable group" refers to a group containing a functional group capable of binding to a carbon cluster through e.g., the Diels-Alder reaction and the Bingel-Hirsh reaction.

The term "$C_x$ to $C_y$" (x, y are positive integers satisfying x<y) means that the number of carbon atoms of the partial structure represented by the name of a functional group described immediately after the term is x to y. To describe more specifically, when the name of the organic group described immediately after "$C_x$ to $C_y$" is a combination of a plurality of the names of functional groups (for example, $C_x$ to $C_y$ alkoxyphenyl group), the number of carbon atoms of the partial structure represented by the name of a functional group described immediately after the term (for example, alkoxy group) of the plurality of the names of the functional groups, is meant to be x to y. For example, a "$C_1$ to $C_{12}$ alkyl group" refers to an alkyl group having 1 to 12 carbon atoms; and a "$C_1$ to $C_{12}$ alkoxyphenyl group" refers to a phenyl group having "an alkoxy group of 1 to 12 carbon atoms".

The term "an unsubstituted or substituted" means that the group described immediately after the term may have a substituent. For example, "an unsubstituted or substituted arylene group" refers to "an arylene group having no substituent or an arylene group having a substituent".

Examples of the substituent include an alkyl group, an alkoxy group, an alkylthio group, an aryl group, an aryloxy group, an arylthio group, an alkenyl group, an alkynyl group, an amino group, a silyl group, a halogen atom, an acyl group, an acyloxy group, a monovalent heterocyclic group, a monovalent heterocyclic thio group, an imine residue, an amide compound residue, an acid imide residue, an alkoxycarbonyl group, a carboxyl group, a nitro group and a cyano group. Hereinafter, as examples of a "substituent", the same ones can be mentioned, if otherwise specified. Furthermore, in some cases, these substituents may further have a "substituent".

The alkyl group as a substituent may be any one of a linear alkyl group, a branched alkyl group and a cyclic alkyl group (cycloalkyl group). A hydrogen atom of an alkyl group may be substituted with a fluorine atom. Examples of the alkyl group include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, a dodecyl group, a trifluoromethyl group, a pentafluoroethyl group, a perfluorobutyl group, a perfluorohexyl group and a perfluorooctyl group. Examples of the $C_1$ to $C_{12}$ alkyl group include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group and a dodecyl group.

The alkoxy group as a substituent may be any one of a linear alkoxy group, a branched alkoxy group and a cyclic alkoxy group (cycloalkoxy group).

A hydrogen atom of the alkoxy group may be substituted with a fluorine atom. Examples of the alkoxy group include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a dodecyloxy group, a trifluoromethoxy group, a pentafluoroethoxy group, a perfluorobutoxy group, a perfluorohexyloxy group, a perfluorooctyloxy group, a methoxymethyloxy group and a 2-methoxyethyloxy group. Examples of a $C_1$ to $C_{12}$ alkoxy group include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group and a dodecyloxy group.

The alkylthio group as a substituent may be any one of a linear alkylthio group, a molecule chain-form alkylthio group and a cyclic alkylthio group (cycloalkylthio group). A hydrogen atom of the alkylthio group may be substituted with a fluorine atom. Examples of the alkylthio group include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a dodecylthio group and a trifluoromethylthio group. Examples of a $C_1$ to $C_{12}$ alkylthio group include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group and a dodecylthio group.

The aryl group as a substituent refers to an atomic group remaining after removing a single hydrogen atom bound to one of carbon atoms constituting an aromatic ring from an aromatic hydrocarbon. The aryl group includes a group having a condensed ring and a group in which two or more independent benzene rings or condensed rings are bound via a single bond. The hydrogen atoms of the aryl group may be further substituted with e.g., an alkyl group and an aryl group as mentioned above. Examples of the aryl group include a phenyl group, a $C_1$ to $C_{12}$ alkoxyphenyl group, a $C_1$ to $C_{12}$ alkylphenyl group, a 1-naphthyl group, a 2-naphthyl group, a 1-anthracenyl group, a 2-anthracenyl group, a 9-anthracenyl group, a 2-fluorenyl group, a pentafluorophenyl group, a biphenylyl group, a $C_1$ to $C_{12}$ alkoxybiphenylyl group and a $C_1$ to $C_{12}$ alkylbiphenylyl group.

As the aryl moiety of an aryloxy group, the same examples as mentioned above as the aryl group are mentioned. Examples of the aryloxy group as a substituent include a phenoxy group, a $C_1$ to $C_{12}$ alkoxyphenoxy group, a $C_1$ to $C_{12}$ alkylphenoxy group, a 1-naphthyloxy group, a 2-naphthyloxy group and a pentafluorophenyloxy group.

As the aryl moiety of an arylthio group, the same examples above as mentioned as the aryl group are mentioned. Examples of the arylthio group as a substituent include a phenylthio group, a $C_1$ to $C_{12}$ alkoxyphenylthio group, a $C_1$ to $C_{12}$ alkylphenylthio group, a 1-naphthylthio group, a 2-naphthylthio group and a pentafluorophenylthio group.

The alkenyl group as substituent may be any one of a linear alkenyl group, a branched alkenyl group and a cyclic alkenyl group. Examples of the alkenyl group include a vinyl group, 1-propenyl group, a 2-propenyl group, a 1-butenyl group, a 2-butenyl group, a 1-pentenyl group, a 2-pentenyl group, a 1-hexenyl group, a 2-hexenyl group and a 1-octenyl group.

The alkynyl group as a substituent may be any one of a linear alkynyl group, branched alkynyl group and a cyclic alkynyl group. Examples of the alkynyl group include an ethynyl group, 1-propynyl group, a 2-propynyl group, a 1-butynyl group, a 2-butynyl group, a 1-pentynyl group, a 2-pentynyl group, a 1-hexynyl group, a 2-hexynyl group and a 1-octynyl group.

The amino group as a substituent includes not only a group represented by —$NH_2$ but also an amino group in which one or two hydrogen atoms are substituted with substituents (i.e., "substituted amino group"). Examples of the substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a heptylamino group, an octylamino group, a 2-ethylhexylamino group, a nonylamino group, a decylamino group, a 3,7-dimethyloctylamino group, a dodecylamino group, a cyclopentylamino group, a dicyclopentylamino group, a cyclohexylamino group, a dicyclohexylamino group, a ditrifluoromethylamino group, a phenylamino group, a diphenylamino group, a $C_1$ to $C_{12}$ alkoxyphenylamino group, a bis($C_1$ to $C_{12}$ alkoxyphenyl)amino group, a $C_1$ to $C_{12}$ alkylphenylamino group, a bis($C_1$ to $C_{12}$ alkylphenyl)amino group, a 1-naphthylamino group, a 2-naphthylamino group, a pentafluorophenylamino group, a pyridylamino group, a pyridazinylamino group, a pyrimidinylamino group, a pyrazinylamino group, a triazinylamino group, a phenyl-$C_1$ to $C_{12}$ alkylamino group, a $C_1$ to $C_{12}$ alkoxyphenyl-$C_1$ to $C_{12}$ alkylamino group, a di($C_1$ to $C_{12}$ alkoxyphenyl-$C_1$ to $C_{12}$ alkyl)amino group, a $C_1$ to $C_{12}$ alkylphenyl-$C_1$ to $C_{12}$ alkylamino group, a di($C_1$ to $C_{12}$ alkylphenyl-$C_1$ to $C_{12}$ alkyl)amino group, a 1-naphthyl-$C_1$ to $C_{12}$ alkylamino group and a 2-naphthyl-$C_1$ to $C_{12}$ alkylamino group.

Examples of the silyl group as a substituent include not only a group represented by —$SiH_3$ but also a silyl group in which one to three hydrogen atoms are substituted with substituents (hereinafter, also referred to as a "substituted silyl group"). Examples of the substituted silyl group include a trimethylsilyl group, a triethylsilyl group, a tripropylsilyl group, a tri-isopropylsilyl group, a dimethyl-isopropylsilyl group, a diethyl-isopropylsilyl group, a tert-butyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloetyl-dimethylsilyl group, a dodecyldimethylsilyl group, a phenyl-$C_1$ to $C_{12}$ alkylsilyl group, a $C_1$ to $C_{12}$ alkoxyphenyl-$C_1$ to $C_{12}$ alkylsilyl group, a $C_1$ to $C_{12}$ alkylphenyl-$C_1$ to $C_{12}$ alkylsilyl group, a 1-naphthyl-$C_1$ to $C_{12}$ alkylsilyl group, a 2-naphthyl-$C_1$ to $C_{12}$ alkylsilyl group, a phenyl-$C_1$ to $C_{12}$ alkyldimethylsilyl group, a triphenylsilyl group, a tri-p-xylylsilyl group, a tribenzylsilyl group, a diphenylmethylsilyl group, a tert-butyldiphenylsilyl group and a dimethylphenylsilyl group.

Examples of the halogen atom as a substituent include a fluorine atom, a chlorine atom, a bromine atom and an iodine atom.

Examples of the acyl group as a substituent include an acetyl group, a propionyl group, a butyryl group, an isobutyryl group, a pivaloyl group, a benzoyl group, a trifluoroacetyl group and a pentafluorobenzoyl group.

Examples of the acyloxy group as a substituent include an acetoxy group, a propionyloxy group, a butyryloxy group, an isobutyryloxy group, a pivaloyloxy group, a benzoyloxy group, a trifluoroacetyloxy group and a pentafluorobenzoyloxy group.

The monovalent heterocyclic group as a substituent refers to an atomic group remaining after removing a single hydrogen atom from a heterocyclic compound (particularly, a heterocyclic compound with aromaticity). The "heterocyclic compound" described in the "monovalent heterocyclic group" above, refers to an organic compound having a ring structure and having a hetero atom such as an oxygen atom, a sulfur atom, a nitrogen atom, a phosphorus atom and a boron atom in addition to the carbon atoms serving as elements constituting a ring. Examples of the monovalent heterocyclic group include a thienyl group, a $C_1$ to $C_{12}$ alkylthienyl group, a pyrrolyl group, a furyl group, a pyridyl group, a $C_1$ to $C_{12}$ alkylpyridyl group, a pyridazinyl group, a pyrimidinyl group, a pyrazinyl group, a triazinyl group, a pyrrolidyl group, a piperidyl group, a quinolyl group and an isoquinolyl group. The hydrogen atoms in these monovalent heterocyclic groups, may be further substituted with e.g., an alkyl group and an alkoxy group as mentioned above.

The monovalent heterocyclic thio group as a substituent refers to a group in which the hydrogen atom of a mercapto group is substituted with a monovalent heterocyclic group.

Examples of the monovalent heterocyclic thio group include heteroarylthio groups such as a pyridylthio group, a pyridazinylthio group, a pyrimidinylthio group, a pyrazinylthio group and a triazinylthio group.

The imine residue as a substituent refers to a residue remaining after removing a hydrogen atom from an imine compound having a structure represented by at least one of formula: H—N=C($R^{Y1}$)$_2$ and formula: H—C$R^{X1}$=N—$R^{Y1}$. In the formula, $R^{X1}$ represents a hydrogen atom, an alkyl group, an aryl group, an arylalkyl group, an arylalkenyl group or an arylalkynyl group; and $R^{Y1}$ represents a hydrogen atom, an alkyl group, an aryl group, an arylalkyl group, an arylalkenyl group or an arylalkynyl group. Note that, when there are two $R^{Y1}$, they may be the same or different, and may be mutually joined into one to form a ring as a divalent group, for example, an alkylene group having 2 to 18 carbon atoms such as an ethylene group, a trimethylene group, a tetramethylene group, a pentamethylene group and a hexamethylene group. As such an imine compound, aldimine, ketimine or a compound remaining after substituting the hydrogen atom bound to the nitrogen atom in aldimine with a substituent such as an alkyl group, an aryl group, an arylalkyl group, an arylalkenyl group and an arylalkynyl group, may be mentioned. Specific examples of the imine residue include the groups represented by the following structural formulas.

[Chemical Formula 54]

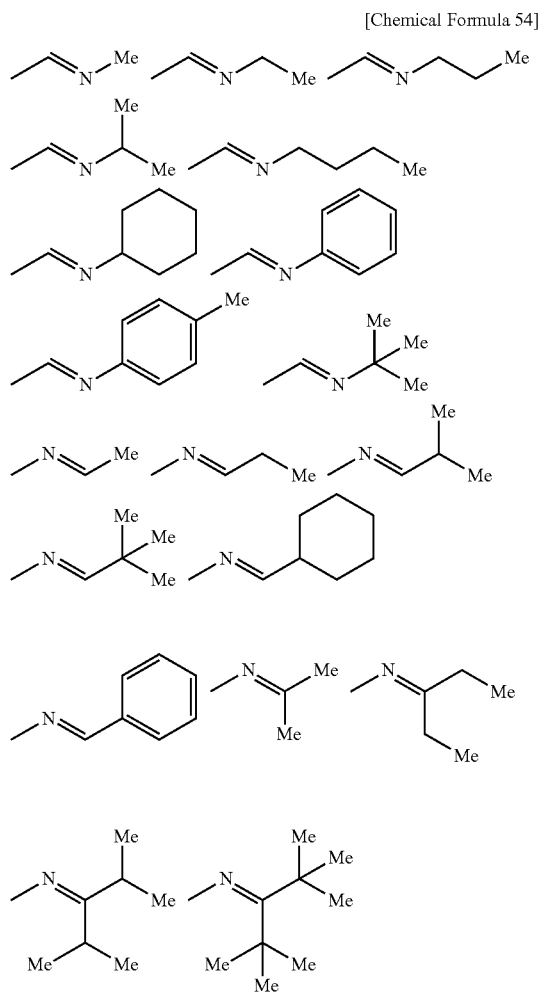

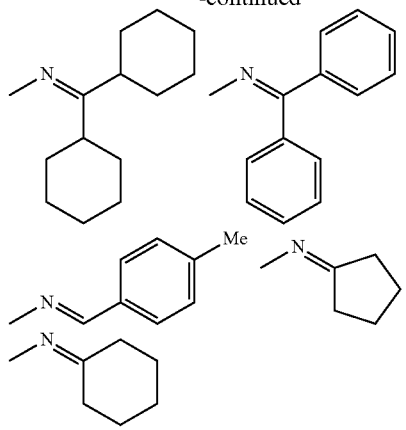

The amide compound residue as a substituent refers to a residue remaining after removing a hydrogen atom from an amide compound having a structure represented by at least one of formula: H—N$R^{X2}$—CO$R^{Y2}$ and formula: H—CO—N($R^{Y2}$)$_2$. In the formula, $R^{X2}$ represents a hydrogen atom, an alkyl group, an aryl group, an arylalkyl group, an arylalkenyl group or an arylalkynyl group; and $R^{Y2}$ represents a hydrogen atom, an alkyl group, an aryl group, an arylalkyl group, an arylalkenyl group or an arylalkynyl group. Examples of the amide compound residue include a formamide residue, an acetamide residue, a propioamide residue, a butyroamide residue, a benzamide residue, a trifluoroacetamide residue, a pentafluorobenzamide residue, a diformamide residue, a diacetamide residue, a dipropioamide residue, a dibutyroamide residue, a dibenzamide residue, a ditrifluoroacetamide residue and a dipentafluorobenzamide residue.

The acid imide residue as a substituent refers to a residue remaining after removing a single hydrogen atom bound to a nitrogen atom from an acid imide. Examples of the acid imide residue include the following groups.

[Chemical Formula 55]

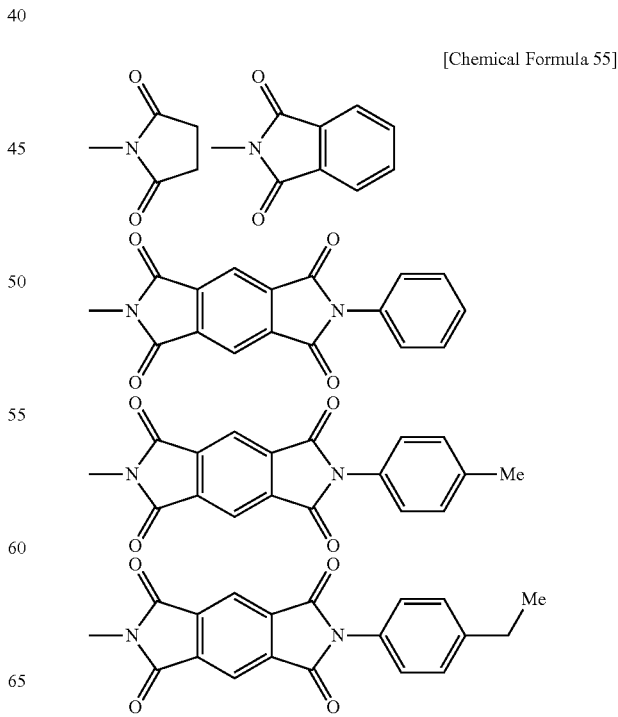

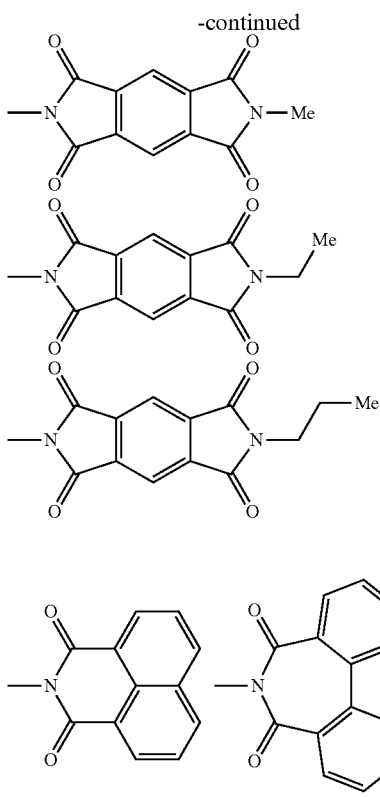

The alkoxycarbonyl group as a substituent refers to a group represented by formula: $R^{X3}OCO-$. In the formula, $R^{X3}$ represents a hydrogen atom, an alkyl group, an aryl group, an arylalkyl group, an arylalkenyl group or an arylalkynyl group. Examples of the alkoxycarbonyl group include a methoxycarbonyl group, an ethoxycarbonyl group and a n-propoxycarbonyl group.

[Polymer Compound According to Photoelectric Conversion Device Embodiment]

The polymer compound according to the photoelectric conversion device embodiment of the invention contains at least one unit selected from the group consisting of an arylene unit and a heteroarylene unit as a repeating unit and at least a part of the repeating unit has a group containing a carbon cluster structure.

The polymer compound according to the photoelectric conversion device embodiment of the invention refers also to a polymer compound having a group containing a carbon cluster structure in a side chain and the following repeating unit in the main chain.

[Chemical Formula 56]

In formula (100), Ar represents an unsubstituted or substituted arylene group, or an unsubstituted or substituted heteroarylene group.

As the group containing a carbon cluster structure, for example, a group having a structure represented by the following formula (110) is mentioned.

[Chemical Formula 57]

[In formula (110), $Z^{11}$ and $Z^{12}$ each independently represent a single bond, an unsubstituted or substituted alkylene group having 1 to 20 carbon atoms, an unsubstituted or substituted arylene group having 6 to 20 carbon atoms, an unsubstituted or substituted heteroarylene group having 4 to 20 carbon atoms, a vinylene group and a divalent group of a combination thereof; V represents a single bond, an oxygen atom or a sulfur atom; s and u each independently represent an integer of 0 to 10; and A' represents a group remaining after removing a hydrogen atom from a fullerene derivative.]

Examples of the unsubstituted or substituted alkylene group having 1 to 20 carbon atoms include a methylene group, an ethylene group, a propylene group, a butylene group, a pentylene group, a hexylene group, a heptylene group, an octylene group, a nonylene group, a decalene group, a dodecalene group, a pentadodecalene group and groups obtained by adding a substituent to these groups. Examples of the unsubstituted or substituted arylene group having 6 to 20 carbon atoms include a phenylene group, a biphenylene group, a naphthylene group, a triphenylene group and groups obtained by adding a substituent to these groups. Examples of the unsubstituted or substituted heteroarylene group having 4 to 20 carbon atoms include a thienylidene group, a pyridinylene group, a furanylidene group and groups obtained by adding a substituent to these groups.

$Z^{11}$ and $Z^{12}$ each are preferably an alkylene group or an arylene group, further preferably an alkylene group, particularly preferably a methylene group, an ethylene group, a butylene group or a hexylene group.

V represents a direct bond, an oxygen atom or a sulfur atom, preferably a direct bond or an oxygen atom, and particularly preferably a direct bond.

Reference symbol s is preferably an integer of 0 to 4, further preferably an integer of 0 to 2, and particularly preferably 0. Reference symbol u is preferably an integer of 0 to 4, further preferably an integer of 0 to 2, and particularly preferably 1.

As the group remaining after removing a single hydrogen atom from a fullerene derivative, a group remaining after removing a single hydrogen atom from a derivative of fullerene C60, a group remaining after removing a single hydrogen atom from a derivative of fullerene C70, a group remaining after removing a single hydrogen atom from a derivative of fullerene C76, a group remaining after removing a single hydrogen atom from a derivative of fullerene C78, or a group remaining after removing a single hydrogen atom from a derivative of fullerene C84 is mentioned. Preferably a group remaining after removing a single hydrogen atom from a derivative of fullerene C60, a group remaining after removing a single hydrogen atom from a derivative of fullerene C70 or a group remaining after removing a single hydrogen atom from a derivative of fullerene C84, and further preferably a group remaining after removing a single hydrogen atom from a derivative of fullerene C60 or a group remaining after removing a single hydrogen atom from a derivative of fullerene C70, is mentioned.

Herein, the fullerene derivative refers to a compound remaining after cutting a carbon-carbon bond of a skeleton constituting a fullerene and the two bonds are substituted respectively with two monovalent groups or a single divalent group. The number of carbon-carbon bonds to be cut may be one or two or more. Examples of such a fullerene derivative include compounds having the following structures represented by A-1, A-2, A-3, A-4, A-5, A-6, A-7, A-8, A-9, A-10, A-11, A-12, A-13, A-14, A-15, A-16, A-17, A-18, A-19, A-20, A-21, A-22 and A-23.

[Chemical Formula 58]
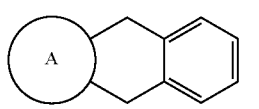 A-1
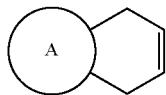 A-2
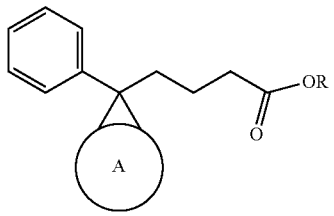 A-3
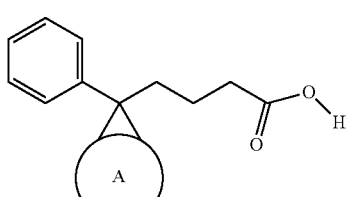 A-4
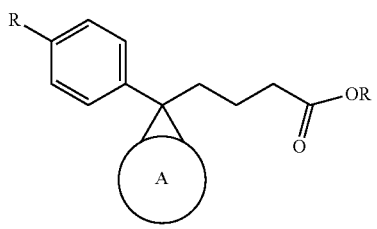 A-5
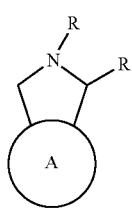 A-6
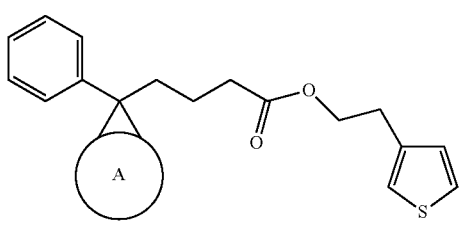 A-7
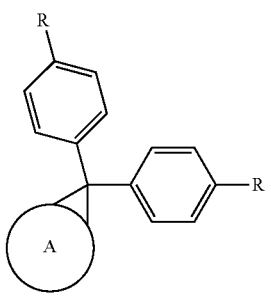 A-8
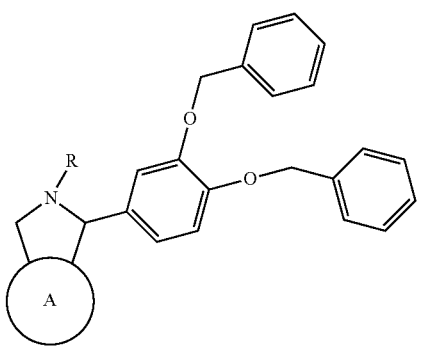 A-9
[Chemical Formula 59]
 A-10
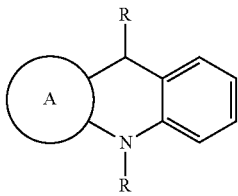 A-11
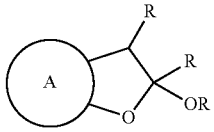 A-12
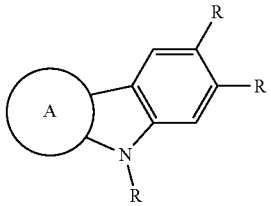 A-13
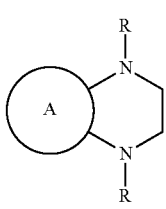 A-14

-continued

A-15
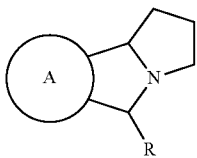

A-16
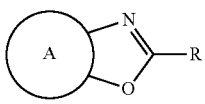

A-17
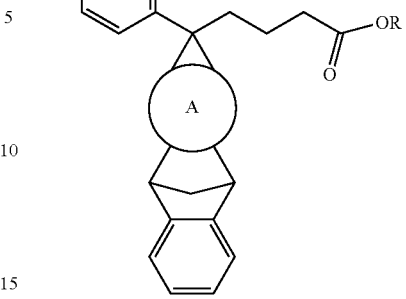

A-18
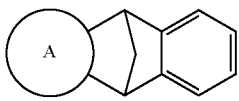

[Chemical Formula 60]

A-19
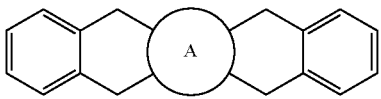

A-20
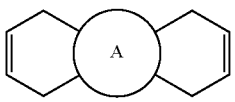

A-21
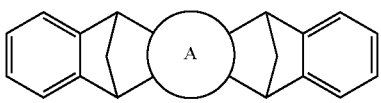

A-22
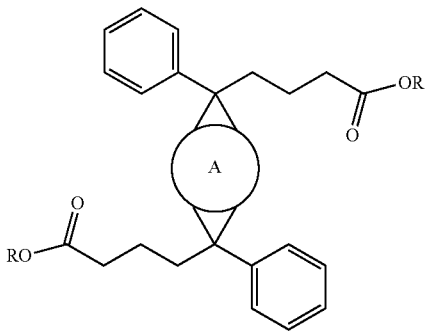

A-23
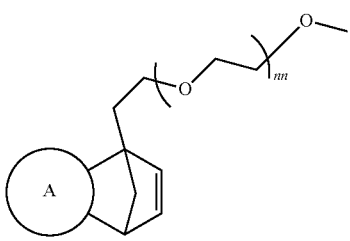

In the above formulas, ring A represents a fullerene ring in fullerene C60, fullerene C70, fullerene C76, fullerene C78, fullerene C84; R represents a hydrogen atom, a halogen atom or a monovalent organic group; and nn represents an integer of 0 to 10.

Ring A is preferably a fullerene ring of fullerene C60, fullerene C70, fullerene C84 and further preferably a fullerene ring of fullerene C60 or fullerene C70. In the above formulas, a fullerene derivative is preferably a compound having a structure represented by A-1, A-2, A-3, A-4, A-5 or A-6, further preferably a compound having a structure represented by A-1, A-2 or A-3, particularly preferably a compound having a structure represented by A-1 or A-2.

Herein, examples of a monovalent organic group represented by R include an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amide compound residue, an acid imide residue, an imine residue, an amino group, a substituted amino group, a substituted silyl group, a substituted silyloxy group, a substituted silylthio group, a substituted silylamino group, a monovalent heterocyclic group, a heterocyclic oxy group, a heterocyclic thio group, an arylalkenyl group, an arylalkynyl group, a carboxyl group and a cyano group.

The alkyl group serving as a monovalent organic group may be linear or branched alkyl group or a cycloalkyloxy group. The number of carbon atoms of the alkyl group is usually 1 to 30. Examples of the alkyl group include chain-form alkyl groups such as a methyl group, an ethyl group, a n-propyl group, an isopropyl group, a n-butyl group, an isobutyl group, a sec-butyl group, a tert-butyl group, a n-pentyl group, an isopentyl group, a 2-methylbutyl group, a 1-methylbutyl group, a n-hexyl group, an isohexyl group, a 3-methylpentyl group, a 2-methylpentyl group, a 1-methylpentyl group, a heptyl group, an octyl group, an isooctyl group, a 2-ethylhexyl group, a 3,7-dimethyloctyl group, a nonyl group, a decyl group, an undecyl group, a dodecyl group, a tetradecyl group, a hexadecyl group, an octadecyl group and an eicosyl group; and cycloalkyl groups such as a cyclopentyl group, a cyclohexyl group and an adamantyl group.

The alkyloxy group serving as a monovalent organic group may be linear or branched alkyloxy group or a cycloalkyloxy group. The alkyloxy group may have a substituent. The number of carbon atoms of the alkyloxy group is usually 1 to 20. Examples of the alkyloxy group include a methoxy group, an ethoxy group, a propyloxy group, an isopropyloxy group, a butoxy group, an isobutoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyl group, a perfluorooctyl group, a methoxymethyloxy group and a 2-methoxyethyloxy group.

The alkylthio group serving as a monovalent organic group may be linear or branched alkylthio group or a cycloalkylthio group. The alkyloxy group may have a substituent. The number of carbon atoms of the alkylthio group is usually 1 to 20. Examples of the alkylthio group include a methylthio group, an ethylthio group, a propylthio group, an isopropylthio group, a butylthio group, an isobutylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group and a trifluoromethylthio group.

The aryl group serving as a monovalent organic group usually has 3 to 60 carbon atoms and may have a substituent. Examples of the aryl group include a phenyl group, a $C_1$ to $C_{12}$ alkyloxyphenyl group, a $C_1$ to $C_{12}$ alkylphenyl group, a 1-naphthyl group, a 2-naphthyl group and a pentafluorophenyl group.

The aryloxy group serving as a monovalent organic group usually has 3 to 60 carbon atoms and may have a substituent on the aromatic ring. Examples of the aryloxy group include a phenoxy group, a $C_1$ to $C_{12}$ alkyloxyphenoxy group, a $C_1$ to $C_{12}$ alkylphenoxy group, a 1-naphthyloxy group, a 2-naphthyloxy group and a pentafluorophenyloxy group.

The arylthio group serving as a monovalent organic group usually has 3 to 60 carbon atoms and may have a substituent on the aromatic ring. Examples of the arylthio group include a phenylthio group, a $C_1$ to $C_{12}$ alkyloxyphenylthio group, a $C_1$ to $C_{12}$ alkylphenylthio group, a 1-naphthylthio group, a 2-naphthylthio group and a pentafluorophenylthio group.

The arylalkyl group serving as a monovalent organic group usually has 7 to 60 carbon atoms and may have a substituent. Examples of the arylalkyl group include a phenyl-$C_1$ to $C_{12}$ alkyl group, a $C_1$ to $C_{12}$ alkyloxyphenyl-$C_1$ to $C_{12}$ alkyl group, a $C_1$ to $C_{12}$ alkyl phenyl-$C_1$ to $C_{12}$ alkyl group, a 1-naphthyl-$C_1$ to $C_{12}$ alkyl group and a 2-naphthyl-$C_1$ to $C_{12}$ alkyl group.

The arylalkyloxy group serving as a monovalent organic group usually has 7 to 60 carbon atoms and may have a substituent. Examples of the arylalkyloxy group include a phenyl-$C_1$ to $C_{12}$ alkyloxy group, a $C_1$ to $C_{12}$ alkyloxyphenyl-$C_1$ to $C_{12}$ alkyloxy group, a $C_1$ to $C_{12}$ alkyl phenyl-$C_1$ to $C_{12}$ alkyloxy group, a 1-naphthyl-$C_1$ to $C_{12}$ alkyloxy group and a 2-naphthyl-$C_1$ to $C_{12}$ alkyloxy group.

The arylalkylthio group serving as a monovalent organic group usually has 7 to 60 carbon atoms and may have a substituent. Examples of the arylalkylthio group include a phenyl-$C_1$ to $C_{12}$ alkylthio group, a $C_1$ to $C_{12}$ alkyloxyphenyl-$C_1$ to $C_{12}$ alkylthio group, a $C_1$ to $C_{12}$ alkyl phenyl-$C_1$ to $C_{12}$ alkylthio group, a 1-naphthyl-$C_1$ to $C_{12}$ alkylthio group and a 2-naphthyl-$C_1$ to $C_{12}$ alkylthio group.

The acyl group serving as a monovalent organic group usually has 2 to 20 carbon atoms. Examples of the acyl group include an acetyl group, a propionyl group, a butyryl group, an isobutyryl group, a pivaloyl group, a benzoyl group, a trifluoroacetyl group and a pentafluorobenzoyl group.

The acyloxy group serving as a monovalent organic group usually has 2 to 20 carbon atoms. Examples of the acyloxy group include an acetoxy group, a propionyloxy group, a butyryloxy group, an isobutyryloxy group, a pivaloyloxy group, a benzoyloxy group, a trifluoroacetyloxy group and a pentafluorobenzoyloxy group.

The amide compound residue serving as a monovalent organic group is a residue remaining after removing a hydrogen atom from an amide compound having a structure represented by at least one of formula: H—NR$^{X2}$—COR$^{Y2}$ and formula: H—CO—N(R$^{Y2}$)$_2$. In the formula, R$^{X2}$ represents a hydrogen atom, an alkyl group, an aryl group, an arylalkyl group, an arylalkenyl group or an arylalkynyl group; and R$^{Y2}$ represents a hydrogen atom, an alkyl group, an aryl group, an arylalkyl group, an arylalkenyl group or an arylalkynyl group. The amide compound residue usually has 2 to 20 carbon atoms. Examples of the amide compound residue include a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group and a dipentafluorobenzamide group.

The acid imide residue serving as a monovalent organic group is a residue remaining after removing a hydrogen atom bound to a nitrogen atom from an acid imide. Examples of the acid imide residue include a succinimide group, a phthalic acid imide group.

The substituted amino group serving as monovalent organic group usually has 1 to 40 carbon atoms. Examples of the substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a pyrrolidyl group, a piperidyl group, a ditrifluoromethylamino group, a phenylamino group, a diphenylamino group, a $C_1$ to $C_{12}$ alkyloxyphenylamino group, a di($C_1$ to $C_{12}$ alkyloxyphenyl)amino group, a di($C_1$ to $C_{12}$ alkylphenyl)amino group, a 1-naphthylamino group, a 2-naphthylamino group, a pentafluorophenylamino group, a pyridylamino group, a pyridazinylamino group, a pyrimidylamino group, a pyrazylamino group, a triazylamino group, a phenyl-$C_1$ to $C_{12}$ alkylamino group, a $C_1$ to $C_{12}$ alkyloxyphenyl-$C_1$ to $C_{12}$ alkylamino group, a $C_1$ to $C_{12}$ alkyl phenyl-$C_1$ to $C_{12}$ alkylamino group, a di($C_1$ to $C_{12}$ alkyloxyphenyl-$C_1$ to $C_{12}$ alkyl)amino group, a di($C_1$ to $C_{12}$ alkylphenyl-$C_1$ to $C_{12}$ alkyl)amino group, a 1-naphthyl-$C_1$ to $C_{12}$ alkylamino group and a 2-naphthyl-$C_1$ to $C_{12}$ alkylamino group.

The substituted silyl group serving as a monovalent organic group is a silyl group represented by —SiH$_3$ and a silyl group remaining after substituting one to three hydrogen atoms in —SiH$_3$ with a substituent(s). Examples of the substituted silyl group include a trimethylsilyl group, a triethylsilyl group, a tri-n-propylsilyl group, a triisopropylsilyl group, a tert-butyldimethylsilyl group, a triphenylsilyl group, a tri-p-xylylsilyl group, a tribenzylsilyl group, a diphenylmethylsilyl group, a tert-butyldiphenylsilyl group and a dimethylphenylsilyl group.

Examples of the substituted silyloxy group serving as a monovalent organic group include a trimethylsilyloxy group, a triethylsilyloxy group, a tri-n-propylsilyloxy group, a triisopropylsilyloxy group, a tert-butyldimethylsilyloxy group, a triphenylsilyloxy group, a tri-p-xylylsilyloxy group, a tribenzylsilyloxy group, a diphenylmethylsilyloxy group, a tert-butyldiphenylsilyloxy group and a dimethylphenylsilyloxy group.

Examples of the substituted silylthio group serving as a monovalent organic group include a trimethylsilylthio group, a triethylsilylthio group, a tri-n-propylsilylthio group, a triisopropylsilylthio group, a tert-butyldimethylsilylthio group, a triphenylsilylthio group, a tri-p-xylylsilylthio group, a tribenzylsilylthio group, a diphenylmethylsilylthio group, a tert-butyldiphenylsilylthio group and a dimethylphenylsilylthio group.

Examples of the substituted silylamino group serving as a monovalent organic group include a trimethylsilylamino group, a triethylsilylamino group, a tri-n-propylsilylamino group, a triisopropylsilylamino group, a tert-butyldimethylsilylamino group, a triphenylsilylamino group, a tri-p-xylylsilylamino group, a tribenzylsilylamino group, a diphenylmethylsilylamino group, a tert-butyl diphenylsilylamino group, a dimethylphenylsilylamino group, a di(trimethylsilyl)amino group, a di(triethylsilyl)amino group, a di(tri-n-propyl silyl) amino group, a di(triisopropylsilyl)amino group, a di(tert-butyl dimethylsilyl)amino group, a di(triphenylsilyl)amino group, a di(tri-p-xylylsilyl)amino group, a di(tribenzylsilyl) amino group, a di(diphenylmethylsilyl)amino group, a di(tert-butyl diphenylsilyl)amino group and a di(dimethylphenylsilyl)amino group.

Examples of the monovalent heterocyclic group serving as a monovalent organic group include groups remaining after removing a single hydrogen atom from heterocyclic compounds such as furan, thiophene, pyrrole, pyrroline, pyrrolidine, oxazole, isoxazole, thiazole, isothiazole, imidazole, imidazoline, imidazolidine, pyrazole, pyrazoline, purazolidine, furazan, triazole, thiadiazole, oxadiazole, tetrazole, pyran, pyridine, piperidine, thiopyran, pyridazine, pyrimidine, pyrazine, piperazine, morpholine, triazine, benzofuran, isobenzofuran, benzothiophene, indole, isoindole, indolizine, indoline, isoindoline, chromene, chromane, isochromane, benzopyran, quinoline, isoquinoline, quinolizine, benzimidazole, benzothiazole, indazole, naphthyridine, quinoxaline, quinazoline, quinazolidine, cinnoline, phthalazine, purine, pteridine, carbazole, xanthene, phenanthridine, acridine, β-carboline, perimidine, phenanthroline, thianthrene, phenoxathiine, phenoxazine, phenothiazine and phenazine. As the monovalent heterocyclic group, a monovalent aromatic heterocyclic group is preferable.

As the heterocyclic oxy group and heterocyclic thio group serving as a monovalent organic group, groups remaining after binding an oxygen atom and a nitrogen atom to monovalent heterocyclic groups as mentioned above are mentioned.

The heterocyclic oxy group serving as a monovalent organic group usually has 4 to 60 carbon atoms. Examples of the heterocyclic oxy group include a thienyloxy group, a $C_1$ to $C_{12}$ alkylthienyloxy group, a pyrrolyloxy group, a furyloxy group, a pyridyloxy group, a $C_1$ to $C_{12}$ alkylpyridyloxy group, a imidazolyloxy group, a pyrazolyloxy group, a triazolyloxy group, an oxazolyloxy group, a thiazoleoxy group and a thiadiazoleoxy group.

The heterocyclic thio group serving as a monovalent organic group usually has 4 to 60 carbon atoms. Examples of the heterocyclic thio group include a thienylmercapto group, a $C_1$ to $C_{12}$ alkylthienylmercapto group, a pyrrolylmercapto group, a furylmercapto group, a pyridylmercapto group, a $C_1$ to $C_{12}$ alkylpyridylmercapto group, an imidazolylmercapto group, a pyrazolylmercapto group, a triazolylmercapto group, an oxazolylmercapto group, a thiazolemercapto group and a thiadiazolemercapto group.

The arylalkenyl group serving as a monovalent organic group usually has 7 to 20 carbon atoms. Examples of the arylalkenyl group include a styryl group.

The arylalkynyl group serving as a monovalent organic group usually has 7 to 20 carbon atoms. Examples of the arylalkynyl group include a phenylacetylenyl group.

Examples of a halogen atom include a fluorine atom, a chlorine atom, a bromine atom and an iodine atom.

Examples of such a group containing a carbon cluster structure include groups represented by the following structures A'-1, A'-2, A'-3, A'-4, A'-5, A'-6, A'-7, A'-8, A'-9, A'-10, A'-11 and A'-12.

[Chemical Formula 61]

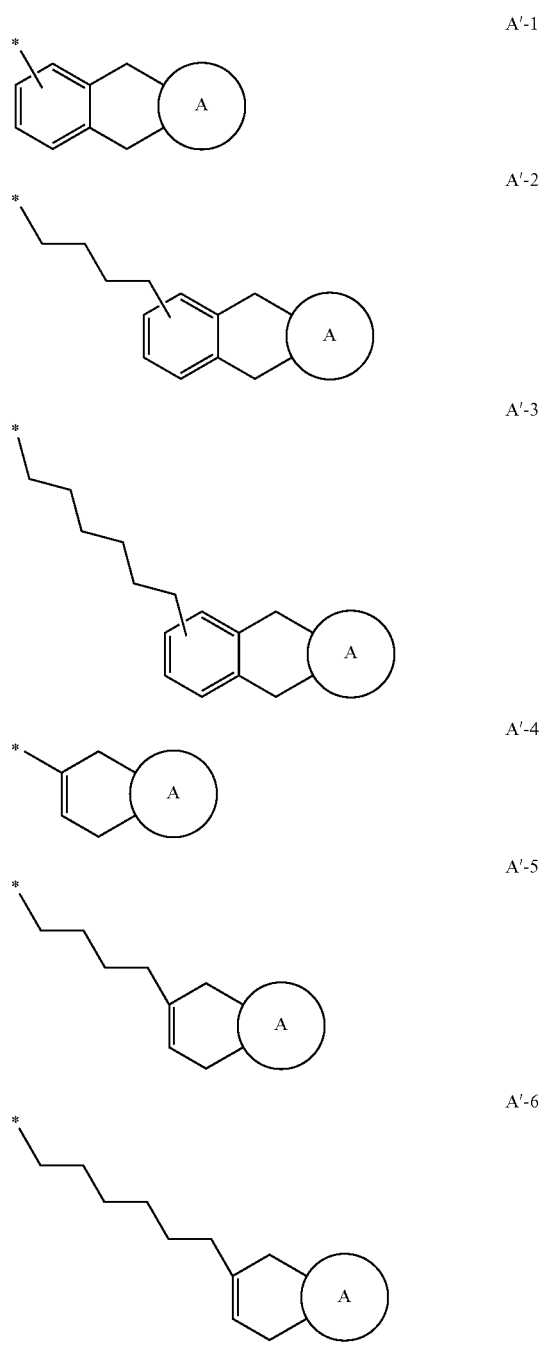

[Chemical Formula 62]

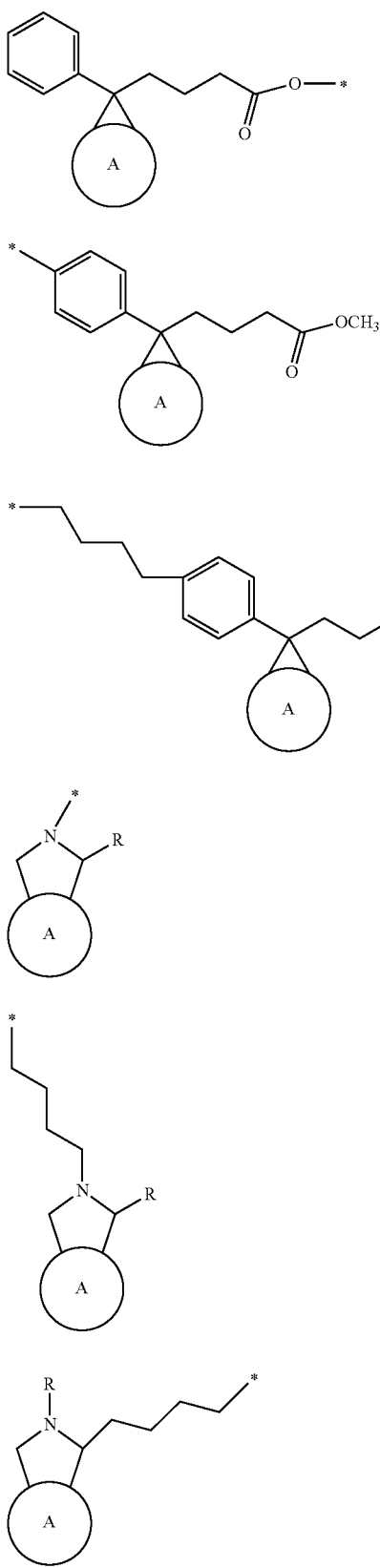

A'-7

A'-8

A'-9

A'-10

A'-11

A'-12

In the above formulas, R represents a hydrogen atom, a halogen atom or a monovalent organic group. As the halogen atom and monovalent organic group, the same examples as above can be mentioned. Ring A is the same as defined above. * indicates a bond.

The arylene group of an arylene unit serving as a repeating unit is the same as defined above.

The number of carbon atoms of the arylene group in an arylene unit with the exclusion of the number of carbon atoms of a substituent is usually 6 to 60, preferably 6 to 30, more preferably 6 to 18, and further preferably 6 to 14.

Examples of the arylene group include groups remaining after removing two hydrogen atoms from a benzene ring, a naphthalene ring, an anthracene ring, a phenanthrene ring, a tetracene ring, a chrysene ring, a triphenylene ring, a tetraphene ring, a pyrene ring, a pentacene ring, a picene ring and a perylene ring. The arylene group may have a halogen atom or a monovalent organic group. As the halogen atom and monovalent organic group, the same examples as mentioned above may be mentioned. Examples of the arylene group include groups having structures represented by the following formulas 1 to 38.

[Chemical Formula 63]

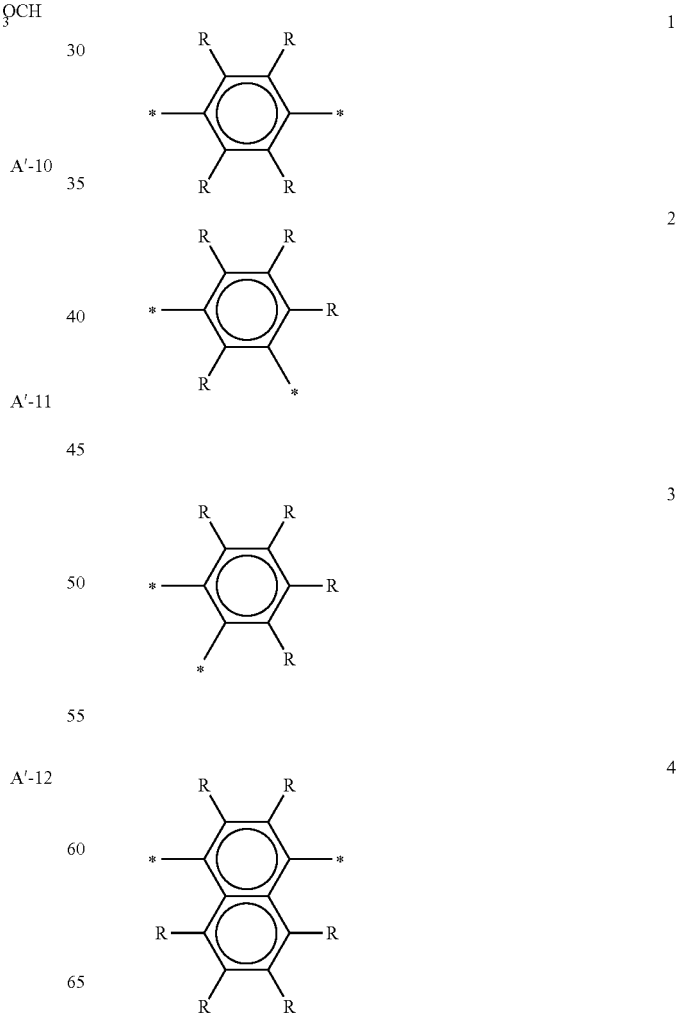

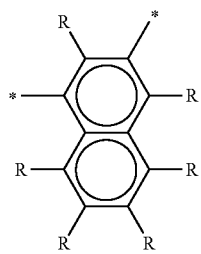
5
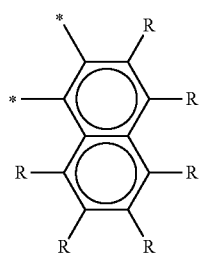
6
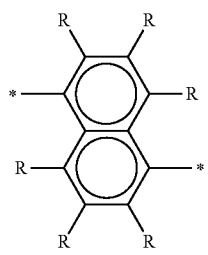
7
[Chemical Formula 64]
8
9
10
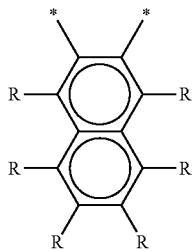
11
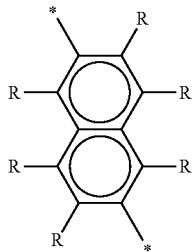
12
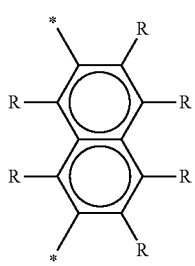
13
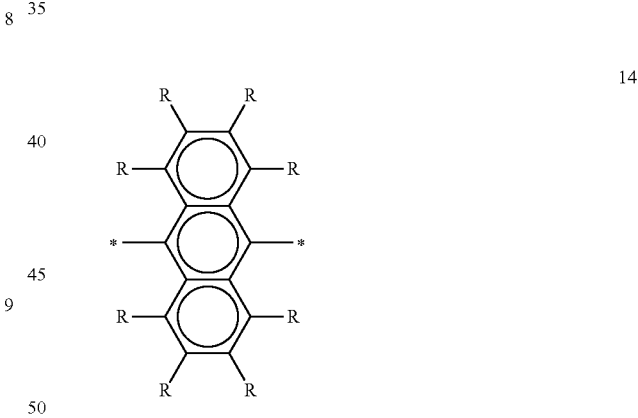
14
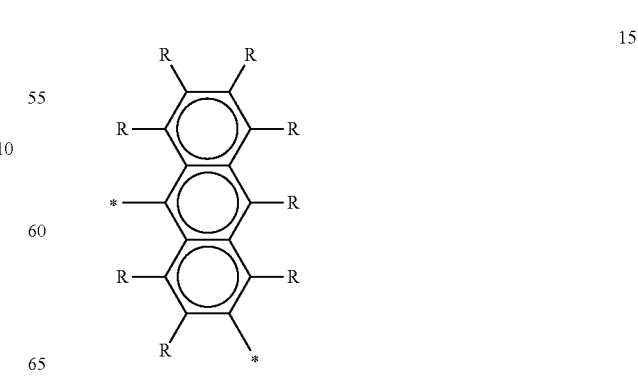
15

[Chemical Formula 65]
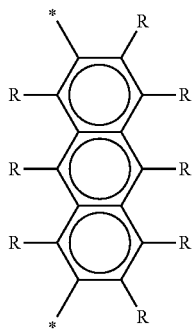
16
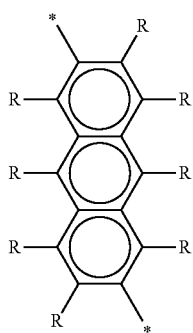
17
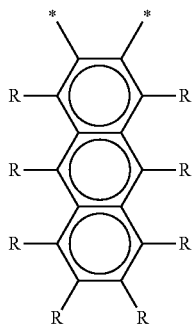
18
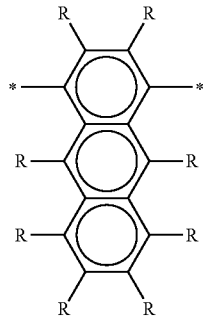
19
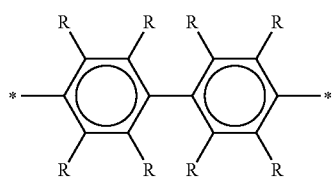
20
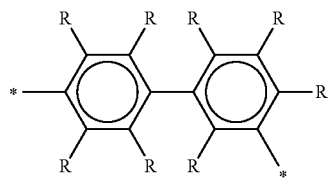
21
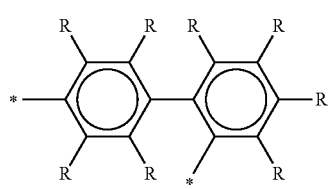
22
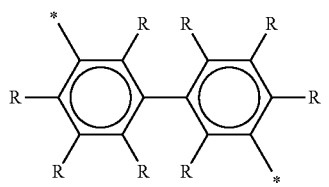
23
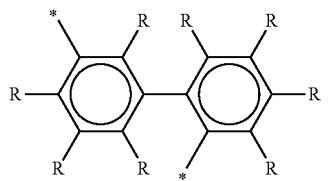
24
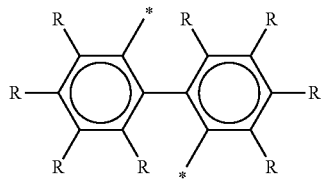
25
[Chemical Formula 66]
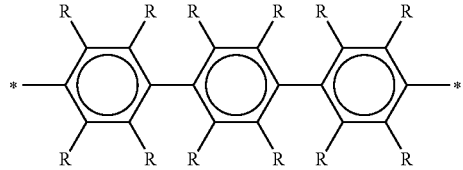
26
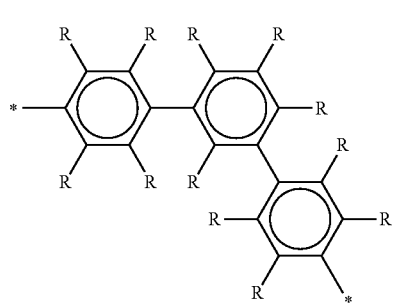
27

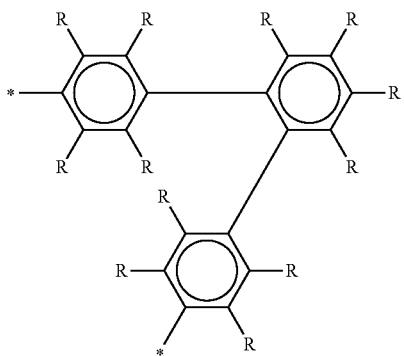
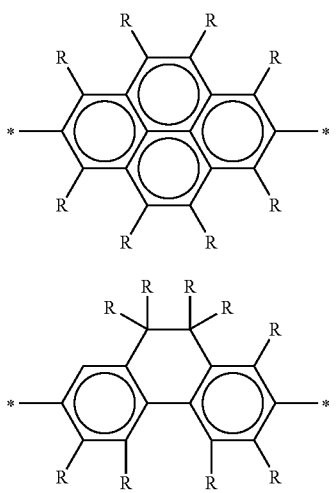
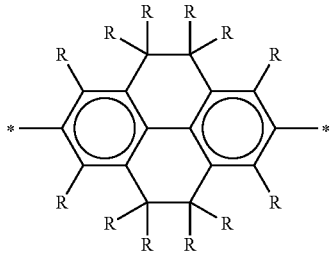
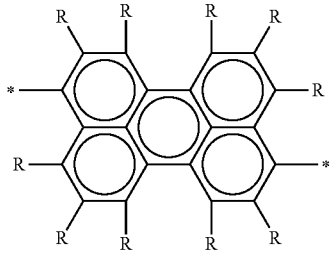
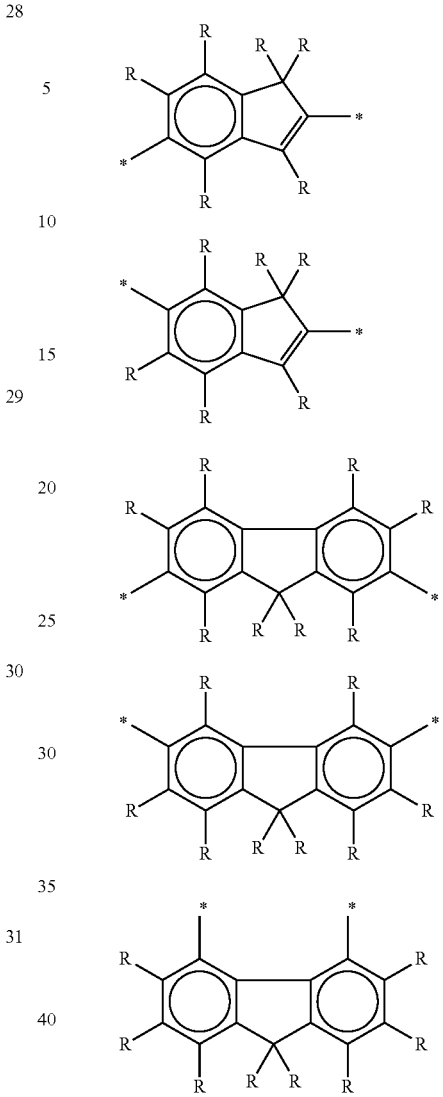

In the above formulas 1 to 38, R represents a hydrogen atom, a halogen atom or a monovalent organic group. As the halogen atom and monovalent organic group, the same examples as mentioned above can be mentioned.

The heteroarylene group of an heteroarylene unit serving as a repeating unit is the same as defined above. It is preferable that the heterocyclic compound with aromaticity is an aromatic heteropolycyclic compound. The heteropolycyclic compound with aromaticity refers to a compound formed by condensation of organic compounds having two or more ring formula structures and the elements constituting a ring include a hetero atom such as an oxygen atom, a sulfur atom, a nitrogen atom, a phosphorus atom, a boron atom, an arsenic atom other than carbon atoms, and further providing a condensation compound with aromaticity. As a heteroarylene group remaining after removing two hydrogen atoms from such a heteropolycyclic compound with aromaticity, a group having the structure represented by any one of the following formulas 49 to 72, 76 to 84, 91 to 93, 99 to 104, 106 to 108 and 110 is mentioned.

[Chemical Formula 68]
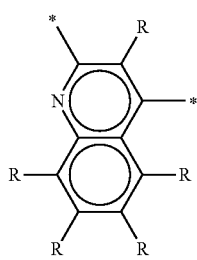
49
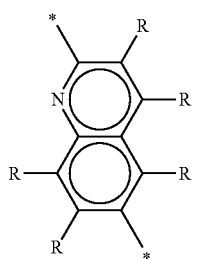
50
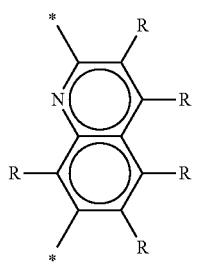
51
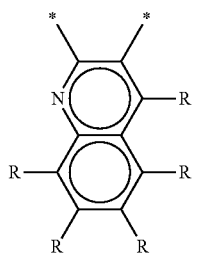
52
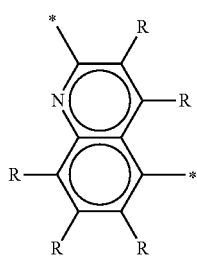
53
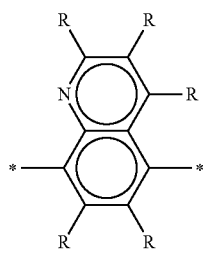
54
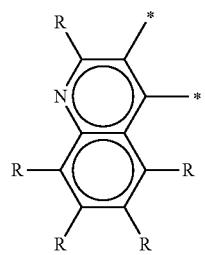
55
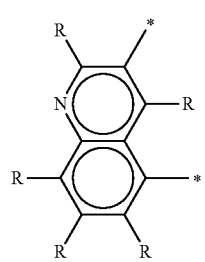
56
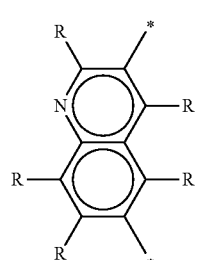
57
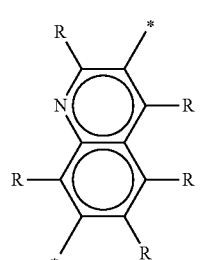
58
[Chemical Formula 69]
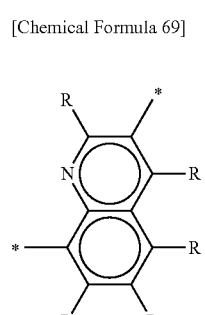
59
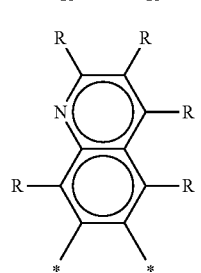
60

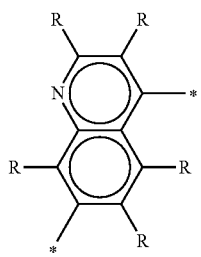 61
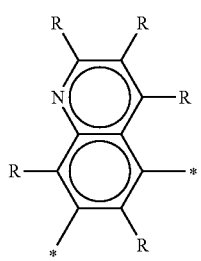 62
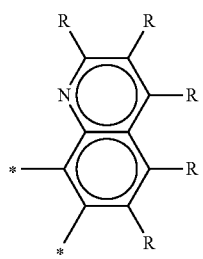 63
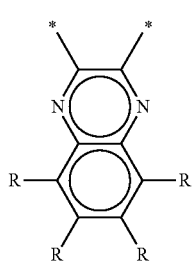 64
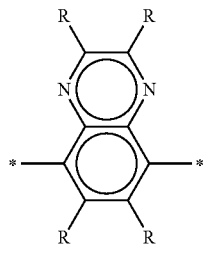 65
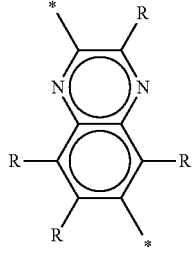 66
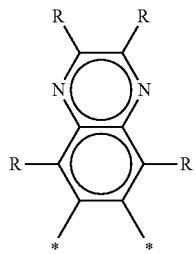 67
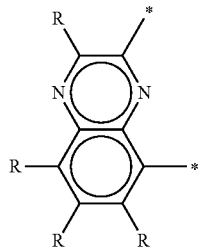 68
[Chemical Formula 70]
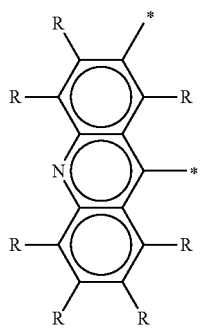 69
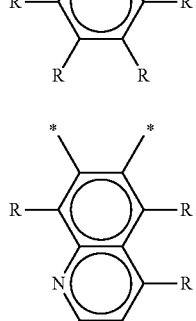 70
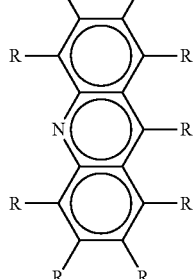 71

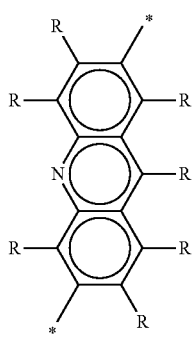
[Chemical Formula 71]
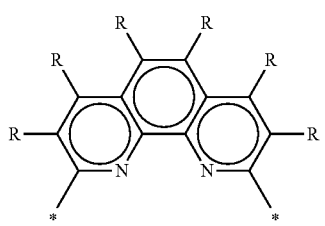
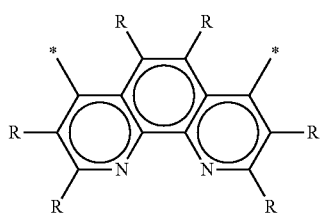
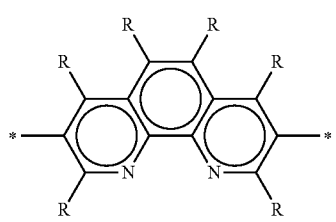
[Chemical Formula 72]
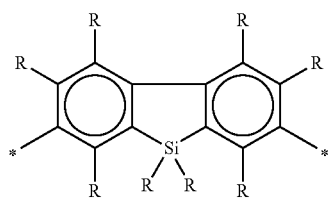
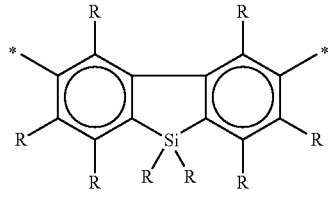
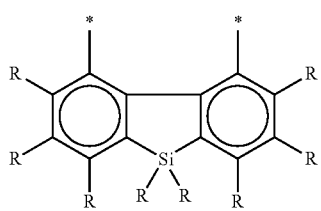
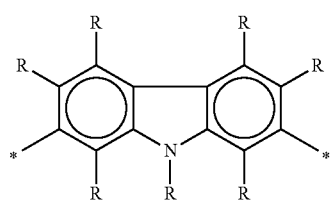
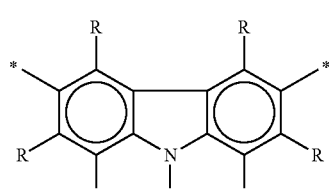
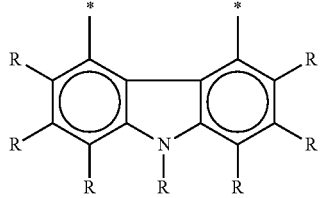
[Chemical Formula 73]
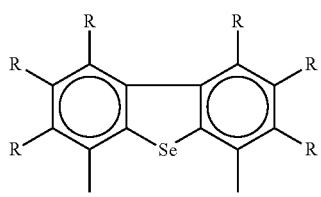
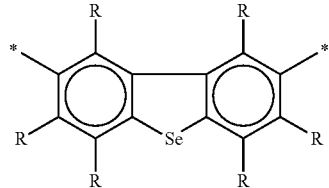
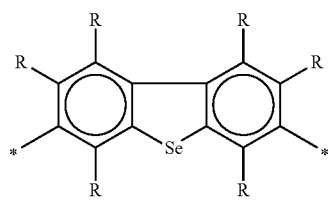

[Chemical Formula 74]

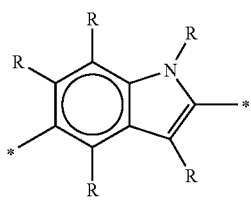
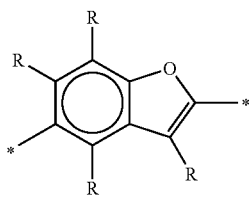
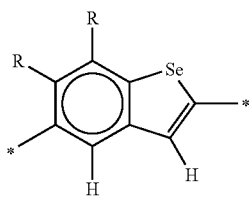
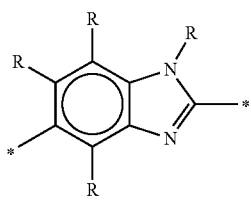
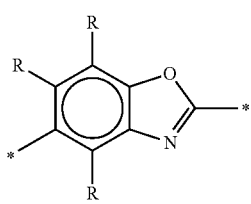
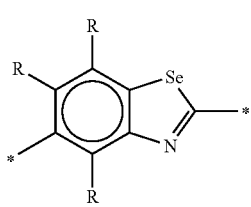
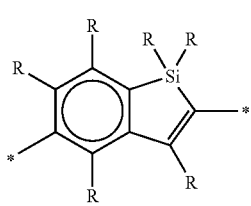

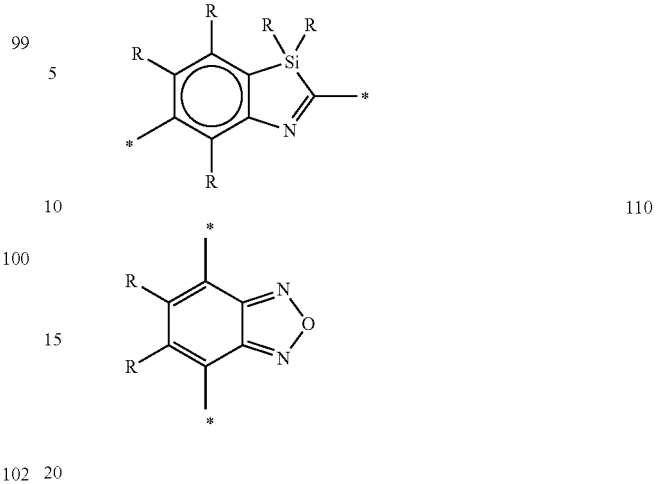

In the above formulas 49 to 72, 76 to 84, 91 to 93, 99 to 104, 106 to 108 or 110, R represents a hydrogen atom, a halogen atom, or a monovalent organic group. As the halogen atom and monovalent organic group, the same examples as mentioned above can be mentioned. * represents a bonding site.

The polymer compound of the photoelectric conversion device embodiment of the invention preferably has a heteroarylene unit, and more preferably has a heteroarylene unit as a repeating unit. Furthermore, it is further preferable that the heteroarylene group in a heteroarylene unit is a group remaining after removing two hydrogen atoms from a compound containing a sulfur ring with aromaticity (hereinafter, also referred to as an "aromatic sulfur-containing ring group"). Examples of an aromatic sulfur-containing ring group include groups remaining after removing two hydrogen atoms from a thiophene ring, a thiazole ring, a polycyclic compound having a thiophene ring and a polycyclic compound having a thiazole ring. These rings may have a halogen atom or a monovalent organic group. As the halogen atom and monovalent organic group, the same examples as mentioned above can be mentioned.

Examples of the group remaining after removing two hydrogen atoms from a thiophene ring include groups having structures represented by the following formulas (1-1), (1-2) and (1-3).

[Chemical Formula 75]

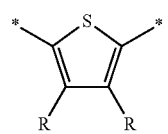 (1-1)

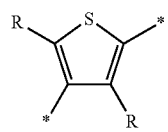 (1-2)

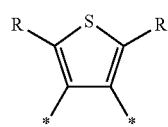 (1-3)

In the above formulas, R represents a hydrogen atom, a halogen atom or a monovalent organic group. As the halogen atom and monovalent organic group, the same examples as mentioned above can be mentioned. * represents a bonding site.

Examples of the group remaining after removing two hydrogen atoms from a thiazole ring, groups having structures represented by the following formulas (1-4) and (1-5) are mentioned.

[Chemical Formula 76]

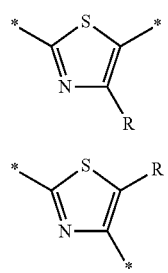

(1-4)

(1-5)

In the above formulas, R represents a hydrogen atom, a halogen atom or a monovalent organic group. As the halogen atom and monovalent organic group, the same example as mentioned above can be mentioned. * represents a bonding site.

Examples of the polycyclic compound having a thiophene ring include compounds having structures represented by the following formulas (2-1), (2-2) and (2-3). Examples of the polycyclic compound having a thiazole ring include a compound having a structure represented by the following formula (2-4).

[Chemical Formula 77]

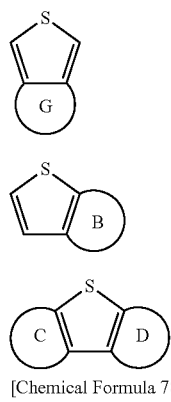

(2-1)

(2-2)

(2-3)

[Chemical Formula 78]

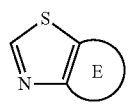

(2-4)

In the above formulas, ring B, ring C, ring D, ring E and ring G each independently represent an unsubstituted or substituted aromatic ring or an unsubstituted or substituted heteroaromatic ring. The compounds represented by formulas (2-1), (2-2), (2-3) and (2-4), which may have a halogen atom or a monovalent organic group, have two or more hydrogen atoms on a ring. As the halogen atom and monovalent organic group, the same examples as mentioned above can be mentioned.

The aromatic ring herein is a ring constituted of carbon atoms (elements constituting the ring) alone. Examples thereof include a benzene ring, a naphthalene ring, an anthracene ring, a phenanthrene ring, a tetracene ring, chrysene ring, triphenylene ring, tetraphene ring, pyrene ring, pentacene ring, picene ring and a perylene ring.

The heteroaromatic ring herein refers to an organic compound which has a ring structure, having hetero atoms such as an oxygen atom, a sulfur atom, a nitrogen atom, a phosphorus atom and a boron atom in addition to carbon atom as the elements constituting a ring. Examples thereof include furan, pyrrole, imidazole, thiophene, phosphole, borole, pyrazole, oxazole, isoxazole, thiazole, pyridine, pyrazine, pyrimidine, pyridazine, triazine benzofuran, isobenzofuran, indole, isoindole, benzothiophene, benzophosphole, benzimidazole, purine, indazole, benzoxazole, benzisoxazole, benzothiazole, quinoline, isoquinoline, quinoxaline, quinazoline and cinnoline. These heteroaromatic rings may further be condensed with another aromatic ring or another heteroaromatic ring.

As the group remaining after removing two hydrogen atoms from a polycyclic compound having a thiophene ring, groups having structures represented by the following formulas are mentioned.

[Chemical Formula 79]

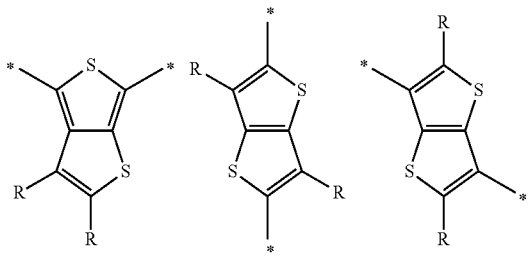

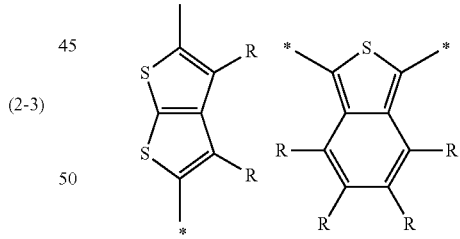

[Chemical Formula 80]

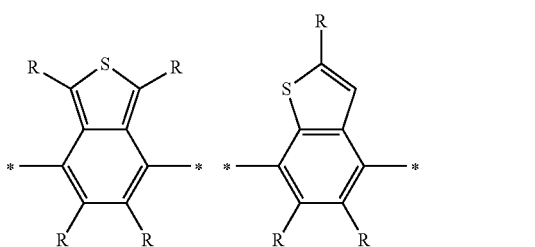

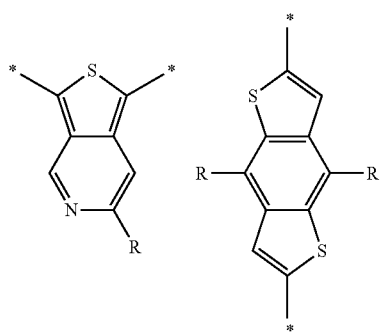
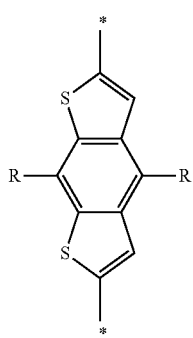
[Chemical Formula 81]
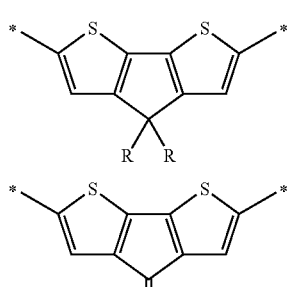
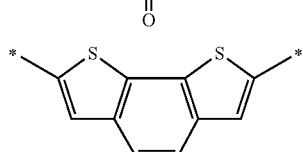
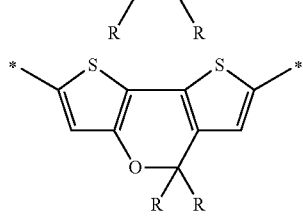
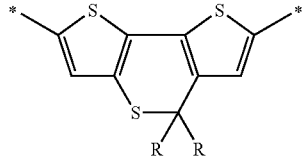
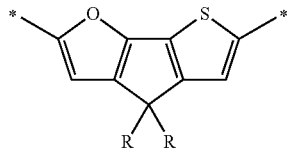
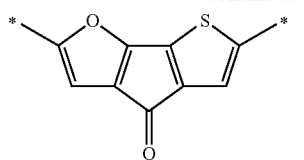
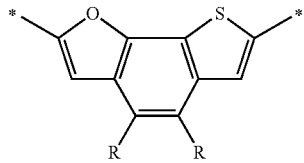
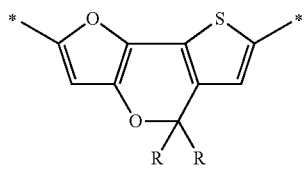
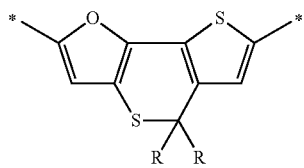
[Chemical Formula 82]
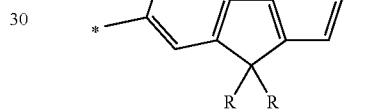
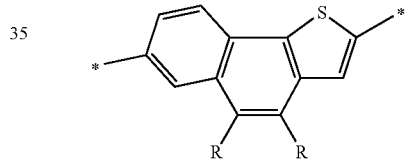
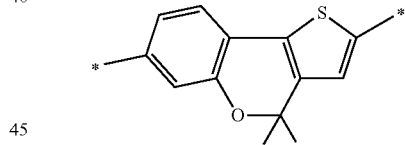
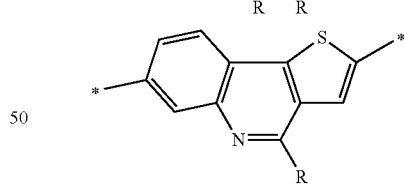
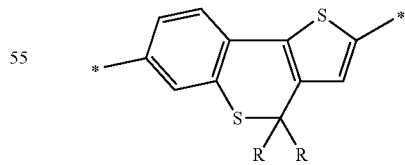
[Chemical Formula 83]
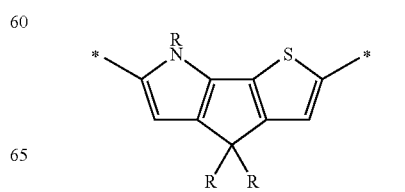

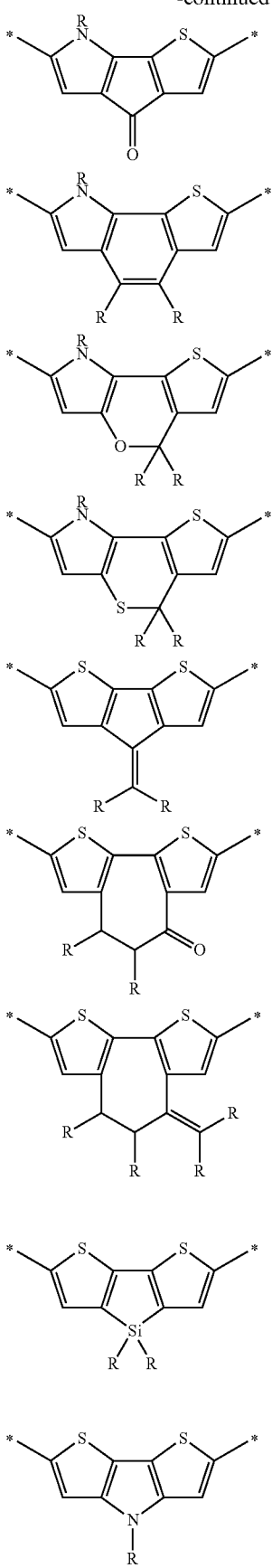

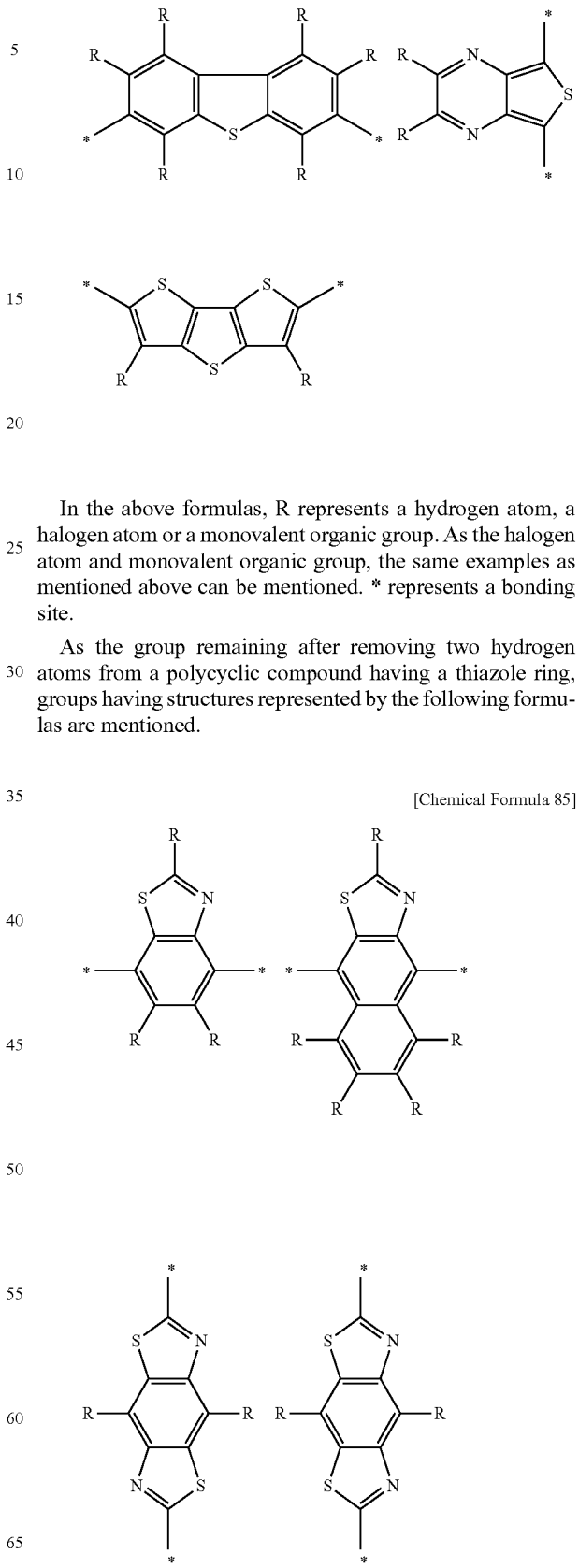

In the above formulas, R represents a hydrogen atom, a halogen atom or a monovalent organic group. As the halogen atom and monovalent organic group, the same examples as mentioned above can be mentioned. * represents a bonding site.

As the group remaining after removing two hydrogen atoms from a polycyclic compound having a thiazole ring, groups having structures represented by the following formulas are mentioned.

-continued

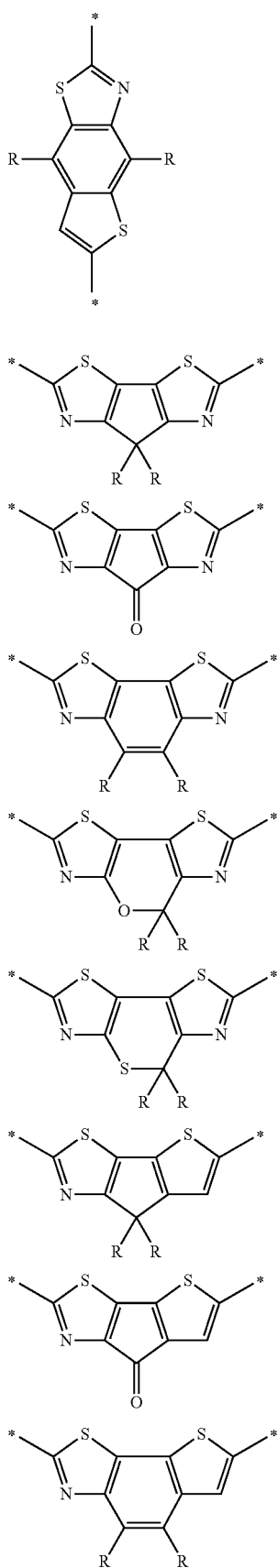

[Chemical Formula 86]

-continued

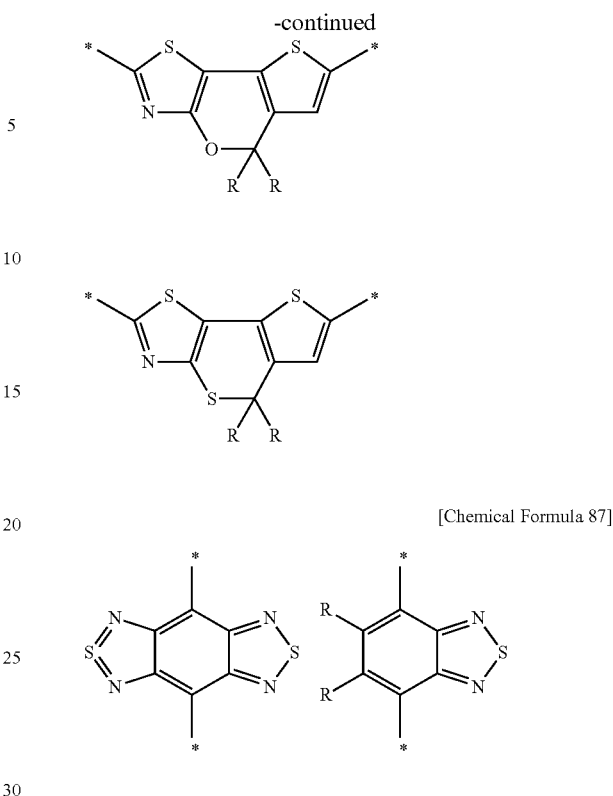

[Chemical Formula 87]

In the above formulas, R represents a hydrogen atom, a halogen atom, or a monovalent organic group. As the halogen atom and monovalent organic group, the same examples as mentioned above can be mentioned. * represents a bonding site.

It is preferable that a polymer compound according to the photoelectric conversion device embodiment of the invention contains a heteroarylene unit as a repeating unit. In the case of containing the heteroarylene unit as a repeating unit, it is further preferable that a heteroarylene group in the heteroarylene unit contains an aromatic sulfur-containing ring group, and it is particularly preferable that all heteroarylene groups are aromatic sulfur-containing ring groups. In the case of containing an aromatic sulfur-containing ring group, the number of aromatic sulfur-containing ring groups continuously present in a main chain is preferably 1 to 20, more preferably 1 to 10, and further preferably 1 to 5. When the range is satisfied, in the case where a polymer compound according to the photoelectric conversion device embodiment of the invention is used in organic solar cells, the voltage of the organic solar cells can be increased, with the result that the organic solar cells having more excellent voltage characteristics can be obtained.

It is further preferable that a polymer compound according to the photoelectric conversion device embodiment of the invention contain a first repeating unit and a second repeating unit, which is different from the first repeating unit, and at least one of the first repeating unit and the second repeating unit has a group containing a carbon cluster structure. For example, the first repeating unit can be a heteroarylene unit and the second repeating unit can be an arylene unit.

It is preferable that the repeating unit including a group containing a carbon cluster structure is a repeating unit represented by the following formula (T5A).

[Chemical Formula 88]

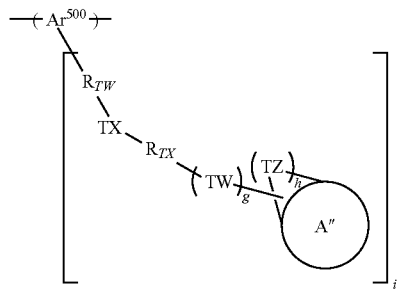

(T5A)

In the above formula (T5A), $Ar^{500}$ represents an unsubstituted or substituted arylene group, or an unsubstituted or substituted heteroarylene group; TX represents a single bond, an oxygen atom, a sulfur atom, an unsubstituted or substituted alkylene group, or an unsubstituted or substituted phenylene group; $R_{TW}$ and $R_{TX}$ each independently represent a single bond, an unsubstituted or substituted alkylene group having 1 to 20 carbon atoms, an unsubstituted or substituted arylene group having 6 to 20 carbon atoms, or a divalent group of a combination thereof; Ring A" represents a carbon cluster structure; i represents an integer of 1 to 4; TW represents a divalent group containing a carbon atom, or a silicon atom; TZ represents a hetero atom selected from a nitrogen atom, an oxygen atom and a sulfur atom, or a carbon atom; h represents an integer of 0 to 12; and g represents 0 or 1. Herein, when h is 0, g is 1 and TW is a silicon atom. When h is 1, TZ is a carbon atom. When h is 2 or more, at least one of a plurality of TZ may be a hetero atom and the bond between adjacent carbon atoms is a single bond or an unsaturated bond, and a divalent group containing a carbon atom and represented by TW may be joined with a ring containing TZ to form a ring. When there are a plurality of $R_{TW}$, $R_{TX}$, TX, TW, TZ, g, h and ring A", they may be independently the same or different.

In the above formula (T5A), TX represents a single bond, an oxygen atom, a sulfur atom, or an unsubstituted or substituted phenylene group, preferably a single bond or an oxygen atom, and more preferably a single bond.

In the above formula (T5A), TW represents a divalent group containing a carbon atom or a silicon atom. As the divalent group containing a carbon atom, an unsubstituted or substituted alkylene group having 1 to 20 carbon atoms, an arylene group having 1 to 20 carbon atoms, or a divalent group of a combination thereof is mentioned.

In the above formula (T5A), $R_{TW}$ and $R_{TX}$ each independently represent a single bond, an unsubstituted or substituted alkylene group having 1 to 20 carbon atoms, an unsubstituted or substituted arylene group having 6 to 20 carbon atoms or a divalent group of a combination thereof, preferably a single bond or an unsubstituted alkylene group and more preferably a single bond or an unsubstituted alkylene group having 1 to 20 carbon atoms.

In the above formula (T5A), ring A" represents a carbon cluster structure. Examples thereof include fullerene C60, fullerene C70, fullerene C76, fullerene C78 and fullerene C84, preferably fullerene C60, fullerene C70 or fullerene C84, and further preferably fullerene C60 or fullerene C70.

In the above formula (T5A), i represents an integer of 1 to 4, preferably an integer of 1 to 3, and more preferably 1 or 2.

In the above formula (T5A), h represents an integer of 0 to 12, preferably an integer of 1 to 8, more preferably an integer of 1 to 4, and further preferably 1 or 4. When h is 2 or more, the bond between adjacent TZ may be a single bond or a double bond.

It is more preferable that the repeating unit having a group containing a carbon cluster structure is at least one unit selected from the group consisting of a repeating unit represented by the following formula (T5'), a repeating unit represented by the following formula (T5B), a repeating unit represented by the following formula (T5C) and a repeating unit represented by the following formula (T5D).

[Chemical Formula 89]

(T5')

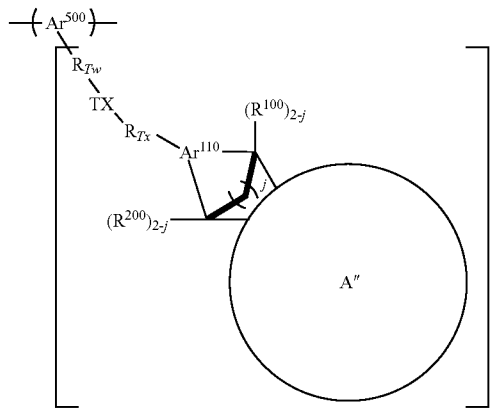

In the above formula (T5'), $Ar^{500}$ is an unsubstituted or substituted arylene group, or an unsubstituted or substituted heteroarylene group; $Ar^{110}$ represent an unsubstituted or substituted arylidine group, or an unsubstituted or substituted heteroarylidine group; TX represents a single bond, an oxygen atom, a sulfur atom, an unsubstituted or substituted alkylene group, or an unsubstituted or substituted phenylene group; $R_{TW}$ and $R_{TX}$ each independently represent a single bond, an unsubstituted or substituted alkylene group having 1 to 20 carbon atoms, an unsubstituted or substituted arylene group having 6 to 20 carbon atoms or a divalent group of a combination thereof; $R^{100}$ and $R^{200}$ each independently represent a hydrogen atom, an unsubstituted or substituted alkyl group having 1 to 20 carbon atoms, or an unsubstituted or substituted alkoxy group having 1 to 20 carbon atoms (when there are a plurality of $R^{100}$ and $R^{200}$, they may be independently the same or different); Ring A" represents a carbon cluster structure; i represents an integer of 1 to 4; and j represents 0 or 1; and when there are a plurality of $R_{TW}$, $R_{TX}$, TX, $Ar^{110}$, $R^{100}$, $R^{200}$, j and ring A", they may be independently the same or different. Note that, when j is 0, the carbon atom to which $R^{100}$ is bound and the carbon atom to which $R^{200}$ is bound are not directly bonded.

In the above formula (T5'), $Ar^{500}$, TX, $R_{TW}$, $R_{TX}$, ring A" and i are the same as defined in formula (T5A).

The number of carbon atoms of an unsubstituted or substituted arylidine group represented by $Ar^{110}$ with the exclusion of the number of carbon atoms of a substituent is usually 6 to 30, and more preferably 6 to 16. The number of carbon atoms of an unsubstituted or substituted heteroarylidine group represented by $Ar^{110}$ with the exclusion of the number of carbon atoms of a substituent is usually 6 to 30, and more preferably 6 to 16. The heteroarylidine group may contain e.g., a nitrogen atom, an oxygen atom and/or a sulfur atom in addition to carbon atoms as the atoms forming an aromatic ring.

Examples of the unsubstituted arylidine group include a phenylidine group, a naphthalenetriyl group, an anthracenetriyl group, a phenanthrenetriyl group, a naphthacenetriyl group, a fluorenetriyl group, a perylenetriyl group and a chrysenetriyl group. As the substituted arylidine group, the groups each having a substituent as mentioned above may be mentioned.

Examples of the unsubstituted heteroarylidine group include a pyrroletriyl group, a furantriyl group, a pyridinetriyl group, a quinolinetriyl group and an isoquinolinetriyl group. As the substituted heteroarylidine group, the groups having a substituent as mentioned above may be mentioned.

In the above formula (T5'), $R^{100}$ and $R^{200}$ each independently represent a hydrogen atom, an unsubstituted or substituted alkyl group having 1 to 20 carbon atoms, or an unsubstituted or substituted alkoxy group having 1 to 20 carbon atoms group, and preferably a hydrogen atom.

[Chemical Formula 90]

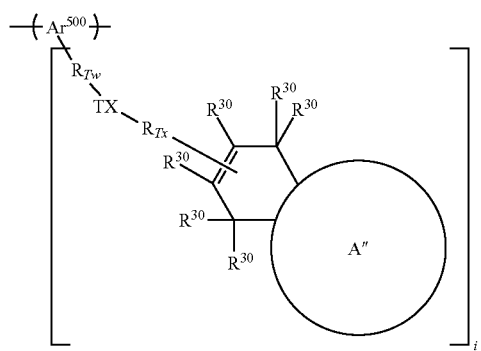

(T5B)

In the above formula (T5B), $Ar^{500}$ represents an unsubstituted or substituted arylene group, or an unsubstituted or substituted heteroarylene group; TX represents a single bond, an oxygen atom, a sulfur atom, an unsubstituted or substituted alkylene group, or an unsubstituted or substituted phenylene group; $R_{TW}$ and $R_{TX}$ each independently represent a single bond, an unsubstituted or substituted alkylene group having 1 to 20 carbon atoms, an unsubstituted or substituted arylene group having 6 to 20 carbon atoms, or a divalent group of a combination thereof; $R^{30}$ represents a hydrogen atom, an unsubstituted or substituted alkyl group having 1 to 20 carbon atoms, an unsubstituted or substituted alkoxy group having 1 to 20 carbon atoms or a direct bond to $R_{TX}$; a plurality of $R^{30}$ may be mutually the same or different; Ring A" represents a carbon cluster structure; i represents an integer of 1 to 4; and when there are a plurality of $R_{TW}$, $R_{TX}$, TX and ring A", they may be independently the same or different.

In the above formula (T5B), $Ar^{500}$, TX, $R_{TW}$, $R_{TX}$, ring A" and i are the same as defined in formula (T5A).

In the above formula (T5B), $R^{30}$ represents a hydrogen atom, an unsubstituted or substituted alkyl group having 1 to 20 carbon atoms, an unsubstituted or substituted alkoxy group having 1 to 20 carbon atoms or a direct bond to $R_x$, and preferably a hydrogen atom; and a plurality of $R^{30}$ may be mutually the same or different.

[Chemical Formula 91]

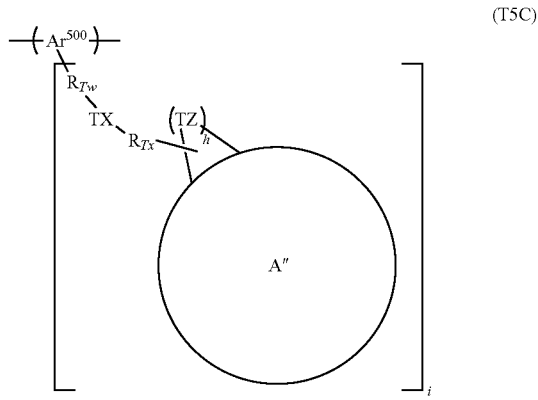

(T5C)

In the above formula (T5C), $Ar^{500}$ represents an unsubstituted or substituted arylene group, or an unsubstituted or substituted heteroarylene group; TX represents a single bond, an oxygen atom, a sulfur atom, an unsubstituted or substituted alkylene group, or an unsubstituted or substituted phenylene group; $R_{TW}$ and $R_{TX}$ each independently represent a single bond, an unsubstituted or substituted alkylene group having 1 to 20 carbon atoms, an unsubstituted or substituted arylene group having 6 to 20 carbon atoms, or a divalent group of a combination thereof; ring A" represents a carbon cluster structure; i represents an integer of 1 to 4; TZ represents a hetero atom selected from a nitrogen atom, an oxygen atom and a sulfur atom, or a carbon atom; the nitrogen atom and carbon atom represented by TZ may have a substituent; h represents an integer of 1 to 12 in which when h is 1, TZ is a carbon atom; and when h is 2 or more, at least one of a plurality of TZ may be a hetero atom and the bond between adjacent carbon atoms may be a single bond or an unsaturated bond. Note that, when there are a plurality of $R_{TW}$, $R_{TX}$, TX, TZ, h and ring A", they may be independently the same or different.

In the above formula (T5C), $Ar^{500}$, TX, TZ, $R_{TW}$, $R_{TX}$, ring A", h and i are the same as defined in formula (T5A).

[Chemical Formula 92]

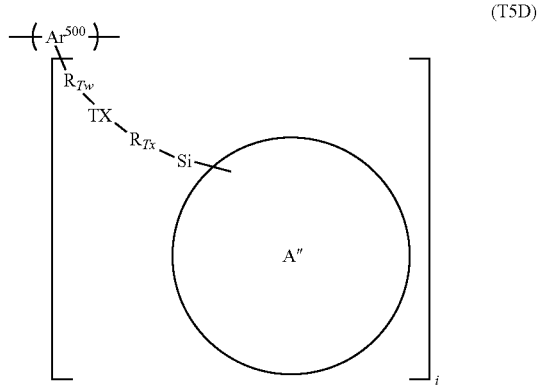

(T5D)

In the above formula (T5D), $Ar^{500}$ represents an unsubstituted or substituted arylene group, or an unsubstituted or substituted heteroarylene group; TX represents a single bond, an oxygen atom, a sulfur atom, an unsubstituted or substituted alkylene group, or an unsubstituted or substituted phenylene group; $R_{TW}$ and $R_{TX}$ each independently represent a single bond, an unsubstituted or substituted alkylene group having 1 to 20 carbon atoms, an unsubstituted or substituted arylene group having 6 to 20 carbon atoms, or a divalent group of a combination thereof; ring A" represents a carbon cluster structure; and i represents an integer of 1 to 4. Note that, when there are a plurality of $R_{TW}$, $R_{TX}$, TX and ring A", they may be independently the same or different.

In the above formula (T5D), $Ar^{500}$, TX, $R_{TW}$, $R_{TX}$, ring A" and i are the same as defined in formula (T5A).

Herein, in the case where a group containing a carbon cluster structure is introduced in the first repeating unit, examples of the structure include the structures represented by the following formulas.

[Chemical Formula 93]

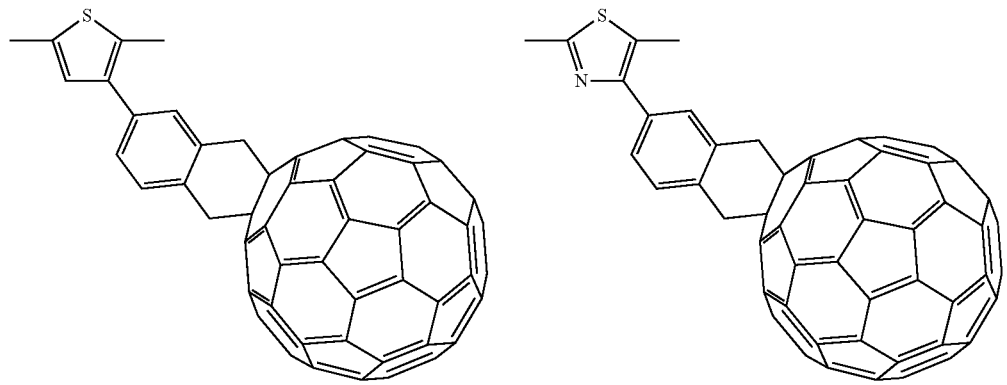

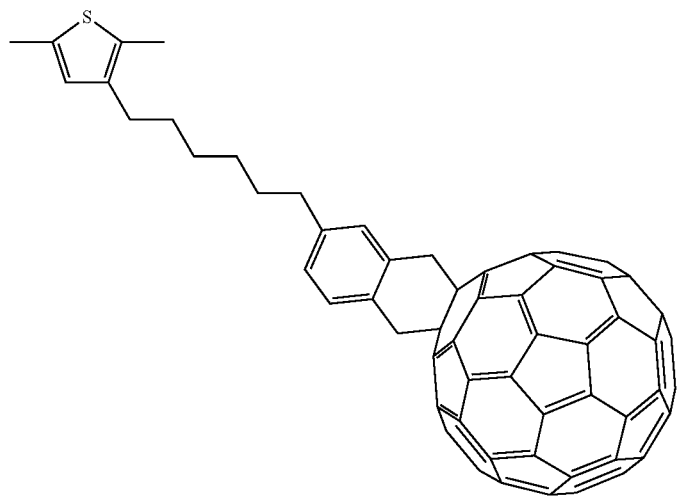

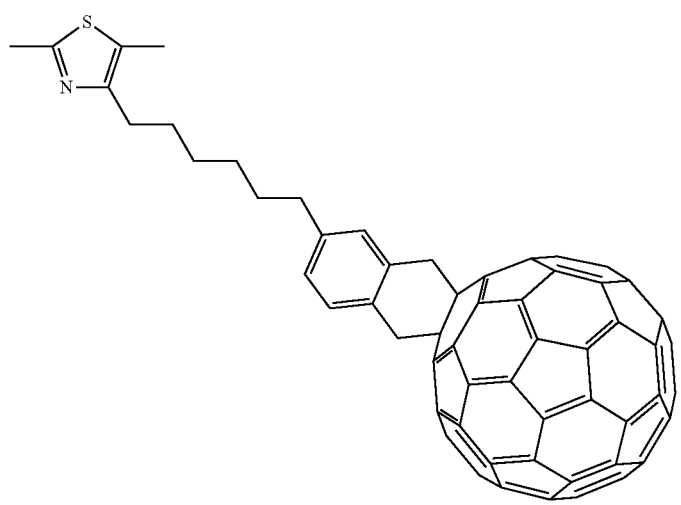

127 128
-continued
[Chemical Formula 94]
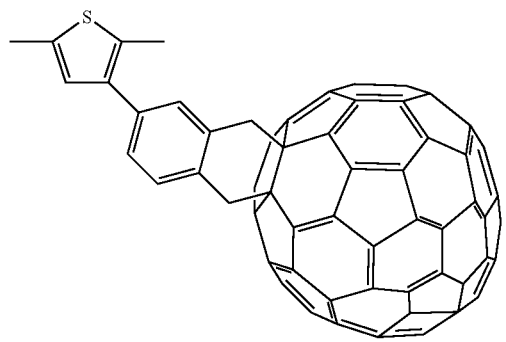 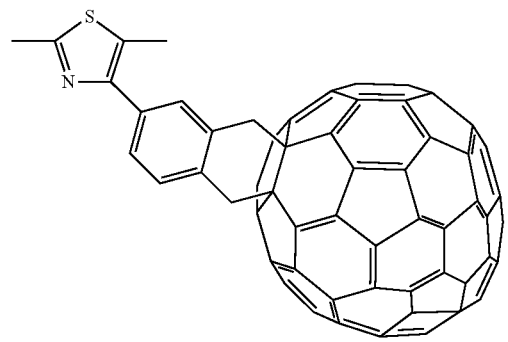
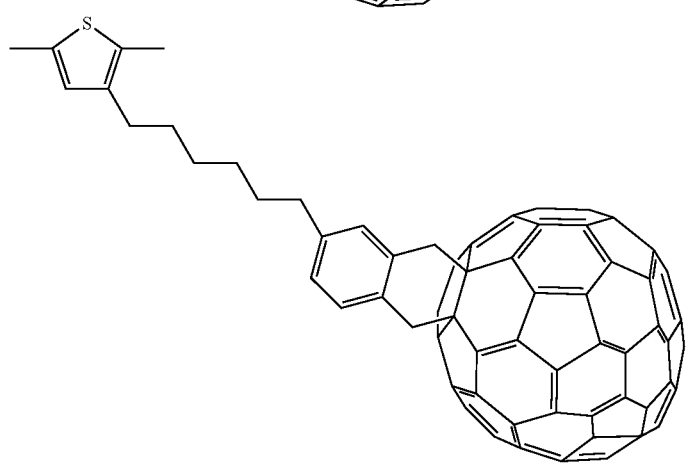
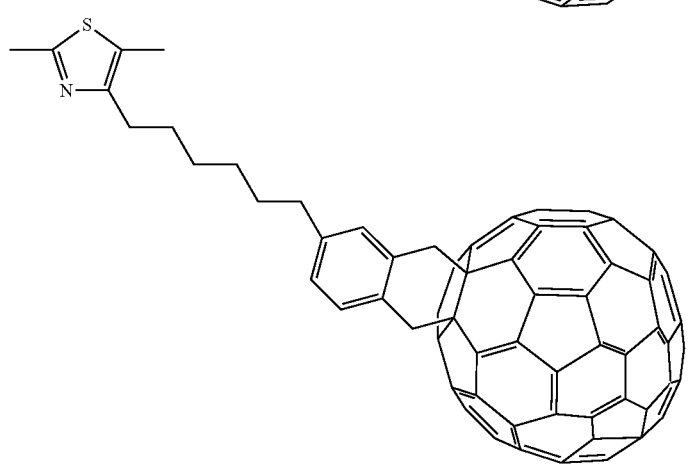
[Chemical Formula 95]
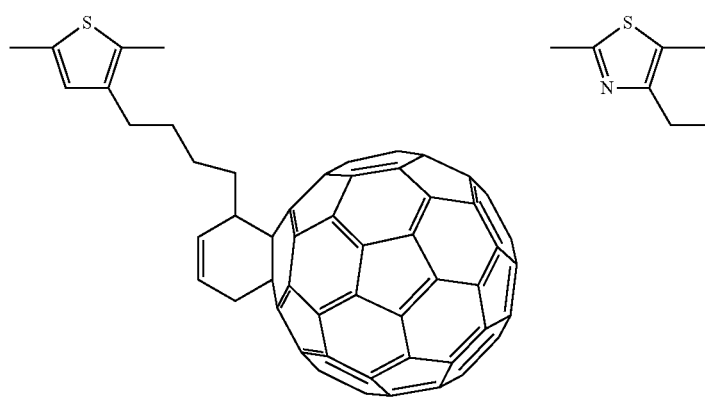 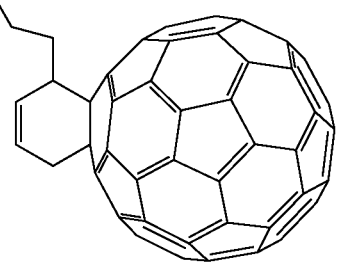

[Chemical Formula 96]
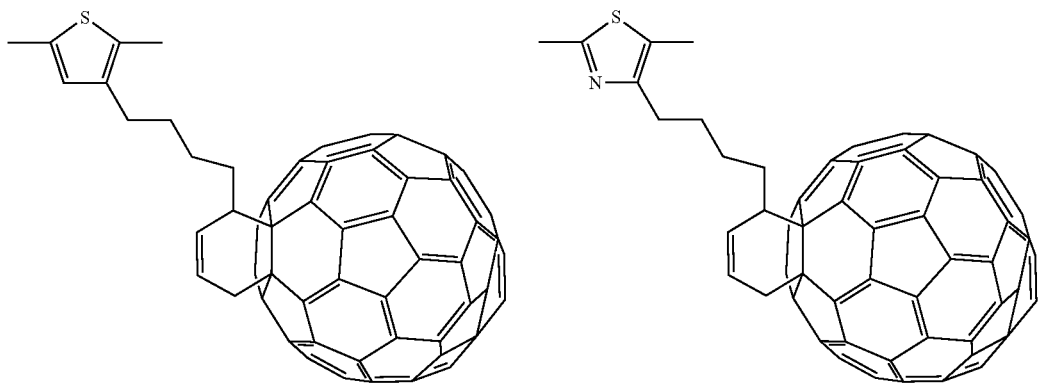
[Chemical Formula 97]
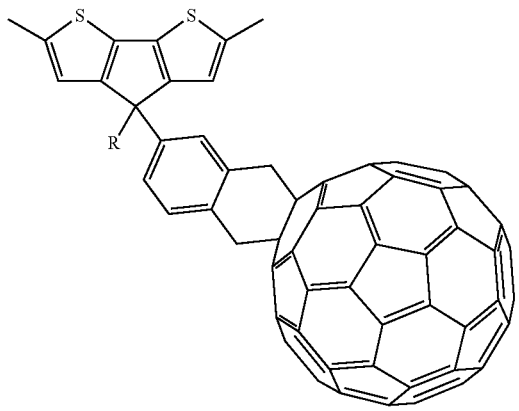
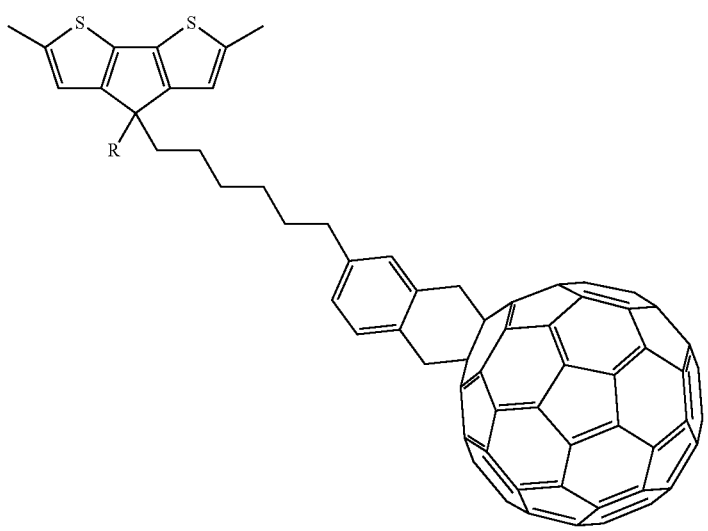

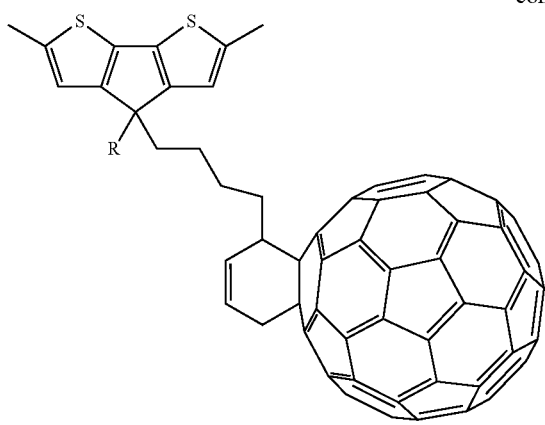
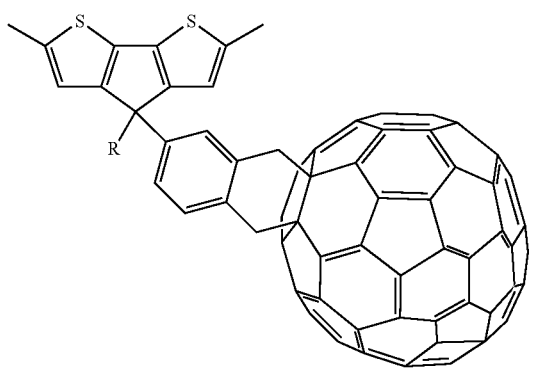
[Chemical Formula 98]
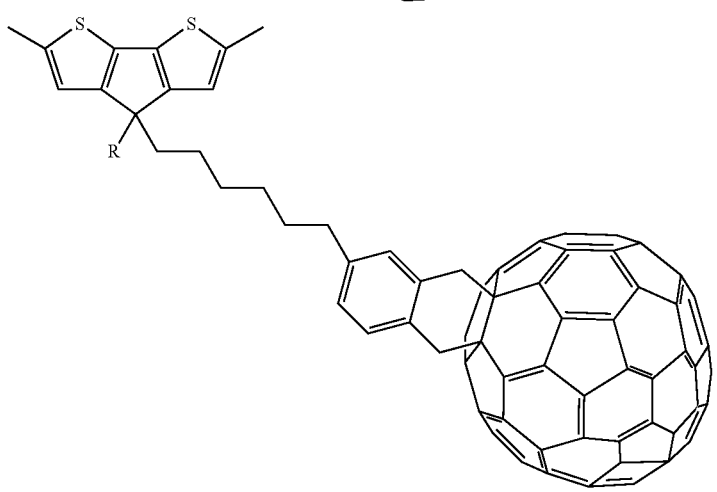
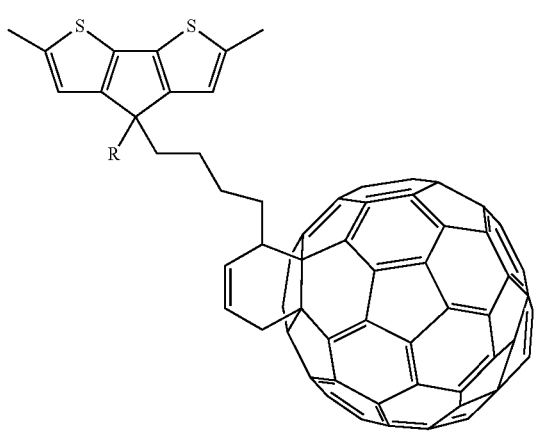

[Chemical Formula 99]
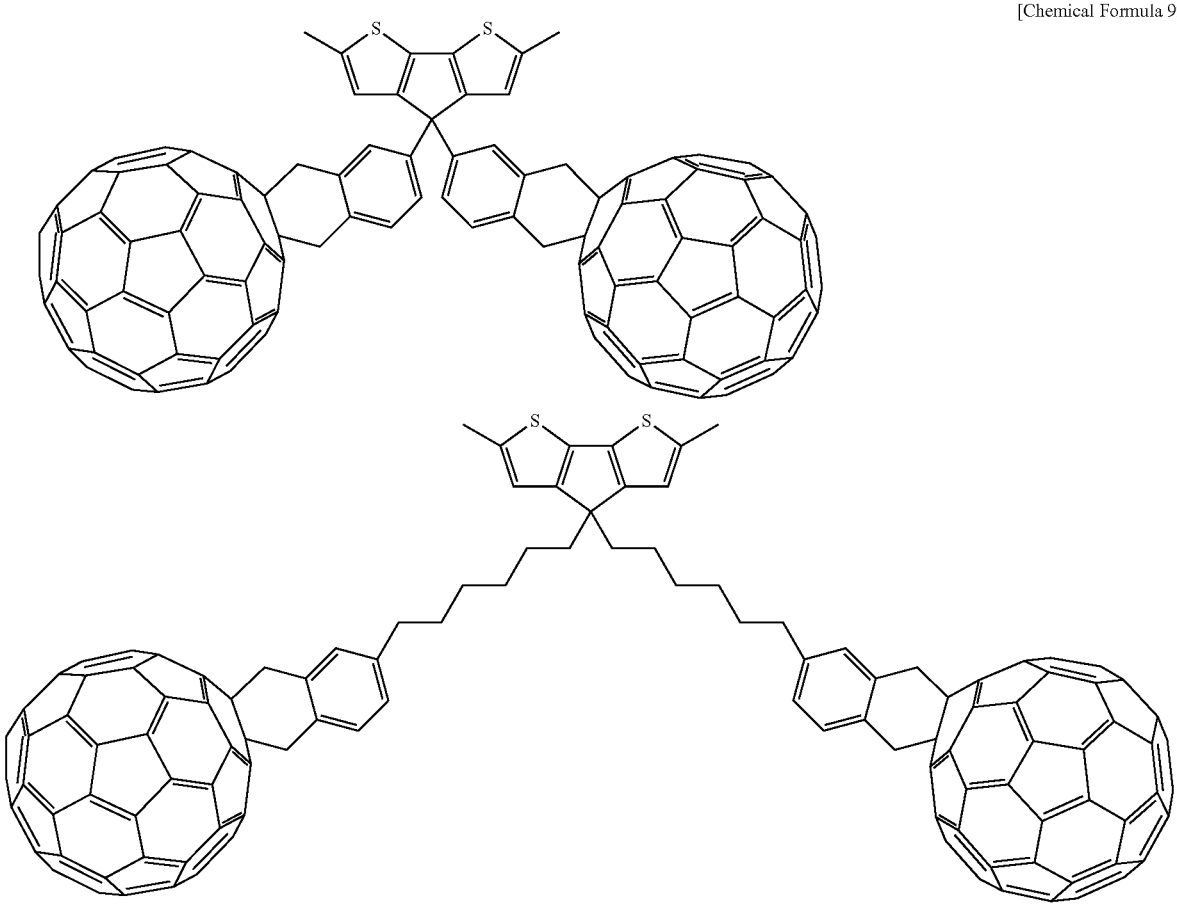
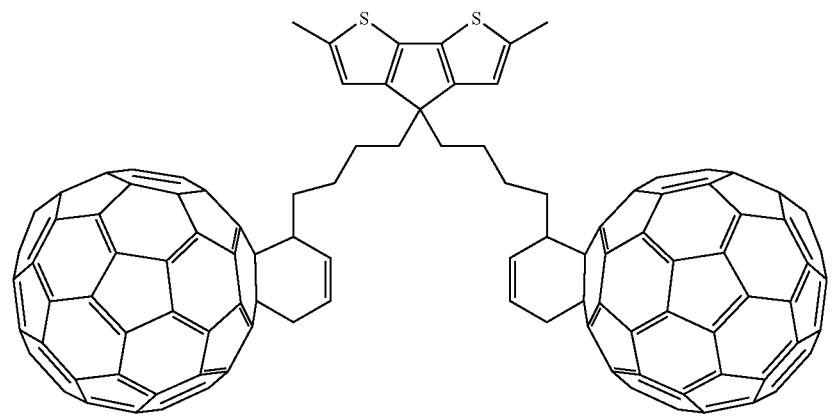
[Chemical Formula 100]
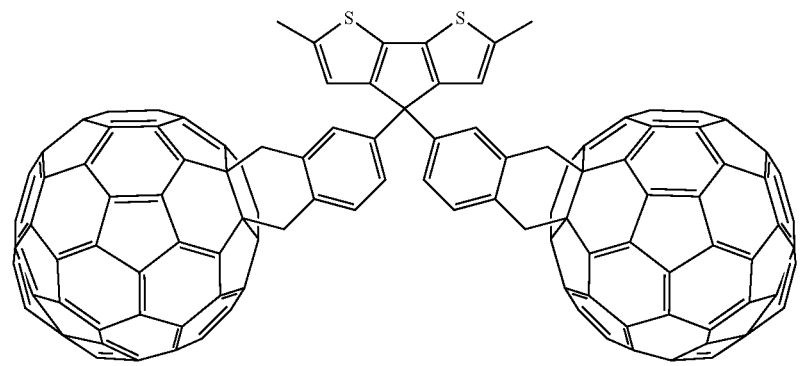

-continued
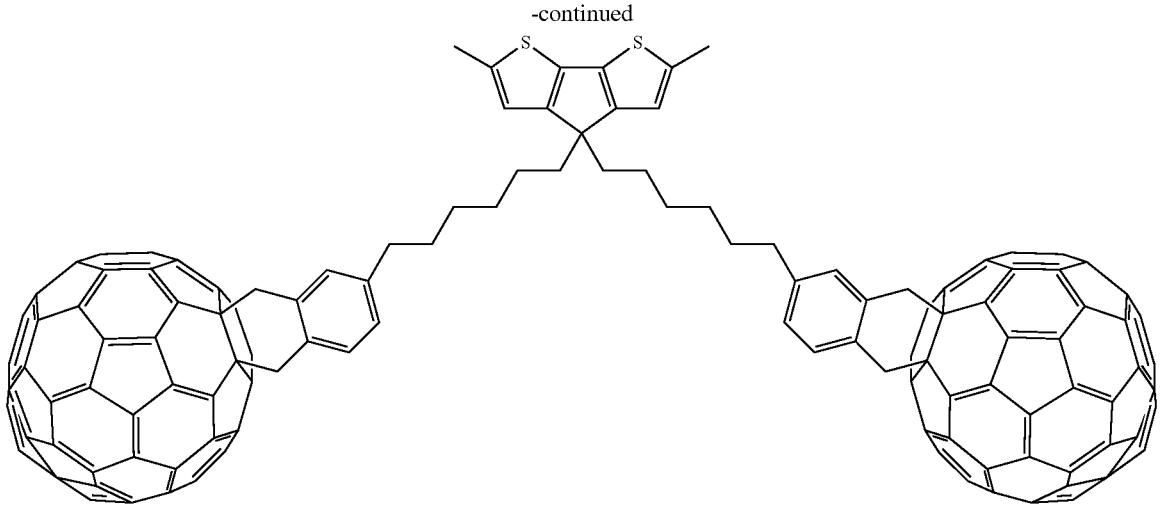
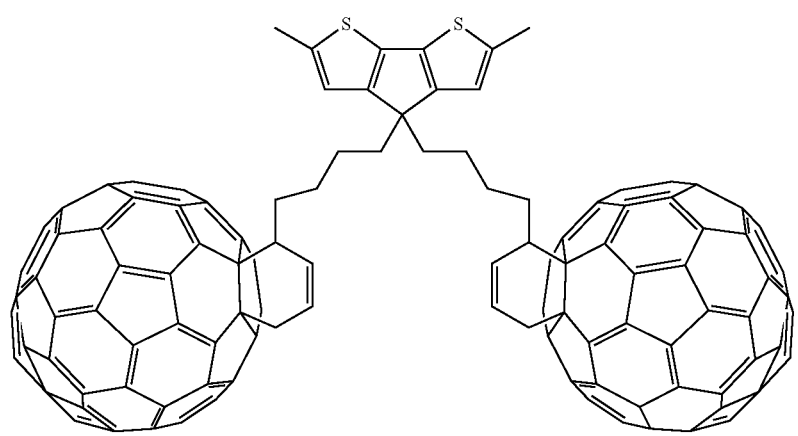
[Chemical Formula 101]
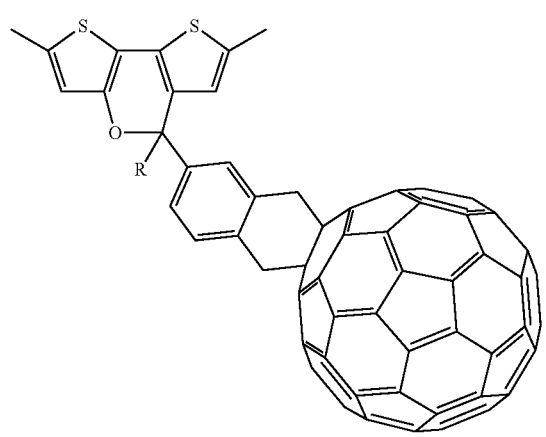

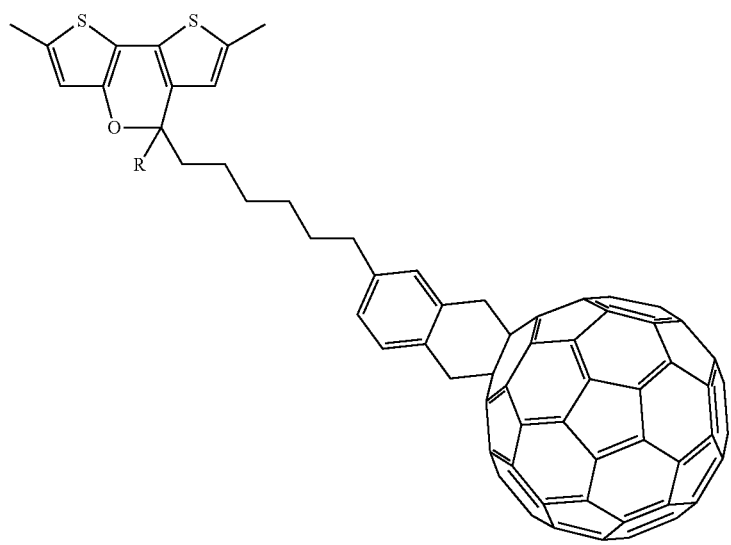
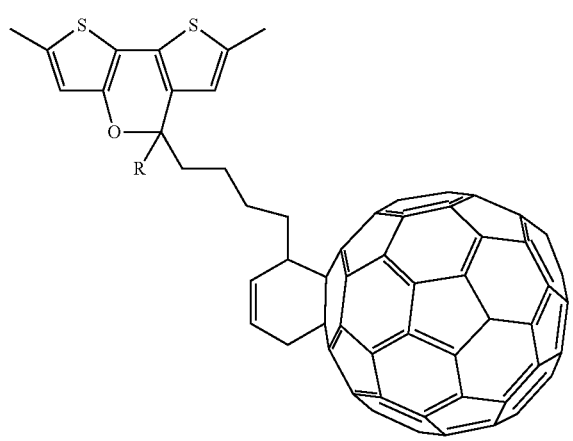
[Chemical Formula 102]
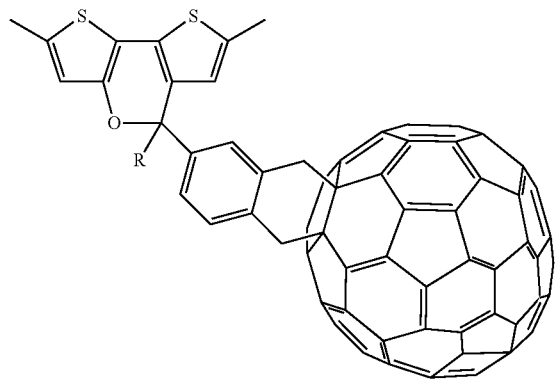

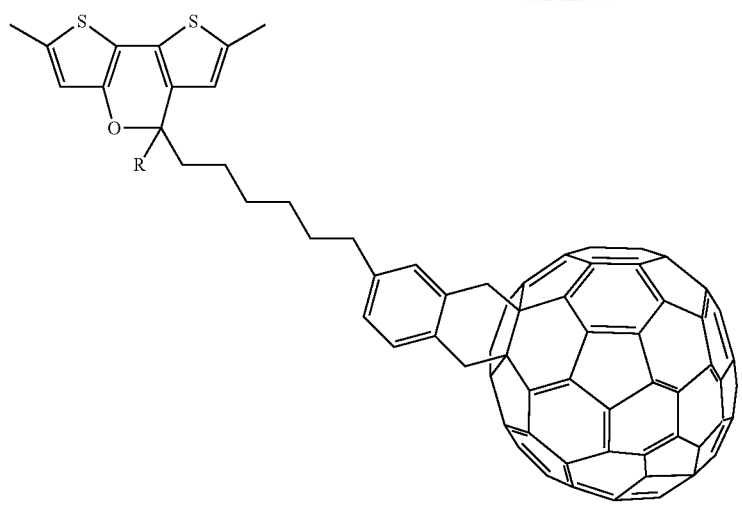
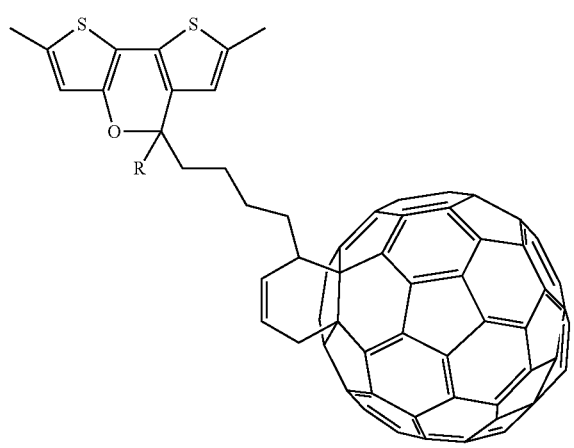
[Chemical Formula 103]
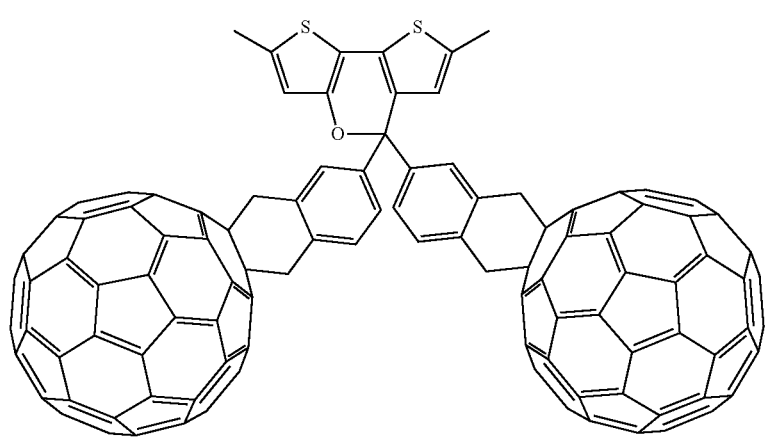

-continued
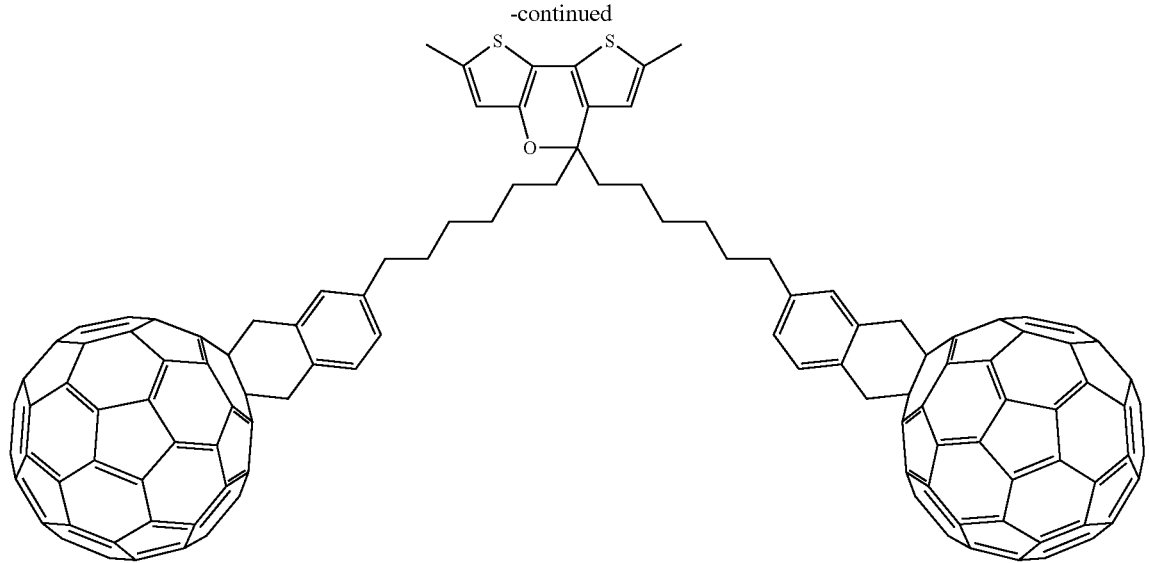
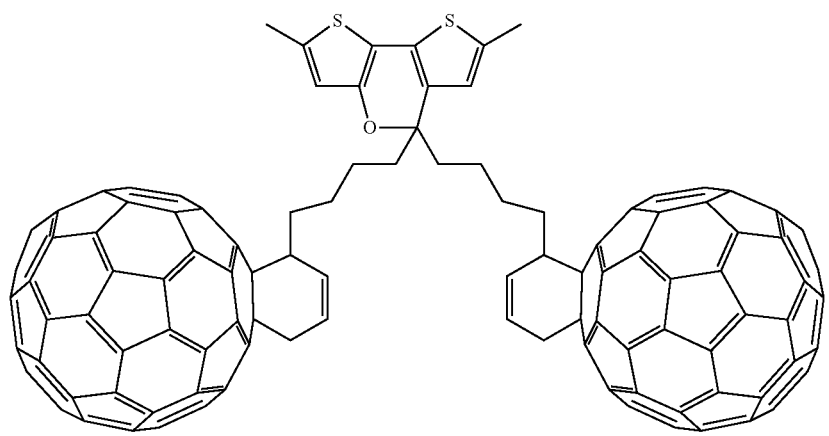
[Chemical Formula 104]
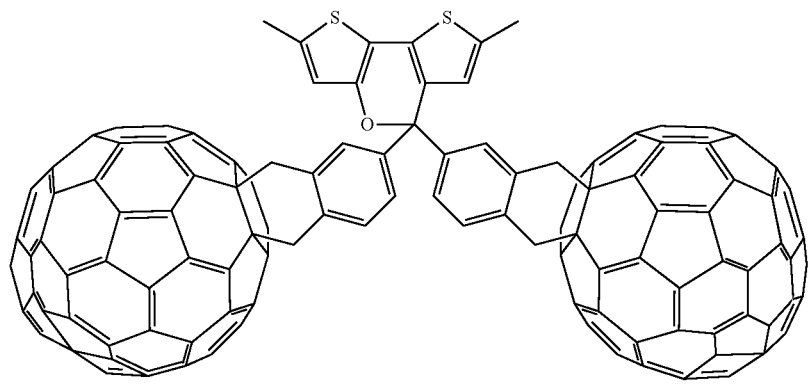

-continued
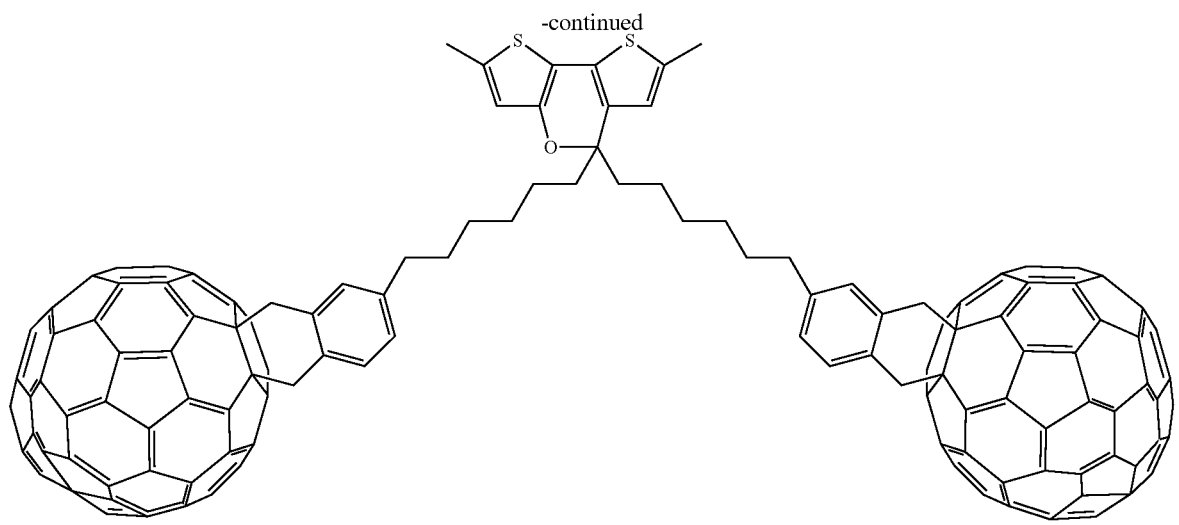
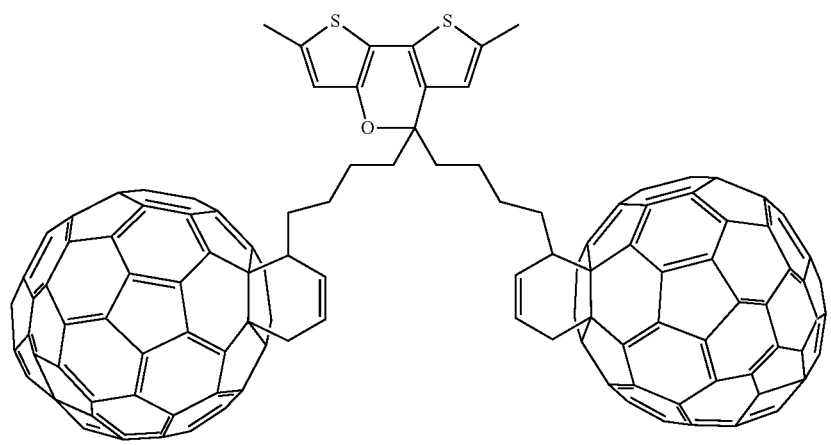
[Chemical Formula 105]
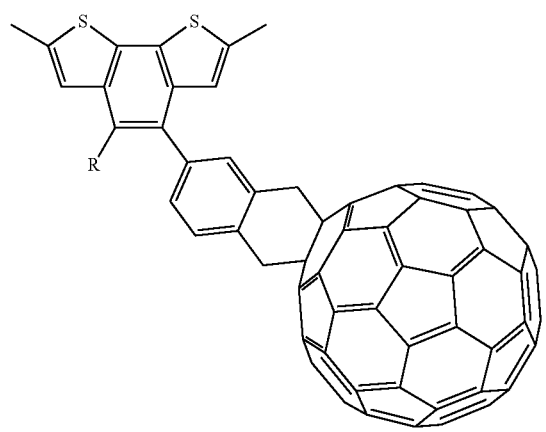

-continued
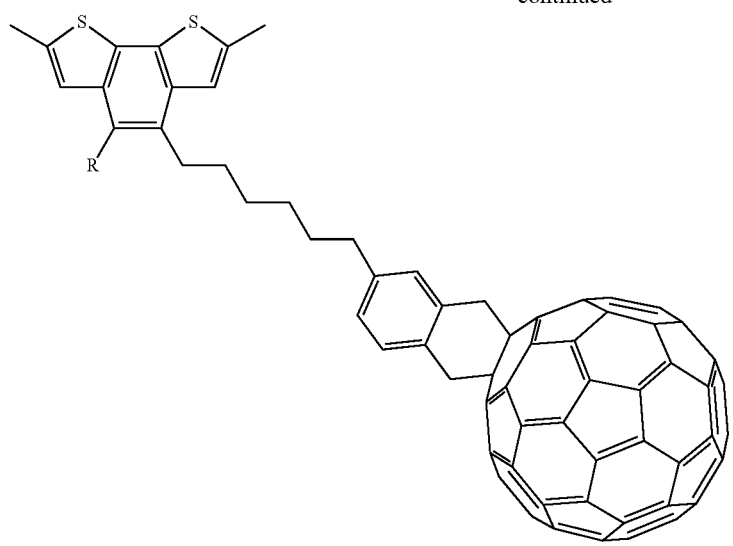
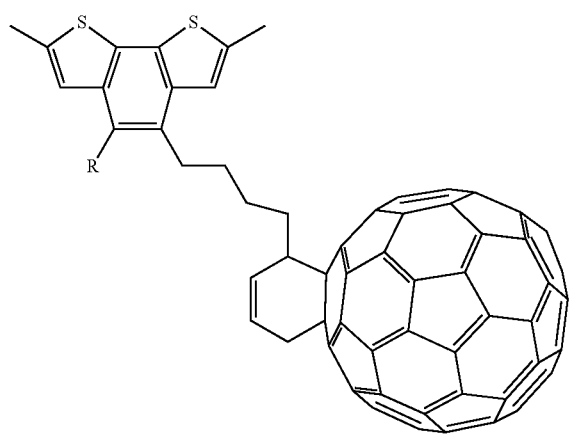
[Chemical Formula 106]
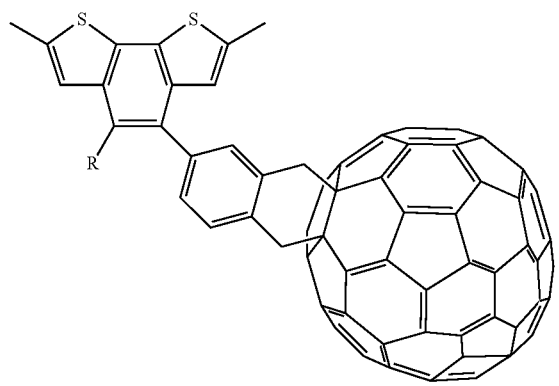

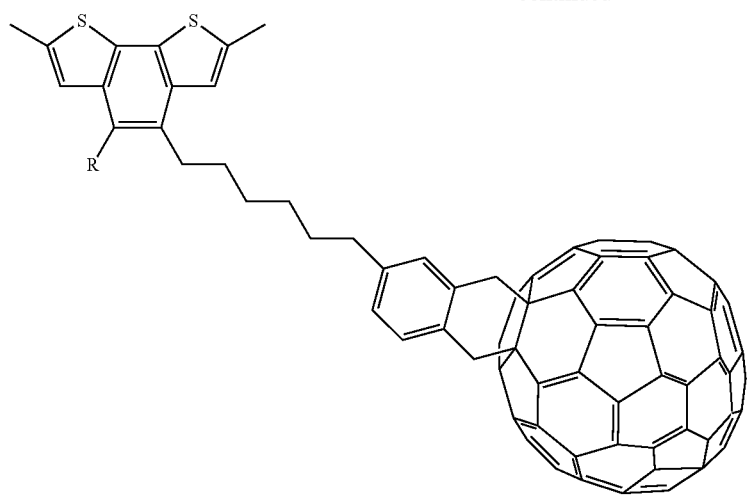
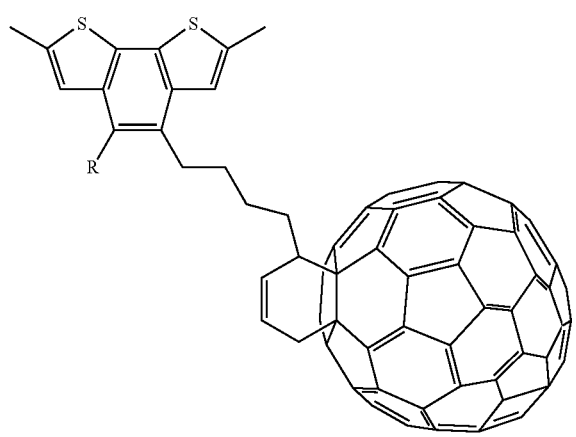
[Chemical Formula 107]
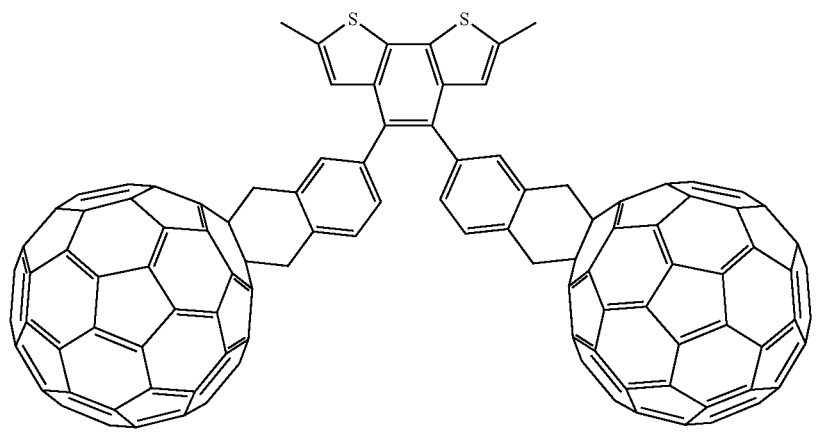

-continued
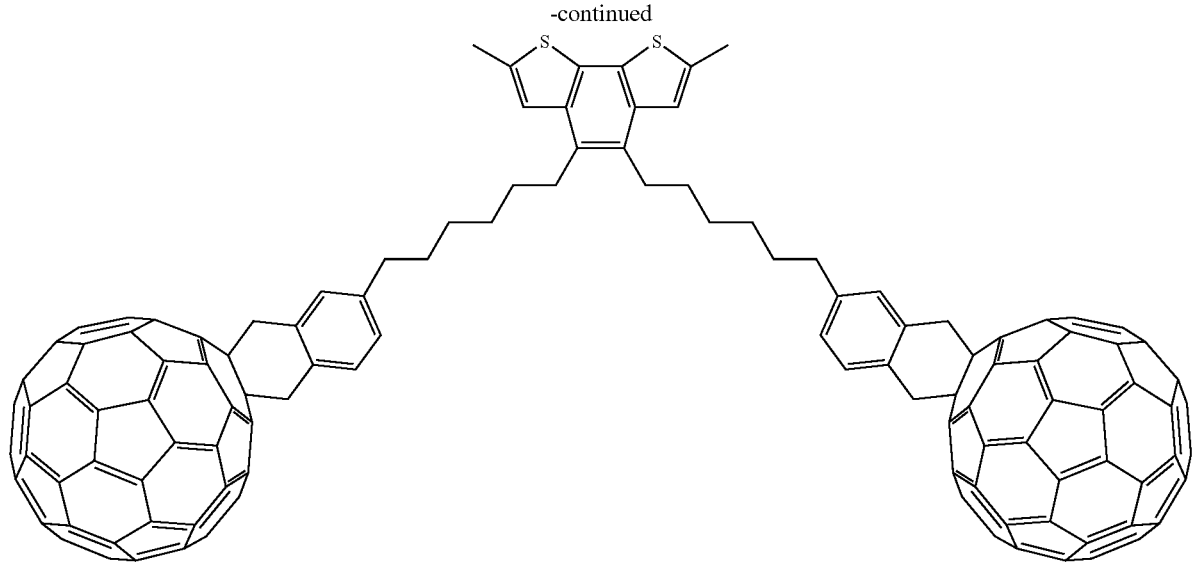
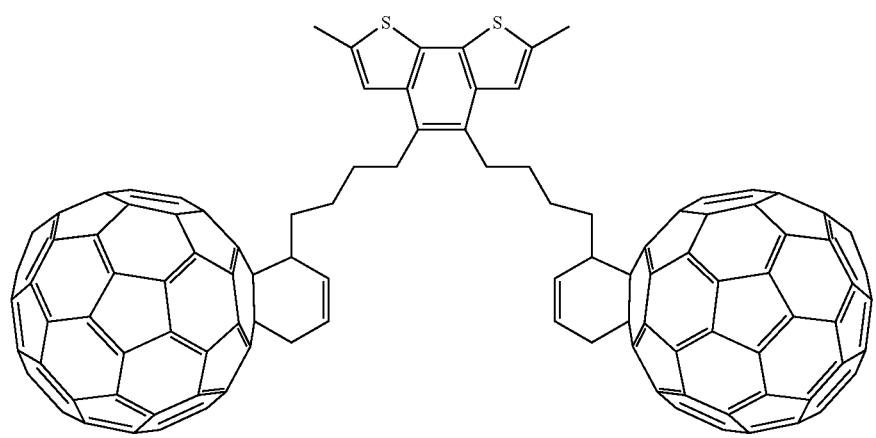
[Chemical Formula 108]
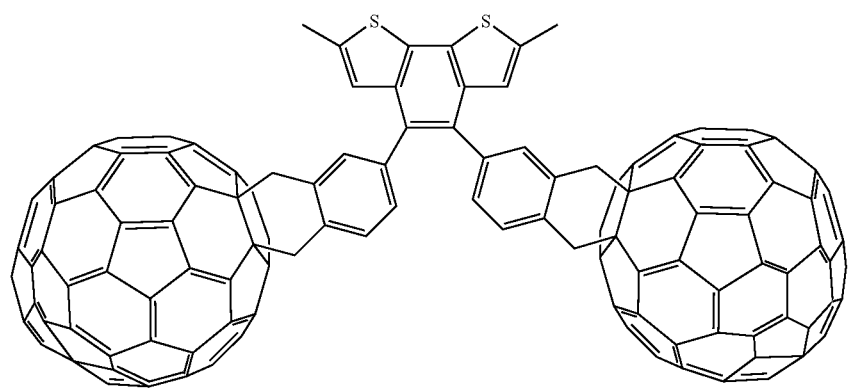

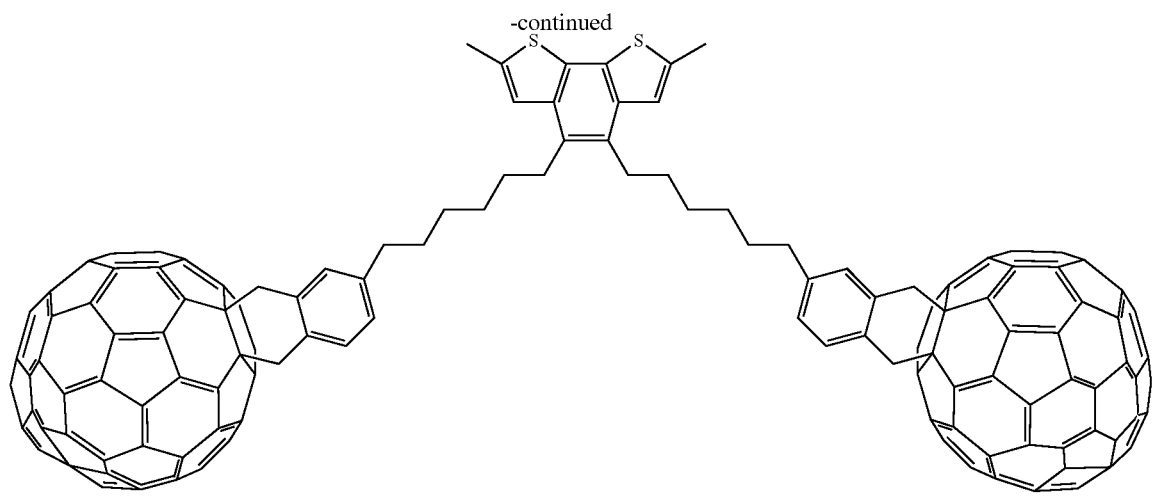
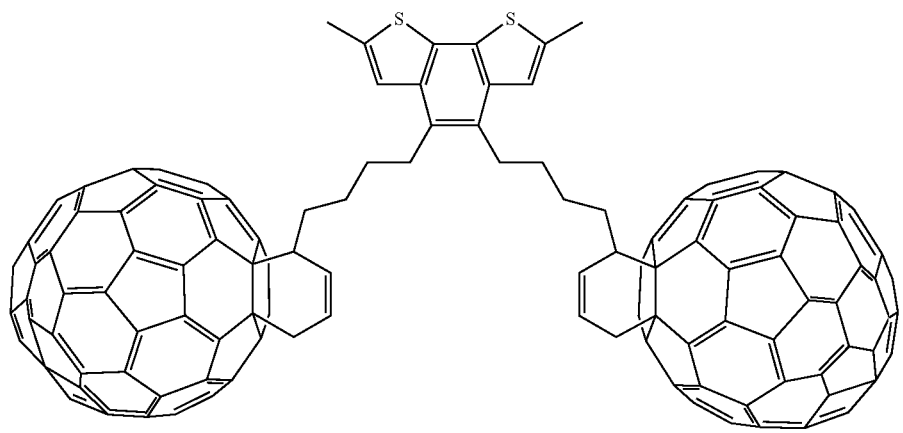
Furthermore, in the case where a group containing a carbon cluster structure is introduced in the second repeating unit, examples of the structure include the structures represented by the following formulas.
[Chemical Formula 109]
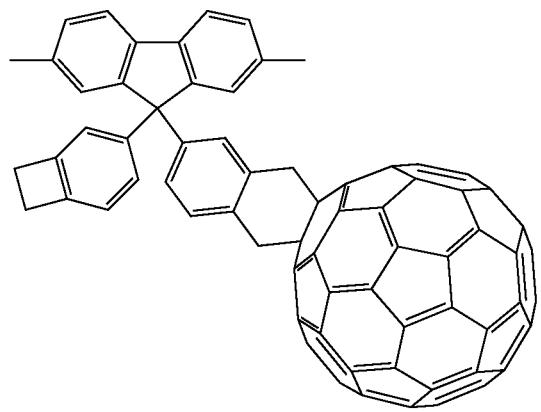

-continued
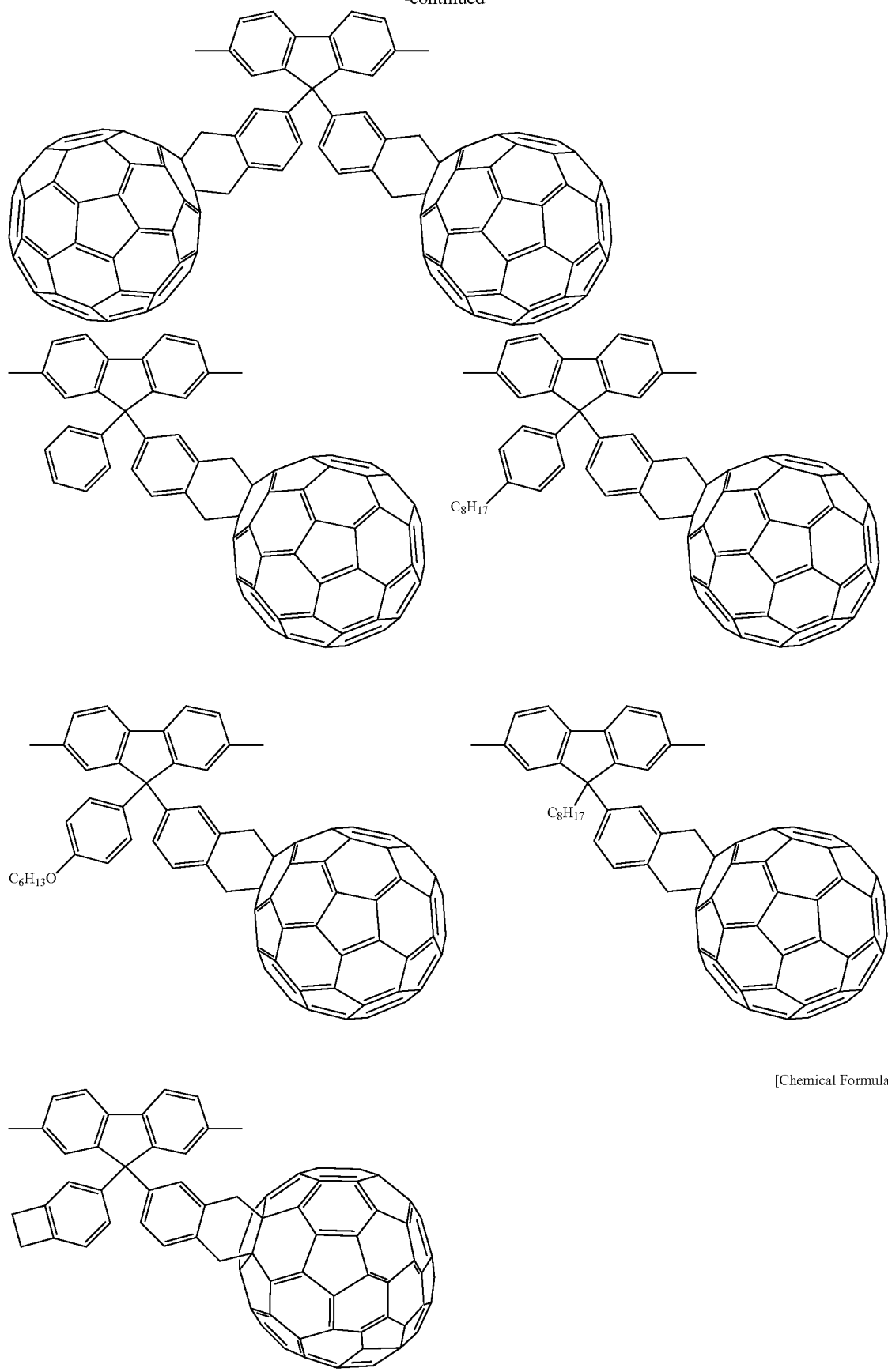
[Chemical Formula 110]

-continued
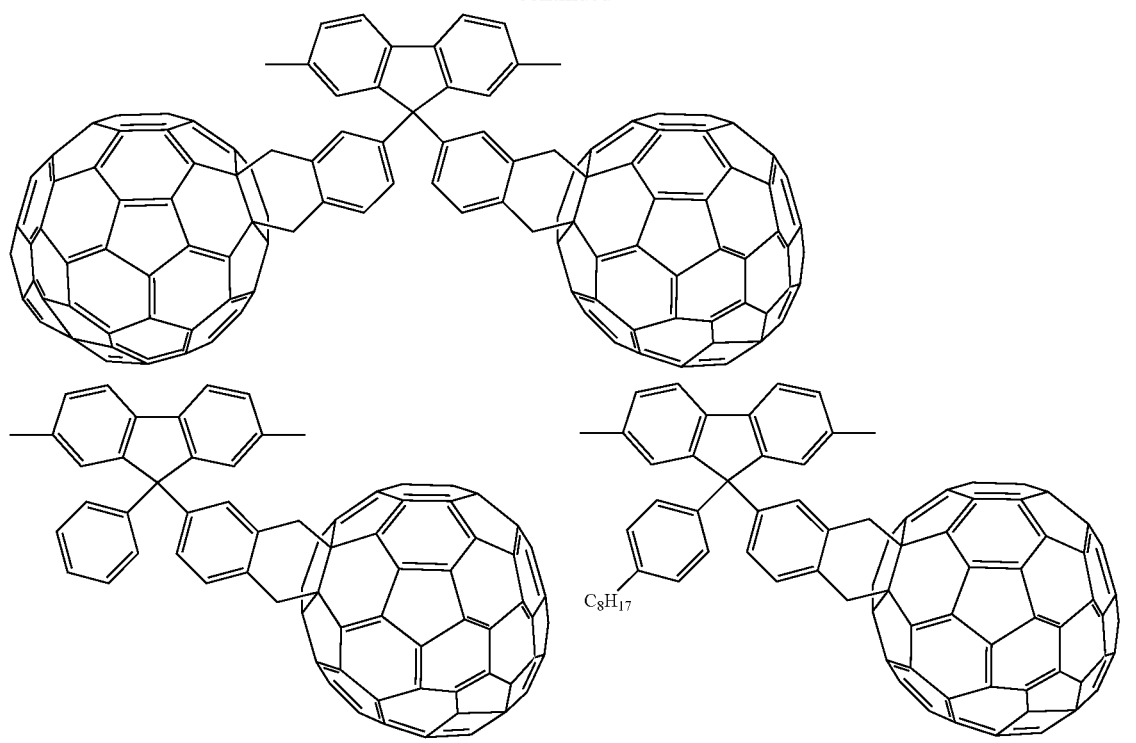
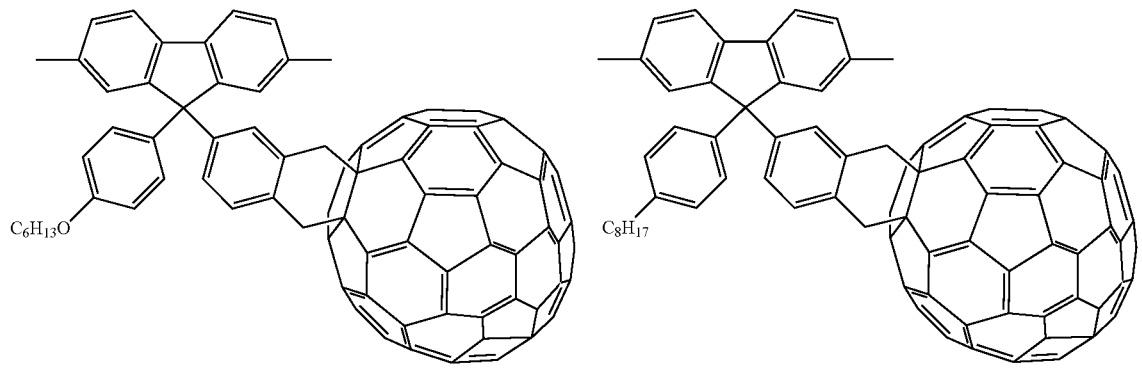
[Chemical Formula 111]
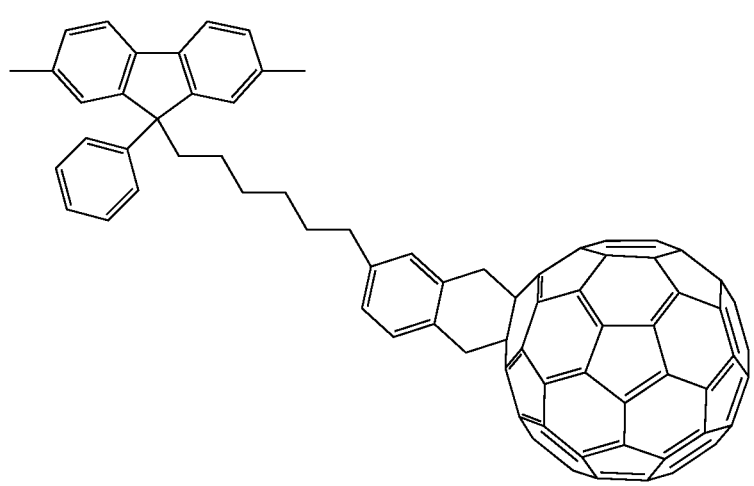

-continued
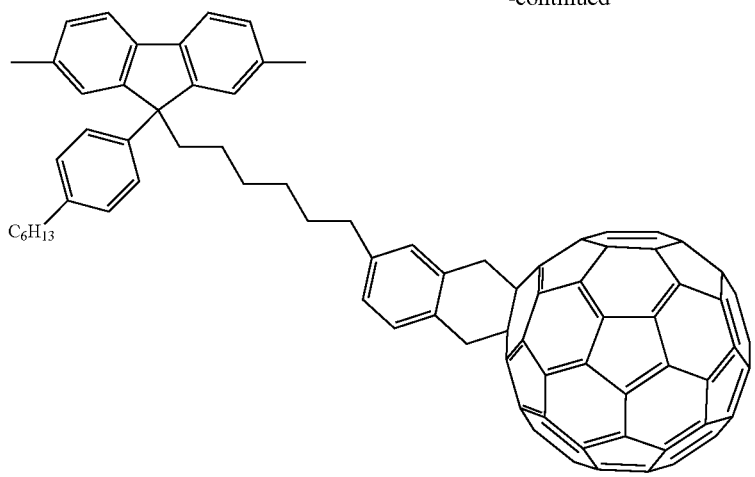
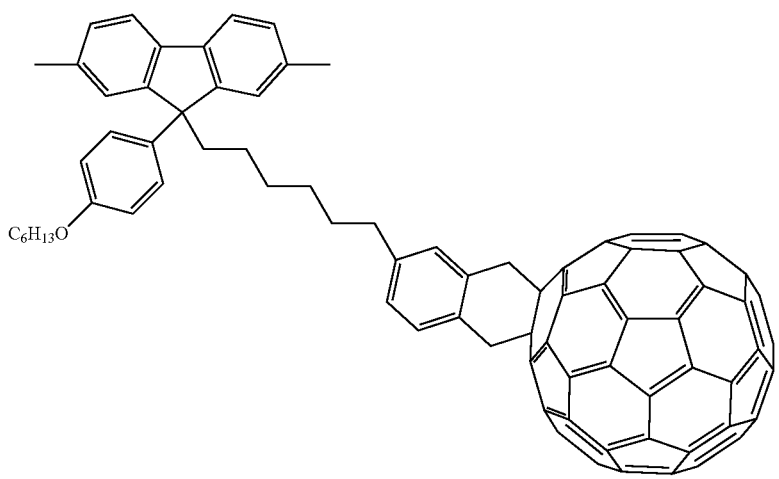
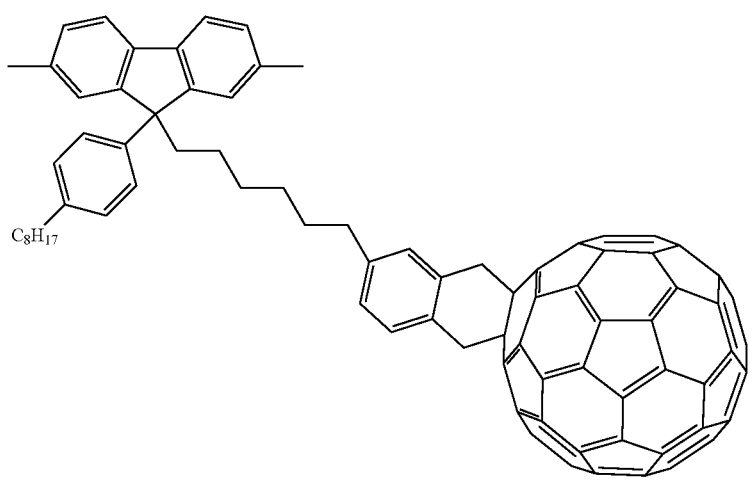

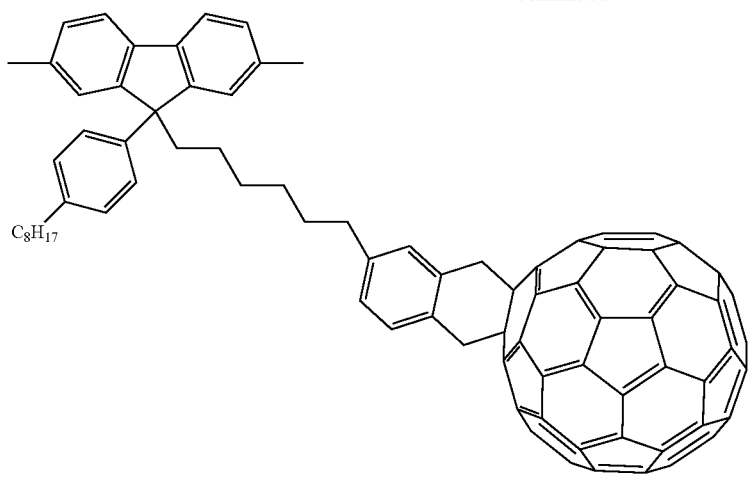
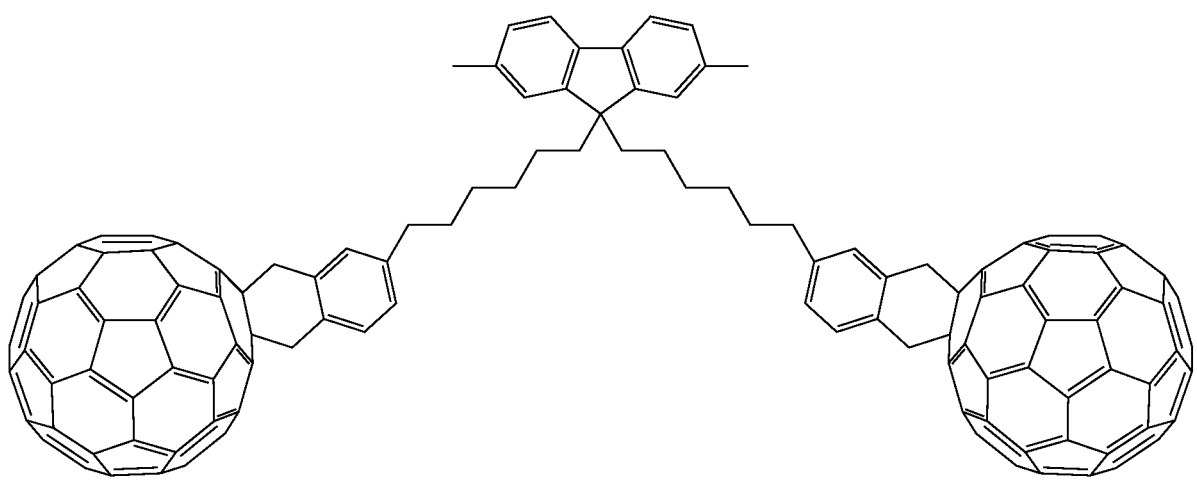
[Chemical Formula 112]
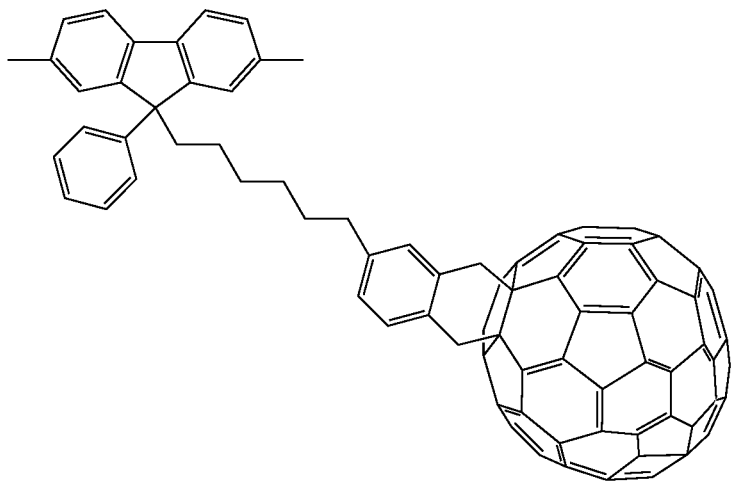

-continued
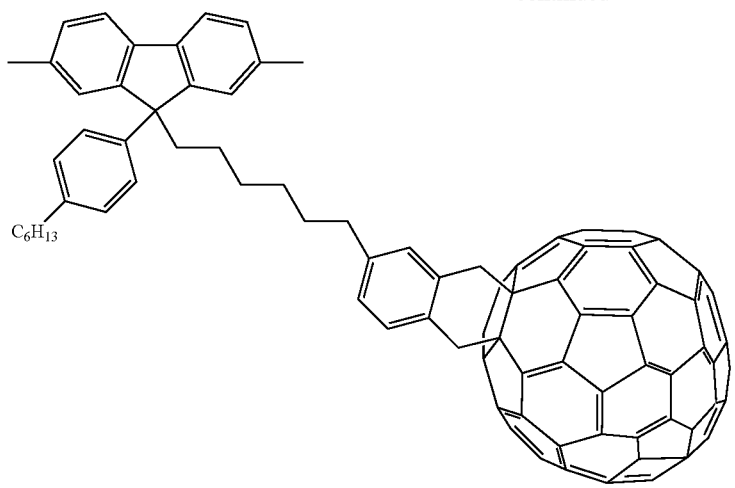
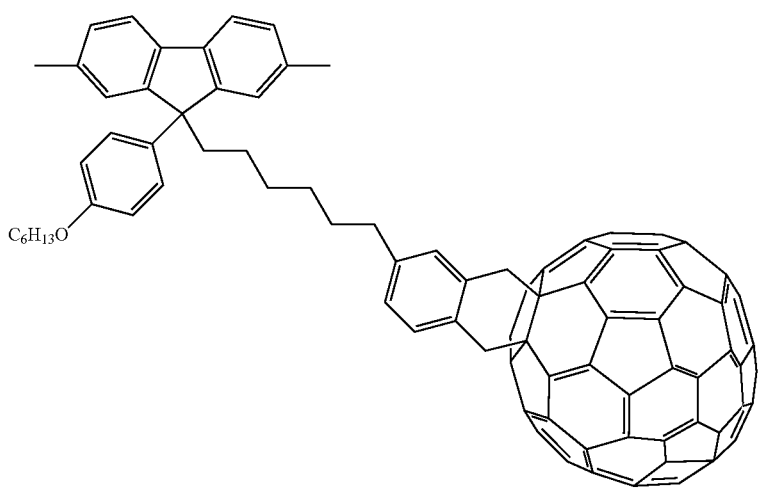
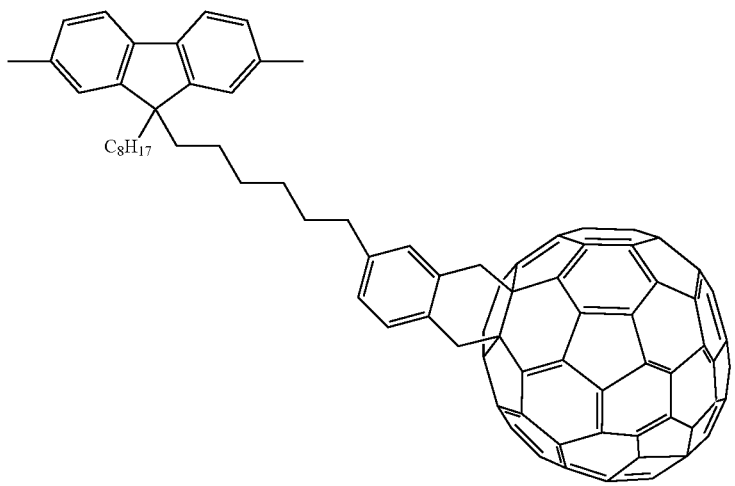

-continued
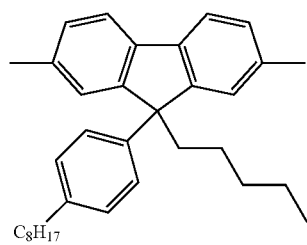
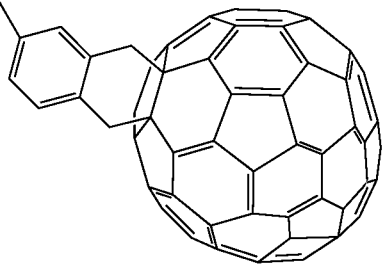
[Chemical Formula 113]
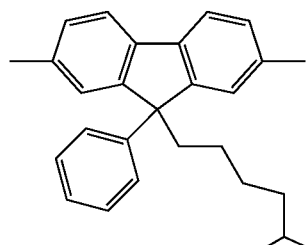
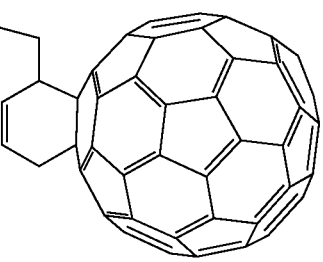

-continued
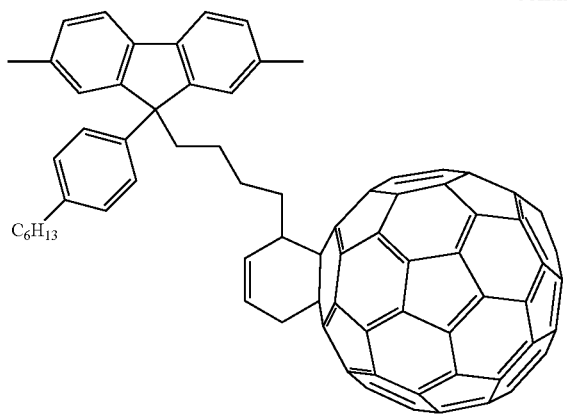
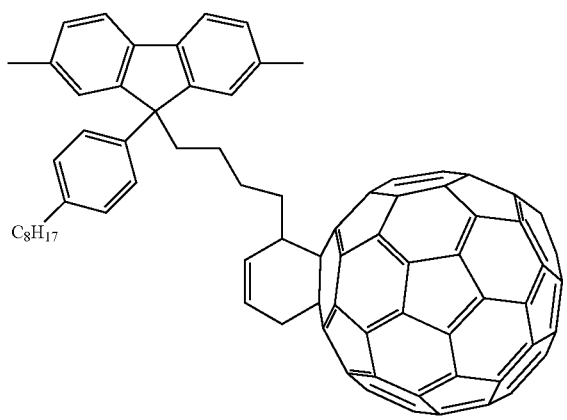
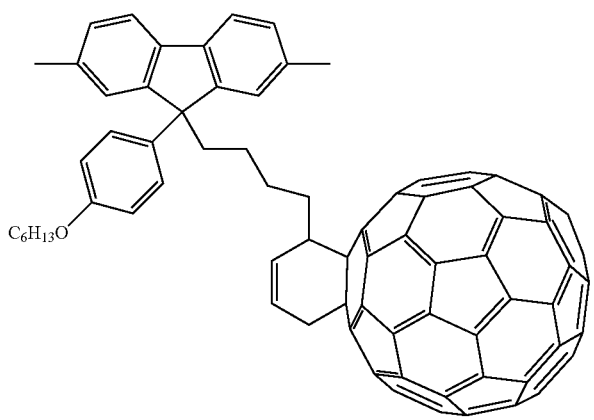
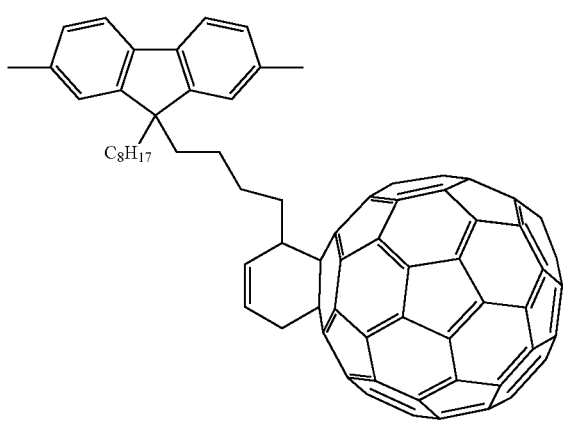

-continued
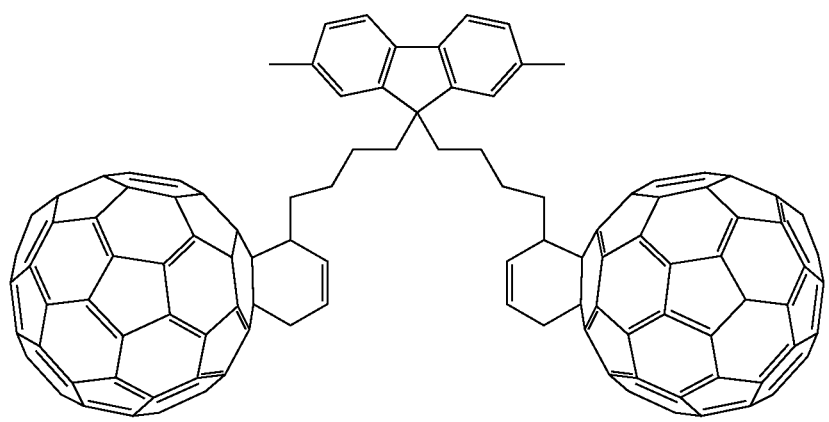
[Chemical Formula 114]
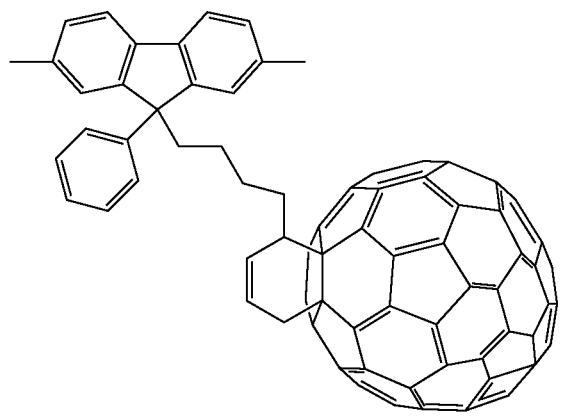
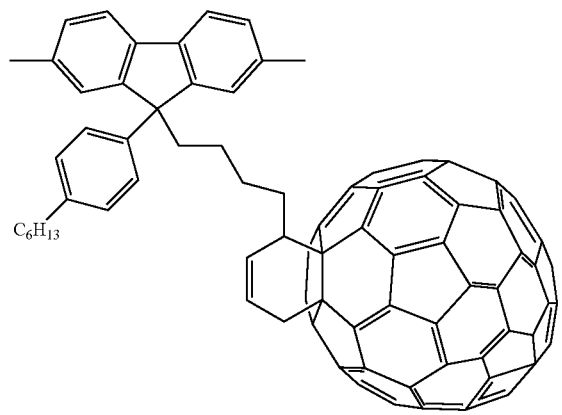
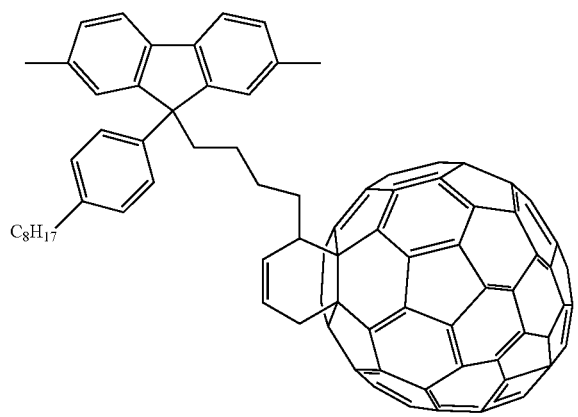

-continued

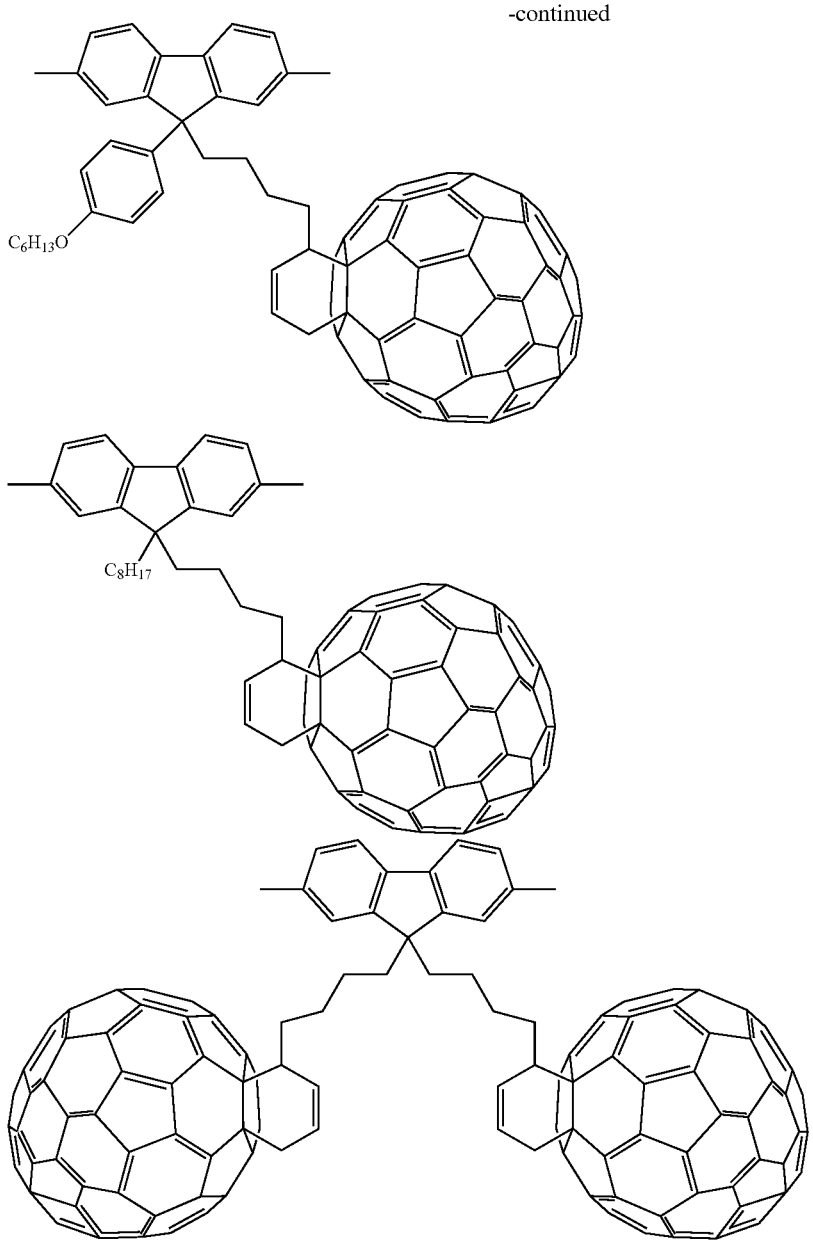

A polymer compound according to the photoelectric conversion device embodiment of the invention has a weight-average molecular weight of usually, $1.0 \times 10^3$ or more, preferably $3.0 \times 10^3$ to $1.0 \times 10^7$, more preferably $8.0 \times 10^3$ to $5.0 \times 10^6$, and further preferably $1.0 \times 10^4$ to $1.0 \times 10^6$.

Note that, in the photoelectric conversion device embodiment of the invention, the weight-average molecular weight is a polystyrene-equivalent weight-average molecular weight measured by gel permeation chromatography (GPC) and calculated by use of a polystyrene standard sample.

Furthermore, a polystyrene-equivalent number-average molecular weight of a polymer compound according to the photoelectric conversion device embodiment of the invention is usually $1 \times 10^3$ to $1 \times 10^8$. When the polystyrene-equivalent number-average molecular weight satisfies the above range, a strong and film tends to be easily obtained, in addition, the solubility of a polymer compound is further increased and formation of a film tends to be easier.

In a polymer compound according to the photoelectric conversion device embodiment of the invention, the content of a carbon cluster structure is usually, 0.001 mass % to 80 mass %, preferably 0.01 mass % to 70 mass %, and particularly preferably 0.1 mass % to 60 mass %.

Furthermore, in a polymer compound according to the photoelectric conversion device embodiment of the invention, the ratio of the repeating unit including a group containing a carbon cluster structure relative to the sum of the repeating units in the polymer compound (the total number of repeating units having a group containing a carbon cluster structure and repeating units having a group containing no carbon cluster structure) is preferably 5 mole % or more and 100 mole % or less, more preferably 15 mole % or more and 80 mole % or less, and further preferably 30 mole % or more and 60 mole % or less.

A terminal group of a polymer compound according to the photoelectric conversion device embodiment of the invention may be protected with a stable group. This is because if a polymerizable group remains as it is, the characteristics of the resultant device formed of the polymer compound deteriorate and the life thereof may decrease. It is preferable that a terminal group has a conjugated bond continued to the conjugated structure of the main chain. A structure in which, for example, connection is made to an aryl group or a monovalent heterocyclic group via a vinylene group may be acceptable.

In the case where a polymer compound according to the photoelectric conversion device embodiment of the invention is a copolymer, the polymer compound may be a block copolymer, a random copolymer, an alternate copolymer or a graft copolymer, or another type of copolymer.

In a polymer compound according to the photoelectric conversion device embodiment of the invention, it is preferable that the light absorption terminal wavelength falls within a long wavelength range. The light absorption terminal wavelength can be obtained by the following method using a film formed of a polymer compound.

In measurement of the absorption spectrum of the film, a spectrophotometer working in ultraviolet, visible light and infrared wavelength range (for example, ultraviolet visible light infrared spectrophotometer, JASCO-V670, manufactured by JASCO Corporation) is used. In employing JASCO-V67, since a detectable wavelength range is 200 nm to 1500 nm, measurement is made within the wavelength range.

First, the absorption spectrum of a substrate to be used in measurement is measured. As the substrate, e.g., a quarts substrate or a glass substrate is used. Subsequently, from solution containing a polymer compound or a melt containing a polymer compound, a film containing the polymer compound is formed on the substrate. Film formation from the solution, drying is performed after film formation. Thereafter, an absorption spectrum of a laminate of film and the substrate is obtained. The difference between the absorption spectrum of the laminate of the film and the substrate and the absorption spectrum of the substrate is obtained as the absorption spectrum of a polymer compound.

In the absorption spectrum of the film, the ordinate indicates the absorbance of the polymer compound and the abscissa indicates wavelength. It is desirable to control the thickness of the film such that the absorbance of the highest absorption peak is 0.5 to 2.

Of the (plurality of) absorption peaks, the absorbance of the absorption peak present at the longest wavelength side (hereinafter, referred to as "the longest wavelength absorption peak") is regarded as 100%. On and through the position corresponding to an absorbance of 50%, a line parallel to the abscissa (wavelength axis) is drawn and cross points of this line and the longest wavelength absorption peak are obtained. Of the cross points between this line and the longest wavelength absorption peak, the cross point present in the longer wavelength side than the peak wavelength of the longest wavelength absorption peak is designated as a first point. On and through the position corresponding to an absorbance of 25% thereof, a line parallel to the abscissa (wavelength axis) is drawn. Of the cross points between this line and the longest wavelength absorption peak, the cross points present in the longer wavelength side than the peak wavelength of the longest wavelength absorption peak is designated as a second point.

When a vertical line is drawn to the abscissa (wavelength axis) from the cross point between the linear line connecting between the first point and the second point and a reference line, the cross point between the abscissa (wavelength axis) and the vertical line, i.e., a wavelength value at the cross point, is defined as a light absorption terminal wavelength.

Herein, the reference line refers to the line defined as follows. The absorbance of the longest wavelength absorption peak is regarded as 100%. At from the point corresponding to 10% of the absorbance, a parallel line to the abscissa (wavelength axis) is drawn. Of the cross points between the line and the longest wavelength absorption peak, the cross point at the longer wavelength side of the peak wavelength of the longest wavelength absorption peak is selected. From the cross point, a vertical line is drawn to the abscissa (wavelength axis). The wavelength value of the cross point between the abscissa (wavelength axis) and the vertical line is defined as a reference wavelength. On and through the point longer by 100 nm from the reference wavelength, a line perpendicular to the abscissa (wavelength axis) is drawn. The cross point between the line and an absorption spectrum of a polymer compound is defined as a third point. On and through the point longer by 150 nm from the reference wavelength, a line perpendicular to the abscissa (wavelength axis) is drawn. The cross point between the line and an absorption spectrum of a polymer compound is defined as a fourth point. The line connecting the third point to the fourth point is referred to as the reference line.

A polymer compound according to the photoelectric conversion device embodiment of the invention can be obtained by condensation polymerization of a compound (monomer) corresponding to the unit to be contained in the polymer compound. The monomer which is synthesized and isolated in advance may be used or synthesized in a reaction system and directly put in use.

<Production Method 1>

A polymer compound according to the photoelectric conversion device embodiment of the invention, which is a compound having a group containing a carbon cluster structure, can be produced by condensation polymerization using compounds to be an arylene unit or a heteroarylene unit when synthesized by condensation polymerization. Other compounds to be used in condensation polymerization can be selected such that the repeating unit is to be an arylene unit or a heteroarylene unit.

A polymer compound according to the photoelectric conversion device embodiment of the invention, can be produced, for example, by condensation polymerization of a compound represented by the following formula (T5A-a).

[Chemical Formula 115]

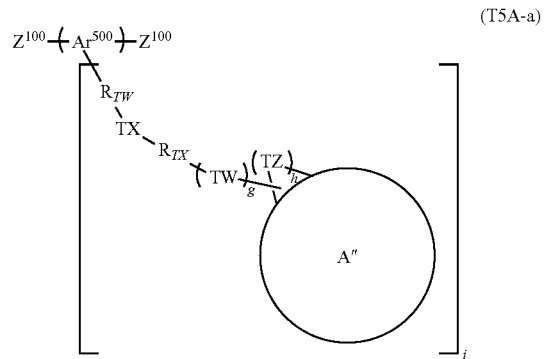

(T5A-a)

In the above formula (T5A-a), $Ar^{500}$, TX, $R_{TW}$, $R_{TX}$, TW, TZ, h, g and ring A" are the same as defined in the above formula (T5A); $Z^{100}$ represents a halogen atom, a methoxy group, a boric acid ester residue (more specifically, as mentioned later), a boric acid residue ($-B(OH)_2$), a group represented by the following formula (Ta-1), a group represented by the following formula (Ta-2), a group represented by the following formula (Ta-3) or a group represented by the following formula (Ta-4); Two $Z^{100}$ may be the same or different; and when there are a plurality of $R_{TW}$, $R_{TX}$, TX, TW, TZ, g, h and ring A", they may be independently the same or different.

[Chemical Formula 116]

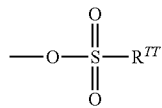
(Ta-1)

In formula (Ta-1), $R^{TT}$ represents an unsubstituted or substituted alkyl group, or an unsubstituted or substituted aryl group.

[Chemical Formula 117]

(Ta-2)

In formula (Ta-2), $X_{TA}$ represents a halogen atom.

[Chemical Formula 118]

(Ta-3)

In formula (Ta-3), $X_{TA}$ is the same as defined above.

[Chemical Formula 119]

(Ta-4)

In formula (Ta-4), $R^{TT}$ is the same as defined above.

Furthermore, a polymer compound according to the photoelectric conversion device embodiment of the invention can be produced, for example, by condensation polymerization of at least one compound selected from the group consisting of a compound represented by the following formula (T5'-a), a compound represented by the following formula (T5B-a), a compound represented by the following formula (T5C-a) and a compound represented by the following formula (T5D-a).

[Chemical Formula 120]

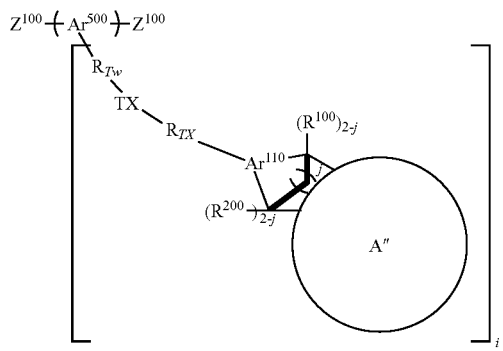
(T5'-a)

In the above formula (T5'-a), $Ar^{500}$, $Ar^{110}$, TX, $R_{TW}$, $R_{TX}$, $R^{100}$, $R^{200}$, ring A", i and j are the same as defined in the above formula (T5'); $Z^{100}$ is the same as defined in formula (T5A-a); two $Z^{100}$ may be the same or different; and when there are a plurality of $R_{TW}$, $R_{TX}$, TX, $Ar^{100}$, $R^{100}$, $R^{200}$, j and ring A", they may be independently the same or different. Note that, when j is 0, the carbon atom bound to $R^{100}$ and the carbon atom bound to $R^{200}$ are not directly bonded.

[Chemical Formula 121]

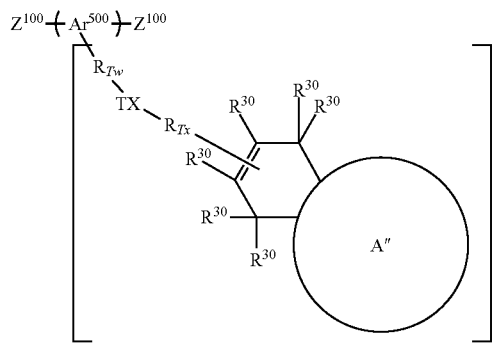
(T5B-a)

In the above formula (T5B-a), $Ar^{500}$, TX, $R_{TW}$, $R_{TX}$, $R^{30}$, ring A" and i are the same as defined in the above formula (T5B); $Z^{100}$ is the same as defined in formula (T5A-a); two $Z^{100}$ may be the same or different; and when there are a plurality of $R_{TW}$, $R_{TX}$, TX and ring A", they may be independently the same or different.

[Chemical Formula 122]

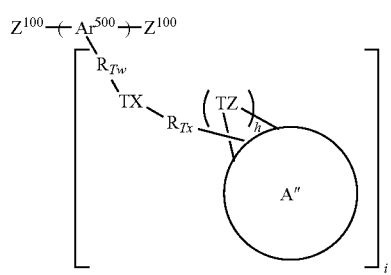
(T5C-a)

In the above formula (T5C-a), $Ar^{500}$, TX, $R_{TW}$, $R_{TX}$, ring A", i, TZ and h are the same as defined in the above formula (T5C); $Z^{100}$ is the same as defined in formula (T5A-a); two $Z^{100}$ may be the same or different; and when there are a plurality of $R_{TW}$, $R_{TX}$, TX, TZ, h and ring A", they may be independently the same or different.

[Chemical Formula 123]

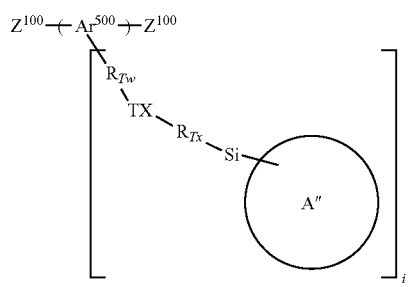
(T5D-a)

In the above formula (T5D-a), $Ar^{500}$, TX, X, $R_{TW}$, $R_{TX}$, ring A" and i are the same as defined in the above formula (T5D); $Z^{100}$ is the same as defined in formula (T5A-a); two $Z^{100}$ may be the same or different; and when there are a plurality of $R_{TW}$, $R_{TX}$, TX and ring A'', they may be independently the same or different.

<Production Method 2>

A polymer compound according to the photoelectric conversion device embodiment of the invention can be obtained by reacting a precursor polymer compound synthesized by condensation polymerization in advance and a carbon cluster. The precursor polymer compound has at least one unit selected from the group consisting of an arylene unit and a heteroarylene unit as repeating units and at least a part of repeating units has a crosslinkable group.

Examples of the crosslinkable group include a group remaining after removing a single hydrogen atom on a vinyl group from a divinyl group and isobutene, a group remaining after removing a single hydrogen atom on the benzene ring from benzocyclobutene; and an azide group. Examples of the crosslinkable group include groups represented by the following formulas B-1, B-2, B-3, B-4, B-5, B-6, B-7, B-8, B-9, B-10, B-11, B-12, B-13, B-14, B-15, B-16, B-17, B-18, B-19, B-20, B-21 and B-22.

[Chemical Formula 124]

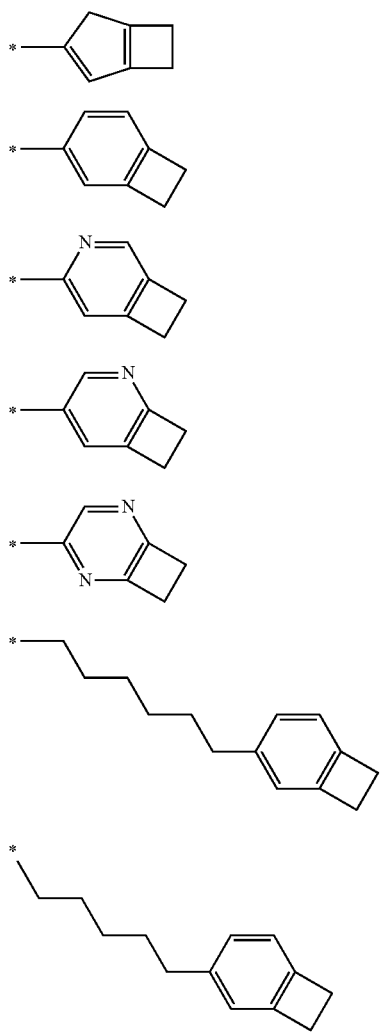

B-1

B-2

B-3

B-4

B-5

B-6

B-7

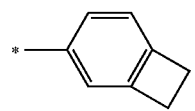

B-8

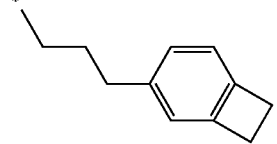

B-9

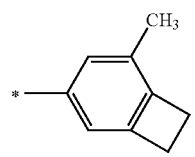

B-10

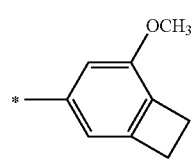

B-11

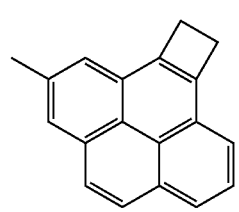

B-12

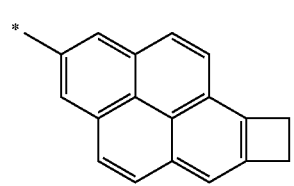

B-13

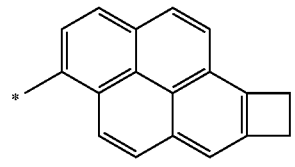

B-14

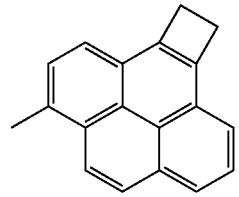

B-15

B-16

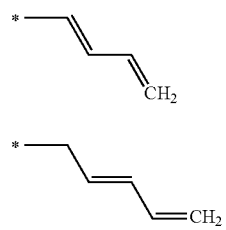

B-17

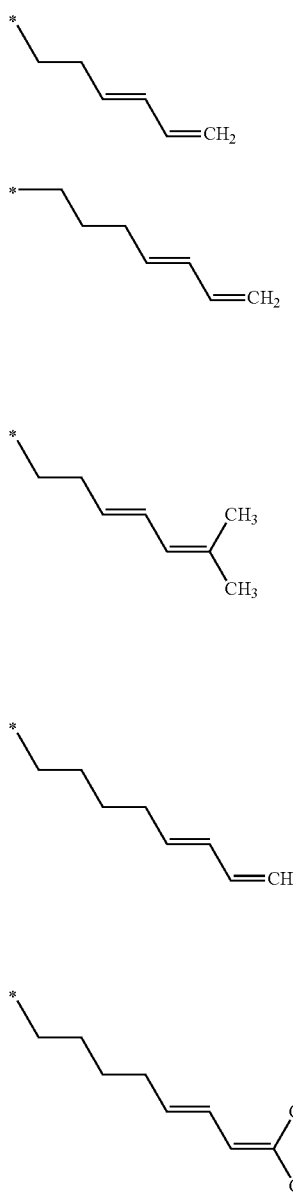
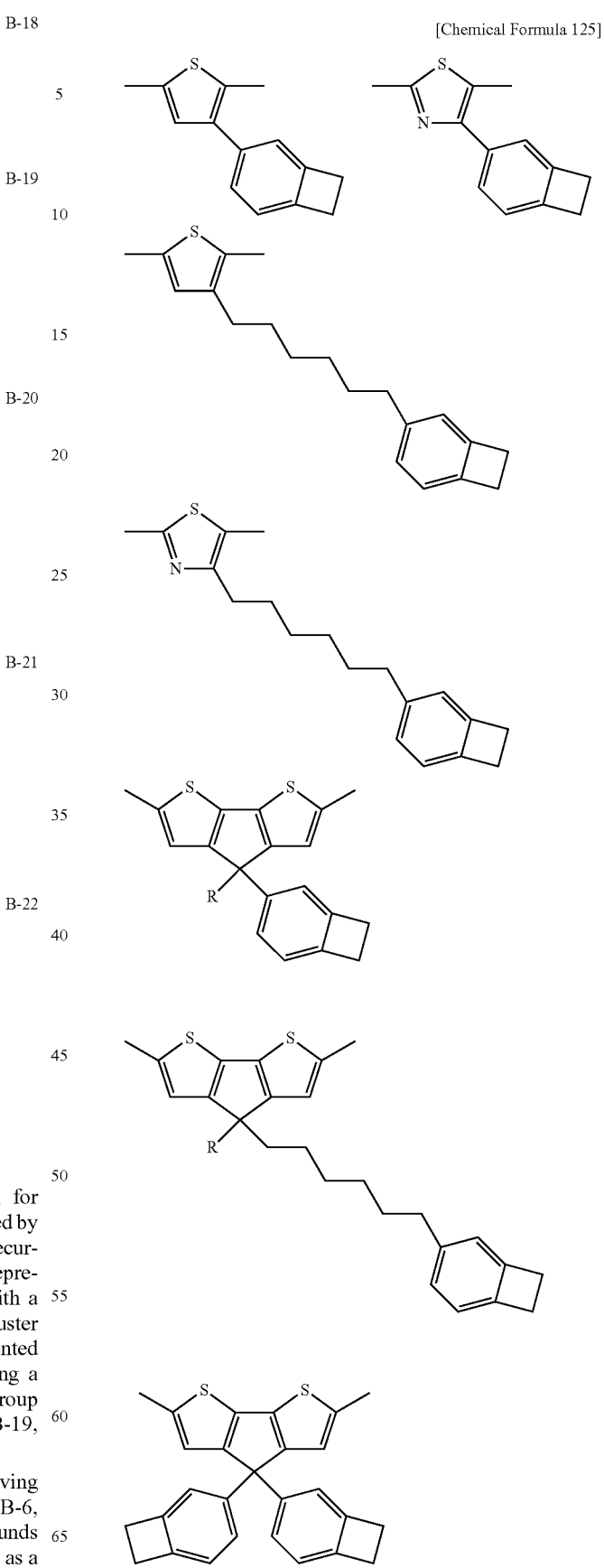

In the formulas, * represents a bonding site.

As a group containing a carbon cluster structure, for example, a polymer compound having a group represented by the above formula A'-1 can be obtained by reacting a precursor polymer compound having a crosslinkable group represented by the above formula B-6, B-7, B-8 or B-9 with a fullerene. Furthermore, as a group containing a carbon cluster structure, a polymer compound having a group represented by the above formula A'-2 can be obtained by reacting a precursor polymer compound having a crosslinkable group represented by the above formula B-16, B-17, B-18 or B-19, with a fullerene.

Examples of precursor polymer compounds having crosslinkable groups represented by the above formulas B-6, B-7, B-8 and B-9 include precursor polymer compounds having structures represented by the following formulas as a repeating unit.

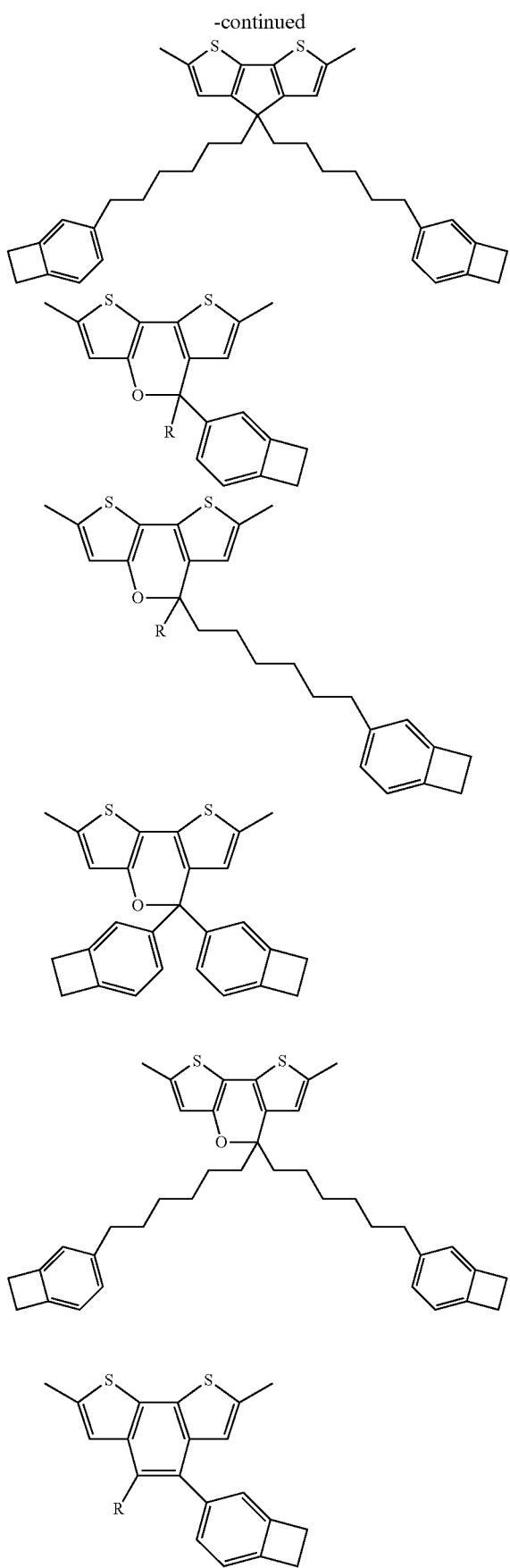
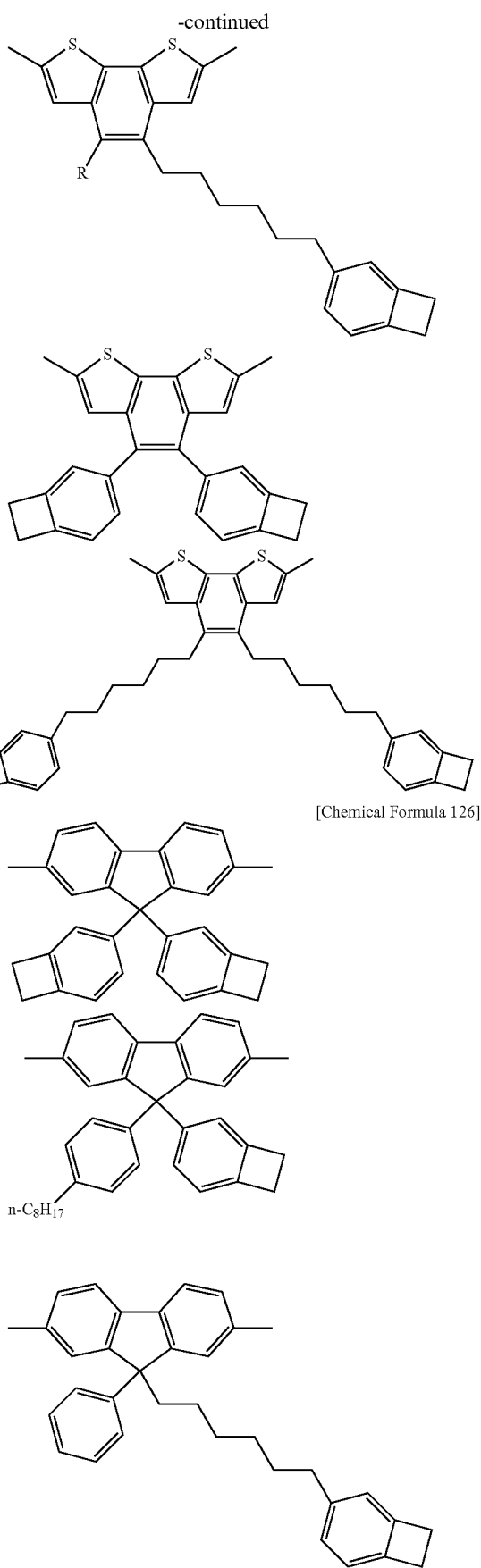

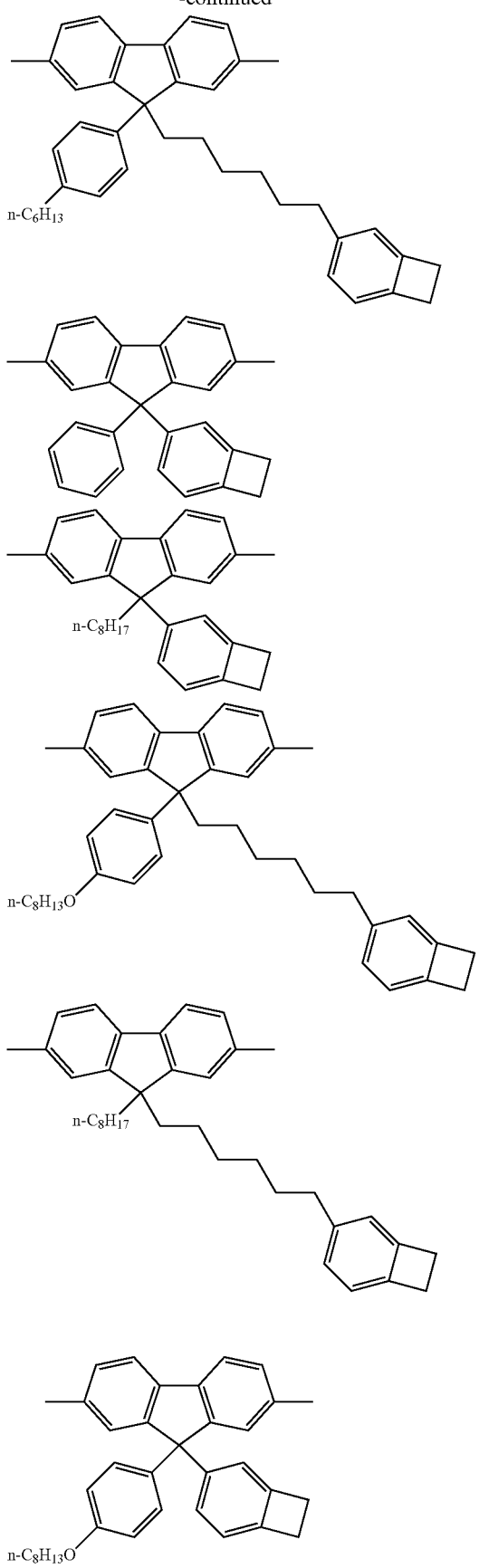
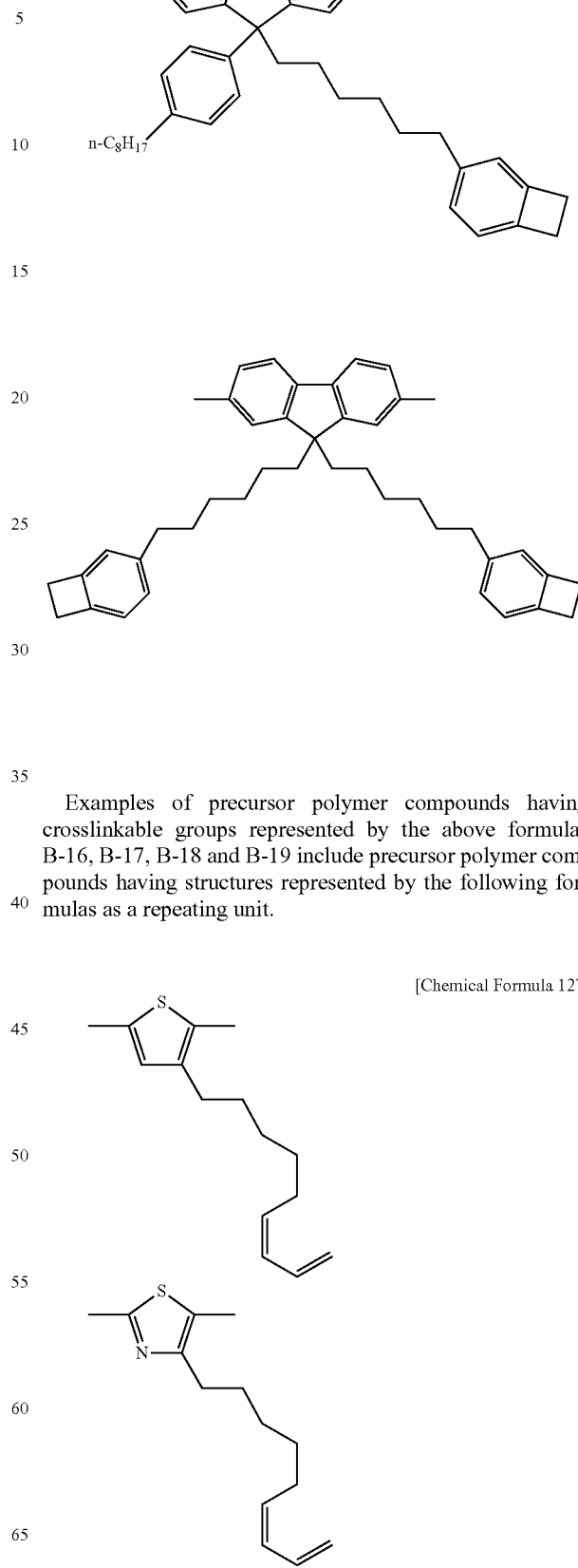
Examples of precursor polymer compounds having crosslinkable groups represented by the above formulas B-16, B-17, B-18 and B-19 include precursor polymer compounds having structures represented by the following formulas as a repeating unit.
[Chemical Formula 127]

183
-continued
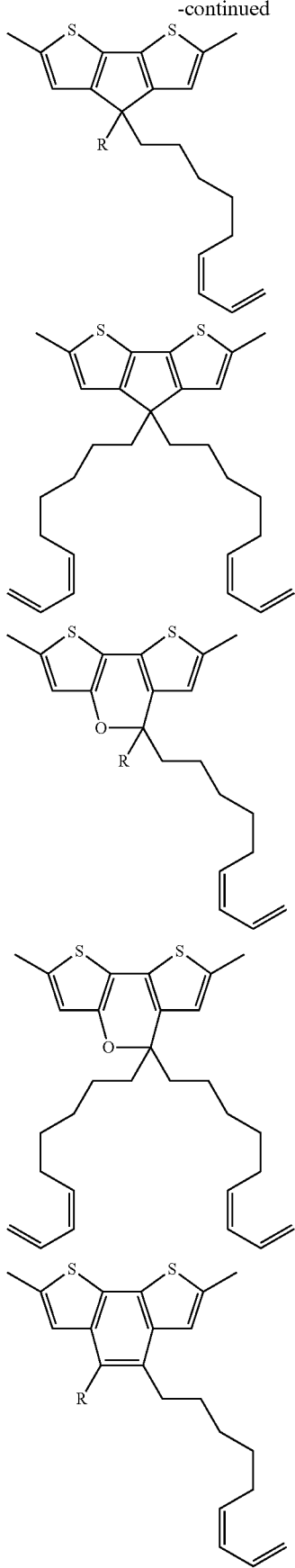
184
-continued
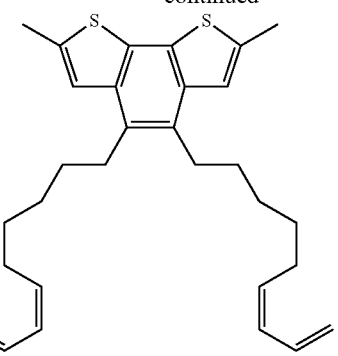
[Chemical Formula 128]
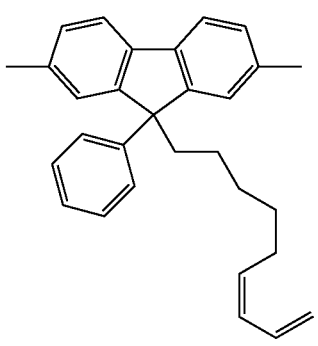
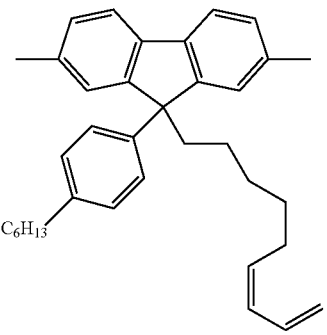
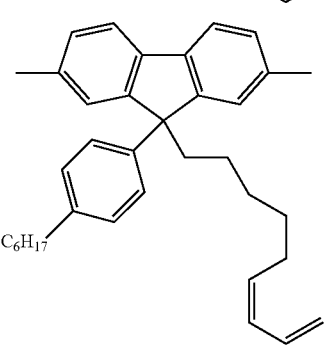
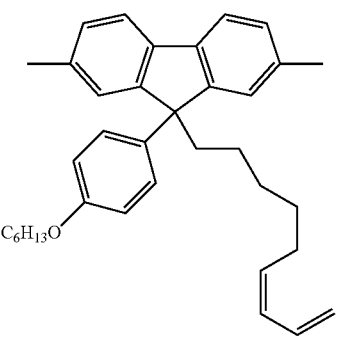

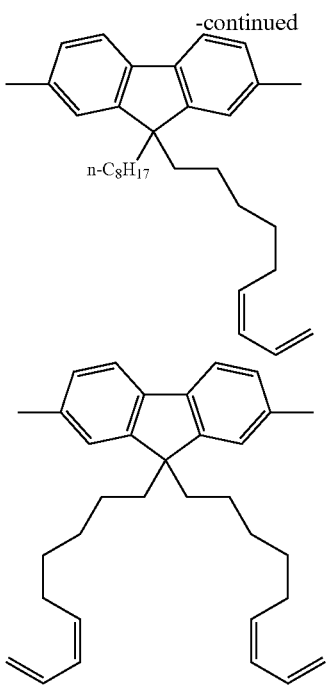

A reaction between a precursor polymer compound having a crosslinkable group represented by the above formula B-6, B-7, B-8 or B-9 and a fullerene, and a reaction between a precursor polymer compound having a crosslinkable group represented by the above formula B-16, B-17, B-18 or B-19 and a fullerene are usually performed in the presence of a solvent such as an organic solvent or in the absence of a solvent, and preferably performed in the presence of a solvent such as an organic solvent.

Examples of the organic solvent include toluene, xylene, chlorobenzene, dichlorobenzene and trichlorobenzene. Chlorobenzene, dichlorobenzene and trichlorobenzene are preferable, and dichlorobenzene and trichlorobenzene are particularly preferable.

The use amount of organic solvent is specified such that the concentration of the sum of a precursor polymer compound having a crosslinkable group represented by the above formula B-6, B-7, B-8 or B-9 and a precursor polymer compound having a crosslinkable group represented by the above formula B-16, B-17, B-18 or B-19 becomes usually 0.1 mass % to 90 mass %, preferably 0.1 mass % to 10 mass %, and more preferably 0.5 mass % to 5 mass %.

The temperature of a reaction between a precursor polymer compound having a crosslinkable group represented by the above formula B-6, B-7, B-8 or B-9 or a precursor polymer compound having a crosslinkable group represented by the above formula B-16, B-17, B-18 or B-19 and a fullerene is preferably 60° C. to 250° C., more preferably 100° C. to 220° C., and further preferably 180° C. to 220° C.

The reaction time, which varies depending upon the conditions such as reaction temperature, is usually one hour or more, and preferably 10 hours to 500 hours.

The amount of fullerene to be used in a reaction is preferably 0.5 mole equivalent to 5 mole equivalents, further preferably 1.0 mole equivalents to 4 mole equivalents, and particularly preferably 1.5 mole equivalents to 3 mole equivalents relative to the molar number of the total crosslinkable groups contained in a precursor polymer compound having a crosslinkable group represented by the above formula B-6, B-7, B-8 or B-9 or a precursor polymer compound having a crosslinkable group represented by the above formula B-16, B-17, B-18 or B-19.

The post treatment of the reaction can be performed by adding the reaction solution obtained in the above reaction to a lower alcohol such as methanol to obtain a precipitate and filtrating and drying the precipitate, in accordance with a conventional method.

The ratio of a fullerene contained in a polymer compound (which is obtainable by the reaction between a precursor polymer compound having a crosslinkable group represented by the above formula B-6, B-7, B-8 or B-9, or a precursor polymer compound having a crosslinkable group represented by the above formula B-16, B-17, B-18 or B-19 and a fullerene) and not carried by the polymer compound, more specifically, provided that the molar number of repeating units contained in the polymer compound and the molar number of fullerene not carried by the polymer compound are defined as $N_{M'}$ and $N_{NS'}$, respectively, it is preferable that $N_{M'}$ and $N_{NS'}$ satisfy the following expression (IV') in view of improving characteristics of a photoelectric conversion device and in view of stabilizing the characteristics.

$$0 \leq N_{NS'} \times 100/N_{M'} \leq 50 \tag{IV'}$$

Herein, the fullerene not carried by a polymer compound refers to free unreacted fullerene not reacted with a (precursor) polymer compound and present in a polymer compound.

The fullerene carried by a polymer compound (immobilized fullerene) and the fullerene (free fullerene) not carried can be quantified by GPC-UV. More specifically, immobilized fullerene and free fullerene are separated by use of different elution time in GPC and UV absorption (335 nm) of both fullerenes are separately measured to quantify them. Specifically, for example, in the case of fullerene C60, the amount of free fullerene can be measured in accordance with the following procedure consisting of steps (1) to (4).

(1) A plurality of toluene solutions of fullerene C60 are prepared in different concentrations and GPC-UV values (detected at 335 nm) of them are separately measured.

(2) Chromatograms obtained in measurement of step (1) are used to form a calibration curve (the value of fullerene elution peak area versus the fullerene concentration)

(3) GPC-UV measurement of a real sample is performed.

(4) The fullerene elution peak area value of a chromatogram obtained in the measurement of step (3) and the calibration curve obtained in step (2) are used to calculate the amount of free fullerene in the real sample.

Furthermore, for example, in the case of fullerene C60, the immobilized fullerene can be quantified in accordance with the following procedure consisting of steps (1) to (5).

(1) To a precursor polymer compound, fullerene C60 is added in different concentrations to prepare standard samples and UV absorption spectrums of the standard samples are separately measured.

(2) From the UV absorption spectrums obtained in step (1), relative absorption intensities at 335 nm are obtained to form a calibration curve (the addition amount of fullerene versus the relative absorption intensity at 335 nm).

(3) a polymer compound elution fraction (containing immobilized fullerene) of a real sample is separated by GPC to obtain the polymer compound elution fraction.

(4) UV absorption spectrum of the polymer compound elution fraction obtained in step (3) is measured.

(5) from the UV absorption spectrum obtained in step (4), the relative absorption intensity at 335 nm is obtained and the amount of immobilized fullerene in the real sample is calculated by using the calibration curve obtained in step (2).

Examples of a purification method for removing free fullerene in the polymer compound include conventional purification methods such as recrystallization, continuous extraction by a Soxhlet extractor and column chromatography.

In the case where column chromatography is used as the purification method, it is preferable to use silica gel, alumina or active carbon, further preferable that silica gel and/or active carbon is used and particularly preferable that they are used in combination.

A method for a condensation polymerization reaction of a polymer compound according to the photoelectric conversion device embodiment of the invention or a precursor polymer compound is not particularly limited; however, in view of simple synthesis of a polymer compound or a precursor polymer compound, a method using the Suzuki coupling reaction or the Stille coupling reaction is preferable. Now, a method for producing a polymer compound according to the photoelectric conversion device embodiment of the invention or a precursor polymer compound by condensation polymerization will be described by way of a precursor polymer compound as an example.

Examples of the method using the Suzuki coupling reaction include a process including a step of reacting one or more compounds represented by, for example, formula (120):

[Chemical Formula 129]

$$Q^{100}\text{-}E^1\text{-}Q^{200} \quad (120)$$

[In formula (120), $E^1$ represents a divalent group containing an aromatic ring. $E^1$ may have a group containing a carbon cluster structure in a side chain and a crosslinkable group in a side chain; and $Q^{100}$ and $Q^{200}$ each independently represent a boric acid residue (—B(OH)$_2$) or a boric acid ester residue.]

and one or more compounds represented by formula (200):

[Chemical Formula 130]

$$T^1\text{-}E^2\text{-}T^2 \quad (200)$$

[In formula (200), $E^2$ represents a unit represented by formula (100); and $T^1$ and $T^2$ each independently represent a halogen atom, an alkylsulfonate group, an arylsulfonate group or an arylalkylsulfonate group.]

in the presence of a palladium catalyst and a base. $E^1$ is preferably a divalent aromatic group and further preferably a group having a structure represented by any one of formulas 1 to 38, 49 to 72, 76 to 84, 91 to 93, 99 to 104, 106 to 108 and 110 as described above. Furthermore, at least one of $E^1$ and $E^2$ has a group containing a carbon cluster structure or a crosslinkable group.

In this case, it is preferable that the sum of molar numbers of one or more compounds represented by formula (200) to be used in the reaction, is excessive in comparison with the sum of molar numbers of one or more compounds represented by formula (120). Provided that the sum of molar numbers of one or more compounds represented by formula (200) to be used in the reaction is regarded as 1 mole, the sum of the molar numbers of one or more compounds represented by formula (120) is preferably 0.6 moles to 0.99 moles, and further preferably 0.7 moles to 0.95 moles.

As the boric acid ester residue, groups represented by the following formulas are mentioned as examples.

[Chemical Formula 131]

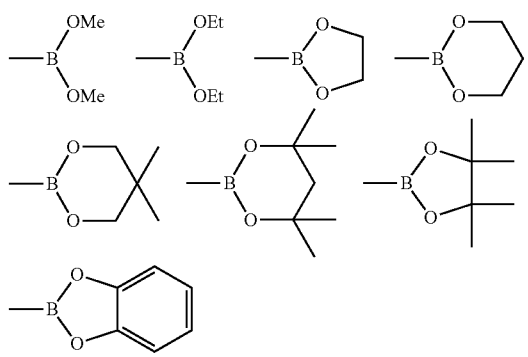

[In the formulas, Me represents a methyl group and Et represents an ethyl group.]

In formula (200), examples of the halogen atom represented by each of $T^1$ and $T^2$ include a fluorine atom, a chlorine atom, a bromine atom and an iodine atom. In view of simple synthesis of a polymer compound, a bromine atom and an iodine atom are preferable and a bromine atom is further preferable.

In formula (200), examples of the alkyl sulfonate group represented by each of $T^1$ and $T^2$ include a methanesulfonate group, an ethanesulfonate group and a trifluoromethanesulfonate group. Examples of the aryl sulfonate group include a benzenesulfonate group and a p-toluene sulfonate group. Examples of the arylalkylsulfonate group include a benzylsulfonate group.

Specifically, as the method using the Suzuki coupling reaction, a process for performing a reaction in an arbitrary solvent in the presence of a base using a palladium catalyst (as a catalyst) is mentioned.

Examples of the palladium catalyst to be used in the Suzuki coupling reaction include Pd (0) catalyst and Pd (II) catalyst. Palladium[tetrakis (triphenylphosphine)], palladium acetate, dichlorobis(triphenylphosphine) palladium, palladium acetate, tris(dibenzylideneacetone)dipalladium and bis(dibenzylideneacetone)palladium are preferable. In view of simple reaction (polymerization) operation and a reaction (polymerization) rate, dichlorobis(triphenylphosphine)palladium, palladium acetate and tris(dibenzylideneacetone)dipalladium are particularly preferable.

As the addition amount of palladium catalyst, any amount may be acceptable as long as it effectively works as a catalyst. Usually, the addition amount is 0.0001 mole to 0.5 moles, and preferably 0.0003 moles to 0.1 mole relative to a compound (1 mole represented by formula (120)).

When a palladium acetate is used as the palladium catalyst to be used for the Suzuki coupling reaction, for example, a phosphorus compound such as triphenylphosphine, tri(o-tolyl)phosphine and tri(o-methoxyphenyl)phosphine can be added as a ligand. In this case, the addition amount of ligand is usually, 0.5 moles to 100 moles, preferably 0.9 moles to 20 moles, and further preferably 1 mole to 10 moles relative to the palladium catalyst (1 mole).

Examples of the base to be used in the Suzuki coupling reaction include inorganic bases, organic bases and inorganic salts. Examples of the inorganic bases include potassium carbonate, sodium carbonate and barium hydroxide. Examples of the organic bases include triethylamine and tributylamine. Examples of the inorganic salts include cesium fluoride.

The addition amount of base is usually 0.5 moles to 100 moles, preferably 0.9 moles to 20 moles, further preferably 1 mole to 10 moles relative to a compound (1 mole) represented by formula (120).

The Suzuki coupling reaction is usually performed in a solvent. Examples of the solvent include N,N-dimethylformamide, toluene, dimethoxyethane and tetrahydrofuran. In view of the solubility of a polymer compound according to the photoelectric conversion device embodiment of the invention or a precursor polymer compound, toluene and tetrahydrofuran are preferable. Furthermore, the base is added in the state of an aqueous solution and may be reacted in a two phase system. When an inorganic salt is used as a base, in view of solubility of an inorganic salt, usually, the inorganic salt is added in the state of an aqueous solution and reacted. Note that, in the case where a base is added in the state of an aqueous solution and reacted in a two phase system, a phase-transfer catalyst such as a quaternary ammonium salt may be added as needed.

The temperature for performing the Suzuki coupling reaction, which varies depending upon the solvent, is usually 50° C. to 160° C. In view of polymerization of a polymer compound, the temperature is preferably 60° C. to 120° C. Furthermore, the temperature may be raised up to near the boiling point of a solvent and allowed to reflux. The reaction time is usually 0.1 hour to 200 hours although the reaction may be terminated when the degree of polymerization reaches a desired value. The reaction time of 1 to 30 hours is efficient and preferable.

The Suzuki coupling reaction is performed under an inert atmosphere such as argon gas and nitrogen gas in a reaction system in which a Pd (0) catalyst will not be inactivated, for example, in a system sufficiently deaerated with e.g., an argon gas or nitrogen gas. More specifically, a polymerization container (reaction system) is sufficiently purged and deaerated with nitrogen gas. Then, a compound represented by formula (120), a compound represented by formula (200) and dichlorobis(triphenylphosphine) palladium (II) are placed in the polymerization container. The polymerization container is further purged and deaerated with nitrogen gas, and a solvent such as toluene previously deaerated with nitrogen gas bubbling is added. To the solution, a base previously deaerated by bubbling with nitrogen gas, for example, an aqueous sodium carbonate solution, is added dropwise. The solution is heated to increase the temperature. For example, polymerization is performed at a reflux temperature for 8 hours while maintaining an inactive atmosphere.

As a method using the Stille coupling reaction, for example, a production method including a step of reacting one or more compounds represented by formula (300):

$$Q^{300}\text{-}E^3\text{-}Q^{400} \qquad (300)$$

[In the formula, $E^3$ represents a divalent group containing an aromatic ring; and $Q^{300}$ and $Q^{400}$, which may be the same or different, represents an organic tin residue.]
with one or more compounds represented by formula (200) in the presence of a palladium catalyst is mentioned. Examples of $E^3$ include preferably an arylene group and a heteroarylene group, and further preferably an arylene group and a heteroarylene group having structures represented by formulas 1 to 38, 49 to 72, 76 to 84, 91 to 93, 99 to 104, 106 to 108 or 110 as mentioned above. Furthermore, at least one of $E^2$ and $E^3$ has a crosslinkable group.

As the organic tin residue, e.g., a group represented by $-SnR^{110}{}_3$ is mentioned. Herein, $R^{110}$ represents a monovalent organic group. Examples of the monovalent organic group include an alkyl group and an aryl group. Examples of the alkyl group include chain-form alkyl groups such as a methyl group, an ethyl group, a n-propyl group, an isopropyl group, a n-butyl group, an isobutyl group, a sec-butyl group, a tert-butyl group, a n-pentyl group, an isopentyl group, a 2-methylbutyl group, a 1-methylbutyl group, a n-hexyl group, an isohexyl group, a 3-methylpentyl group, a 2-methylpentyl group, a 1-methylpentyl group, a heptyl group, an octyl group, an isooctyl group, a 2-ethylhexyl group, a nonyl group, a decyl group, an undecyl group, a dodecyl group, a tetradecyl group, a hexadecyl group, an octadecyl group, an eicosyl group; and cycloalkyl groups such as a cyclopentyl group, a cyclohexyl group and an adamantyl group. Examples of the aryl group include a phenyl group and a naphthyl group. Examples of the organic tin residue preferably include $-SnMe_3$, $-SnEt_3$, $-SnBu_3$, or $-SnPh_3$, and further preferably $-SnMe_3$, $-SnEt_3$ or $-SnBu_3$. In the above preferable examples, Me represents a methyl group; Et represents an ethyl group; Bu represents a butyl group; and Ph represents a phenyl group.

In formula (200), examples of the halogen atom represented by each of $T^1$ and $T^2$ include a fluorine atom, a chlorine atom, a bromine atom and an iodine atom. In view of simple synthesis of a polymer compound, a bromine atom and an iodine atom are preferable.

In formula (200), examples of the alkylsulfonate group represented by each of $T^1$ and $T^2$ include a methanesulfonate group, an ethanesulfonate group and a trifluoromethanesulfonate group. Examples of the arylsulfonate group include a benzenesulfonate group and a p-toluenesulfonate group. As the arylsulfonate group, a benzylsulfonate group is mentioned as an example.

Specifically, a reaction method performed in an arbitrary solvent in the presence of a catalyst such as a palladium catalyst is mentioned.

As a palladium catalyst to be used in the Stille coupling reaction, a Pd (0) catalyst and a Pd (II) catalyst are mentioned. Examples thereof include palladium[tetrakis(triphenylphosphine)], palladium acetates, dichlorobis(triphenylphosphine) palladium, palladium acetate, tris(dibenzylideneacetone)dipalladium and bis(dibenzylideneacetone) palladium. In view of simple operation of a reaction (polymerization) and a reaction (polymerization) rate, palladium[tetrakis (triphenylphosphine)] and tris (dibenzylideneacetone) dipalladium are preferable.

The addition amount of palladium catalyst to be used in the Stille coupling reaction, any amount is acceptable as long as it efficiently works as a catalyst. The addition amount is usually, 0.0001 mole to 0.5 moles, and preferably 0.0003 moles to 0.2 moles relative to the compound (1 mole) represented by formula (300).

In the Stille coupling reaction, if necessary, a ligand and a cocatalyst can be used. Examples of the ligand include phosphorus compounds such as triphenylphosphine, tri(o-tolyl) phosphine, tri(o-methoxyphenyl)phosphine, and tris(2-furyl) phosphine; and arsenic compounds such as triphenylarsine and triphenoxyarsine. Examples of the cocatalyst include copper iodide, copper bromide, copper chloride and copper(I) 2-thenoate.

When a ligand or a cocatalyst is used, the addition amount of ligand or cocatalyst is usually 0.5 moles to 100 moles, preferably 0.9 moles to 20 moles, and further preferably 1 moles to 10 moles relative to a palladium catalyst (1 mole).

The Stille coupling reaction is usually performed in a solvent. Examples of the solvent include N,N-dimethylformamide, N,N-dimethylacetamide, toluene, dimethoxyethane and tetrahydrofuran. In view of the solubility of a polymer compound according to the photoelectric conversion device embodiment of the invention or a precursor polymer compound, toluene and tetrahydrofuran are preferable.

The temperature for performing the Stille coupling reaction, which varies depending upon the solvent, is usually 50° C. to 160° C., and preferably 60° C. to 120° C. in view of simple polymerization of a polymer compound. Furthermore, the temperature may be raised up to near the boiling point of a solvent to reflux.

The time for performing the above reaction (reaction time) is usually 0.1 hour to 200 hours although the reaction may be terminated when the degree of polymerization reaches a desired value. The reaction time of 1 to 30 hours is efficient and preferable.

The Stille coupling reaction is performed under an inert atmosphere such as argon gas and nitrogen gas in a reaction system in which a Pd catalyst will not be inactivated, for example, in a system sufficiently deaerated with e.g., an argon gas or nitrogen gas. More specifically, a polymerization container (reaction system) is sufficiently purged and deaerated with nitrogen gas. Then, a compound represented by formula (300), a compound represented by formula (200) and a palladium catalyst are placed in the polymerization container. The polymerization container is further purged and deaerated with nitrogen gas, and a solvent such as toluene previously deaerated with nitrogen gas bubbling is added and thereafter, a ligand and cocatalyst are added if necessary. The solution is heated to increase the temperature. Polymerization is performed, for example, at a reflux temperature for 8 hours while maintaining an inactive atmosphere.

A polymer compound according to the photoelectric conversion device embodiment of the invention can show a high charge (electron, hole) transportability. Because of this, when an organic film containing a polymer compound is used as a device, charge injected from an electrode or charge generated by light absorption can be transported. A polymer compound according to the photoelectric conversion device embodiment of the invention can be preferably used in a photoelectric conversion device (particularly, an organic solar cell) due to these characteristics.

[Photoelectric Conversion Composition]

The photoelectric conversion composition according to the photoelectric conversion device embodiment of the invention contains a first compound and a second compound, which differs from the first compound. Herein, the first compound is a polymer compound according to the photoelectric conversion device embodiment of the invention.

A first embodiment of the second compound is a polymer compound with a light absorption terminal wavelength (as defined above) of 500 nm or more and 1500 nm or less. By using the polymer compound with a light absorption terminal wavelength of 500 nm or more and 1500 nm or less, light absorption amount can be increased and the short-circuit current density can be improved. A polymer compound preferably has a light absorption terminal wavelength of 550 nm or more and 1200 nm or less, and further preferably has a light absorption terminal wavelength of 600 nm or more and 1000 nm or less. As such a polymer compound, for example, polymer compounds having constitutional units represented by the following formulas are mentioned.

[Chemical Formula 132]

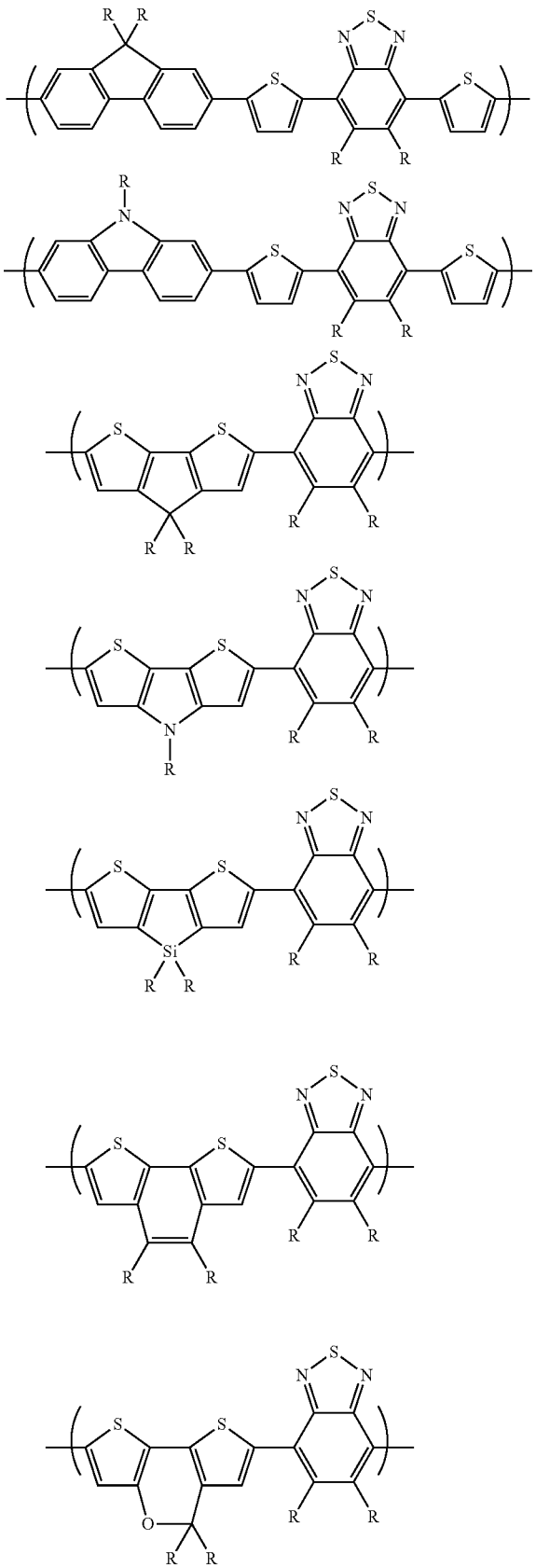

193
-continued
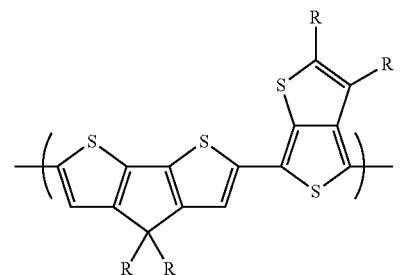
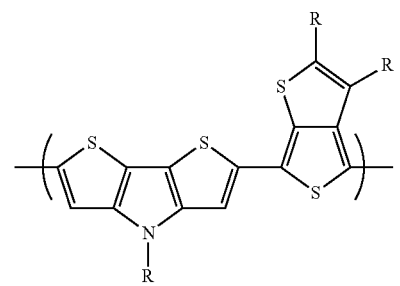
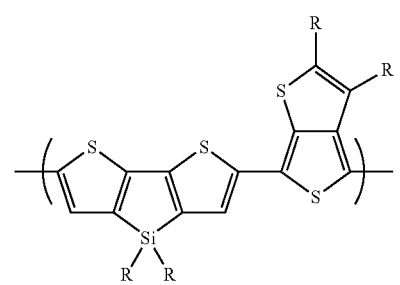
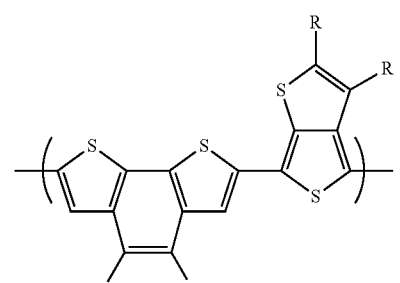
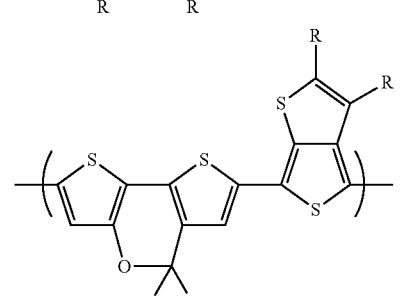
[Chemical Formula 133]
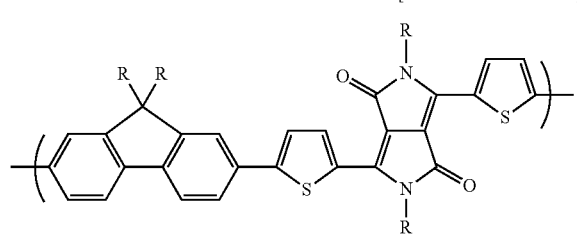
194
-continued
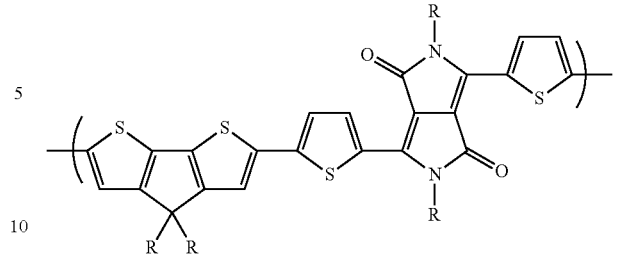
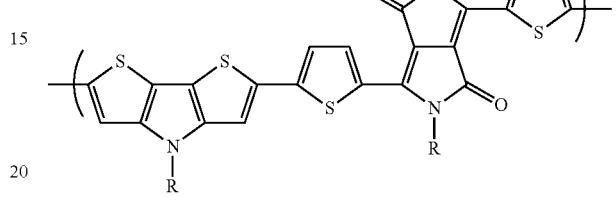
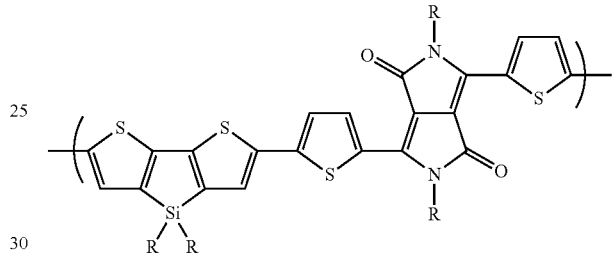
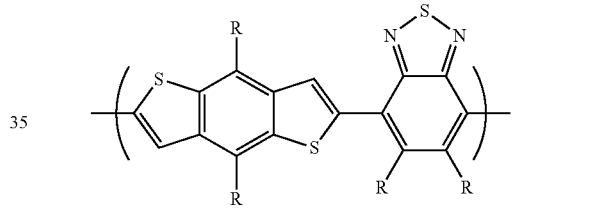
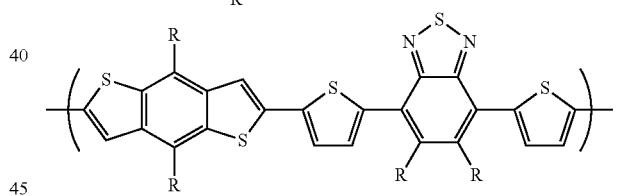
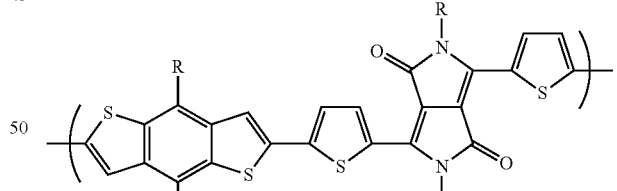
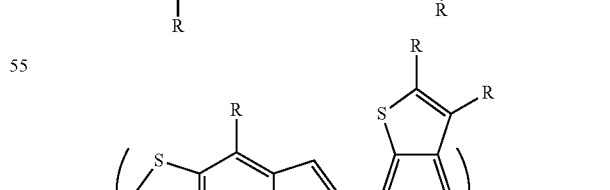
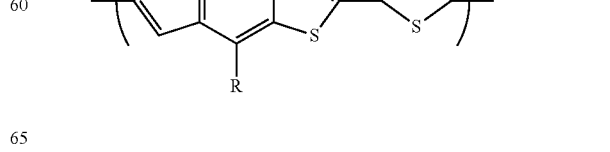
[In the formulas, R represents a hydrogen atom, a halogen atom or a monovalent organic group; and examples of the halogen atom and monovalent organic group, the same examples as mentioned above can be mentioned.]

A second embodiment of the second compound is a fullerene or a fullerene derivative. It is preferable to use a fullerene or a fullerene derivative because charge separation is accelerated to improve photoelectric conversion efficiency.

Examples of the fullerene and fullerene derivative include fullerene C60, fullerene C70, fullerene C76, fullerene C78, fullerene C84 and these derivatives.

Examples of the fullerene derivative include a compound represented by formula (T-13), a compound represented by formula (T-14), a compound represented by formula (T-15) and a compound represented by formula (T-16).

[Chemical Formula 134]

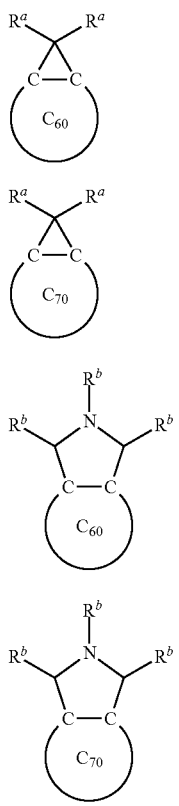

(T-13)

(T-14)

(T-15)

(T-16)

[In formulas (T-13), (T-14), (T-15) and (T-16), $R^a$ is an alkyl group, an aryl group, a heteroaryl group or a group having an ester structure; a plurality of $R^a$ may be the same or different; $R^b$ represents an alkyl group or an aryl group; and a plurality of $R^b$ may be the same or different.]

Definitions and specific examples of alkyl groups and aryl groups represented by $R^a$ and $R^b$ are the same as those of the alkyl group and aryl group represented by R in the above in a monovalent organic group.

The heteroaryl group represented by $R^a$, which usually has 3 to 60 carbon atoms, include a thienyl group, a pyrrolyl group, a furyl group, a pyridyl group, a quinolyl group and an isoquinolyl group.

As the group having an ester structure represented by $R^a$, for example, a group represented by formula (T-17) is mentioned.

[Chemical Formula 135]

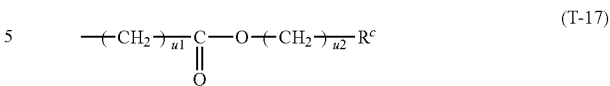

(T-17)

[In formula (T-17), u1 represents an integer of 1 to 6; u2 represents an integer of 0 to 6; and $R^c$ represents an alkyl group, an aryl group or a heteroaryl group.]

The definitions of an alkyl group, an aryl group, a heteroaryl group represented by $R^c$ and specific examples thereof are the same as those of the alkyl group, aryl group, and heteroaryl group represented by $R^a$.

Examples of a derivative of fullerene C60 include the following compounds.

[Chemical Formula 136]

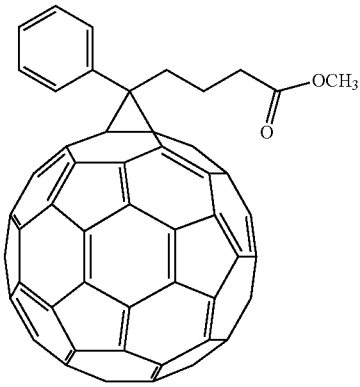

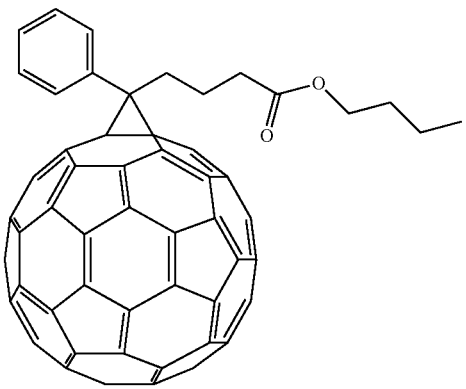

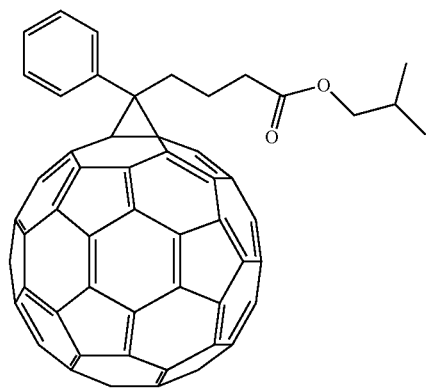

-continued

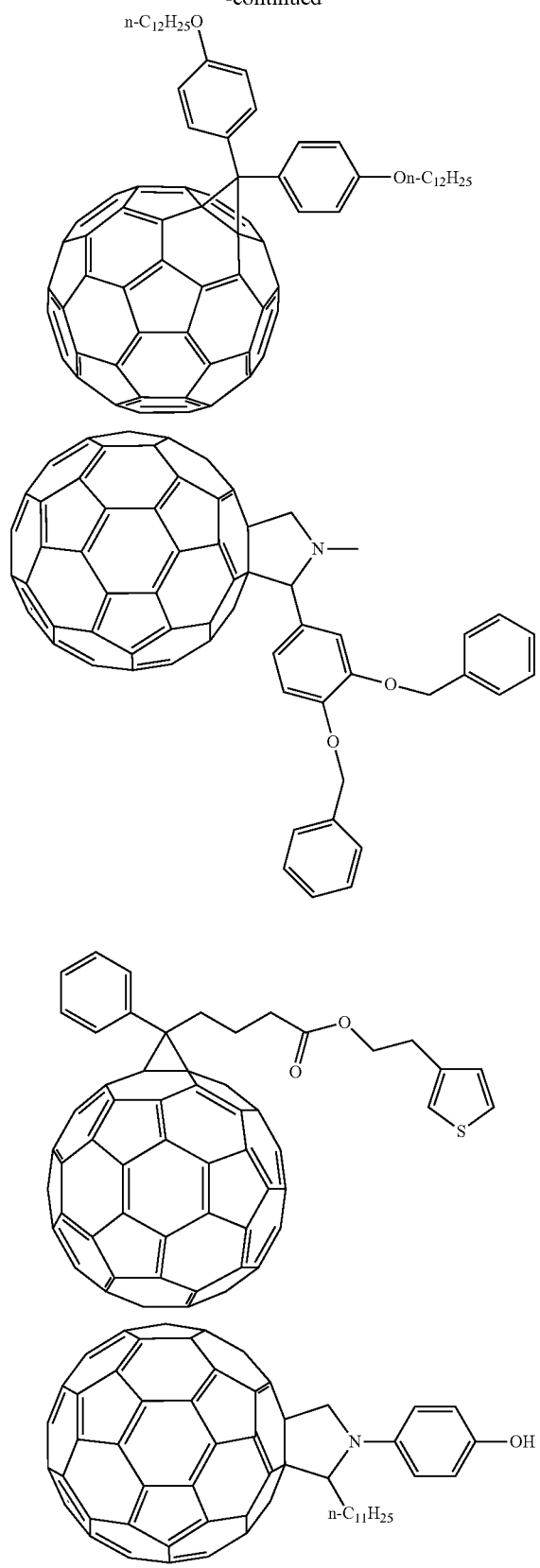

Examples of a derivative of fullerene C70 include the following compounds.

[Chemical Formula 137]

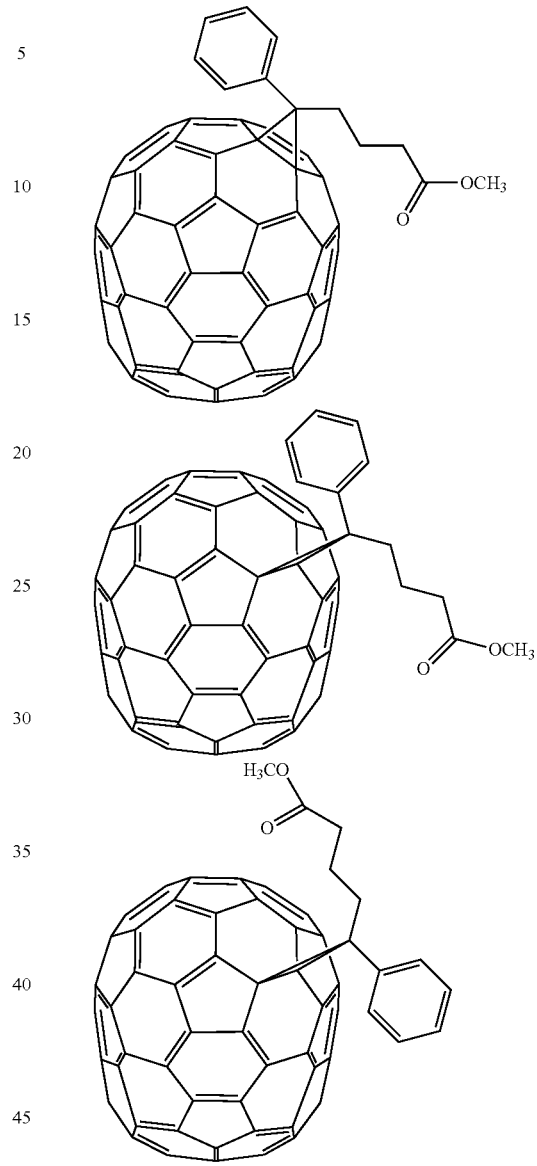

Examples of the fullerene derivative include [6,6]-Phenyl-C61 butyric acid methyl ester (C60PCBM,), [6,6]-Phenyl-C71 butyric acid methyl ester(C70PCBM), [6,6]-Phenyl-C85 butyric acid methyl ester (C84PCBM) and [6,6]-Thienyl-C61 butyric acid methyl ester.

Furthermore, in a photoelectric conversion composition according to the photoelectric conversion device embodiment of the invention, a content of the second compound is 0.1 mass % to 99 mass % based on the total amount of photoelectric conversion composition, preferably 1 mass % to 80 mass %, and more preferably 5 mass % to 60 mass %.

[Photoelectric Conversion Device]

A photoelectric conversion device according to the photoelectric conversion device embodiment of the invention includes one or more active layers containing a polymer compound or a photoelectric conversion composition according to the photoelectric conversion device embodiment of the invention between a pair of electrodes.

As a preferable embodiment of the photoelectric conversion device according to the photoelectric conversion device embodiment of the invention, the device has a pair of electrodes at least one of which is transparent or semitransparent and an active layer formed of an organic composition of a p-type organic semiconductor and a n-type organic semiconductor. The polymer compound according to the photoelectric conversion device embodiment of the invention, since it has characteristics of a p-type semiconductor and an n-type semiconductor in the molecule, can be preferably used as an active layer of a photoelectric conversion device.

A photoelectric conversion device according to the photoelectric conversion device embodiment of the invention is usually formed on a substrate. As the substrate, any substrate can be used as long as it is not chemically changed in forming an electrode and an organic material layer. Examples of a material for the substrate include glass, plastic, a polymer film and silicon. In the case of an opaque substrate, it is preferable that an opposite electrode (more specifically, the electrode away from the substrate) is transparent or semitransparent.

Another embodiment of a photoelectric conversion device according to the photoelectric conversion device embodiment of the invention is a photoelectric conversion device including a pair of electrodes at least one of which is transparent or semitransparent, a first active layer containing a polymer compound or photoelectric conversion composition according to the photoelectric conversion device embodiment of the invention between the electrodes and a second active layer in adjacent to the first active layer and containing an electron-accepting compound such as a fullerene derivative. The first active layer may have arbitrary electron-donating compound and an electron-accepting compound other than the polymer compound or photoelectric conversion composition according to the photoelectric conversion device embodiment of the invention as long as an object of the invention is not inhibited.

As the transparent or semitransparent electrode material, a conductive metal oxide film and a semitransparent metal film are mentioned. More specifically, films formed of e.g., a conductive material such as indium oxide, zinc oxide, tin oxide and a complex of these (e.g., indium.tin.oxide (ITO), indium.zinc.oxide), NESA, gold, platinum, silver and copper are used. ITO, indium.zinc.oxide and tin oxide are preferable. Examples of a method for forming an electrode include a vacuum vapor deposition method, a sputtering method, an ion plating method and a plating method.

As the electrode material, an organic transparent conductive film formed of e.g., polyaniline and a derivative thereof and polythiophene and a derivative thereof may be used.

One of the electrodes may not be transparent. As the electrode material for the electrode, e.g., a metal and a conductive polymer can be used. Specific examples of the electrode material include metals such as lithium, sodium, potassium, rubidium, cesium, magnesium, calcium, strontium, barium, aluminium, scandium, vanadium, zinc, yttrium, indium, cerium, samarium, europium, terbium and ytterbium and alloys formed of two or more of these, alloys formed of one or more metals as mentioned above with one or more metals selected from the group consisting of gold, silver, platinum, copper, manganese, titanium, cobalt, nickel, tungsten and tin, graphite, a graphite interlayer compound, polyaniline and a derivative thereof, and polythiophene and a derivative thereof. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

As a means for improving photoelectric conversion efficiency, an intermediate layer may be additionally used other than the active layer. Examples of the material to be used as the intermediate layer include alkaline metals such as lithium fluoride, halides of alkaline earth metals, oxides such as titanium oxide and PEDOT (poly-3,4-ethylenedioxythiophene).

The active layer may contain the polymer compounds according to the photoelectric conversion device embodiment of the invention singly or in combination of two or more. To enhance the hole transportability of the active layer, a compound other than a polymer compound according to the photoelectric conversion device embodiment of the invention may be added to the active layer as an electron-donating compound and/or electron-accepting compound. Note that, the electron-donating compound and the electron-accepting compound are relatively determined based on the energy levels of these compounds.

Examples of the electron-donating compound include not only a polymer compound according to the photoelectric conversion device embodiment of the invention but also a pyrazoline derivative, an arylamine derivative, a stilbene derivative, a triphenyldiamine derivative, an oligo thiophene and a derivative thereof, polyvinylcarbazole and a derivative thereof, polysilane and a derivative thereof, polysiloxane derivative having an aromatic amine residue in a side chain or main chain, polyaniline and a derivative thereof, polythiophene and a derivative thereof, polypyrrole and a derivative thereof, polyphenylenevinylene and a derivative thereof and polythienylenevinylene and a derivative thereof.

Examples of the electron-accepting compound include not only a polymer compound according to the photoelectric conversion device embodiment of the invention but also carbon materials, metal oxides such as titanium oxide, an oxadiazole derivative, anthraquinodimethane and a derivative thereof, benzoquinone and a derivative thereof, naphthoquinone and a derivative thereof, anthraquinone and a derivative thereof, tetracyanoanthraquinodimethane and a derivative thereof, a fluorenone derivative, diphenyldicyanoethylene and a derivative thereof, a diphenoquinone derivative, a metal complex of 8-hydroxyquinoline and a derivative thereof, a polyquinoline and a derivative thereof, polyquinoxaline and a derivative thereof, polyfluorene and a derivative thereof, a phenanthroline derivative such as 2,9-dimethyl-4,7-diphenyl-1,10-phenanthroline (bathocuproin), a fullerene and a fullerene derivative. Preferably, titanium oxide, carbon nanotube, a fullerene and a fullerene derivative, and particularly preferably a fullerene and a fullerene derivative are mentioned.

The definitions and examples of the fullerene and the fullerene derivative above are the same as those of the fullerene or fullerene derivative described as one of the embodiments of the second compound.

When the same active layer contains a polymer compound according to the photoelectric conversion device embodiment of the invention and a fullerene derivative, the ratio of the fullerene derivative is usually 0.1 mass % to 99 mass %, preferably 1 mass % to 80 mass %, and more preferably 5 mass % to 60 mass % based on the total amount of photoelectric conversion composition.

The thickness of the active layer is usually 1 nm to 100 μm, preferably 2 nm to 1000 nm, more preferably 5 nm to 500 nm, and further preferably 20 nm to 200 nm.

The active layer may be formed by any method, for example, a method of forming a film from a solution containing a polymer compound and a method of forming a film by a vacuum vapor deposition method are mentioned.

A preferable formation method for a photoelectric conversion device is a method for forming a photoelectric conversion device including a first electrode and a second electrode, an active layer between the first electrode and the second electrode, including a step of forming the active layer by applying a solution (generally, also referred to as "ink".) containing a polymer compound according to the photoelectric conversion device embodiment of the invention and a solvent, onto the first electrode in accordance with a coating method, and a step of forming a second electrode on the active layer. An organic film containing a polymer compound according to the photoelectric conversion device embodiment of the invention can be formed by coating a solution containing a polymer compound according to the photoelectric conversion device embodiment of the invention and a solvent.

As the solvent to be used in the solution, any solvent may be used as long as it dissolves a polymer compound according to the photoelectric conversion device embodiment of the invention. Examples of the solvent include unsaturated hydrocarbon solvents such as toluene, xylene, mesitylene, tetralin, decalin, bicyclohexyl, n-butylbenzene, sec-butyl benzene and tert-butyl benzene; halogenated saturated hydrocarbon solvents such as carbon tetrachloride, chloroform, dichloromethane, dichloroethane, chloro butane, bromobutane, chloro pentane, bromopentane, chloro hexane, bromohexane, chloro cyclohexane and bromocyclohexane; halogenated unsaturated hydrocarbon solvents such as chlorobenzene, dichlorobenzene and trichlorobenzene; and ether solvents such as tetrahydrofuran and tetrahydropyran. A polymer compound according to the photoelectric conversion device embodiment of the invention can be dissolved in a solvent as mentioned above usually in a concentration of 0.1 mass % or more.

In forming a film (an active layer) by use of a solution, a coating method such a slit-coating method, a knife coating method, a spin coating method, a casting method, a microgravure coating method, a gravure coating method, a bar coating method, a roll coating method, a wire bar coating method, a dip coating method, a spray coating method, a screen printing method, a gravure printing method, a flexo-printing method, an off-set printing method, an inkjet printing method, a dispenser printing method, a nozzle coating method and a capillary coating method can be used. A slit-coating method, a capillary coating method, a gravure coating method, a microgravure coating method, a bar coating method, a knife coating method, a nozzle coating method, an inkjet printing method and a spin coating method are preferable.

In view of film formation property, the surface tension of a solvent at 25° C. is preferably more than 15 mN/m, more preferably more than 15 mN/m and less than 100 mN/m, and further preferably more than 25 mN/m and less than 60 mN/m.

[Solar Cell]

A photoelectric conversion device using a polymer compound according to the photoelectric conversion device embodiment of the invention can be operated as an organic film solar cell by irradiating light such as sun light from a transparent or semitransparent electrode to generate photoelectromotive force between electrodes. Furthermore, a plurality of organic film solar cells, if integrated, can be used as an organic film solar cell module.

Figure 4:
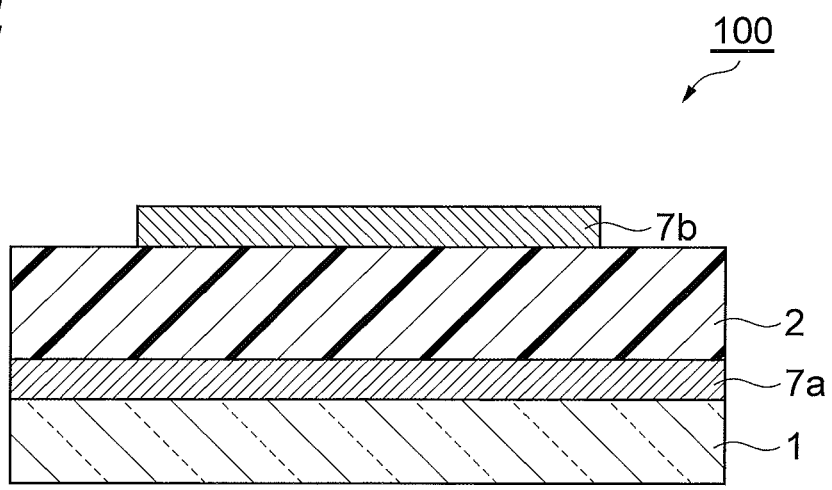
FIG. 4 is a schematic sectional view of an organic film solar cell.

FIG. 4 shows a schematic sectional view of an organic film solar cell according to the photoelectric conversion device embodiment of the invention. FIG. 4 shows an organic film solar cell 100, which has a substrate 1, a first electrode 7a formed of the substrate 1, an active layer 2 formed of an organic film containing a polymer compound according to the photoelectric conversion device embodiment of the invention, on the first electrode 7a, and a second electrode 7b formed on the active layer 2.

In an organic film solar cell according to the photoelectric conversion device embodiment of the invention, a transparent or semitransparent electrode is used as one of the first electrode 7a and the second electrode 7b. As the electrode material, the aforementioned materials can be used. To obtain a high open voltage, the electrodes can be preferably selected so as to have a large work-function difference. To enhance light sensitivity, a charge generator and a sensitizer can be added to the active layer 2 (organic film). As the substrate 1, e.g., a silicon substrate, a glass substrate and a plastic substrate can be used.

[Solar Cell Module]

An organic film solar cell may fundamentally take the same module structure as that of a conventional solar cell module. The solar cell module generally constituted by forming a cell on a support substrate formed of e.g., a metal and ceramic and covering the cell with e.g., a filling resin and protective glass. Due to the structure, light is taken in from the opposite side to the support substrate. When a support substrate is formed of a transparent material such as reinforced glass and a cell is formed on the transparent substrate, light can be taken in from the side of the transparent support substrate. Specifically, a module structure called as a super straight type, a sub straight type and a potting type, and a substrate integrated module structure used in e.g., amorphous silicon solar cells are known. An organic film solar cell formed of a polymer compound according to the photoelectric conversion device embodiment of the invention may appropriately take such a module structure depending upon the intended use, point of use and environment.

A typical super straight type or sub straight type module has a structure in which cells are arranged at regular intervals between support substrates one or both sides of which are formed of a transparent material and provided with antireflection treatment; adjacent cells are connected with e.g., a metal lead or flexible wire and collector electrodes are arranged in the outer periphery to take out electric force generated to the outside. Between the substrate and cells, various types of plastic materials such as ethylene vinyl acetate (EVA) may be provided in the form of a film or a filling resin depending upon the purpose such as protecting cells or improving power collection efficiency.

Furthermore, in using the module in a site such as a site receiving less external impact in which coverage of the surface of the module with a hard material is not required, a one-side support substrate can be removed by forming the surface protection layer of a transparent plastic film or hardening the filling resin to add a protective function. Around the support substrate, metal frames are provided and immobilized so as to sandwich the support substrate in order to keep internal airtightness and rigidity of the module, the space between the support substrate and the frames is sealed airtight with a sealing material. Furthermore, when a flexible material is used as the cells themselves, support substrate, filling material and sealing material, a solar cell may be constituted on a curved surface.

In the case of a solar cell using a flexible support formed of e.g., a polymer film, cells are sequentially formed by feeding out a roll-form support and cut into a desired size and the periphery thereof are sealed with a flexible and moisture-proof material to form cell main-bodies. Furthermore, the cell main bodies are formed into module structures called "SCAF" described in Solar Energy Materials and Solar Cells, 48, p 383-391. Furthermore, solar cells using a flexible support can be bonded and immobilized onto e.g., curved glass and put in use.

[Organic Image Sensor]

To a photoelectric conversion device using a polymer compound according to the photoelectric conversion device embodiment of the invention, when light is irradiated from a transparent or semitransparent electrode with or without application of voltage between the electrodes, photocurrent flows. In this manner, the photoelectric conversion device serves as an organic light sensor. A plurality of organic light sensors, if integrated, can be used as an organic image sensor.

[Organic Transistor]

A polymer compound according to the photoelectric conversion device embodiment of the invention can exert a high charge transportability and preferably used as an organic film transistor. Examples of the organic film transistor include one, which is constituted of a source electrode and a drain electrode, an organic semiconductor layer (i.e., active layer, the same shall apply hereinafter) serving as a current channel between these electrodes, and a gate electrode for controlling the amount of current passing through the current channel. The organic semiconductor layer is constituted of an organic film containing a polymer compound according to the photoelectric conversion device embodiment of the invention as mentioned above. Examples of such an organic film transistor include an electric field effect type and electrostatic induction type.

It is preferable that the electric field effect type organic film transistor has a source electrode and a drain electrode, an organic semiconductor layer serving as a current channel between these electrodes, a gate electrode for controlling the amount of current passing through the current channel and an insulating layer arranged between the organic semiconductor layer and the gate electrode. It is particularly preferable that the source electrode and drain electrode are provided in contact with the organic semiconductor layer and further the gate electrode is provided via the insulating layer in contact with the organic semiconductor layer. In the electric field effect type organic film transistor, the organic semiconductor layer is constituted of an organic film containing a polymer compound according to the photoelectric conversion device embodiment of the invention.

An electrostatic induction type organic film transistor has a source electrode and a drain electrode, an organic semiconductor layer serving as a current channel between these electrodes and a gate electrode for controlling the amount of current passing through the current channel. It is preferable that the gate electrode is provided within the organic semiconductor layer. It is particularly preferable that the source electrode, drain electrode and the gate electrode provided within the organic semiconductor layer are provided in contact with the organic semiconductor layer. Herein, as the structure of the gate electrode, any structure is acceptable as long as a current channel is formed such that current flows from the source electrode to the drain electrode and the amount of current flowing through the current channel can be controlled by the voltage applied to the gate electrode. For example, a comb electrode is mentioned. Also in the electrostatic induction type organic film transistor, the organic semiconductor layer is formed of an organic film containing a polymer compound according to the photoelectric conversion device embodiment of the invention.

Figure 5:
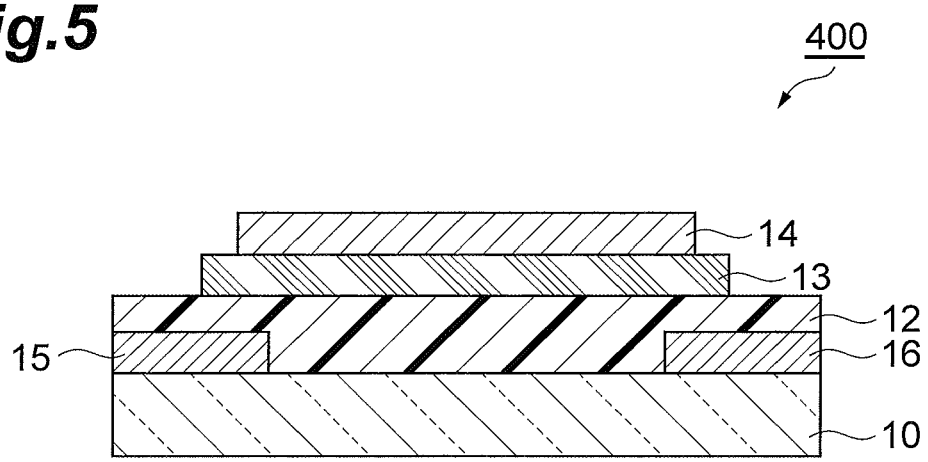
FIG. 5 is a schematic sectional view of an organic film transistor.

FIG. 5 is a schematic sectional view of an organic film transistor (electric field effect type organic film transistor) according to the photoelectric conversion device embodiment of the invention. FIG. 5 shows an organic film transistor 400, which has a substrate 10, a source electrode 15 and a drain electrode 16 formed on the substrate 10 at a predetermined interval, an organic semiconductor layer 12 formed on the substrate 10 so as to cover the source electrode 15 and drain electrode 16, an insulating layer 13 formed on the organic semiconductor layer 12, and a gate electrode 14 formed on the insulating layer 13 so as to cover the region of the insulating layer 13 between the source electrode 15 and the drain electrode 16.

In the organic film transistor 400 according to the photoelectric conversion device embodiment of the invention, the organic semiconductor layer 12 is formed of an organic film containing a polymer compound according to the photoelectric conversion device embodiment of the invention, and serves as a current channel between the source electrode 15 and the drain electrode 16. Furthermore, the gate electrode 14 controls the amount of current passing through the current channel in the organic semiconductor layer 12 by applying voltage.

Of the organic film transistors, an electric field effect type organic film transistor can be manufactured by a conventional method, for example, a method described in Japanese Unexamined Patent Application Publication No. 5-110069. Furthermore, an electrostatic induction type organic film transistor can be manufactured by a conventional method, for example, a method described in Japanese Unexamined Patent Application Publication No. 2004-006476.

The aforementioned organic film transistor can be used for controlling pixels of e.g., electrophoretic displays, liquid crystal displays and organic electroluminescence displays and used as a pixel driving device for controlling uniformity of screen brightness and information alternation rate.

EXAMPLES

Hereinafter, the present invention will be more specifically described based on examples and comparative examples, with the understanding that the present invention is in no way limited to the following examples.

[Polymer Compound According to Luminescence Device Form]

First, examples and comparative examples for a polymer compound according to a luminescence device form and an organic EL device using the same will be described.

(Measurement of Number-Average Molecular Weight and Weight-Average Molecular Weight)

The polystyrene-equivalent number-average molecular weight and the polystyrene-equivalent weight-average molecular weight were determined by gel permeation chromatography (GPC) (product name: LC-10Avp manufactured by Shimadzu Corporation). The polymer compound to be measured was dissolved in tetrahydrofuran to a concentration of about 0.5 mass % and 30 μL thereof was injected into the GPC. The mobile phase of GPC used was tetrahydrofuran, and the flow rate was 0.6 mL/min. The columns were two TSKgel SuperHM-H (manufactured by Tosoh Corporation) columns and one TSKgel SuperH2000 (manufactured by Tosoh Corporation) column, connected in series. The detector used was a differential refractive index detector (product name: RID-10A manufactured by Shimadzu Corporation).

The LC-MS measurement was conducted by the following method. The measuring sample was dissolved in chloroform or tetrahydrofuran to a concentration of about 2 mg/mL, and 1 μL was injected into LC-MS (product name: 1100LCMSD manufactured by Agilent Technologies). Ion-exchanged water, acetonitrile, tetrahydrofuran, or a mixed solution thereof was used for the mobile phase of LC-MS, and acetic acid was added if necessary. The column used was an L-column 2 ODS (3 μm) (manufactured by Chemicals Evaluation and Research Institute, inner diameter: 2.1 mm, length: 100 mm, particle size: 3 μm).

Synthesis Example 1

Synthesis of Polymer Compound 1

A compound 10 (1.8163 g, 1.99 mmol) represented by the following formula:

[Chemical Formula 138]

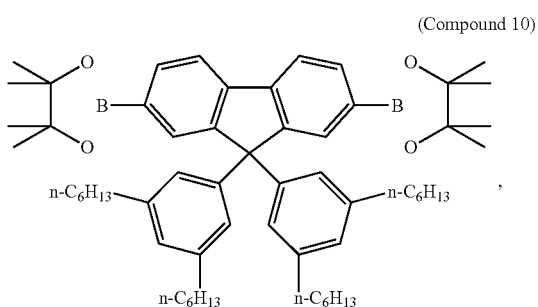

(Compound 10)

a compound 11 (1.1002 g, 1.20 mmol) represented by the following formula:

[Chemical Formula 139]

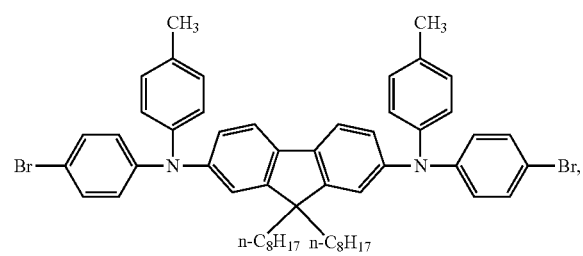

(Compound 11)

a compound 2 (0.2829 g, 0.50 mmol) represented by the following formula:

[Chemical Formula 140]

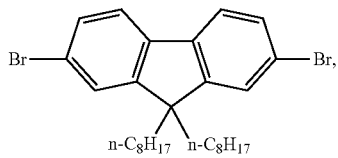

(Compound 2)

a compound 12 (0.1587 g, 0.30 mmol) represented by the following formula:

[Chemical Formula 141]

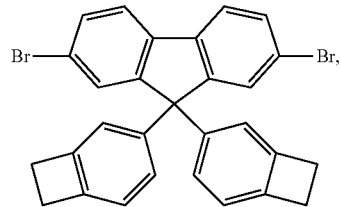

(Compound 12)

dichlorobis(triphenylphosphine)palladium (1.4 mg), and toluene (47 mL) were mixed in an inactive atmosphere, and the mixture was heated to 105° C. A 20 mass % tetraethylammonium hydroxide aqueous solution (6.6 mL) was added dropwise to a reaction solution, and refluxed for 8 hours. After the reaction, phenylboronic acid (24.4 mg) and dichlorobis(triphenylphosphine)palladium (1.4 mg) were added thereto, and the mixture was further refluxed for 23 hours. Then, a sodium diethyldithiocarbamate aqueous solution was added thereto, and the mixture was stirred at 80° C. for 2 hours. After cooling the reaction solution, the reaction solution was rinsed twice with water, twice with a 3 mass % acetic acid aqueous solution, and twice with water, and the obtained solution was added dropwise to methanol and filtered out to obtain a precipitate. The precipitate was dissolved in toluene and passed through an alumina column and a silica gel column in that order for purification. The obtained solution was added dropwise to methanol and stirred, and then the resultant precipitate was filtered out and dried to obtain 1.76 g of a polymer compound 1. The polystyrene-equivalent number-average molecular weight of the polymer compound 1 was $6.5 \times 10^4$, and the polystyrene-equivalent weight-average molecular weight was $2.3 \times 10^5$.

The polymer compound 1 is a random copolymer composed of a repeating unit represented by the following formula:

[Chemical Formula 142]

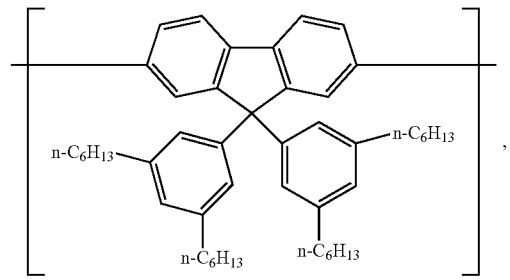

a repeating unit represented by the following formula:

[Chemical Formula 143]

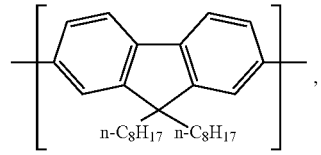

a repeating unit represented by the following formula:

[Chemical Formula 144]

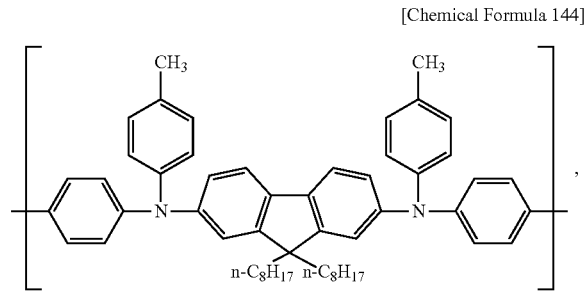

and a repeating unit represented by the following formula:

[Chemical Formula 145]

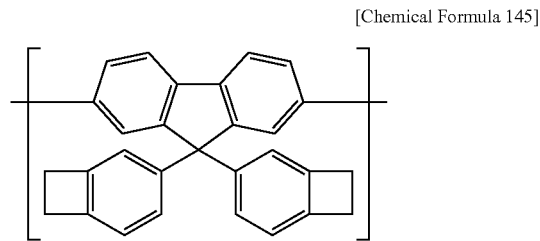

in a molar ratio of 50:12.5:30:7.5, based on the theoretical values calculated from the charging raw materials.

Synthesis Example 2

Synthesis of Polymer Compound 2

A compound 7 (2.6525 g, 5.00 mmol) represented by the following formula:

[Chemical Formula 146]

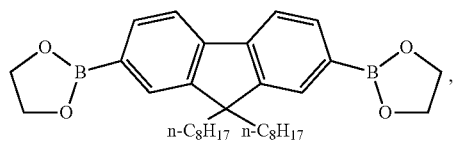

(Compound 7)

a compound 2 (0.6856 g, 1.25 mmol), a compound 13 (2.0476 g, 3.00 mmol) represented by the following formula:

[Chemical Formula 147]

(Compound 13)

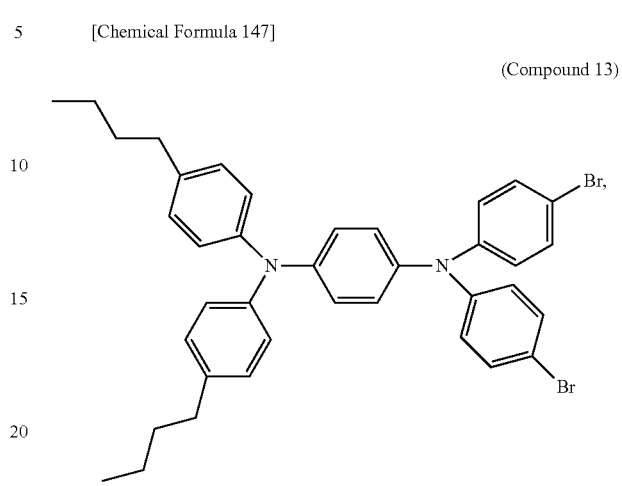

a compound 14 (0.3219 g, 0.75 mmol) represented by the following formula:

[Chemical Formula 148]

(Compound 14)

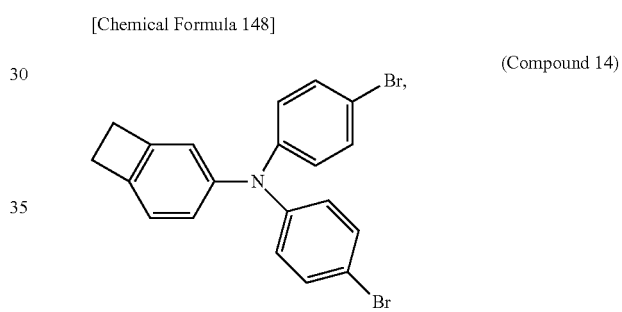

dichlorobis(triphenylphosphine)palladium (7.0 mg), and toluene (50 mL) were mixed in an inactive atmosphere, and the mixture was heated to 105° C. A 17.5 mass % sodium carbonate aqueous solution (13.6 mL) was added dropwise to a reaction solution, and refluxed for 8 hours. After the reaction, phenylboronic acid (60.0 mg) and dichlorobis(triphenylphosphine)palladium (7.0 mg) were added thereto, and the mixture was further refluxed for 23 hours. Then, a sodium diethyldithiocarbamate aqueous solution was added thereto, and the mixture was stirred at 80° C. for 2 hours. After cooling the reaction solution, the reaction solution was rinsed twice with water, twice with a 3 mass % acetic acid aqueous solution, and twice with water, and the obtained solution was added dropwise to methanol and filtered out to obtain a precipitate. The precipitate was dissolved in toluene and passed through an alumina column and a silica gel column in that order for purification. The obtained solution was added dropwise to methanol and stirred, and then the resultant precipitate was filtered out and dried to obtain 3.31 g of a polymer compound 2. The polystyrene-equivalent number-average molecular weight of the polymer compound 2 was $7.6 \times 10^4$, and the polystyrene-equivalent weight-average molecular weight was $1.8 \times 10^5$.

The polymer compound 2 is a random copolymer composed of a repeating unit represented by the following formula:

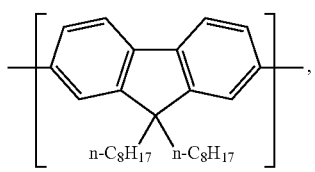

a repeating unit represented by the following formula:

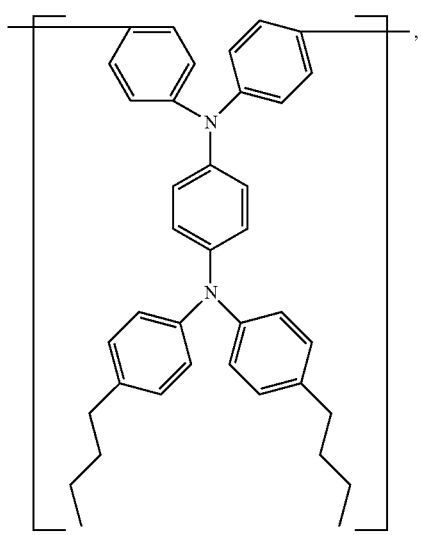

and a repeating unit represented by the following formula:

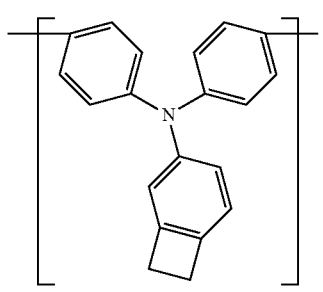

in a molar ratio of 62.5:30:7.5, based on the theoretical values calculated from the charging raw materials.

Synthesis Example 3

Synthesis of Polymer Compound 3

A compound 10 (1.8163 g, 1.99 mmol), a compound 11 (1.5586 g, 1.70 mmol), a compound 12 (0.1587 g, 0.30 mmol), dichlorobis(triphenylphosphine)palladium (1.4 mg), and toluene (47 mL) were mixed in an inactive atmosphere, and heated to 105° C. A 20 mass % tetraethylammonium hydroxide aqueous solution (6.6 mL) was added dropwise to a reaction solution, and refluxed for 8 hours. After the reaction, phenylboronic acid (24.4 mg) and dichlorobis(triphenylphosphine)palladium (1.4 mg) were added thereto, and further refluxed for 23 hours. Then, a sodium diethyldithiocarbamate aqueous solution was added thereto, and the mixture was stirred at 80° C. for 2 hours. After cooling the reaction solution, the reaction solution was rinsed twice with water, twice with a 3 mass % acetic acid aqueous solution, and twice with water, and the obtained solution was added dropwise to methanol and filtered out to obtain a precipitate. The precipitate was dissolved in toluene and passed through an alumina column and a silica gel column in that order for purification. The obtained solution was added dropwise to methanol and stirred, and then the resultant precipitate was filtered out and dried to obtain 1.88 g of a polymer compound 3. The polystyrene-equivalent number-average molecular weight of the polymer compound 3 was $5.6 \times 10^4$, and the polystyrene-equivalent weight-average molecular weight was $2.4 \times 10^5$.

The polymer compound 3 is a random copolymer composed of a repeating unit represented by the following formula:

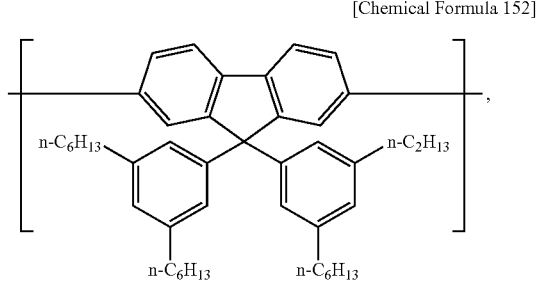

a repeating unit represented by the following formula:

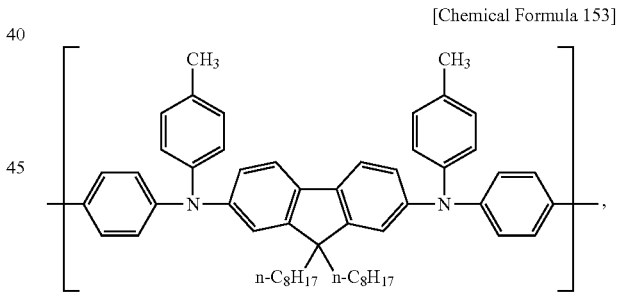

and a repeating unit represented by the following formula:

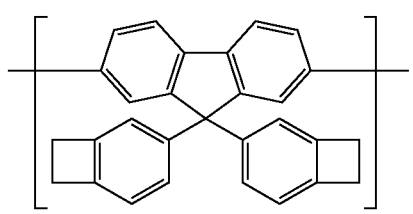

in a molar ratio of 50:42.5:7.5, based on the theoretical values calculated from the charging raw materials.

Synthesis Example 4

Synthesis of Polymer Compound 4

Synthesis Example 1

A polymer compound 3 (1.5000 g, 2.38 mmol), fullerene C60 (manufactured by sigma Aldrich Co.) (0.5160 g, 0.72 mmol), and 120 mL of ortho-dichlorobenzene were mixed in an inactive atmosphere. After the obtained mixed solution was bubbled by argon gas for 30 minutes, the mixed solution was heated to 190° C. and stirred for 24 hours. Then, the reaction solution was reprecipitated in methanol, filtrated, and dried under reduced pressure.

After drying, 80 mL of tetrahydrofuran was added to the obtained crude polymer and dissolved, and the solution was subjected to Celite filtration to obtain a polymer solution. Then, the polymer solution was passed through a Kiriyama-rohto with Celite laminated on the lower layer of the Kiriyama-rohto and a mixture of activated carbon and silica gel laminated on the upper layer thereof. After this operation was repeated twice, tetrahydrofuran was distilled off, and the residue was redissolved in toluene. After the polymer solution was added dropwise to methanol, and the mixture was stirred, the obtained precipitate was filtered out and dried, to obtain 1.01 g of a polymer compound 4. The polystyrene-equivalent number-average molecular weight of the polymer compound 4 was $1.4 \times 10^5$, and the polystyrene-equivalent weight-average molecular weight was $4.3 \times 10^5$.

The amount of fullerene to be supported to all the repeating units of the obtained polymer compound 4 was 6.4 mole %, and the amount of fullerene not to be supported was 0.0 mole %.

Synthesis Example 5

Synthesis of Polymer Compound 5

Synthesis Example 2

A polymer compound 1 (1.5000 g, 2.24 mmol), fullerene C60 (manufactured by sigma Aldrich Co.) (0.4848 g, 0.67 mmol), and 110 mL of ortho-dichlorobenzene were mixed in an inactive atmosphere. After the obtained mixed solution was bubbled by argon gas for 30 minutes, the mixed solution was heated to 190° C. and stirred for 24 hours. Then, the reaction solution was reprecipitated in methanol, filtrated, and dried under reduced pressure.

After drying, 80 mL of tetrahydrofuran was added to the obtained crude polymer and dissolved, and the solution was subjected to Celite filtration to obtain a polymer solution. Then, the polymer solution was passed through a Kiriyama-rohto with Celite laminated on the lower layer of the Kiriyama-rohto and a mixture of activated carbon and silica gel laminated on the upper layer thereof. After this operation was repeated twice, tetrahydrofuran was distilled off, and the residue was redissolved in toluene. After the polymer solution was added dropwise to methanol, and the mixture was stirred, the obtained precipitate was filtered out and dried, to obtain 0.86 g of a polymer compound 5. The polystyrene-equivalent number-average molecular weight of the polymer compound 5 was $1.6 \times 10^5$, and the polystyrene-equivalent weight-average molecular weight was $4.8 \times 10^5$.

The amount of fullerene to be supported to all the repeating units of the obtained polymer compound 5 was 6.3 mole %, and the amount of fullerene not to be supported was 0.0 mole %.

Synthesis Example 6

Synthesis of Polymer Compound 6

A compound 6 (5.2592 g, 7.12 mmol), a compound 7 (1.4850 g, 2.80 mmol) represented by the following formula:

[Chemical Formula 155]

(Compound 6)

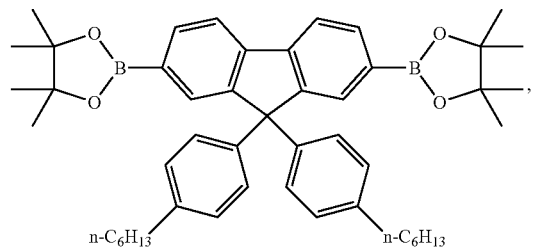

a compound 8 (5.8007 g, 9.00 mmol) represented by the following formula:

[Chemical Formula 156]

(Compound 8)

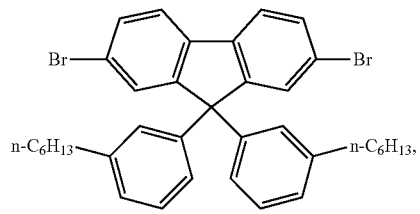

a compound 9 (0.0946 g, 0.20 mmol) represented by the following formula:

[Chemical Formula 157]

(Compound 9)

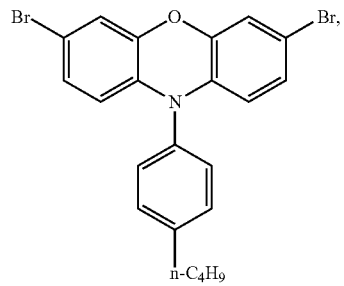

a compound 4 (0.5909 g, 0.8 mmol) represented by the following formula:

[Chemical Formula 158]

(Compound 4)

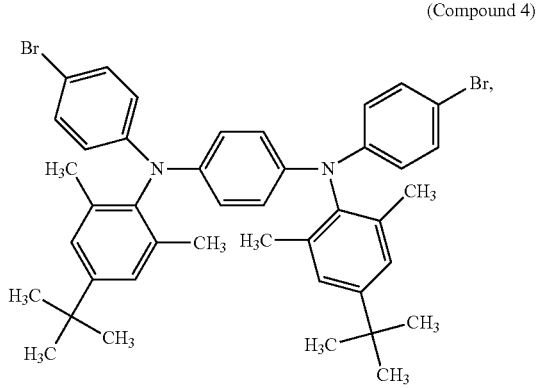

dichlorobis(triphenylphosphine)palladium (14.0 mg), and toluene (111 mL) were mixed in an inactive atmosphere, and the mixture was heated to 105° C. A 20 mass % tetraethylammonium hydroxide aqueous solution (33.2 mL) was added dropwise to a reaction solution, and refluxed for 3 hours. After the reaction, phenylboronic acid (1.292 g) and dichlorobis(triphenylphosphine)palladium (14.0 mg) were added thereto, and the mixture was further refluxed for 23 hours. Then, a sodium diethyldithiocarbamate aqueous solution was added thereto, and the mixture was stirred at 80° C. for 2 hours. After cooling the reaction solution, the reaction solution was rinsed twice with water, twice with a 3 mass % acetic acid aqueous solution, and twice with water, and the obtained solution was added dropwise to methanol and filtered out to obtain a precipitate. The precipitate was dissolved in toluene and passed through an alumina column and a silica gel column in that order for purification. The obtained solution was added dropwise to methanol and stirred, and then the resultant precipitate was filtered out and dried to obtain 7.56 g of a polymer compound 6. The polystyrene-equivalent number-average molecular weight of the polymer compound 6 was $1.0 \times 10^5$, and the polystyrene-equivalent weight-average molecular weight was $2.4 \times 10^5$.

The polymer compound 6 is a random copolymer composed of a repeating unit represented by the following formula:

[Chemical Formula 159]

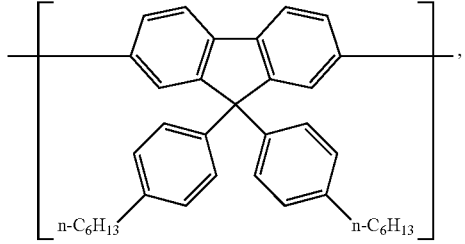

a repeating unit represented by the following formula:

[Chemical Formula 160]

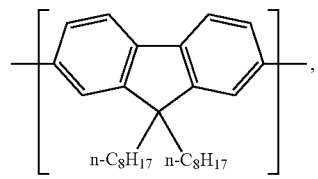

a repeating unit represented by the following formula:

[Chemical Formula 161]

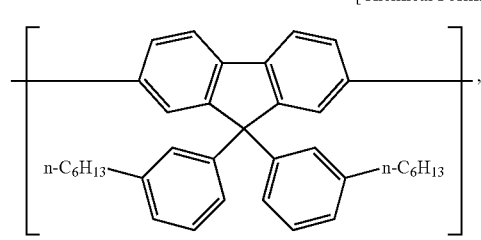

a repeating unit represented by the following formula:

[Chemical Formula 162]

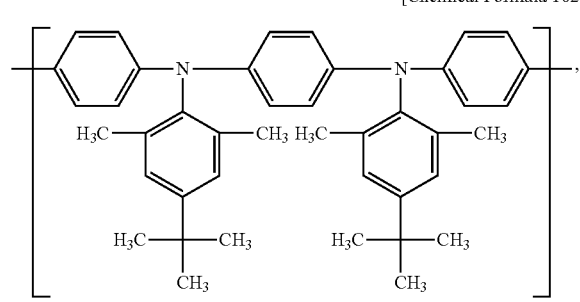

and a repeating unit represented by the following formula:

[Chemical Formula 163]

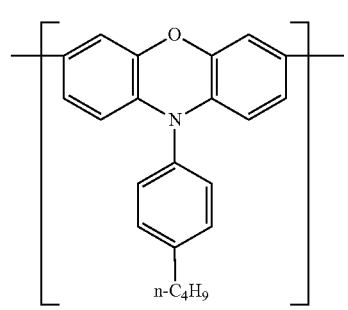

in a molar ratio of 36:14:45:4:1, based on the theoretical values calculated from the charging raw materials.

Synthesis Example 7

Synthesis of Polymer Compound 7

A compound 15 (2.4925 g, 5.00 mmol) represented by the following formula:

[Chemical Formula 164]

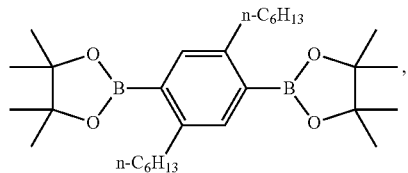

(Compound 15)

a compound 16 (0.5513 g, 1.00 mmol), represented by the following formula:

[Chemical Formula 165]

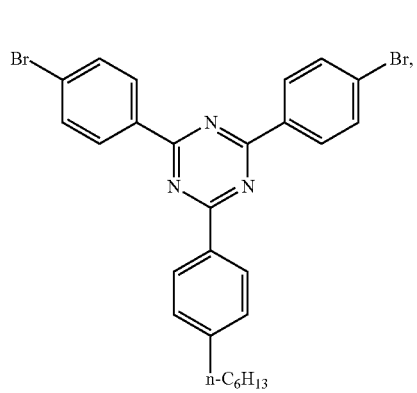

(Compound 16)

a compound 8 (2.5781 g, 4.00 mmol), dichlorobis(triphenylphosphine)palladium (1.7 mg), and toluene (50 mL) were mixed in an inactive atmosphere, and the mixture was heated to 105° C. A 20 mass % tetraethylammonium hydroxide aqueous solution (16.6 mL) was added dropwise to a reaction solution, and refluxed for 8 hours. After the reaction, phenylboronic acid (60.9 mg) and dichlorobis(triphenylphosphine)palladium (1.7 mg) were added thereto, and the mixture was further refluxed for 23 hours. Then, a sodium diethyldithiocarbamate aqueous solution was added thereto, and the mixture was stirred at 80° C. for 2 hours. After cooling the reaction solution, the reaction solution was rinsed twice with water, twice with a 3 mass % acetic acid aqueous solution, and twice with water, and the obtained solution was added dropwise to methanol and filtered out to obtain a precipitate. The precipitate was dissolved in toluene and passed through an alumina column and a silica gel column in that order for purification. The obtained solution was added dropwise to methanol and stirred, and then the resultant precipitate was filtered out and dried to obtain 3.13 g of a polymer compound 7. The polystyrene-equivalent number-average molecular weight of the polymer compound 7 was $2.6 \times 10^5$, and the polystyrene-equivalent weight-average molecular weight was $6.7 \times 10^5$.

The polymer compound 7 is a random copolymer composed of a repeating unit represented by the following formula:

[Chemical Formula 166]

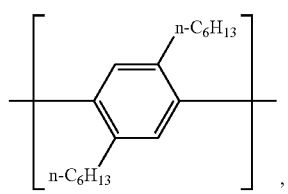

a repeating unit represented by the following formula:

[Chemical Formula 167]

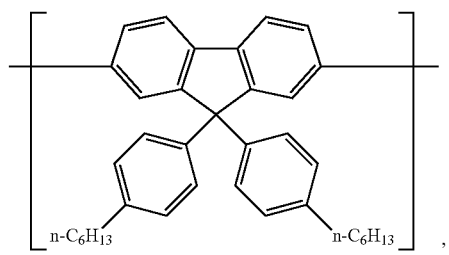

and a repeating unit represented by the following formula:

[Chemical Formula 168]

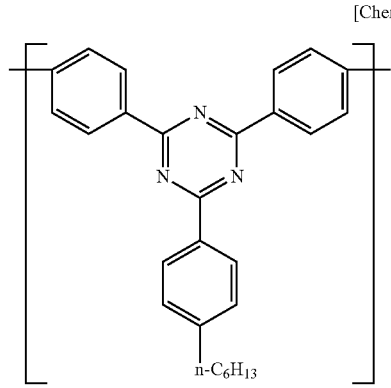

in a molar ratio of 50:40:10, based on the theoretical values calculated from the charging raw materials.

Synthesis Example 8

Synthesis of Polymer Compound 8

A compound 6 (7.5733 g, 10.23 mmol), a compound 7 (2.1494 g, 4.03 mmol), a compound 3 (7.635 g, 11.82 mmol), a compound 9 (0.1369 g, 0.29 mmol), a compound 4 (1.0707 g, 1.44 mmol), a compound 17 (0.6895 g, 0.86 mmol) represented by the following formula:

[Chemical Formula 169]

(Compound 17)

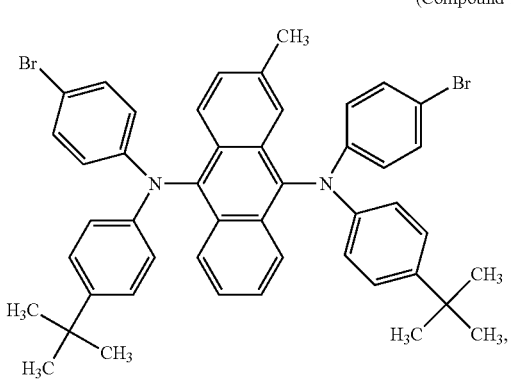

dichlorobis(triphenylphosphine)palladium (5.0 mg), and toluene (315 mL) were mixed in an inactive atmosphere, and heated to 105° C. A 20 mass % tetraethylammonium hydroxide aqueous solution (48.9 mL) was added dropwise to a reaction solution, and refluxed for 8 hours. After the reaction, phenylboronic acid (0.17 g) and dichlorobis(triphenylphosphine)palladium (5.0 mg) were added thereto, and further refluxed for 23 hours. Then, a sodium diethyldithiocarbamate aqueous solution was added thereto, and the mixture was stirred at 80° C. for 2 hours. After cooling the reaction solution, the reaction solution was rinsed twice with water, twice with a 3 mass % acetic acid aqueous solution, and twice with water, and the obtained solution was added dropwise to methanol and filtered out to obtain a precipitate. The precipitate was dissolved in toluene and passed through an alumina column and a silica gel column in that order for purification. The obtained solution was added dropwise to methanol and stirred, and then the resultant precipitate was filtered out and dried to obtain 12.48 g of a polymer compound 8. The polystyrene-equivalent number-average molecular weight of the polymer compound 8 was $9.7 \times 10^4$, and the polystyrene-equivalent weight-average molecular weight was $2.8 \times 10^5$.

The polymer compound 8 is a random copolymer composed of a repeating unit represented by the following formula:

[Chemical Formula 170]

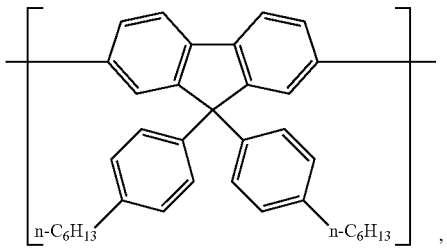

a repeating unit represented by the following formula:

[Chemical Formula 171]

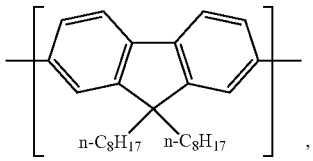

a repeating unit represented by the following formula:

[Chemical Formula 172]

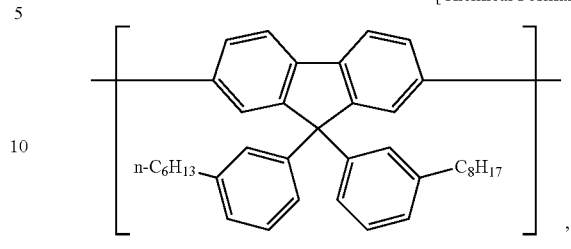

a repeating unit represented by the following formula:

[Chemical Formula 173]

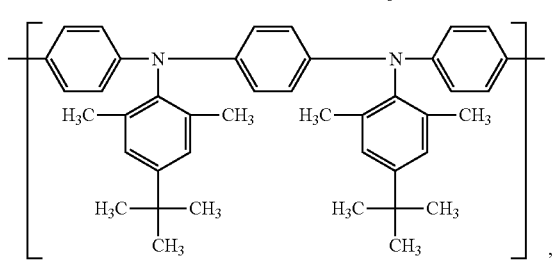

a repeating unit represented by the following formula:

[Chemical Formula 174]

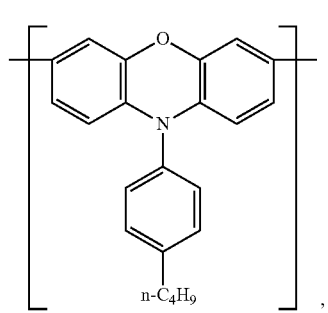

and a repeating unit represented by the following formula:

[Chemical Formula 175]

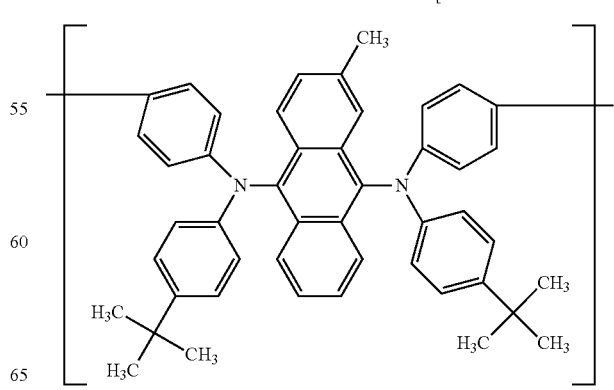

in a molar ratio of 36:14:41:5:1:3, based on the theoretical values calculated from the charging raw materials.

Synthesis Example 9

Synthesis of Polymer Compound 9

A compound 6 (2.8964 g, 3.92 mmol), a compound 2 (1.9744 g, 3.60 mmol), a compound 4 (0.2963 g, 0.40 mmol), dichlorobis(triphenylphosphine)palladium (2.8 mg), and toluene (80 mL) were mixed in an inactive atmosphere, and heated to 105° C. A 17.5 mass % sodium carbonate aqueous solution (10.9 mL) was added dropwise to a reaction solution, and refluxed for 8 hours. After the reaction, phenylboronic acid (50.0 mg) and dichlorobis(triphenylphosphine)palladium (2.8 mg) were added thereto, and further refluxed for 23 hours. Then, a sodium diethyldithiocarbamate aqueous solution was added thereto, and the mixture was stirred at 80° C. for 2 hours. After cooling the reaction solution, the reaction solution was rinsed twice with water, twice with a 3 mass % acetic acid aqueous solution, and twice with water, and the obtained solution was added dropwise to methanol and filtered out to obtain a precipitate. The precipitate was dissolved in toluene and passed through an alumina column and a silica gel column in that order for purification. The obtained solution was added dropwise to methanol and stirred, and then the resultant precipitate was filtered out and dried to obtain 2.00 g of a polymer compound 9. The polystyrene-equivalent number-average molecular weight of the polymer compound 9 was $1.1 \times 10^5$, and the polystyrene-equivalent weight-average molecular weight was $2.8 \times 10^5$.

The polymer compound 9 is a random copolymer composed of a repeating unit represented by the following formula:

[Chemical Formula 176]

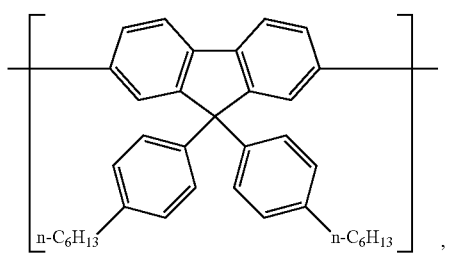

a repeating unit represented by the following formula:

[Chemical Formula 177]

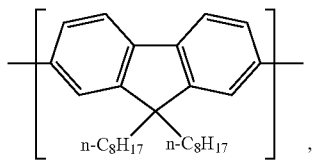

and a repeating unit represented by the following formula:

[Chemical Formula 178]

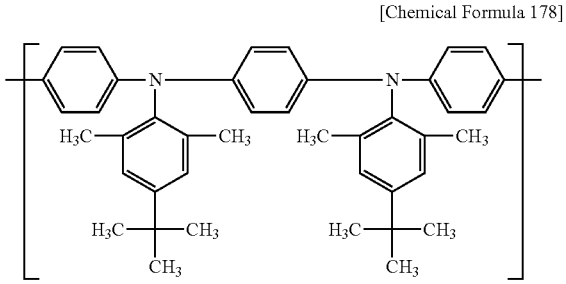

in a molar ratio of 50:45:5, based on the theoretical values calculated from the charging raw materials.

Synthesis Example 10

Synthesis of Polymer Compound 10

Synthesis Example 3

A polymer compound 2 (1.200 g, 2.90 mmol), fullerene C60 (manufactured by sigma Aldrich Co.) (0.6219 g, 0.90 mmol), and 140 mL of ortho-dichlorobenzene were mixed in an inactive atmosphere. After the obtained mixed solution was bubbled by argon gas for 30 minutes, the mixed solution was heated to 190° C. and stirred for 24 hours. Then, the reaction solution was reprecipitated in methanol, filtrated, and dried under reduced pressure.

After drying, tetrahydrofuran was added to the obtained crude polymer and dissolved, and the solution was subjected to Celite filtration to obtain a polymer solution. Then, the polymer solution was passed through a Kiriyama-rohto with Celite laminated on the lower layer of the Kiriyama-rohto and a mixture of activated carbon and silica gel laminated on the upper layer thereof. After this operation was repeated twice, tetrahydrofuran was distilled off, and the residue was redissolved in toluene. After the polymer solution was added dropwise to methanol, and the mixture was stirred, the obtained precipitate was filtered out and dried, to obtain 0.43 g of a polymer compound 10. The polystyrene-equivalent number-average molecular weight of the polymer compound 10 was $1.1 \times 10^5$, and the polystyrene-equivalent weight-average molecular weight was $3.7 \times 10^5$.

The amount of fullerene to be supported to all the repeating units of the obtained polymer compound 10 was 2.2 mole %, and the amount of fullerene not to be supported was 0.0 mole %.

Synthesis Example 11

Synthesis of Polymer Compound 11

Synthesis of Compound B

A compound B was synthesized from a compound A by a reaction represented by the following formula.

[Chemical Formula 179]

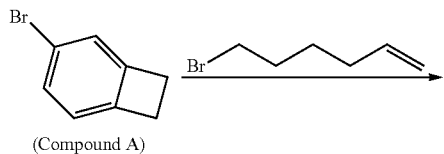

(Compound A)

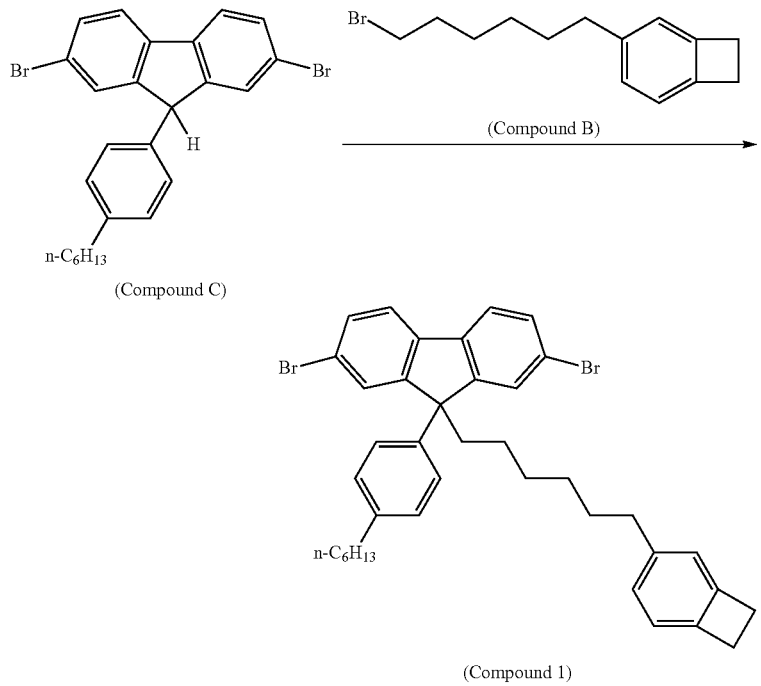

-continued

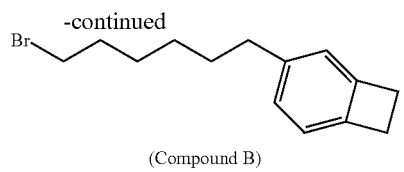

(Compound B)

After 6-bromo-1-hexene (90.9 g) and tetrahydrofuran (350 mL) were placed in a 3000 mL four-necked flask equipped with a stirrer, 9-borabicyclo[3.3.1]nonane (66.6 g) was slowly added dropwise thereto, and the mixture was stirred while being kept warm at room temperature for 19 hours.

After 1,1'-bis(diphenylphosphino)ferrocene-palladium (II) dichloride (8.92 g), a 3 mol/L sodium hydroxide aqueous solution (290 mL), a compound A (40.0 g), and tetrahydrofuran (350 mL) were placed in the reaction solution, the temperature of the resultant reaction solution was raised to 70° C., and the reaction solution was stirred while being kept warm for 1 hour.

The reaction solution was cooled to 0° C.; hexane and hydrogen peroxide water were slowly added thereto; and the reaction solution was stirred while being kept warm for 30 minutes. An organic layer was rinsed with water; the obtained organic layer was concentrated; and a crude product was purified by using a silica gel column (developing solvent: hexane/ethyl acetate mixed solution) to obtain 25.2 g of a compound B as a transparent and colorless oil.

LC-MS (APCI, positive): $[M+H]^+$ 266

Synthesis of Compound 1

A compound 1 was synthesized from the compound B by a reaction represented by the following formula.

After a compound B (16.7 g), a compound C (20.8 g), and methyltrioctylammonium chloride (Aliquat336 manufactured by Sigma-Aldrich Co.) (0.92 g) were placed in a 300 mL four-necked flask equipped with a stirrer, the temperature thereof was raised to 85° C., and the mixture was stirred while being kept warm for 1 hour. A 40 mass % potassium hydrate aqueous solution (24 mL) was slowly added dropwise thereto, and the mixture was stirred while being kept warm at 85° C. for 3 hours.

The temperature of the reaction solution was returned to room temperature; and water and dichloromethane were added to the reaction solution to separate an organic layer from an aqueous layer. The organic layer was rinsed with water, and the obtained organic layer was concentrated to obtain a crude product. The crude product was recrystallized by a mixed solution of isopropanol and toluene to obtain 15.2 g of a compound 1 as a white solid.

LC-MS (APCI, positive): [M+H]$^+$668

Synthesis of Polymer Compound 11

A compound 10 (1.8090 g, 1.99 mmol), a compound 2 (0.1132 g, 0.20 mmol), a compound 11 (1.1002 g, 1.20 mmol), a compound 1 (0.4032 g, 0.60 mmol), dichlorobis(triphenylphosphine)palladium (1.8 mg), and toluene (50 mL) were mixed in an inactive atmosphere, and heated to 105° C.

A 20 mass % tetraethylammonium hydroxide aqueous solution (7 ml) was added dropwise to a reaction solution, and refluxed for 4 hours. After the reaction, phenylboronic acid (24.4 mg) and dichlorobis(triphenylphosphine)palladium (1.8 mg) were added thereto, and further refluxed for 16.5 hours. Then, a sodium diethyldithiocarbamate aqueous solution was added thereto, and the mixture was stirred at 80° C. for 2 hours. After cooling the reaction solution, the reaction solution was rinsed twice with water, twice with a 3 mass % acetic acid aqueous solution, and twice with water, and the obtained solution was added dropwise to methanol and filtered out to obtain a precipitate.

The precipitate was dissolved in toluene and passed through an alumina column and a silica gel column in that order for purification. The obtained solution was added dropwise to methanol and stirred, and then the resultant precipitate was filtered out and dried to obtain 1.98 g of a polymer compound 11. The polystyrene-equivalent number-average molecular weight of the polymer compound 11 was $5.2 \times 10^4$, and the polystyrene-equivalent weight-average molecular weight was $2.2 \times 10^5$.

The polymer compound 11 is a random copolymer composed of a repeating unit represented by the following formula:

[Chemical Formula 181]

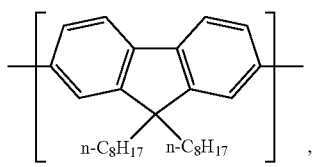

a repeating unit represented by the following formula:

[Chemical Formula 182]

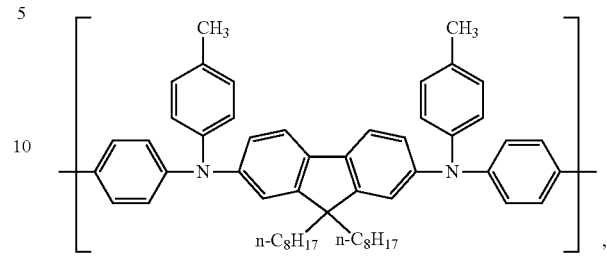

a repeating unit represented by the following formula:

[Chemical Formula 183]

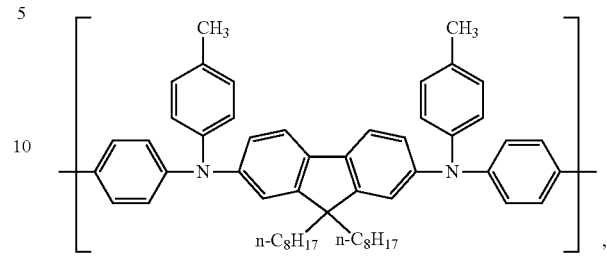

and a repeating unit represented by the following formula:

[Chemical Formula 184]

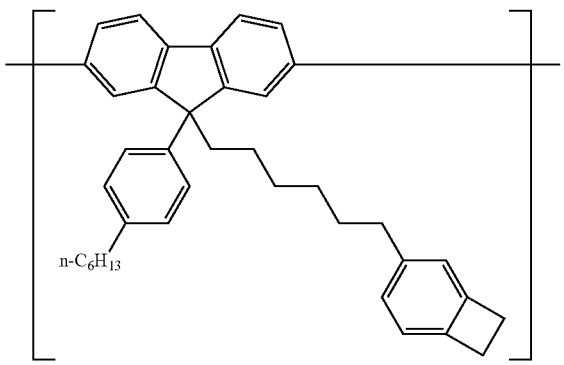

in a molar ratio of 50:5:30:15, based on the theoretical values calculated from the charging raw materials.

Synthesis Example 12

Synthesis of Polymer Compound 12

Synthesis Example 4

A polymer compound 11 (1.5426 g, 2.38 mmol), fullerene C60 (manufactured by sigma Aldrich Co.) (0.5163 g, 0.72 mmol), and 120 mL of ortho-dichlorobenzene were mixed in an inactive atmosphere. After the obtained mixed solution was bubbled by argon gas for 30 minutes, the mixed solution was heated to 190° C. and stirred for 24 hours. Then, the reaction solution was reprecipitated in methanol, filtrated, and dried under reduced pressure.

After drying, 80 mL of tetrahydrofuran was added to the obtained crude polymer and dissolved, and the solution was subjected to Celite filtration to obtain a polymer solution. Then, the polymer solution was passed through a Kiriyama-rohto with Celite laminated on the lower layer of the Kiriyama-rohto and a mixture of activated carbon and silica gel laminated on the upper layer thereof. After this operation was repeated twice, tetrahydrofuran was distilled off, and the residue was redissolved in toluene. After the polymer solution was added dropwise to methanol, and the mixture was stirred, the obtained precipitate was filtered out and dried, to obtain 1.11 g of a polymer compound 12. The polystyrene-equivalent number-average molecular weight of the polymer compound 12 was $1.5 \times 10^5$, and the polystyrene-equivalent weight-average molecular weight was $5.3 \times 10^5$.

The amount of fullerene to be supported to all the repeating units of the obtained polymer compound 12 was 4.5 mole %, and the amount of fullerene not to be supported was 0.0 mole %.

Production of Organic EL Device

Example 1

A solution of poly(ethylenedioxythiophene)/polystyrene-sulfonic acid (H. C. Starck, product name: AI4083) was used for film formation by spin coating to a thickness of 65 nm on a glass substrate which had an ITO film with a thickness of 45 nm formed thereon by sputtering, and the film was dried on a hot plate at 200° C. for 10 minutes.

Next, a polymer compound 1 and a polymer compound 5 were respectively dissolved in xylene solutions to prepare xylene solutions of 0.7 mass %.

Next, the xylene solution of the polymer compound 1 and the xylene solution of the polymer compound 5 were mixed so that the mass ratio of the solid contents of the polymer compound 1 and the polymer compound 5 was 80:20. This xylene solution was spin coated, to form a film with a thickness of 20 nm. This was heated on a hot plate in a nitrogen gas atmosphere at 180° C. for 60 minutes.

Next, a polymer compound 6 was dissolved in xylene to prepare a xylene solution of 1.3 mass %. The xylene solution was spin coated to form a film with a thickness of 65 nm, and the film was subjected to heating for 10 minutes at 130° C. in a nitrogen atmosphere for drying, then to vapor deposition with barium to approximately 5 nm as a cathode, and then aluminum to approximately 80 nm, to produce an organic EL device. Vapor deposition of the metals was initiated after the degree of vacuum reached at least $1 \times 10^4$ Pa.

Upon application of a voltage to the obtained organic EL device, EL luminescence with a peak at 465 nm was obtained from the device, and the maximum luminous efficiency was 7.1 cd/A.

After setting the current value of the obtained organic EL device for an initial brightness of 1000 cd/m², it was driven at constant current and the time-dependent change in a brightness was measured. As a result, the brightness was reduced by half after 2420 hours.

Example 2

An organic EL device was produced in the same manner as in Example 1 except that a polymer compound 2 was used in place of the polymer compound 1 in Example 1.

Upon application of a voltage to the obtained organic EL device, EL luminescence with a peak at 465 nm was obtained from the device, and the maximum luminous efficiency was 7.5 cd/A.

After setting the current value of the obtained organic EL device for an initial brightness of 1000 cd/m², it was driven at constant current and the time-dependent change in a brightness was measured. As a result, the brightness was reduced by half after 2030 hours.

Example 3

An organic EL device was produced in the same manner as in Example 1 except that a xylene solution containing only the polymer compound 5 was used in place of the xylene solution in Example 1 in which the polymer compound 1 and the polymer compound 5 were mixed.

Upon application of a voltage to the obtained organic EL device, EL luminescence with a peak at 465 nm was obtained from the device, and the maximum luminous efficiency was 4.8 cd/A.

After setting the current value of the obtained organic EL device for an initial brightness of 1000 cd/m², it was driven at constant current and the time-dependent change in a brightness was measured. As a result, the brightness was reduced by half after 2325 hours.

Example 4

An organic EL device was produced in the same manner as in Example 1 except that a polymer compound 3 and a polymer compound 4 were used in place of the polymer compound 1 and the polymer compound 5 in Example 1.

Upon application of a voltage to the obtained organic EL device, EL luminescence with a peak at 465 nm was obtained from the device, and the maximum luminous efficiency was 6.9 cd/A.

After setting the current value of the obtained organic EL device for an initial brightness of 1000 cd/m², it was driven at constant current and the time-dependent change in a brightness was measured. As a result, the brightness was reduced by half after 2310 hours.

Example 5

An organic EL device was produced in the same manner as in Example 1 except that a xylene solution in which a polymer compound 7 and an iridium complex represented by the following formula (L-1) were mixed so that the mass ratio of solid contents of the polymer compound 7 and iridium complex was 80:20 was spin coated in place of the xylene solution of the polymer compound 6 in Example 1, to form a film with a thickness of 80 nm.

[Chemical Formula 185]

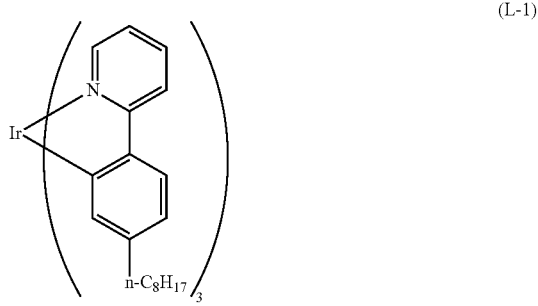

(L-1)

Upon application of a voltage to the obtained organic EL device, EL luminescence with a peak at 510 nm was obtained from the device, and the maximum luminous efficiency was 16.2 cd/A.

After setting the current value of the obtained organic EL device for an initial brightness of 1000 cd/m², it was driven at constant current and the time-dependent change in a brightness was measured. As a result, the brightness was reduced by half after 380 hours.

Example 6

An organic EL device was produced in the same manner as in Example 1 except that a polymer compound 8 was used in place of the polymer compound 6 in Example 1.

Upon application of a voltage to the obtained organic EL device, EL luminescence with a peak at 520 nm was obtained from the device, and the maximum luminous efficiency was 12.0 cd/A.

After setting the current value of the obtained organic EL device for an initial brightness of 1000 cd/m$^2$, it was driven at constant current and the time-dependent change in a brightness was measured. As a result, the brightness was reduced by half after 61740 hours.

Example 7

An organic EL device was produced in the same manner as in Example 1 except that a xylene solution in which a polymer compound 9 and an iridium complex represented by the following formula (L-2) were mixed so that the mass ratio of solid contents of the polymer compound 9 and iridium complex was 92.5:7.5 was spin coated in place of the xylene solution of the polymer compound 6 in Example 1, to form a film with a thickness of 80 nm.

[Chemical Formula 186]

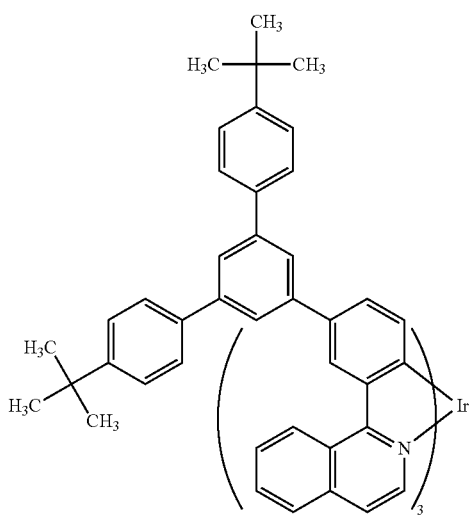

(L-2)

Upon application of a voltage to the obtained organic EL device, EL luminescence with a peak at 625 nm was obtained from the device, and the maximum luminous efficiency was 6.2 cd/A.

After setting the current value of the obtained organic EL device for an initial brightness of 1000 cd/m$^2$, it was driven at constant current and the time-dependent change in a brightness was measured. As a result, the brightness was reduced by half after 20320 hours.

Example 8

An organic EL device was produced in the same manner as in Example 1 except that a polymer compound 10 was used in place of the polymer compound 5 in Example 1.

Upon application of a voltage to the obtained organic EL device, EL luminescence with a peak at 465 nm was obtained from the device, and the maximum luminous efficiency was 6.1 cd/A.

After setting the current value of the obtained organic EL device for an initial brightness of 1000 cd/m$^2$, it was driven at constant current and the time-dependent change in a brightness was measured. As a result, the brightness was reduced by half after 2290 hours.

Example 9

An organic EL device was produced in the same manner as in Example 1 except that a polymer compound 2 and a polymer compound 10 were used in place of the polymer compound 1 and the polymer compound 5 in Example 1.

Upon application of a voltage to the obtained organic EL device, EL luminescence with a peak at 465 nm was obtained from the device, and the maximum luminous efficiency was 4.2 cd/A.

After setting the current value of the obtained organic EL device for an initial brightness of 1000 cd/m$^2$, it was driven at constant current and the time-dependent change in a brightness was measured. As a result, the brightness was reduced by half after 2460 hours.

Example 10

An organic EL device was produced in the same manner as in Example 1 except that a polymer compound 3 and a polymer compound 12 were used in place of the polymer compound 1 and the polymer compound 5 in Example 1.

Upon application of a voltage to the obtained organic EL device, EL luminescence with a peak at 465 nm was obtained from the device, and the maximum luminous efficiency was 5.7 cd/A.

After setting the current value of the obtained organic EL device for an initial brightness of 1000 cd/m$^2$, it was driven at constant current and the time-dependent change in a brightness was measured. As a result, the brightness was reduced by half after 2920 hours.

Example 11

An organic EL device was produced in the same manner as in Example 6 except that a polymer compound 2 and a polymer compound 10 were used in place of the polymer compound 1 and the polymer compound 5 in Example 6.

Upon application of a voltage to the obtained organic EL device, EL luminescence with a peak at 520 nm was obtained from the device, and the maximum luminous efficiency was 11.9 cd/A.

After setting the current value of the obtained organic EL device for an initial brightness of 1000 cd/m$^2$, it was driven at constant current and the time-dependent change in a brightness was measured. As a result, the brightness was reduced by half after 50890 hours.

Example 12

An organic EL device was produced in the same manner as in Example 6 except that a polymer compound 3 and a polymer compound 12 were used in place of the polymer compound 1 and the polymer compound 5 in Example 6.

Upon application of a voltage to the obtained organic EL device, EL luminescence with a peak at 520 nm was obtained from the device, and the maximum luminous efficiency was 14.0 cd/A.

After setting the current value of the obtained organic EL device for an initial brightness of 1000 cd/m$^2$, it was driven at constant current and the time-dependent change in a brightness was measured. As a result, the brightness was reduced by half after 67110 hours.

Example 13

An organic EL device was produced in the same manner as in Example 7 except that a polymer compound 2 and a polymer compound 10 were used in place of the polymer compound 1 and the polymer compound 5 in Example 7.

Upon application of a voltage to the obtained organic EL device, EL luminescence with a peak at 625 nm was obtained from the device, and the maximum luminous efficiency was 6.0 cd/A.

After setting the current value of the obtained organic EL device for an initial brightness of 1000 cd/m$^2$, it was driven at constant current and the time-dependent change in a brightness was measured. As a result, the brightness was reduced by half after 22310 hours.

Example 14

An organic EL device was produced in the same manner as in Example 7 except that a polymer compound 3 and a polymer compound 12 were used in place of the polymer compound 1 and the polymer compound 5 in Example 7.

Upon application of a voltage to the obtained organic EL device, EL luminescence with a peak at 625 nm was obtained from the device, and the maximum luminous efficiency was 6.0 cd/A.

After setting the current value of the obtained organic EL device for an initial brightness of 1000 cd/m$^2$, it was driven at constant current and the time-dependent change in a brightness was measured. As a result, the brightness was reduced by half after 24520 hours.

Comparative Example 1

An organic EL device was produced in the same manner as in Example 1 except that a xylene solution containing only the polymer compound 1 was used in place of the xylene solution in Example 1 in which the polymer compound 1 and the polymer compound 5 were mixed.

Upon application of a voltage to the obtained organic EL device, EL luminescence with a peak at 465 nm was obtained from the device, and the maximum luminous efficiency was 8.4 cd/A.

After setting the current value of the obtained organic EL device for an initial brightness of 1000 cd/m$^2$, it was driven at constant current and the time-dependent change in a brightness was measured. As a result, the brightness was reduced by half after 860 hours.

Comparative Example 2

An organic EL device was produced in the same manner as in Example 2 except that a xylene solution containing only the polymer compound 2 was used in place of the xylene solution in Example 2 in which the polymer compound 2 and the polymer compound 5 were mixed.

Upon application of a voltage to the obtained organic EL device, EL luminescence with a peak at 465 nm was obtained from the device, and the maximum luminous efficiency was 8.8 cd/A.

After setting the current value of the obtained organic EL device for an initial brightness of 1000 cd/m$^2$, it was driven at constant current and the time-dependent change in a brightness was measured. As a result, the brightness was reduced by half after 1041 hours.

Comparative Example 3

An organic EL device was produced in the same manner as in Example 4 except that a xylene solution containing only the polymer compound 3 was used in place of the xylene solution in Example 4 in which the polymer compound 3 and the polymer compound 4 were mixed.

Upon application of a voltage to the obtained organic EL device, EL luminescence with a peak at 465 nm was obtained from the device, and the maximum luminous efficiency was 8.5 cd/A.

After setting the current value of the obtained organic EL device for an initial brightness of 1000 cd/m$^2$, it was driven at constant current and the time-dependent change in a brightness was measured. As a result, the brightness was reduced by half after 1001 hours.

Comparative Example 4

An organic EL device was produced in the same manner as in Example 5 except that a xylene solution containing only the polymer compound 1 was used in place of the xylene solution in Example 5 in which the polymer compound 1 and the polymer compound 5 were mixed.

Upon application of a voltage to the obtained organic EL device, EL luminescence with a peak at 510 nm was obtained from the device, and the maximum luminous efficiency was 18.8 cd/A.

After setting the current value of the obtained organic EL device for an initial brightness of 1000 cd/m$^2$, it was driven at constant current and the time-dependent change in a brightness was measured. As a result, the brightness was reduced by half after 280 hours.

Comparative Example 5

An organic EL device was produced in the same manner as in Example 6 except that a xylene solution containing only the polymer compound 1 was used in place of the xylene solution in Example 6 in which the polymer compound 1 and the polymer compound 5 were mixed.

Upon application of a voltage to the obtained organic EL device, EL luminescence with a peak at 520 nm was obtained from the device, and the maximum luminous efficiency was 14.2 cd/A.

After setting the current value of the obtained organic EL device for an initial brightness of 1000 cd/m$^2$, it was driven at constant current and the time-dependent change in a brightness was measured. As a result, the brightness was reduced by half after 32970 hours.

Comparative Example 6

An organic EL device was produced in the same manner as in Example 7 except that a xylene solution containing only the polymer compound 1 was used in place of the xylene solution in Example 7 in which the polymer compound 1 and the polymer compound 5 were mixed.

Upon application of a voltage to the obtained organic EL device, EL luminescence with a peak at 625 nm was obtained from the device, and the maximum luminous efficiency was 7.2 cd/A.

After setting the current value of the obtained organic EL device for an initial brightness of 1000 cd/m$^2$, it was driven at constant current and the time-dependent change in a brightness was measured. As a result, the brightness was reduced by half after 16800 hours.

Comparative Example 7

An organic EL device was produced in the same manner as in Example 1 except that a xylene solution prepared so that the mass ratio of the solid contents of the polymer compound 1 and fullerene C60 was 92.5:7.5 was used in place of the xylene solution in Example 1 in which the polymer compound 1 and the polymer compound 5 were mixed.

Upon application of a voltage to the obtained organic EL device, EL luminescence with a peak at 465 nm was obtained from the device, and the maximum luminous efficiency was greatly decreased to 3.2 cd/A.

The results of examples and comparative examples are shown in Table 1. In Table 1, a "kind" and a "ratio" described in each layer show the kind and mixing ratio (mass ratio) of the polymer compound (or Ir complex) used for each layer. A "peak" shows a peak of EL luminescence and a "brightness life" shows a brightness half-life.

[Polymer Compound According to Photoelectric Conversion Device Form]

Next, examples and comparative examples for a polymer compound according to a photoelectric conversion device form and a photoelectric conversion device using the same will be described.

(NMR Measurement)

NMR measurement was conducted for a compound dissolved in deuteriochloroform using a NMR apparatus (manufactured by Varian, INOVA300).

(Measurement of Number-Average Molecular Weight and Weight-Average Molecular Weight)

As to number-average molecular weight and weight-average molecular weight, polystyrene-equivalent number-average molecular weight and polystyrene-equivalent weight-average molecular weight were determined by a gel permeation chromatography (GPC) (manufactured by Shimadzu Corporation, product name: LC-10Avp). A polymer compound to

TABLE 1

|  | Hole transport layer | | Light-emitting layer | | Peak [nm] | Brightness life [time] | Maximum luminous efficiency [cd/A] |
|---|---|---|---|---|---|---|---|
|  | Kind | Ratio | Kind | Ratio | | | |
| Example 1 | Polymer compound 1<br>Polymer compound 5 | 80<br>20 | Polymer compound 6 | 100 | 465 | 2420 | 7.1 |
| Example 2 | Polymer compound 2<br>Polymer compound 5 | 80<br>20 | Polymer compound 6 | 100 | 465 | 2030 | 7.5 |
| Example 3 | Polymer compound 5 | 100 | Polymer compound 6 | 100 | 465 | 2325 | 4.8 |
| Example 4 | Polymer compound 3<br>Polymer compound 4 | 80<br>20 | Polymer compound 6 | 100 | 465 | 2310 | 6.9 |
| Example 5 | Polymer compound 1<br>Polymer compound 5 | 80<br>20 | Polymer compound 7<br>Ir complex (L-1) | 80<br>20 | 510 | 380 | 16.2 |
| Example 6 | Polymer compound 1<br>Polymer compound 5 | 80<br>20 | Polymer compound 8 | 100 | 520 | 61740 | 12.0 |
| Example 7 | Polymer compound 1<br>Polymer compound 5 | 80<br>20 | Polymer compound 9<br>Ir complex (L-2) | 92.5<br>7.5 | 625 | 20320 | 6.2 |
| Example 8 | Polymer compound 1<br>Polymer compound 10 | 80<br>20 | Polymer compound 6 | 100 | 465 | 2290 | 6.1 |
| Example 9 | Polymer compound 2<br>Polymer compound 10 | 80<br>20 | Polymer compound 6 | 100 | 465 | 2460 | 4.2 |
| Example 10 | Polymer compound 3<br>Polymer compound 12 | 80<br>20 | Polymer compound 6 | 100 | 465 | 2920 | 5.7 |
| Example 11 | Polymer compound 2<br>Polymer compound 10 | 80<br>20 | Polymer compound 8 | 100 | 520 | 50890 | 11.9 |
| Example 12 | Polymer compound 3<br>Polymer compound 12 | 80<br>20 | Polymer compound 8 | 100 | 520 | 67110 | 14.0 |
| Example 13 | Polymer compound 2<br>Polymer compound 10 | 80<br>20 | Polymer compound 9<br>Ir complex (L-2) | 92.5<br>7.5 | 625 | 22310 | 6.0 |
| Example 14 | Polymer compound 3<br>Polymer compound 12 | 80<br>20 | Polymer compound 9<br>Ir complex (L-2) | 92.5<br>7.5 | 625 | 24520 | 6.0 |
| Comparative Example 1 | Polymer compound 1 | 100 | Polymer compound 6 | 100 | 465 | 860 | 8.4 |
| Comparative Example 2 | Polymer compound 2 | 100 | Polymer compound 6 | 100 | 465 | 1041 | 8.8 |
| Comparative Example 3 | Polymer compound 3 | 100 | Polymer compound 6 | 100 | 465 | 1001 | 8.5 |
| Comparative Example 4 | Polymer compound 1 | 100 | Polymer compound 7<br>Ir complex (L-1) | 80<br>20 | 510 | 280 | 18.8 |
| Comparative Example 5 | Polymer compound 1 | 100 | Polymer compound 8 | 100 | 520 | 32970 | 14.2 |
| Comparative Example 6 | Polymer compound 1 | 100 | Polymer compound 9<br>Ir complex (L-2) | 92.5<br>7.5 | 625 | 16800 | 7.2 |
| Comparative Example 7 | Polymer compound 1<br>Fullerene C60 | 92.5<br>7.5 | Polymer compound 6 | 100 | 465 | — | 3.2 |

The polymer compounds 4, 5, 10 and 12 correspond to polymer compounds according to a light-emitting device form. The organic EL device including a hole transport layer containing the polymer compounds 4, 5, 10 or 12 showed an excellent brightness life.

be measured was dissolved in tetrahydrofuran so that the concentration was about 0.5 mass %, and 30 μL was injected into GPC. As a mobile phase of GPC, tetrahydrofuran was used, and caused to flow at a flow rate of 0.6 mL/min. As to the columns, two TSK gel Super HM-H (manufactured by Tosoh Corporation) and one TSK gel Super H2000 (manufactured by Tosoh Corporation) were connected in series. As a detector, a differential refractive index detector (manufactured by Shimadzu Corporation, product name: RID-10A) was used.

Synthesis Example 101

Synthesis of Compound G-1

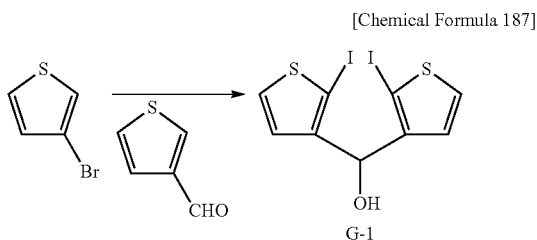

[Chemical Formula 187]

A four-necked flask containing argon replacing for the interior gas was charged with 13.0 g (80.0 mmol) of 3-bromothiophene and 80 mL of diethylether to give a uniform solution. The solution was added dropwise with a n-butyl lithium hexane solution (2.6 M, 31 mL, 80.6 mmol) while it was kept at −78° C. After letting the reaction solution react at −78° C. for 2 hours, a solution in which 8.96 g (80.0 mmol) of 3-thiophene aldehyde was dissolved in 20 mL of diethylether was added dropwise. After adding dropwise, the reaction solution was stirred at −78° C. for 30 minutes, and further stirred at room temperature (25° C.) for 30 minutes. The reaction solution was again cooled to −78° C., and a n-butyl lithium hexane solution (2.6 M, 62 mL, 161 mmol) was added dropwise over 15 minutes. After adding dropwise, the reaction solution was stirred at −25° C. for 2 hours, and further stirred at room temperature (25° C.) for 1 hour. Then the reaction solution was cooled to −25° C., and a solution in which 60 g (236 mmol) of iodine was dissolved in 1000 mL of diethylether was added dropwise over 30 minutes. After adding dropwise, the reaction solution was stirred at room temperature (25° C.) for 2 hours, and added with 50 mL of a 1 N sodium thiosulfate aqueous solution to stop the reaction. After extracting a reaction product by adding diethylether, the reaction product was dried over magnesium sulfate, and after filtration, the filtrate was concentrated, to obtain 35 g of a crude product. The crude product was purified by recrystallization with chloroform, to obtain 28 g of a compound G-1.

Synthesis Example 102

Synthesis of Compound G-2

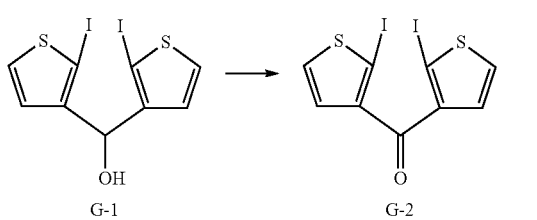

[Chemical Formula 188]

A four-necked flask was added with 10.5 g (23.4 mmol) of bisiodothienyl methanol (compound G-1) synthesized in Synthesis Example 101 and 150 mL of methylene chloride to give a uniform solution. The resultant solution was added with 7.50 g (34.8 mmol) of pyridinium chlorochromate and stirred at room temperature (25° C.) for 10 hours. After removing an insoluble component by filtration of the reaction solution, the filtrate was concentrated to obtain 10.0 g (22.4 mmol) of a compound G-2.

Synthesis Example 103

Synthesis of Compound G-3

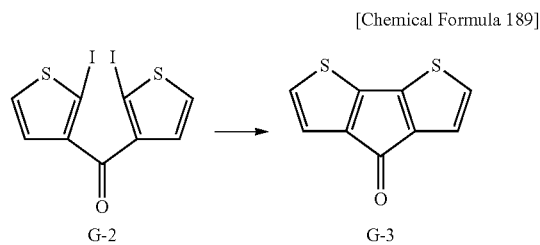 [SMILES: O=C(c1ccsc1I)c1ccsc1I ; O=C1c2ccsc2-c2sccc21]

[Chemical Formula 189]

A flask containing argon replacing for the interior gas was added with 10.0 g (22.4 mmol) of the compound G-2 synthesized in Synthesis Example 102, 6.0 g (94.5 mmol) of copper powder, and 120 mL of dehydrated N,N-dimethylformamide, and stirred at 120° C. for 4 hours. After reaction, the flask was cooled to room temperature (25° C.), and the reaction solution was filtered through a silica gel column to remove an insoluble component. Then the reaction solution was added with water, and followed by chloroform to extract a reaction product. The organic layer as the chloroform solution was dried over magnesium sulfate; the organic layer was filtered, and the filtrate was concentrated to obtain a crude product. The crude product was purified by a silica gel column (developing solvent: chloroform), to obtain 3.26 g of a compound G-3. The foregoing operations were conducted plural times.

Synthesis Example 104

Synthesis of Compound G-4

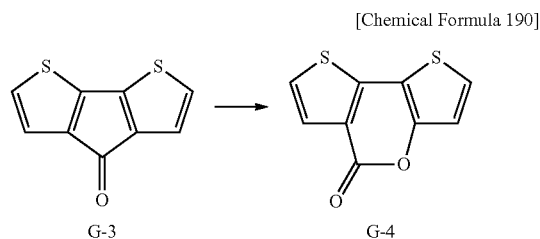 [SMILES: O=C1c2ccsc2-c2sccc21 ; O=c1oc2ccsc2c2sccc12]

[Chemical Formula 190]

A four-necked flask equipped with a mechanical stirrer and containing argon replacing for the interior gas was charged with 3.85 g (20.0 mmol) of the compound G-3 synthesized in Synthesis Example 103, 50 mL of chloroform, and 50 mL of trifluoroacetic acid to give a uniform solution. The resultant solution was added with 5.99 g (60 mmol) of sodium perborate monohydrate and stirred at room temperature (25° C.) for 45 minutes. Then, the reaction solution was added with water;

a reaction product was extracted by adding chloroform; the organic layer as the chloroform solution was caused to flow through a silica gel column; and the solvent of the filtrate was distilled off by an evaporator. The residue was recrystallized by using methanol, to obtain 534 mg of a compound G-4. The operations of Synthesis Example 104 were conducted plural times.

The NMR spectrum data of the compound G-4 will be shown below.

$^{1}$H NMR (CDCl$_{3}$, ppm): δ 7.64 (d, 1H), 7.43 (d, 1H), 7.27 (d, 1H), 7.10 (d, 1H).

Synthesis Example 105

Synthesis of Compound G-5

[Chemical Formula 191]

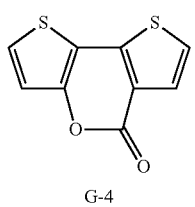

G-4

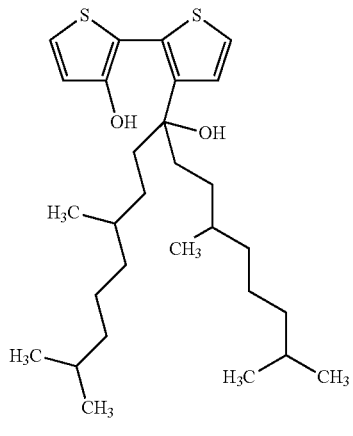

G-5

A four-necked flask containing argon replacing for the interior gas was charged with 1.00 g (4.80 mmol) of a compound G-4, and 30 mL of dehydrated tetrahydrofuran to give a uniform solution. While the flask was kept at −20° C., the reaction solution was added with 12.7 mL of a 3,7-dimethyloctyl magnesium bromide ether solution (1 M). Then, the temperature was raised to −5° C. over 30 minutes, and the reaction solution was stirred for 30 minutes in that condition. Then, the temperature was raised to 0° C. over 10 minutes, and the reaction solution was stirred for 1.5 hours in that condition. Then, the reaction solution was added with water to stop the reaction, and added with ethyl acetate to extract a reaction product. The organic layer as the ethyl acetate solution was dried over sodium sulfate, and after filtration, the ethyl acetate solution was caused to flow through a silica gel column, and then the solvent of the filtrate was distilled off to obtain 1.50 g of a compound G-5.

The NMR spectrum data of the compound G-5 will be shown below.

$^{1}$H NMR (CDCl$_{3}$, ppm): δ 8.42 (b, 1H), 7.25 (d, 1H), 7.20 (d, 1H), 6.99 (d, 1H), 6.76 (d, 1H), 2.73 (b, 1H), 1.90 (m, 4H), 1.58-1.02 (b, 20H), 0.92 (s, 6H), 0.88 (s, 12H).

Synthesis Example 106

Synthesis of Compound G-6

[Chemcial Formula 192]

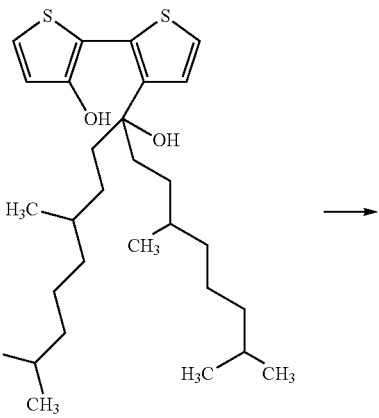

G-5

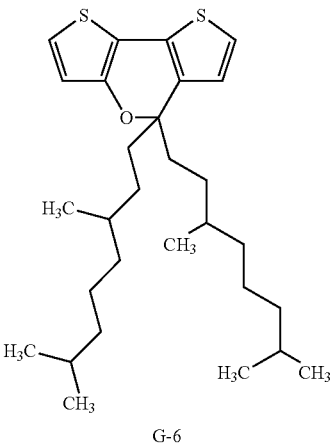

G-6

A flask containing argon replacing for the interior gas was charged with 1.50 g of a compound G-5 and 30 mL of toluene to give a uniform solution. The resultant solution was added with 100 mg of sodium p-toluene sulfonate monohydrate, and stirred at 100° C. for 1.5 hours. After cooling the reaction solution to room temperature (25° C.), water was added, followed by toluene to extract a reaction product. After drying the organic layer as the toluene solution over sodium sulfate, the solvent was distilled off after filtration. The obtained crude product was purified by a silica gel column (developing solvent: hexane) to obtain 1.33 g of a compound G-6. These operations were conducted plural times.

The NMR spectrum data of the compound G-6 will be shown below.

$^1$H NMR (CDCl$_3$, ppm): δ 6.98 (d, 1H), 6.93 (d, 1H), 6.68 (d, 1H), 6.59 (d, 1H), 1.89 (m, 4H), 1.58-1.00 (b, 20H), 0.87 (s, 6H), 0.86 (s, 12H).

Synthesis Example 107

Synthesis of Compound G-7

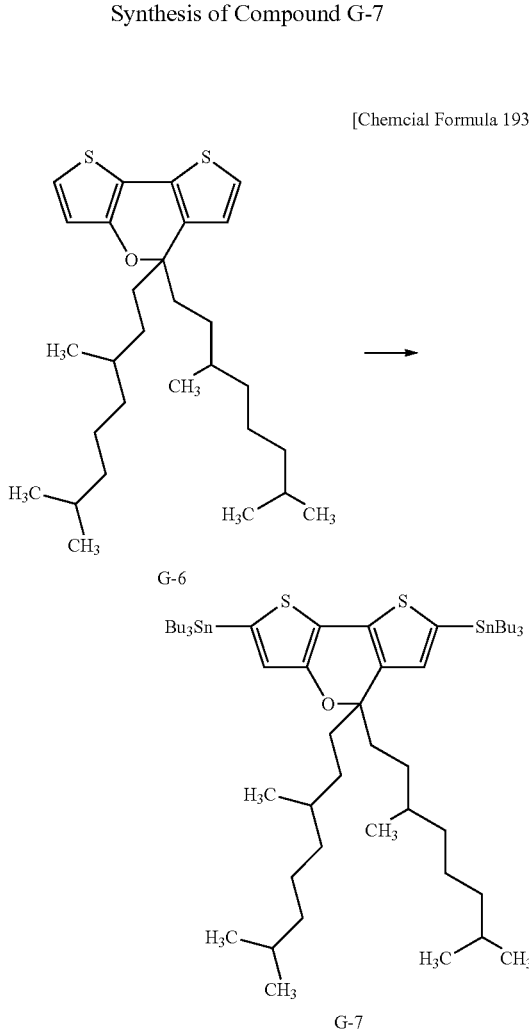

[Chemcial Formula 193]

G-6

G-7

A flask containing argon replacing for the interior gas was charged with 2.16 g (4.55 mmol) of a compound G-6 and 100 mL of dehydrated tetrahydrofuran to give a uniform solution. The resultant solution was kept at −78° C., and the solution was added dropwise with 4.37 mL (11.4 mmol) of a 2.6 M n-butyl lithium hexane solution over 10 minutes. After adding dropwise, the reaction solution was stirred at −78° C. for 30 minutes, and then stirred at room temperature (25° C.) for 2 hours. Then, the flask was cooled to −78° C., and the reaction solution was added with 4.07 g (12.5 mmol) of tributyl tin chloride. After adding, the reaction solution was stirred at −78° C. for 30 minutes, and then stirred at room temperature (25° C.) for 3 hours. Then, the reaction solution was added with water to stop the reaction, and added with ethyl acetate to extract a reaction product. After drying the organic layer as the ethyl acetate solution over sodium sulfate, and the filtrate was concentrated by an evaporator after filtration, to distill off the solvent. The obtained oily substance was purified by a silica gel column (developing solvent: hexane). As the silica gel in the silica gel column, silica gel which was immersed with hexane containing 5 mass % triethylamine for 5 minutes in advance, and then rinsed with hexane was used. After purification, 3.52 g (3.34 mmol) of a compound G-7 was obtained.

Synthesis Example 108

Synthesis of Compound G-8

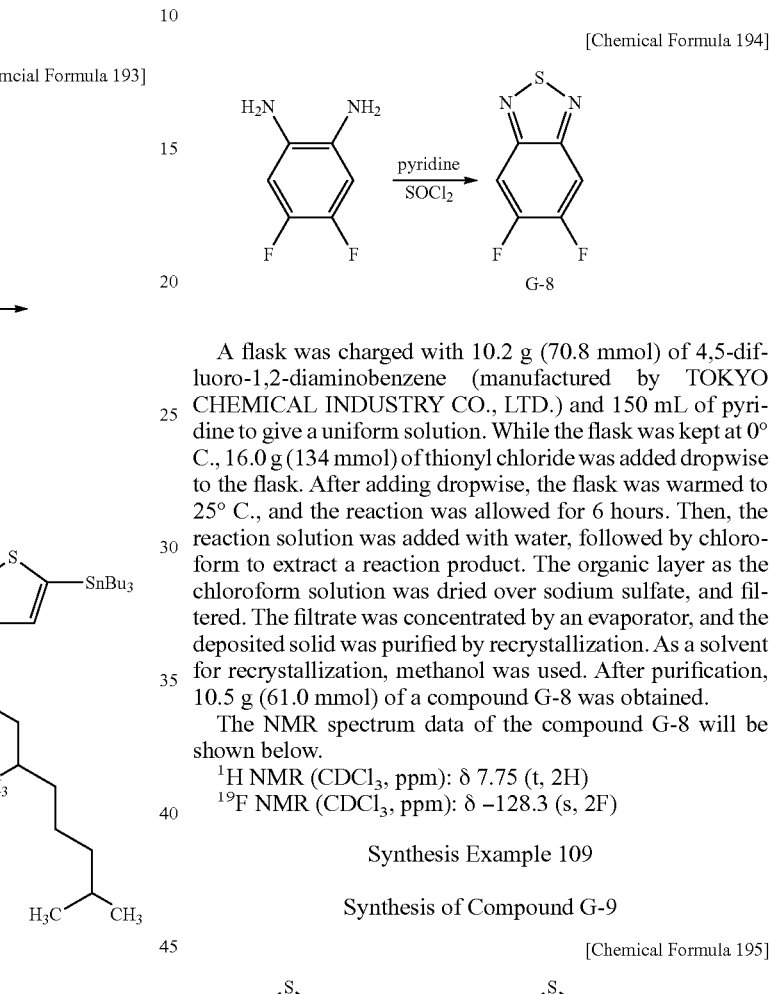

[Chemical Formula 194]

G-8

A flask was charged with 10.2 g (70.8 mmol) of 4,5-difluoro-1,2-diaminobenzene (manufactured by TOKYO CHEMICAL INDUSTRY CO., LTD.) and 150 mL of pyridine to give a uniform solution. While the flask was kept at 0° C., 16.0 g (134 mmol) of thionyl chloride was added dropwise to the flask. After adding dropwise, the flask was warmed to 25° C., and the reaction was allowed for 6 hours. Then, the reaction solution was added with water, followed by chloroform to extract a reaction product. The organic layer as the chloroform solution was dried over sodium sulfate, and filtered. The filtrate was concentrated by an evaporator, and the deposited solid was purified by recrystallization. As a solvent for recrystallization, methanol was used. After purification, 10.5 g (61.0 mmol) of a compound G-8 was obtained.

The NMR spectrum data of the compound G-8 will be shown below.

$^1$H NMR (CDCl$_3$, ppm): δ 7.75 (t, 2H)
$^{19}$F NMR (CDCl$_3$, ppm): δ −128.3 (s, 2F)

Synthesis Example 109

Synthesis of Compound G-9

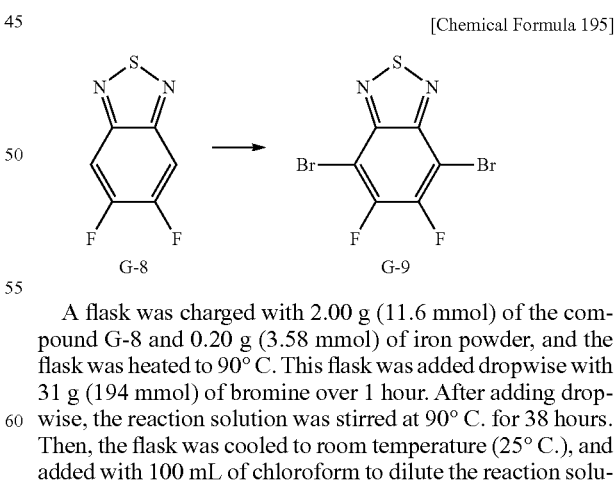

[Chemical Formula 195]

G-8   G-9

A flask was charged with 2.00 g (11.6 mmol) of the compound G-8 and 0.20 g (3.58 mmol) of iron powder, and the flask was heated to 90° C. This flask was added dropwise with 31 g (194 mmol) of bromine over 1 hour. After adding dropwise, the reaction solution was stirred at 90° C. for 38 hours. Then, the flask was cooled to room temperature (25° C.), and added with 100 mL of chloroform to dilute the reaction solution. The obtained solution was poured into 300 mL of a 5 mass % sodium sulfite aqueous solution, and stirred for 1 hour. An organic layer of the obtained mixed solution was separated by a separating funnel, and an aqueous layer was extracted three times with chloroform. The obtained extracted liquid was combined with the organic layer separated earlier, and the mixed solution was dried over sodium sulfate. The filtrate was concentrated by an evaporator after filtration, to distill off the solvent. The obtained yellow solid was dissolved in methanol heated to 55° C., and then cooled to 25° C. The deposited crystal was collected by filtration, and then dried under reduced pressure at room temperature (25° C.) to obtain 1.50 g of a compound G-9.

The NMR spectrum data of the compound G-9 will be shown below.

$^{19}$F NMR (CDCl$_3$, ppm): δ −118.9 (s, 2F).

Synthesis Example 110

Synthesis of Compound G-10

[Chemical Formula 196]

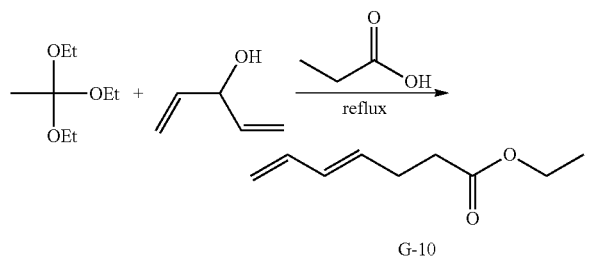

G-10

In an argon atmosphere, divinylcarbinol (25.24 g), triethyl orthoacetate (340 g) and propionic acid (0.20 g) were mixed, and the mixture was refluxed at 130° C. for 4 hours using a Dean-Stark apparatus while removing ethanol. After completion of the reaction, the resultant reaction solution was cooled, to this were added hexane and ion exchanged water, and the mixture was stirred at 60° C. for 3 hours. After liquid separation, the organic layer was rinsed with ion exchanged water three times, and dried over sodium sulfate. The resultant organic layer was passed through an alumina flash column and concentrated. To the resultant oil were added, again, hexane, ion exchanged water and propionic acid (0.20 g), and the mixture was stirred at 60° C. for 8 hours. After liquid separation, the organic layer was rinsed with ion exchanged water three times, and dried over sodium sulfate. The resultant organic layer was passed through an alumina flash column and concentrated to obtain 28 g of a compound G-10.

The NMR spectrum data of the compound G-10 will be shown below.

$^1$H-NMR (270 MHz, CDCl$_3$, ppm): δ 1.25 (t, 3H), 2.07 (q, 2H), 2.41 (m, 4H), 5.05 (dd, 2H), 5.70 (m, 1H), 6.09 (dd, 1H), 6.29 (m, 1H).

Synthesis Example 111

Synthesis of Compound G-11

[Chemical Formula 197]

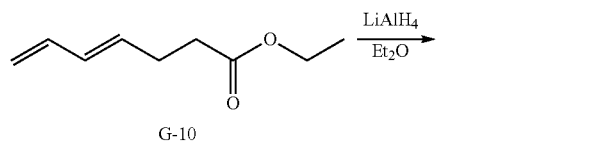

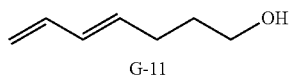

G-11

In an argon atmosphere, the compound G-10 (14.65 g) and diethyl ether (770 ml) were mixed, and the mixture was cooled down to 0° C. Next, into the resultant mixed solution, a 1M lithium aluminum hydride diethyl ether solution (50 mL) was added dropwise over 1 hour, and the mixture was stirred for 1 hour while maintaining 0° C. Into the resultant reaction solution, a 5 mass % sodium hydroxide aqueous solution (100 mL) was slowly added dropwise, to stop the reaction; then, the organic layer was rinsed with water three times; and the organic layer was dried over sodium sulfate. The resultant organic layer was passed through an alumina flash column and concentrated to obtain 8.0 g of a compounds G-11.

The NMR spectrum data of the compound G-11 will be shown below.

$^1$H-NMR (270 MHz, CDCl$_3$, ppm): δ 1.67 (tt, 2H), 2.13-2.28 (m, 3H), 3.63 (q, 2H), 5.04 (dd, 2H), 5.72 (dd, 1H), 6.07 (dd, 1H), 6.30 (m, 1H).

Synthesis Example 112

Synthesis of Compound G-12

[Chemical Formula 198]

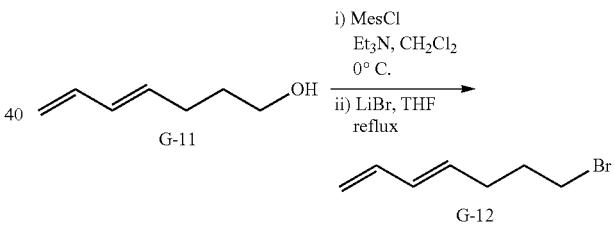

In an argon atmosphere, the compound G-11 (18.98 g) and dichloromethane (730 ml) were mixed, and the mixture was cooled down to 0° C. Into the resultant mixed solution, triethylamine (58 mL) was added dropwise; then, methanesulfonyl chloride (24 mL) was added dropwise; and the mixture was stirred for 2 hours while maintaining 0° C. To the resultant reaction solution was added water to stop the reaction, and the mixture was then extracted with diethyl ether and dried over sodium sulfate, to obtain 32 g of a yellow oil.

In an argon atmosphere, the yellow oil (32 g), lithium bromide (36 g) and tetrahydrofuran (400 ml) were mixed, and the mixture was refluxed for 7 hours. The resultant reaction solution was cooled; ion exchanged water and toluene were added; the mixture was subjected to liquid separation; and the organic layer was rinsed with ion exchanged water 5 times, and dried over sodium sulfate. The resultant organic layer was concentrated; hexane was added to this; and the mixture was then passed through an alumina flash column, and concentrated. The resultant oil was subjected to fractional distillation (3 mmHg, 27° C.), to obtain 15.1 g of a compound G-12.

The NMR spectrum data of the compound G-12 will be shown below.

$^1$H-NMR (270 MHz, CDCl$_3$, ppm): δ 1.96 (tt, 2H), 2.22-2.29 (m, 2H), 3.41 (t, 2H), 5.05 (dd, 2H), 5.65 (m, 1H), 6.10 (dd, 1H), 6.30 (m, 1H).

Synthesis Example 113

Synthesis of Compound G-13

[Chemical Formula 199]

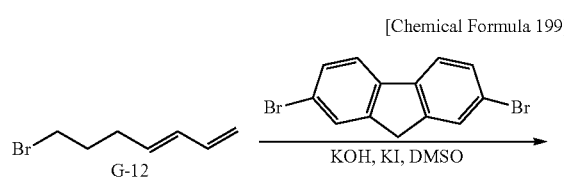

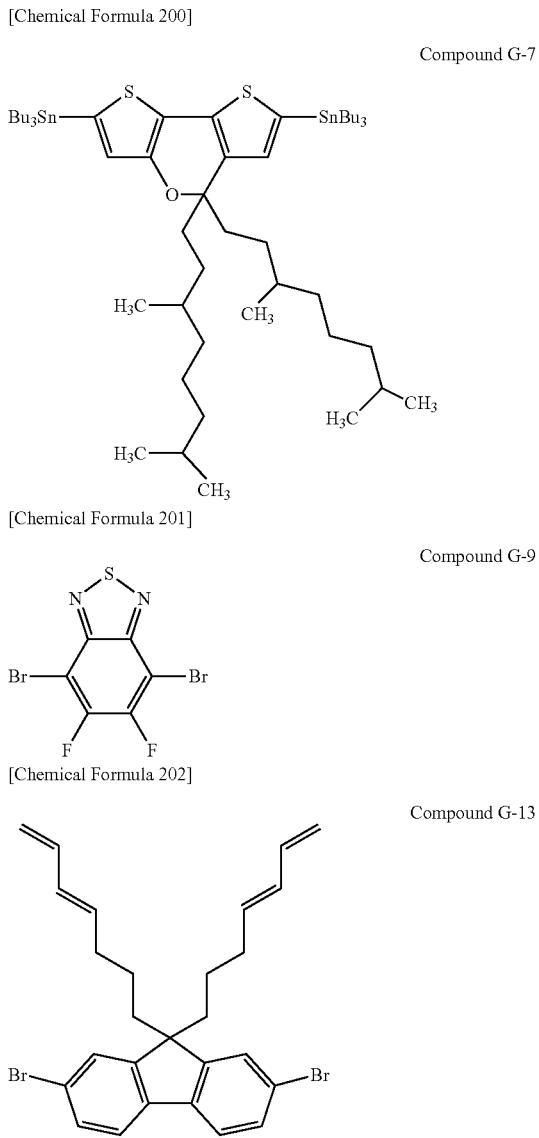

In an argon atmosphere, in a four-necked flask, the compound G-12 (5.29 g), 2,7-dibromofluorene (4.67 g) and dimethyl sulfoxide (DMSO) (35 ml) were mixed. To the resultant mixed solution were added potassium hydroxide (3.43 g) and potassium iodide (0.17 g) ground by a mortar, and the mixture was heated at 85° C. for 45 minutes. To the resultant mixed solution were added ion exchanged water and ethyl acetate; the mixture was subjected to liquid separation; and the organic layer was then rinsed with saturated saline ten times, dried over sodium sulfate, and then concentrated. The resultant oil was purified by silica gel column chromatography (developing solvent: hexane), to obtain 4.9 g of a compound G-13 as a white solid.

The NMR spectrum data and mass spectrum data of the compound G-13 will be shown below.

$^1$H-NMR (270 MHz, CDCl$_3$, ppm): δ 0.68 (m, 4H), 1.81-1.96 (m, 8H), 4.99 (dd, 4H), 5.44 (m, 2H), 5.89 (dd, 2H), 6.22 (td, 2H), 7.47 (m, 6H).

MS (APCI-MS: Positive) m/z: 512 ([M]$^+$).

Synthesis Example 114

Synthesis of Polymer A

[Chemical Formula 200]

[Chemical Formula 201]

[Chemical Formula 202]

A flask containing argon replacing for the interior gas was charged with 400 mg (0.380 mmol) of the compound G-7, 106.5 mg (0.323 mmol) of the compound G-9, 10 mg (0.020 mmol) of the compound G-13, and 25 mL of toluene to give a uniform solution. The obtained toluene solution was bubbled with argon gas for 30 minutes. Then, the toluene solution was added with 5.22 mg (0.00570 mmol) of tris(dibenzylidene acetone)dipalladium and 10.4 mg (0.0342 mmol) of tris(2-toluoyl)phosphine, and stirred at 100° C. for 6 hours. Then, the reaction solution was added with 100 mg of phenyl bromide, and further stirred for 5 hours. Then, the flask was cooled to 25° C. and the reaction solution was poured into 300 mL of methanol. The deposited polymer was collected by filtration; and the obtained polymer was put into cylindrical filter paper, and extracted with methanol, acetone and hexane for respectively 5 hours by using a Soxhlet extraction apparatus. The polymer remaining in the cylindrical filter paper was dissolved in 100 mL of toluene, and added with 2 g of sodium diethyldithiocarbamate and 40 mL of water, and stirred for 8 hours under reflux. After removing the aqueous layer, the organic layer was rinsed twice with water, then rinsed twice with a 3 mass % acetic acid aqueous solution, then rinsed twice with water, then rinsed twice with a 5 mass % potassium fluoride aqueous solution, and then rinsed twice with water; and the obtained solution was poured into methanol to make a polymer precipitate. After filtering the polymer, it was dried, and the obtained polymer was redissolved in o-dichlorobenzene, and caused to pass through an alumina/silica gel column. The obtained solution was poured into methanol to make a polymer precipitate, and the polymer was filtered and then dried, to obtain 202 mg of the purified polymer. Hereinafter, this polymer is referred to as a polymer A. The polystyrene-equivalent weight-average molecular weight of the polymer A was $3.8 \times 10^4$, and the polystyrene-equivalent number-average molecular weight was $2.4 \times 10^4$.

Example 101

Manufacture of Photoelectric Conversion Composition A

A flask containing argon replacing for the interior gas was charged with 100 mg of the polymer A obtained in Synthesis Example 114, 250 mg of fullerene C60 (nanom purple ST, manufactured by Frontier Carbon Corporation), and 50 mL of ortho-dichlorobenzene to give a uniform solution, and the solution was allowed to react at 100° C. for 6 hours. After the reaction, the reaction solution was cooled to room temperature, and caused to pass through a silica gel column. The obtained solution was poured into methanol; and the deposited solid was filtered and rinsed with methanol to obtain 277 mg of a black solid. The black solid is referred to as a photoelectric conversion composition A. It is presumed that the photoelectric conversion composition A is a mixture of a polymer B having the following structural formula and free fullerene C60 (polymer B: fullerene C60=5:95 (mass ratio)).

[Chemical Formula 203]

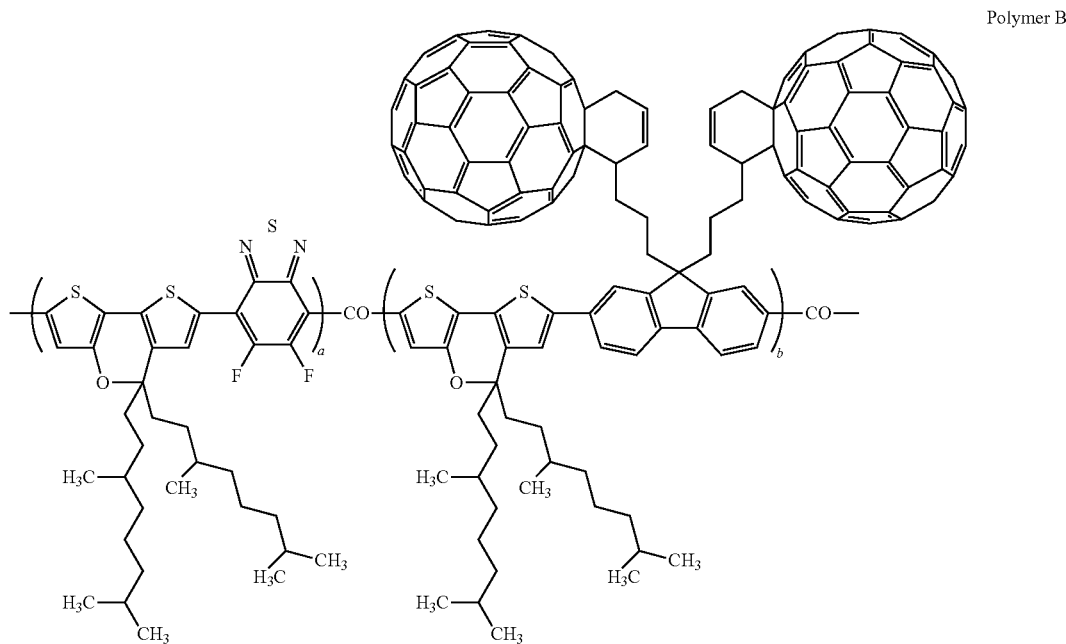

Polymer B

-continued

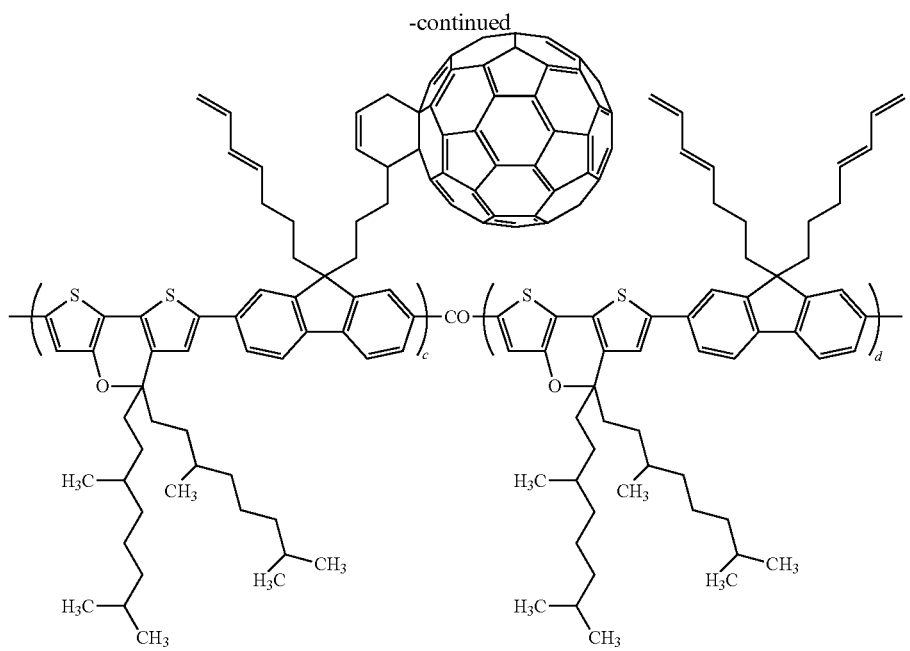

(wherein a, b, c and d represent the number of repeating units.)

<Production and Evaluation of Ink and Organic Film Solar Cell>

A glass substrate with a 150 nm-thick ITO film formed by sputtering was surface-finished by an ozone UV treatment. Next, a photoelectric conversion composition A (10 mg) was dissolved in ortho-dichlorobenzene (2 mL), to produce ink 1. The ink 1 was applied on the substrate by spin coating, to produce an organic film (thickness: about 100 nm) containing the photoelectric conversion composition A. The light absorption terminal wavelength of the organic film thus produced was 890 nm. Then, on the organic film, lithium fluoride was vapor-deposited into a thickness of 2 nm by a vacuum vapor deposition machine, and then Al was vapor-deposited into a thickness of 100 nm. The shape of the obtained organic film solar cell was a 2 mm×2 mm square. The obtained organic film solar cell was irradiated with constant light using a solar simulator (manufactured by BUNKOUKEIKI, product name OTENTO-SUNII: AM1.5G filter, radiation illuminance 100 mW/cm$^2$); generated current and voltage were measured; and photoelectric conversion efficiency, short-circuit current density, open voltage, and fill factor were determined. Jsc (short-circuit current density) was 3.04 mA/cm$^2$, Voc (open end voltage) was 0.71 V, ff (fill factor (curvilinear factor)) was 0.50, and photoelectric conversion efficiency (T) was 1.07%.

Comparative Example 101

A glass substrate with a 150 nm-thick ITO film formed by sputtering was surface-finished by an ozone UV treatment. Next, a polymer A and fullerene C60 (nanom purple ST manufactured by Frontier Carbon Corporation) (the mass ratio of the polymer A/fullerene C60=1/2) were dissolved in ortho-dichlorobenzene (the total of the masses of the polymer A and fullerene C60 was 2.0 mass % based on the total amount of ink 2), to produce ink 2. The ink 2 was applied on the substrate by spin coating, to produce an organic film (thickness: about 100 nm) containing the polymer A and the fullerene C60. The light absorption terminal wavelength of the organic film thus produced was 890 nm. Then, on the organic film, lithium fluoride was vapor-deposited into a thickness of 2 nm by a vacuum vapor deposition machine, and then Al was vapor-deposited into a thickness of 100 nm. The shape of the obtained organic film solar cell was a 2 mm×2 mm square. The obtained organic film solar cell was irradiated with constant light using a solar simulator (manufactured by BUNKOUKEIKI, product name OTENTO-SUNII: AM1.5G filter, radiation illuminance 100 mW/cm$^2$); generated current and voltage were measured; and photoelectric conversion efficiency, short-circuit current density, open voltage, and fill factor were determined. Jsc (short-circuit current density) was 2.54 mA/cm$^2$, Voc (open end voltage) was 0.70 V, ff (fill factor (curvilinear factor)) was 0.43, and photoelectric conversion efficiency (η) was 0.76%.

Synthesis Example 115

Synthesis of Polymer C

[Chemical Formula 204]

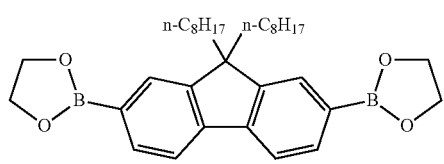

G-14

G-13

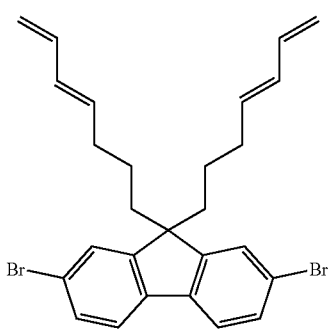

In a flask, 270 mg (0.509 mmol) of a compound G-14, 250 mg (0.488 mmol) of a compound G-13, and 130 mg of methyltrialkylammonium chloride (product name Aliquat336 (registered trademark) manufactured by Aldrich Co.) were added, and dissolved in 26 mL of toluene; and the obtained toluene solution was bubbled with argon for 30 minutes. Then, the reaction solution was added with 1.71 mg of palladium acetate, 9.4 mg of tris(2-methoxyphenyl)phosphine, and 2.6 mL of a sodium carbonate aqueous solution (16.7 mass %), and stirred under reflux for 3 hours. Then, the reaction solution was added with 50 mg of phenylboric acid, and further stirred under reflux for 2 hours. Then, the reaction solution was added with 2 g of sodium diethyldithiocarbamate and 20 mL of water, and stirred for 2 hours under reflux. After completion of the reaction, the reaction solution was cooled to about room temperature (25° C.), and the obtained reaction solution was then left still to collect the separated toluene layer. The toluene layer was rinsed twice with water, twice with a 3 mass % acetic acid aqueous solution, and twice with water; and the obtained toluene layer was poured into methanol, to collect the deposited precipitate. The precipitate was dried under reduced pressure, and then dissolved in toluene. Next, the obtained toluene solution was passed through a silica gel/an alumina column and purified. The obtained toluene solution was concentrated under reduced pressure, then poured into methanol, and deposited; and the generated precipitation was collected. The precipitation was rinsed with methanol and dried under reduced pressure to obtain 203 mg of a polymer. Hereinafter, this polymer is referred to as a polymer C. The polystyrene-equivalent weight-average molecular weight of the polymer C was $8.2 \times 10^4$, and the polystyrene-equivalent number-average molecular weight thereof was $3.5 \times 10^4$.

Example 103

Manufacture of Photoelectric Conversion Composition B

A flask containing argon replacing for the interior gas was charged with 100 mg of the polymer C obtained in Synthesis Example 115, 132 mg of fullerene C60 (nanom purple ST, manufactured by Frontier Carbon Corporation), and 50 mL of ortho-dichlorobenzene to give a uniform solution, and the solution was allowed to react at 100° C. for 2 hours. After the reaction, the reaction solution was cooled to room temperature, and caused to pass through a silica gel column. The obtained solution was poured into methanol; and the deposited solid was filtered and rinsed with methanol to obtain 191 mg of a black solid. The black solid is referred to as a photoelectric conversion composition B. It is presumed that the photoelectric conversion composition B is a mixture of a polymer D having the following structural formula and free fullerene C60 (polymer D: fullerene C60=50:50 (mass ratio)).

[Chemical Formula 205]

Polymer D

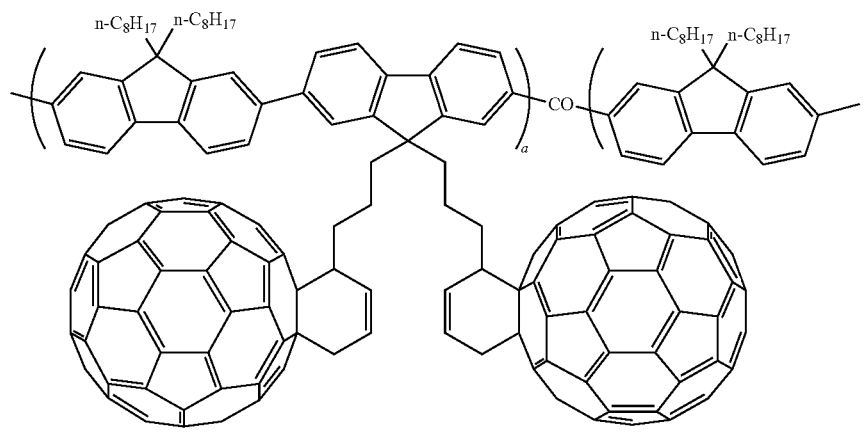

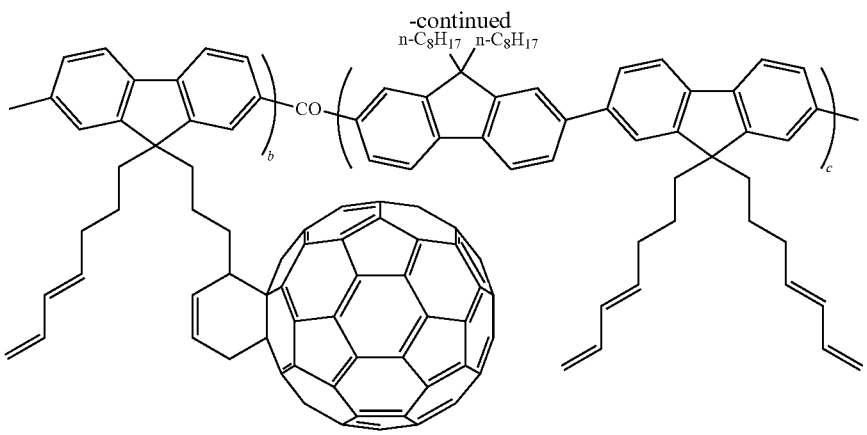

(wherein a, b, and c, represent the number of repeating units.)

Synthesis Example 116

Synthesis of Polymer E

[Chemical Formula 206]

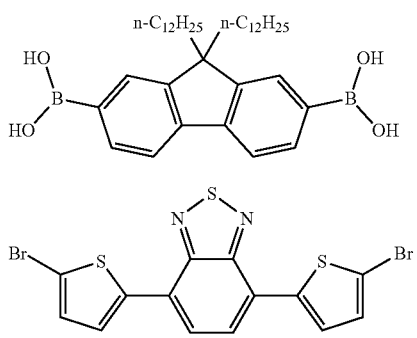

In a flask, 7302 mg (15.94 mmol) of a compound G-15, 8469 mg (14.34 mmol) of a compound G-16, and 3940 mg of methyltrialkylammonium chloride (product name Aliquat336 (registered trademark) manufactured by Aldrich Co.) were added, and dissolved in 789 mL of toluene; and the obtained toluene solution was bubbled with argon for 30 minutes. Then, the reaction solution was added with 53.66 mg of palladium acetate, 294.8 mg of tris(2-methoxyphenyl) phosphine, and 78.9 mL of a sodium carbonate aqueous solution (16.7 mass %), and stirred under reflux for 5 hours. Then, the reaction solution was added with 1096 mg of phenylboric acid, and further stirred under reflux for 2 hours. Then, the reaction solution was added with 143 g of sodium diethyldithiocarbamate and 712 mL of water, and stirred for 2 hours under reflux. After completion of the reaction, the reaction solution was cooled to about room temperature (25° C.), and the obtained reaction solution was then left still to collect the separated toluene layer. The toluene layer was rinsed twice with water, twice with a 3 mass % acetic acid aqueous solution, and twice with water; and the obtained toluene layer was poured into methanol, to collect the deposited precipitate. The precipitate was dried under reduced pressure, and then dissolved in toluene. Next, the obtained toluene solution was passed through a silica gel/an alumina column and purified. The obtained toluene solution was concentrated under reduced pressure, then poured into methanol, and deposited; and the generated precipitation was collected. The precipitation was rinsed with methanol and dried under reduced pressure to obtain 8120 mg of a polymer. Hereinafter, this polymer is referred to as a polymer E. The polystyrene-equivalent weight-average molecular weight of the polymer E was $1.43 \times 10^4$, and the polystyrene-equivalent number-average molecular weight thereof was $2.52 \times 10^4$. The light absorption terminal wavelength of the polymer E was 650 nm.

The organic film solar cell produced using the photoelectric conversion composition B and the polymer E is expected to show high short-circuit current density and high photoelectric conversion efficiency.

Synthesis Example 117

Synthesis of Compound G-18

[Chemical Formula 207]

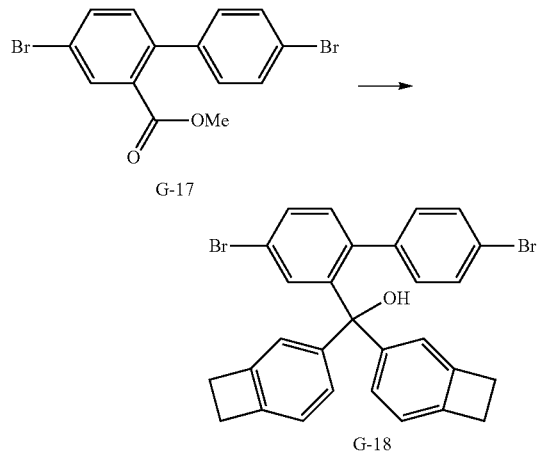

A stirring piece was put into a three-necked recovery flask, and a capacitor and a thermo couple were attached thereto. 3-bromobenzocyclobutane (4.1 g) and tetrahydrofuran (69 mL) were charged, and cooled to −78° C. in a dry ice-acetone bath. n-butyl lithium (16.9 mL) was added thereto; the mixture was stirred for 2 hours; and a solution in which a compound G-17 (4.1 g) was dissolved in tetrahydrofuran (12 mL)

was added dropwise. The mixture was stirred at −78° C. for 2 hours, and further stirred at room temperature at 4 hours. Water was slowly added to the mixture while the mixture was cooled in an ice bath; the mixture was moved to a separating funnel and rinsed; and the mixture was further rinsed with water twice. The obtained organic layer was dehydrated using magnesium sulfate, and the solid was filtered to concentrate the solution. As a result, 8.1 g (yield: 99.9%, LC purity: 73.0%) of a solid containing a compound G-18 was obtained.

Synthesis Example 118

Synthesis of Compound G-19

[Chemical Formula]

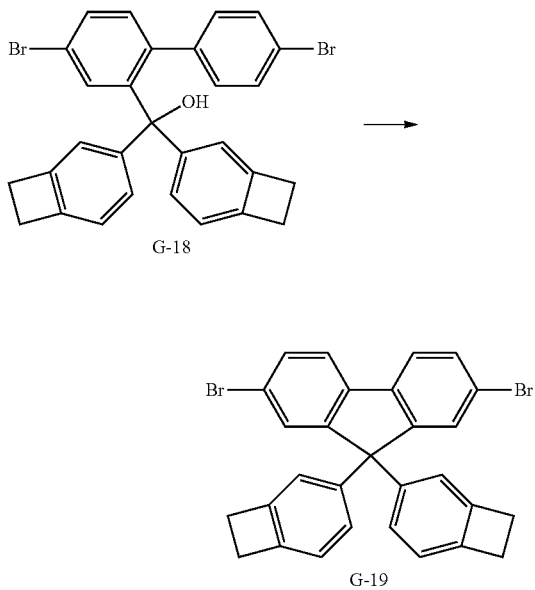

G-18

G-19

The compound G-18 was charged into a recovery flask, and dichloromethane (24 mL) was added thereto, to produce a solution. $BF_3.Et_2O$ (7.0 mL) was added dropwise from a dropping funnel after cooling the solution to 0° C. in an ice bath. $BF_3.Et_2O$ (7.0 mL) was further added after stirring for 1 hour; and the mixture was stirred for 1 hour and stirred at room temperature for 5 hours. After water was added and the mixture was stirred, the mixture was transferred to the separating funnel, followed by chloroform to extract a reaction product three times. After the obtained organic layer was dried over sodium sulfate, the solution was concentrated, and chloroform was added. While the mixture was heated and refluxed, methanol was added to conduct crystallization, and the obtained crystal was filtered. The crystal was added to chloroform; the mixture was heated; methanol was added thereto; and the mixture was stirred at room temperature for 2 hours. The produced crystal was filtered and dried. 2.0 g (yield: 35.0%, LC purity: 99.5%) of a desired compound G-19 was obtained as a white solid.

The NMR spectrum data of the compound G-19 will be shown below.

$^1$H NMR (300 MHz, $CDCl_3$, ppm): δ 7.56 (d, 8.1 Hz, 2H), 7.49 (d, 1.2 Hz, 2H), 7.45 (dd, 8.1, 1.2 Hz, 2H), 7.01 (d, 7.8 Hz, 2H), 6.92 (d, 7.8 Hz, 2H), 6.81 (s, 2H), 3.11 (s, 4H)

Synthesis Example 119

Synthesis of Polymer F

[Chemical Formula 209]

Compound G-14

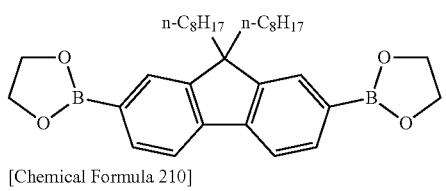

[Chemical Formula 210]

Compound G-19

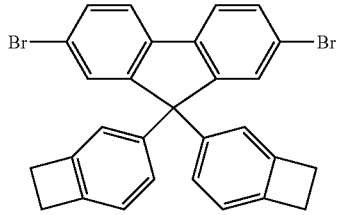

In a flask, 267 mg (0.503 mmol) of a compound G-14, 250 mg (0.473 mmol) of a compound G-19, and 129 mg of methyltrialkylammonium chloride (product name Aliquat336 (registered trademark) manufactured by Aldrich Co.) were added, and dissolved in 26 mL of toluene; and the obtained toluene solution was bubbled with argon for 30 minutes. Then, the reaction solution was added with 1.70 mg of palladium acetate, 9.3 mg of tris(2-methoxyphenyl)phosphine, and 2.6 mL of a sodium carbonate aqueous solution (16.7 mass %), and stirred under reflux for 2 hours. Then, the reaction solution was added with 29 mg of phenylboric acid, and further stirred under reflux for 2 hours. Then, the reaction solution was added with 4.7 g of sodium diethyldithiocarbamate and 23 mL of water, and stirred for 2 hours under reflux. After completion of the reaction, the reaction solution was cooled to about room temperature (25° C.), and the obtained reaction solution was then left still to collect the separated toluene layer. The toluene layer was rinsed twice with water, twice with a 3 mass % acetic acid aqueous solution, and twice with water; and the obtained toluene layer was poured into methanol, to collect the deposited precipitate. The precipitate was dried under reduced pressure, and then dissolved in toluene. Next, the obtained toluene solution was passed through a silica gel/an alumina column and purified. The obtained toluene solution was concentrated under reduced pressure, then poured into methanol, and deposited; and the generated precipitation was collected. The precipitation was rinsed with methanol and dried under reduced pressure to obtain 219 mg of a polymer. Hereinafter, this polymer is referred to as a polymer F. The polystyrene-equivalent weight-average molecular weight of the polymer F was $1.01 \times 10^5$, and the polystyrene-equivalent number-average molecular weight thereof was $4.2 \times 10^4$.

Example 104

Manufacture of Photoelectric Conversion Composition C

A flask containing argon replacing for the interior gas was charged with 100 mg of the polymer F obtained in Synthesis Example 119, 130 mg of fullerene C60 (nanom purple ST, manufactured by Frontier Carbon Corporation), and 50 mL of ortho-dichlorobenzene to give a uniform solution, and the solution was allowed to react at 100° C. for 2 hours. After the reaction, the reaction solution was cooled to room temperature, and caused to pass through a silica gel column. The obtained solution was poured into methanol; and the deposited solid was filtered and rinsed with methanol to obtain 121 mg of a black solid. The black solid is referred to as a photoelectric conversion composition C. It is presumed that the photoelectric conversion composition C is a mixture of a polymer G having the following structural formula and free fullerene C60.

[Chemical Formula 211]

The organic film solar cell produced using the photoelectric conversion composition C is expected to show high short-circuit current density and high photoelectric conversion efficiency.

REFERENCE SIGNS LIST

1 ... substrate, 2 ... active layer, 7a, 7b ... electrode, 10 ... substrate, 12 ... organic semiconductor layer, 13 ... insulating layer, 14 ... gate electrode, 15 ... source electrode, 16 ... drain electrode, 20 ... substrate, 22 ... anode, 23 ... charge injection layer, 24 ... hole transport layer; 25 ... light-emitting layer, 26 ... electron transport layer, 27 ... charge injection layer, 28 ... cathode, 30 ... substrate, 31 ... anode, 32 ... hole transport layer, 33 ... light-emitting layer, 34 ... cathode, 35 ... protection layer, 100 ... organic film solar cell, 200 ... organic EL device (constitution p), 220 ... organic EL device (constitution h), 300 ... surface light source, 400 ... organic film transistor.

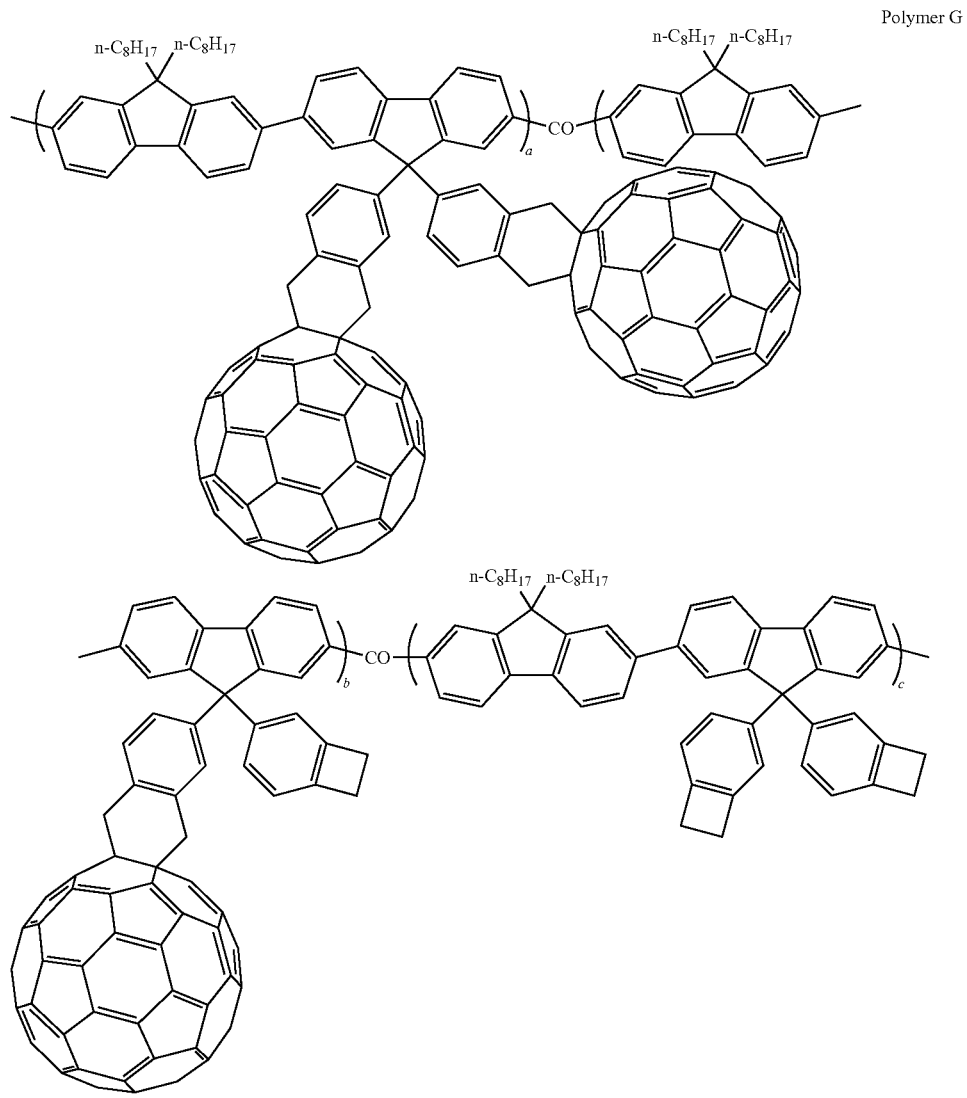

(wherein a, b, and c represent the number of repeating units.)

The invention claimed is:

1. A polymer compound, having a plurality of repeating units wherein at least one of the repeating units has a group containing a carbon cluster structure represented by formula (5A):

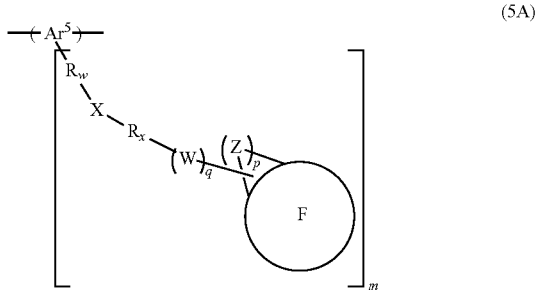

(5A)

wherein $Ar^5$ represents an unsubstituted or substituted arylene group, an unsubstituted or substituted heteroarylene group, an unsubstituted or substituted divalent heterocyclic group, or an unsubstituted or substituted divalent aromatic amine residue; X represents a single bond, an oxygen atom, a sulfur atom, an unsubstituted or substituted alkylene group, or an unsubstituted or substituted phenylene group; and $R_w$ and $R_x$ each independently represent a single bond, an unsubstituted or substituted $C_1$ to $C_{20}$ alkylene group, an unsubstituted or substituted $C_6$ to $C_{20}$ arylene group, or a divalent group of a combination thereof; ring F represents a carbon cluster structure; m represents an integer of 1 to 4; W represents a silicon atom or a divalent group containing a carbon atom; Z represents a carbon atom or a heteroatom selected from a nitrogen atom, an oxygen atom and a sulfur atom; p represents an integer of 0 to 12; q represents 0 or 1 wherein (a) when p is 0, q is 1 and W is a silicon atom; (b) when p is 1, Z is a carbon atom: (c) when p is 2 or more, the bond between adjacent carbon atoms is a single bond or an unsaturated bond W is a divalent group containing a carbon atom, and W forms a ring together with a ring containing Z; and (d) when there are a plurality of $R_w$, $R_x$, X, W, Z, p, q and ring F, they are independently the same or different.

2. The polymer compound according to claim 1, having at least two of the repeating units selected from the group consisting of an arylene unit, a heteroarylene unit, a heterocyclic unit, and an aromatic amine unit.

3. The polymer compound according to Claim 1, having at least one of the repeating units selected from the group consisting of an arylene unit, a heteroarylene unit, a heterocyclic unit, and an aromatic amine unit.

4. The polymer compound according to claim 2, wherein the aromatic amine unit is selected from the group consisting of a unit represented by formula (2) and a unit represented by formula (3):

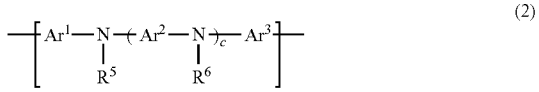

(2)

wherein $Ar^1$, $Ar^2$ and $Ar^3$ each independently represent an unsubstituted or substituted arylene group, an unsubstituted or substituted heteroarylene group, or an unsubstituted or substituted divalent heterocyclic group; $R^5$ and $R^6$ each independently represent a hydrogen atom, an unsubstituted or substituted alkyl group, an unsubstituted or substituted aryl group, or an unsubstituted or substituted monovalent heterocyclic group; and c represents 0 or 1,

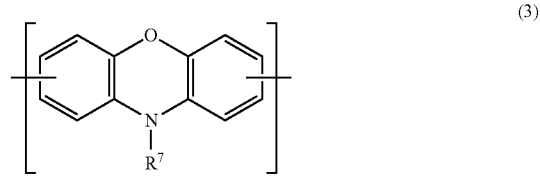

(3)

wherein $R^7$ represents a hydrogen atom, an unsubstituted or substituted alkyl group, an unsubstituted or substituted aryl group, or an unsubstituted or substituted monovalent heterocyclic group.

5. The polymer compound according to claim 2, wherein the arylene unit is a unit having a fluorene structure.

6. The polymer compound according to claim 5, wherein the polymer is a conjugated polymer.

7. The polymer compound according to claim 1, wherein the carbon cluster structure is a structure containing a fullerene.

8. The polymer compound according to claim 7, wherein the fullerene is fullerene C60.

9. A polymer compound, having a plurality of repeating units wherein at least one of the repeating units has a group containing a carbon cluster structure containing a fullerene, and is represented by formula (6):

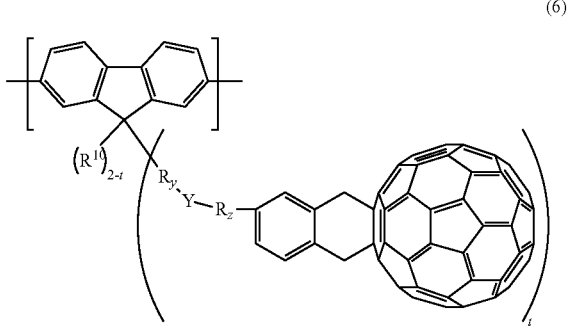

(6)

wherein Y represents a single bond, an oxygen atom, a sulfur atom, an unsubstituted or substituted alkylene group. or an unsubstituted or substituted phenylene group; $R_y$ and $R_z$ each independently represent a single bond, an unsubstituted or substituted $C_1$ to $C_{20}$ alkylene group, an unsubstituted or substituted $C_6$ to $C_{20}$ arylene group, or a divalent group of a combination thereof; $R^{10}$ represents a hydrogen atom, an unsubstituted or substituted alkyl group, an unsubstituted or substituted alkoxy group, an unsubstituted or substituted aryl group, an unsubstituted or substituted monovalent heterocyclic group, or a crosslinkable group; t represents 1 or 2; and when there are a plurality of $R_y$, $R_z$ and Y, they are independently the same or different.

10. A polymer compound obtained by reacting a carbon cluster and a precursor polymer compound, wherein the precursor polymer compound has at least two repeating units selected from the group consisting of an arylene unit, a heteroarylene unit, a heterocyclic unit, and an aromatic amine unit, and wherein at least one of the repeating units is represented by formula (7):

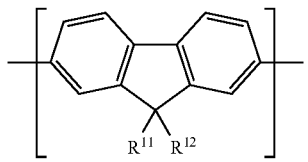

wherein $R^{11}$ represents a crosslinkable group; and $R^{12}$ represents a hydrogen atom, a crosslinkable group, an unsubstituted or substituted alkyl group, or an unsubstituted or substituted aryl group.

11. A polymer compound, having a plurality of repeating units wherein at least one of the repeating units has a group containing a carbon cluster structure, and at least one of the repeating units is selected from the group consisting of an arylene unit and a heteroarylene unit, wherein the carbon cluster structure is represented by formula (T5A):

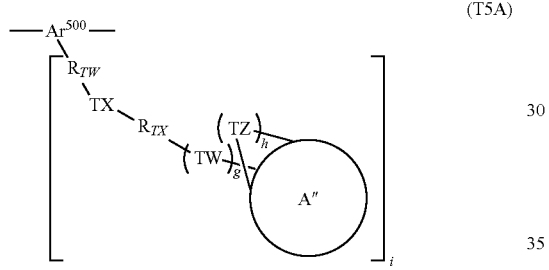

wherein $Ar_{500}$ represents an unsubstituted or substituted arylene group, or an unsubstituted or substituted heteroarylene group; TX represents a single bond, an oxygen atom, a sulfur atom, an unsubstituted or substituted alkylene group, or an unsubstituted or substituted phenylene group; $R_{TW}$ and $R_{TX}$ each independently represent a single bond, an unsubstituted or substituted $C_1$ to $C_{20}$ alkylene group, an unsubstituted or substituted $C_6$ to $C_{20}$ arvlene group or a divalent group of a combination thereof; ring A" represents a carbon cluster structure; i represents an integer of 1 to 4; TW represents a silicon atom or a divalent group containing a carbon atom; TZ represents a carbon atom or a heteroatom selected from a nitrogen atom, an oxygen atom and a sulfur atom; h represents an integer of 0 to 12; g represents 0 or 1 wherein (a) when h is 0, g is 1 and TW is a silicon atom; (b) when h is 1, TZ is a carbon atom: (c) when h is 2 or more, at least one of a plurality of TZ is a hetero atom, the bond between adjacent carbon atoms is a single bond or an unsaturated bond, TW is a divalent group containing a carbon atom, and TW forms a ring together with a ring containing TZ; and (d) when there are a plurality of $R_{TW}$, $R_{TX}$, TX, TW, TZ, g, h and ring A", they are independently the same or different.

12. The polymer compound according to claim 1, wherein the group containing a carbon cluster structure is selected from a group remaining after removing one hydrogen atom from a fullerene C60 derivative, a group remaining after removing one hydrogen atom from a fullerene C70 derivative, and a group remaining after removing one hydrogen atom from a fullerene C84 derivative.

13. The polymer compound according to claim 1, wherein the at least one repeating unit having a group containing a carbon cluster structure comprises 5 mole % to 100 mole % of a total of all of the repeating units.

14. The polymer compound according to claim 1, wherein when p is 2or more, at least one of a plurality of Z is a heteroatom.

15. The polymer compound according to claim 10, wherein the crosslinkable group is a compound selected from the group consisting of the following formulas (7A-6), (7A-7), (7A-8), (7A-9), (7A-10), (7A-11), (7A-15), (7A-16), (7A-17), (7A-18), (7A-19), (7A-20), (7A-21), (7A-22), (7A-23), (7A-24), (7A-25), (7A-26), (7A-27), (7A-28), (7A-29) and (7A-30):

(7A-6)

(7A-7)

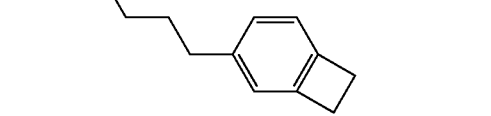
(7A-8)

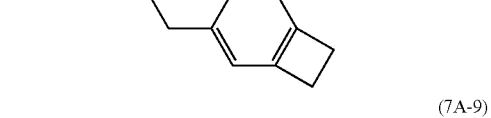
(7A-9)

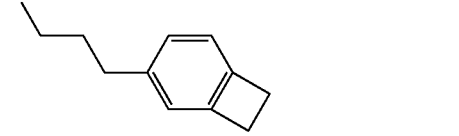
(7A-10)

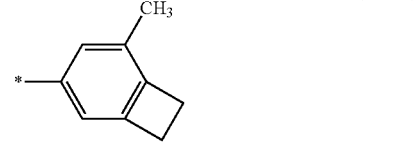
(7A-11)

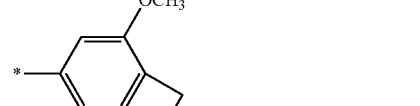
(7A-15)

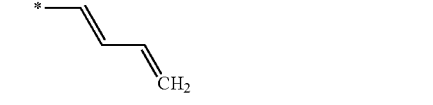
(7A-16)

-continued
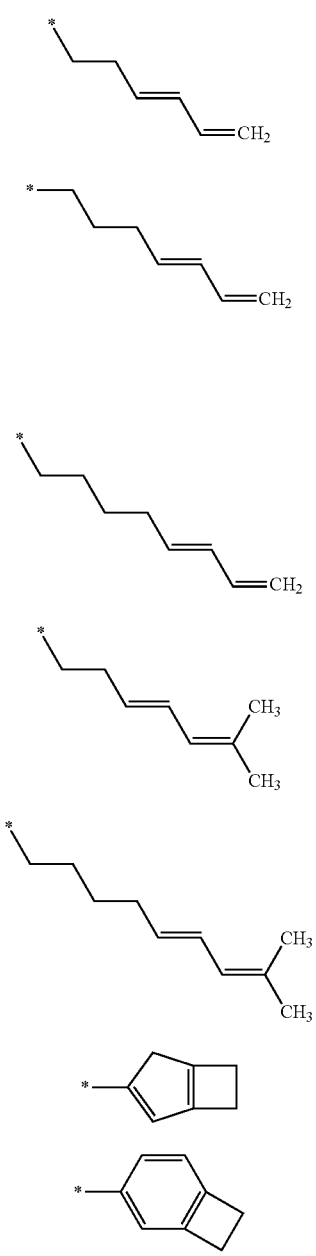
(7A-17)
(7A-18)
(7A-19)
(7A-20)
(7A-21)
(7A-22)
(7A-23)
-continued
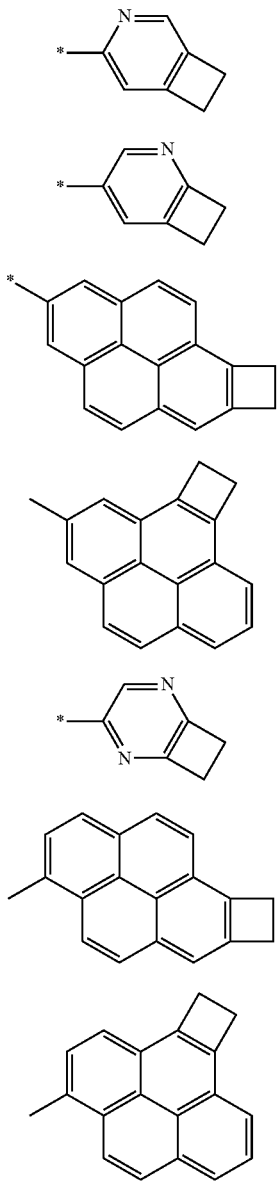
(7A-24)
(7A-25)
(7A-26)
(7A-27)
(7A-28)
(7A-29)
(7A-30)
wherein * represents a bonding site.
* * * * *